(12) United States Patent
Kimura et al.

(10) Patent No.: US 7,443,202 B2
(45) Date of Patent: Oct. 28, 2008

(54) SEMICONDUCTOR DEVICE AND ELECTRONIC APPARATUS HAVING THE SAME

(75) Inventors: Hajime Kimura, Kanagawa (JP); Atsushi Umezaki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 11/752,546

(22) Filed: May 23, 2007

(65) Prior Publication Data

US 2007/0296660 A1    Dec. 27, 2007

(30) Foreign Application Priority Data

Jun. 2, 2006    (JP)    ............... 2006-155460

(51) Int. Cl.
*H03K 19/0175*    (2006.01)
(52) U.S. Cl. .......................... 326/82; 345/204
(58) Field of Classification Search ............. 326/82–86; 345/204, 210–214
See application file for complete search history.

(56) References Cited

U.S. PATENT DOCUMENTS

| | | | |
|---|---|---|---|
| 5,191,233 A | | 3/1993 | Nakano |
| 5,399,915 A | | 3/1995 | Yahata |
| 5,467,043 A | | 11/1995 | Ohi |
| 5,648,791 A | * | 7/1997 | Date et al. ............ 345/89 |
| 5,680,149 A | | 10/1997 | Koyama et al. |
| 5,867,138 A | | 2/1999 | Moon |
| 6,191,779 B1 | | 2/2001 | Taguchi et al. |
| 6,262,598 B1 | | 7/2001 | Cairns et al. |
| 6,292,183 B1 | | 9/2001 | Yamazaki et al. |
| 6,300,927 B1 | | 10/2001 | Kubota et al. |
| 6,384,808 B2 | | 5/2002 | Azami |
| 6,392,625 B1 | | 5/2002 | Sato et al. |
| 6,476,637 B1 | | 11/2002 | Brownlow et al. |
| 6,567,067 B2 | | 5/2003 | Azami |
| 6,617,878 B2 | | 9/2003 | Brownlow et al. |
| 6,700,429 B2 | | 3/2004 | Kanno et al. |
| 6,731,273 B2 | | 5/2004 | Koyama et al. |

(Continued)

FOREIGN PATENT DOCUMENTS

JP    2001-257581    9/2001

(Continued)

OTHER PUBLICATIONS

Yeh et al., "P-173L:*Late-News Poster*: A 2.2-inch QVGA System-on-Glass LCD Using P-Type Low Temperature Poly-Silicon Thin Film Transistors"; 2005 *SID International Symposium Digest of Technical Papers*, vol. 36, Book 1; pp. 352-355; May 2005.

(Continued)

*Primary Examiner*—Don P Le
(74) *Attorney, Agent, or Firm*—Fish & Richardson P.C.

(57) ABSTRACT

With an offset circuit including transistors of the same conductivity type, offset of an input signal is performed. Then, the input signal after the offset is supplied to a logic circuit including transistors of the same conductivity type as that of the offset circuit, thereby H and L levels of the input signal can be shifted at the same time. Further, since the offset circuit and the logic circuit are formed using the transistors of the same conductivity type, a display device can be manufactured at a low cost.

18 Claims, 65 Drawing Sheets

U.S. PATENT DOCUMENTS

| | | | |
|---|---|---|---|
| 6,777,981 | B2 | 8/2004 | Kobayashi |
| 6,980,194 | B2 | 12/2005 | Tobita |
| 7,091,749 | B2 * | 8/2006 | Miyake et al. ............... 326/88 |
| 2003/0011584 | A1 * | 1/2003 | Azami et al. ............... 345/204 |
| 2005/0243079 | A1 * | 11/2005 | Ozaki ....................... 345/204 |
| 2007/0063993 | A1 * | 3/2007 | Shishido .................... 345/175 |
| 2007/0085847 | A1 * | 4/2007 | Shishido .................... 345/204 |

FOREIGN PATENT DOCUMENTS

JP  2002-118458  4/2002

OTHER PUBLICATIONS

Yeh et al., "22.2:*Invited Paper*: System-on-Glass LTPS LCD using P-type TFTs"; 2006 *SID International Symposium Digest of Technical Papers*, vol. 37, Book 2; pp. 1177-1180; Jun. 2006.

* cited by examiner

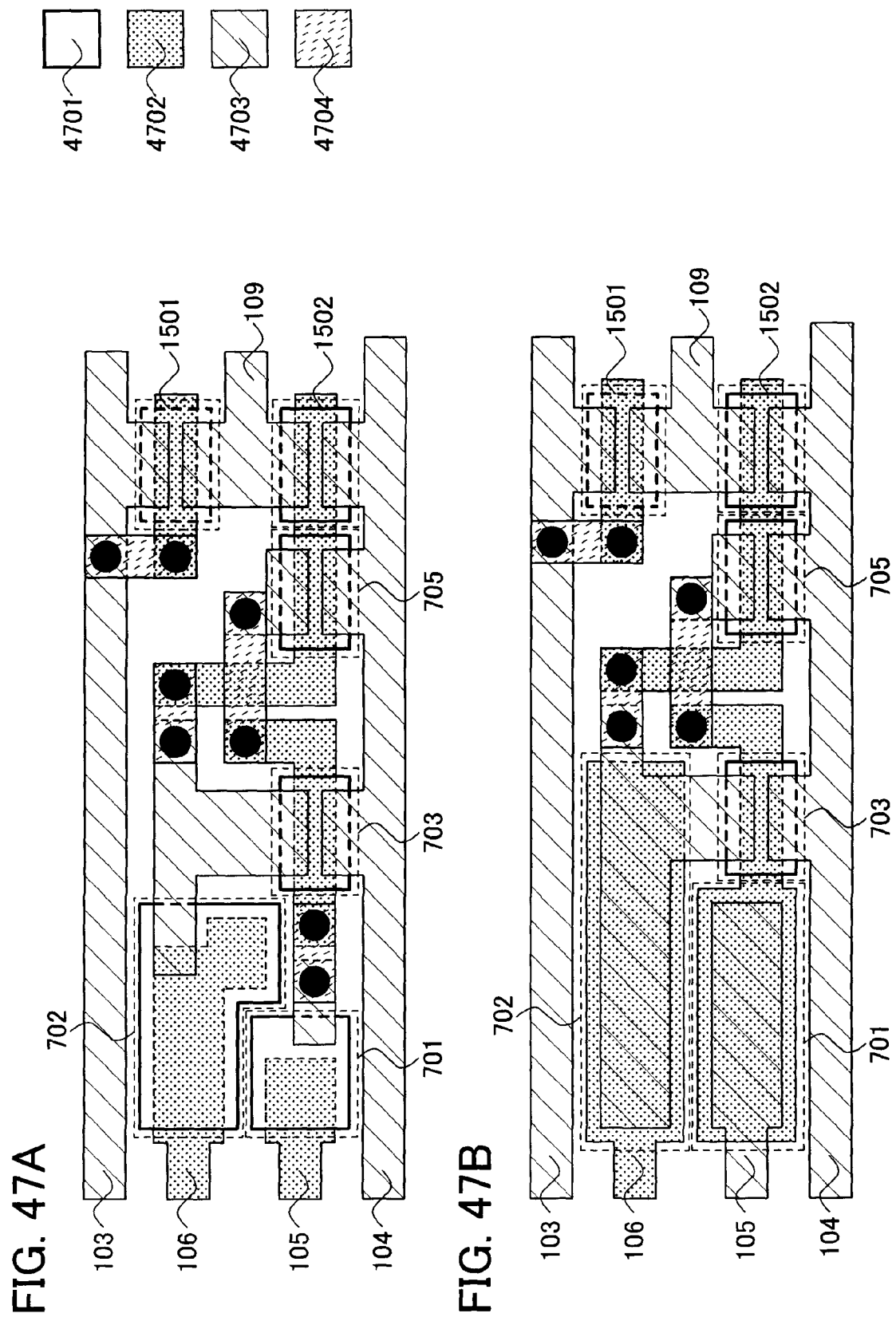

SEMICONDUCTOR DEVICE AND ELECTRONIC APPARATUS HAVING THE SAME

BACKGROUND OF THE INVENTION

1. Field of the Invention

The present invention relates to a semiconductor device and a driving method of a semiconductor device. In addition, the present invention relates to a display device having a semiconductor device, in particular, relates to a liquid crystal display device having a semiconductor device and an electronic apparatus having the liquid crystal display device.

2. Description of the Related Art

In recent years, display devices such as a liquid crystal display device and a light-emitting device have been actively developed in accordance with increase in large display devices such as liquid crystal televisions. In particular, a technique in which a pixel circuit and a driver circuit including a shift register circuit or the like (hereinafter referred to as an internal circuit) are formed over the same substrate by using transistors formed of a noncrystalline semiconductor over an insulator, which contributes largely to reduction in power consumption and cost, has been actively developed. The internal circuit formed over the insulator is connected via an FPC or the like to a controller IC or the like (hereinafter referred to as an external circuit) disposed outside the insulator, and an operation thereof is controlled.

As the internal circuit formed over the insulator, various level shifters have been invented (see Reference 1: Japanese Published Patent Application No. 2001-257581, and Reference 2: Japanese Published Patent Application No. 2002-118458)

SUMMARY OF THE INVENTION

Each level shifter described in References 1 and 2 cannot shift levels of an input signal on negative and positive poser source sides at the same time. That is, in the case of shifting the levels of an input signal on the negative and positive power source sides, a level shifter for shifting the level of an input signal on the negative power source side and a level shifter for shifting the level of an input signal on the positive power source side have been required.

In view of the problem, it is an object of the present invention to provide a level shifter capable of simultaneously shifting levels of an input signal on a negative power source side and on a positive power source side, a semiconductor device and a display device such as a liquid crystal display device each having such a level shifter, and an electronic apparatus having the display device.

In accordance with one feature of the present invention, a first capacitor, a second capacitor, a first transistor, a second transistor, a third transistor, and a fourth transistor are included, and a first electrode of the first capacitor is electrically connected to a third wiring, a first electrode of the second capacitor is electrically connected to a fourth wiring, a gate of the first transistor is electrically connected to a second electrode of the first capacitor, a first terminal of the first transistor is electrically connected to a second wiring, a second terminal of the first transistor is electrically connected to a second electrode of the second capacitor, a gate of the second transistor is electrically connected to the second electrode of the second capacitor, a first terminal of the second transistor is electrically connected to the second wiring, a second terminal of the second transistor is electrically connected to the second electrode of the first capacitor, a gate of the third transistor is electrically connected to the second electrode of the second capacitor, a first terminal of the third transistor is electrically connected to the second wiring, a second terminal of the third transistor is electrically connected to a fifth wiring, a gate and a first terminal of the fourth transistor are electrically connected to a first wiring, and a second terminal of the fourth transistor is electrically connected to the fifth wiring.

Note that the first to fourth transistors may be transistors of the same conductivity type. In the case where the first to fourth transistors are P-channel transistors, a potential of the first wiring may be higher than a potential of the second wiring. In the case where the first to fourth transistors are N-channel transistors, the potential of the first wiring may be lower than the potential of the second wiring.

In accordance with one feature of the present invention, a first capacitor, a second capacitor, a first transistor, a second transistor, a third transistor, a fourth transistor, a fifth transistor, and a sixth transistor are included, and a first electrode of the first capacitor is electrically connected to a third wiring, a first electrode of the second capacitor is electrically connected to a fourth wiring, a gate of the first transistor is electrically connected to a second electrode of the first capacitor, a first terminal of the first transistor is electrically connected to a second wiring, a second terminal of the first transistor is electrically connected to a second electrode of the second capacitor, a gate of the second transistor is electrically connected to the second electrode of the second capacitor, a first terminal of the second transistor is electrically connected to the second wiring, a second terminal of the second transistor is electrically connected to the second electrode of the first capacitor, a gate of the third transistor is electrically connected to the second electrode of the second capacitor, a first terminal of the third transistor is electrically connected to the second wiring, a second terminal of the third transistor is electrically connected to a fifth wiring, a gate and a first terminal of the fourth transistor are electrically connected to a first wiring, a second terminal of the fourth transistor is electrically connected to the fifth wiring, a gate of the fifth transistor is electrically connected to the second electrode of the first capacitor, a first terminal of the fifth transistor is electrically connected to the second wiring, a second terminal of the fifth transistor is electrically connected to a sixth wiring, a gate and a first terminal of the sixth transistor are electrically connected to the first wiring, and a second terminal of the sixth transistor is electrically connected to the sixth wiring.

Note that the first to sixth transistors may be transistors of the same conductivity type. In the case where the first to sixth transistors are P-channel transistors, a potential of the first wiring may be higher than a potential of the second wiring. In the case where the first to sixth transistors are N-channel transistors, the potential of the first wiring may be lower than the potential of the second wiring.

In accordance with one feature of the present invention, a first capacitor, a second capacitor, a first transistor, a second transistor, a third transistor, a fourth transistor, a fifth transistor, and a sixth transistor are included, and a first electrode of the first capacitor is electrically connected to a third wiring, a first electrode of the second capacitor is electrically connected to a fourth wiring, a gate of the first transistor is electrically connected to a second electrode of the first capacitor, a first terminal of the first transistor is electrically connected to a second wiring, a second terminal of the first transistor is electrically connected to a second electrode of the second capacitor, a gate of the second transistor is electrically connected to the second electrode of the second capacitor, a first terminal of the second transistor is electrically connected to the second wiring, a second terminal of the second transistor is electrically connected to the second electrode of the first capacitor, a gate of the third transistor is electrically connected to the second electrode of the second capacitor, a first terminal of the third transistor is electrically connected to the second wiring, a gate and a first terminal of the fourth transistor are electrically connected to a first wiring, a second terminal of the fourth transistor is electrically connected to a second terminal of the third transistor, a gate of the fifth transistor is electrically connected to the second electrode of the second capacitor, a first terminal of the fifth transistor is electrically connected to the second wiring, a second terminal of the fifth transistor is electrically connected to a fifth wiring, a gate of the sixth transistor is electrically connected to the second terminal of the third transistor and the second terminal of the fourth transistor, a first terminal of the sixth transistor is electrically connected to the first wiring, and a second terminal of the sixth transistor is electrically connected to the fifth wiring.

Note that the first to sixth transistors may be transistors of the same conductivity type. In the case where the first to sixth transistors are P-channel transistors, a potential of the first wiring may be higher than a potential of the second wiring. In the case where the first to sixth transistors are N-channel transistors, the potential of the first wiring may be lower than the potential of the second wiring.

In accordance with one feature of a liquid crystal display device of the present invention, a pixel including a liquid crystal element and a driver circuit are included, the driver circuit includes a first capacitor, a second capacitor, a first transistor, a second transistor, a third transistor, and a fourth transistor, and a first electrode of the first capacitor is electrically connected to a third wiring, a first electrode of the second capacitor is electrically connected to a fourth wiring, a gate of the first transistor is electrically connected to a second electrode of the first capacitor, a first terminal of the first transistor is electrically connected to a second wiring, a second terminal of the first transistor is electrically connected to a second electrode of the second capacitor, a gate of the second transistor is electrically connected to the second electrode of the second capacitor, a first terminal of the second transistor is electrically connected to the second wiring, a second terminal of the second transistor is electrically connected to the second electrode of the first capacitor, a gate of the third transistor is electrically connected to the second electrode of the second capacitor, a first terminal of the third transistor is electrically connected to the second wiring, a second terminal of the third transistor is electrically connected to a fifth wiring, a gate and a first terminal of the fourth transistor are electrically connected to a first wiring, and a second terminal of the fourth transistor is electrically connected to the fifth wiring.

Note that the first to fourth transistors may be transistors of the same conductivity type. In the case where the first to fourth transistors are P-channel transistors, a potential of the first wiring may be higher than a potential of the second wiring. In the case where the first to fourth transistors are N-channel transistors, the potential of the first wiring may be lower than the potential of the second wiring.

In accordance with one feature of a liquid crystal display device of the present invention, a pixel including a liquid crystal element and a driver circuit are included, the driver circuit includes a first capacitor, a second capacitor, a first transistor, a second transistor, a third transistor, a fourth transistor, a fifth transistor, and a sixth transistor, and a first electrode of the first capacitor is electrically connected to a third wiring, a first electrode of the second capacitor is electrically connected to a fourth wiring, a gate of the first transistor is electrically connected to a second electrode of the first capacitor, a first terminal of the first transistor is electrically connected to a second wiring, a second terminal of the first transistor is electrically connected to a second electrode of the second capacitor, a gate of the second transistor is electrically connected to the second electrode of the second capacitor, a first terminal of the second transistor is electrically connected to the second wiring, a second terminal of the second transistor is electrically connected to the second electrode of the first capacitor, a gate of the third transistor is electrically connected to the second electrode of the second capacitor, a first terminal of the third transistor is electrically connected to the second wiring, a second terminal of the third transistor is electrically connected to a fifth wiring, a gate and a first terminal of the fourth transistor are electrically connected to a first wiring, a second terminal of the fourth transistor is electrically connected to the fifth wiring, a gate of the fifth transistor is electrically connected to the second electrode of the first capacitor, a first terminal of the fifth transistor is electrically connected to the second wiring, a second terminal of the fifth transistor is electrically connected to a sixth wiring, a gate and a first terminal of the sixth transistor are electrically connected to the first wiring, and a second terminal of the sixth transistor is electrically connected to the sixth wiring.

Note that the first to sixth transistors may be transistors of the same conductivity type. In the case where the first to sixth transistors are P-channel transistors, a potential of the first wiring may be higher than a potential of the second wiring. In the case where the first to sixth transistors are N-channel transistors, the potential of the first wiring may be lower than the potential of the second wiring.

In accordance with one feature of a liquid crystal display device of the present invention, a pixel including a liquid crystal element and a driver circuit are included, the driver circuit includes a first capacitor, a second capacitor, a first transistor, a second transistor, a third transistor, a fourth transistor, a fifth transistor, and a sixth transistor, and a first electrode of the first capacitor is electrically connected to a third wiring, a first electrode of the second capacitor is electrically connected to a fourth wiring, a gate of the first transistor is electrically connected to a second electrode of the first capacitor, a first terminal of the first transistor is electrically connected to a second wiring, a second terminal of the first transistor is electrically connected to a second electrode of the second capacitor, a gate of the second transistor is electrically connected to the second electrode of the second capacitor, a first terminal of the second transistor is electrically connected to the second wiring, a second terminal of the second transistor is electrically connected to the second electrode of the first capacitor, a gate of the third transistor is electrically connected to the second electrode of the second capacitor, a first terminal of the third transistor is electrically connected to the second wiring, a gate and a first terminal of the fourth transistor are electrically connected to a first wiring, a second terminal of the fourth transistor is electrically connected to a second terminal of the third transistor, a gate of the fifth transistor is electrically connected to the second electrode of the second capacitor, a first terminal of the fifth transistor is electrically connected to the second wiring, a second terminal of the fifth transistor is electrically connected to a fifth wiring, a gate of the sixth transistor is electrically connected to the second terminal of the third transistor and the second terminal of the fourth transistor, a first terminal of the sixth transistor is electrically connected to the first wiring, and a second terminal of the sixth transistor is electrically connected to the fifth wiring.

Note that the first to sixth transistors may be transistors of the same conductivity type. In the case where the first to sixth transistors are P-channel transistors, a potential of the first wiring may be higher than a potential of the second wiring. In the case where the first to sixth transistors are N-channel transistors, the potential of the first wiring may be lower than the potential of the second wiring.

Note also that a switch in the present invention may be any switch such as an electrical switch or a mechanical switch. That is, it may be anything as long as it can control a current flow. For example, a transistor, a diode (e.g., a PN diode, a PIN diode, a Schottky diode, or a diode-connected transistor), a thyristor, or a logic circuit configured with them may be used. Therefore, in the case of using a transistor as a switch, a polarity (conductivity type) of the switch, which operates just as a switch, is not particularly limited. However, when less off-current is preferred, it is preferable to use a transistor of a polarity with less off-current. As an example of the transistor with less off-current, a transistor provided with an LDD region, a transistor with a multi-gate structure, and the like can be given. Further, it is preferable that an N-channel transistor be used in the case where a potential of a source terminal of the transistor operating as the switch is closer to a low-potential side power source (e.g., Vss, GND, or 0 V), and a P-channel transistor be used in the case where the potential of the source terminal of the transistor operating as the switch is closer to a high-potential side power source (e.g., Vdd). This is because an absolute value of a gate-source voltage of the transistor can be increased so that the transistor can operate easily as a switch.

Note that a CMOS switch may also be used by using both N-channel and P-channel switches. The CMOS switch can operate easily as a switch because a current can flow when either one of the P-channel and N-channel switches is turned on. For example, regardless of whether a voltage of an input signal to the switch is high or low, a voltage can be outputted appropriately. Further, since a voltage amplitude of a signal for turning on or off the switch can be reduced, power consumption can be reduced.

Note that in the case where a transistor is used as a switch, there are an input terminal (one of a source terminal and a drain terminal), an output terminal (the other of the source terminal and the drain terminal), and a terminal (a gate terminal) of controlling electrical conduction. On the other hand, in the case where a diode is used as a switch, there is not necessarily a terminal of controlling electrical conduction; therefore, the number of wirings for controlling terminals can be reduced.

Note that in the present invention, being "connected" includes electrical connection, functional connection, and direct connection. Therefore, each structure disclosed in the present invention may include an object in addition to a predetermined connection. For example, at least one of elements which allow electrical connection (e.g., a switch, a transistor, a capacitor, an inductor, a resistor, or a diode) may also be disposed between a certain portion and another certain portion. Further, at least one of circuits which allow functional connection (e.g., a logic circuit such as an inverter, a NAND circuit, or a NOR circuit; a signal converting circuit such as a DA converting circuit, an AD converting circuit, or a gamma-correction circuit; a potential-level converting circuit such as a power source circuit, e.g., a voltage step-up circuit or a voltage step-down circuit, or a level shifter circuit of changing a potential level of an Hi signal or a Low signal; a voltage source; a current source; a switching circuit; an amplifier circuit such as a circuit capable of increasing an signal amplitude, the current amount, or the like, such as an operation amplifier, a differential amplifier circuit, a source follower circuit, or a buffer circuit; a signal generating circuit; a memory circuit; or a controlling circuit) may also be disposed therebetween. Alternatively, without interposing another element or circuit therebetween, direct connection may be performed.

The case only including the case where connection is performed without interposing any other element or circuit is described as being "directly connected". Further, the case described as being "electrically connected" includes the case of electrical connection (i.e., the case of connection with another element interposed therebetween), the case of functional connection (i.e., the case of connection with another circuit interposed therebetween), and the case of direct connection (i.e., the case of connection without interposing another element or circuit therebetween).

Note that a display element, a display device, a light-emitting element, or a light-emitting device may be of various modes or may include various elements. For example, as the display element, the display device, the light-emitting element, or the light-emitting device, a display medium of which contrast changes by an electromagnetic function can be applied, such as an EL element (e.g., an organic EL element, an inorganic EL element, or an EL element containing both organic and inorganic materials), an electron-emissive element, a liquid crystal element, an electronic ink, a grating light valve (GLV), a plasma display (PDP), a digital micromirror device (DMD), a piezoceramic display, and a carbon nanotube. Note that, display devices using an EL element include an EL display; display devices using an electron-emissive element include a Field Emission Display (FED), a Surface-conduction Electron-emitter Display (SED), and the like; display devices using a liquid crystal element include a liquid crystal display, a transmissive liquid crystal display, a semi-transmissive liquid crystal display, and a reflective liquid crystal display; and display devices using an electronic ink include an electronic paper.

Note that in the present invention, as a transistor, a transistor of any mode can be used. Therefore, the usable kind of a transistor is not particularly limited. Thus, for example, a thin film transistor (TFT) or the like including a non-single crystalline semiconductor film typified by non-crystalline silicon or polycrystalline silicon can be used. As a result of this, for example, manufacturing can be performed at a low manufacturing temperature, at a low cost, over a large substrate, or over a transparent substrate, and the transistor can transmit light. Further, a transistor formed using a semiconductor substrate or an SOI substrate, a MOS transistor, a junction type transistor, a bipolar transistor, or the like can also be used. As a result of this, for example, transistors with less variation can be manufactured, transistors having a high current supplying capability can be manufactured, transistors with a small size can be manufactured, or a circuit with less power consumption can be formed. Further, a transistor including a compound semiconductor such as ZnO, a-InGaZnO, SiGe, or GaAs, a thin film transistor formed by forming a thin film of the transistor, or the like can also be used. As a result of this, for example, manufacturing can be performed at a low manufacturing temperature, manufacturing can be performed at room temperature, and a transistor can be formed directly on a substrate which is low in heat resistance, such as a plastic substrate or a film substrate. Further, a transistor formed by an ink jet method or a printing method, or the like can also be used. As a result of this, for example, manufacturing can be performed at room temperature, manufacturing can be performed with a low degree of vacuum, or manufacturing can be performed with a large substrate. In addition, manufacturing can also be performed without a mask (a reticle), so that a layout of a transistor can be easily changed. Further, a transistor including an organic semiconductor or a carbon nanotube, or another transistor can also be used. As a result of this, a transistor can be formed over a substrate capable of being bent. Note that the non-single crystalline semiconductor film may contain hydrogen or halogen. Further, the kind of a substrate over which a transistor is disposed is not particularly limited, and various substrates can be used. Therefore, for example, a transistor can be provided for a single crystalline substrate, an SOI substrate, a glass substrate, a quartz substrate, a plastic substrate, a paper substrate, a cellophane substrate, a stone substrate, a stainless steel substrate, a substrate having stainless steel foil, or the like. Further, a transistor may be formed over a substrate, and then the transistor may be transferred to another substrate, thereby disposing over the another substrate. By using these substrates, for example, a transistor having good properties can be formed, a transistor with less power consumption can be formed, a device which is not broken so easily can be formed, or heat resistance can be provided.

A structure of a transistor can employ various modes, and is not limited to a certain structure. For example, a multi-gate structure including two or more gate electrodes can be employed. In the case of the multi-gate structure, since channel regions are connected in series, it seems like a structure in which a plurality of transistors are connected in series. In the case of the multi-gate structure, for example, off-current can be reduced, reliability can be improved by increasing the withstand voltage of the transistor, and a drain-source current is not changed so much even if a drain-source voltage is changed when operating in the saturation region so that flat properties can be achieved. Further, a structure in which gate electrodes are provided above and below a channel may also be employed. By employing the structure in which gate electrodes are provided above and below a channel, a channel region is increased, so that, for example, a current value can be increased and an S value can be reduced because a depletion layer is easily formed. The structure in which gate electrodes are provided above and below a channel seems like a structure in which a plurality of transistors are connected in parallel. Further, any structure of the following may also be employed: a structure in which a gate electrode is disposed above a channel; a structure in which a gate electrode is disposed below a channel; a staggered structure; and an inversely staggered structure. A channel region may be divided into a plurality of regions, and the divided channel regions may be connected in parallel or in series. Further, a source or drain electrode may be overlapped with a channel (or a part thereof). By employing the structure in which a source or drain electrode is overlapped with a channel (or a part thereof), operational instability due to charge accumulation in a part of a channel can be prevented. Further, an LDD region may also be provided. By providing an LDD region, for example, off-current can be reduced, reliability can be improved by increasing the withstand voltage of the transistor, and a drain-source current is not changed so much even if a drain-source voltage is changed when operating in the saturation region so that flat properties can be achieved.

Note that, various types of transistors may be employed as the transistor in the present invention, and the transistor can be formed over various types of substrates. Therefore, all of circuits may be provided for any substrate such as a glass substrate, a plastic substrate, a single crystalline substrate, or an SOI substrate. By forming all of the circuits over the same substrate, for example, the number of component parts can be reduced to reduce cost, and the number of connections to the circuit components can be reduced to improve reliability. Alternatively, parts of the circuits may be formed over a substrate and the other parts of the circuits may be formed over another substrate. That is, not all of the circuits are required to be formed over the same substrate. For example, parts of the circuits may be formed with transistors over a glass substrate, and the other parts of the circuits may be formed using a single crystalline substrate and an IC chip thereof may be connected by COG (Chip On Glass) so as to be disposed over the glass substrate. Alternatively, the IC chip may be connected to the glass substrate by TAB (Tape Automated Bonding) or a printed wiring board. In this manner, by forming parts of the circuits over the same substrate, for example, the number of component parts can be reduced to reduce cost, or the number of connections to the circuit components can be reduced to improve reliability. In addition, by forming a portion with a high driving voltage or a portion with high driving frequency, which would consume large power, over a different substrate, increase of power consumption can be prevented.

Note also that one pixel corresponds to one element which can control brightness in the present invention. For example, one pixel corresponds to one color element and brightness is expressed with the one color element. Therefore, in that case, in the case of a color display device having color elements of R (Red), G (Green), and B (Blue), a minimum unit of an image is composed of three pixels of an R pixel, a G pixel, and a B pixel. Note that the color elements are not limited to three colors, and color elements with more than three colors may be employed. For example, RGBW (W means white), or RGB plus at least one of yellow, cyan, magenta, emerald green, and vermilion may also be employed. Further, each similar color to at least one of RGB may also be added; for example, R, G, B1, and B2 may be employed. Although both of B1 and B2 are color blue, they are slightly different in frequency. By employing these color elements, for example, a display which is more true to life can be performed, and power consumption can be reduced. Alternatively, as another example, in the case of controlling brightness of one color element by using a plurality of regions, one region corresponds to one pixel. Therefore, in that case, one color element is composed of a plurality of pixels. Further, in that case, a region area which contributes to a display may be different depending on each pixel. In addition, a viewing angle may also be widened by slightly changing each signal supplied to each of the plurality of areas for controlling brightness provided per color element, that is, each of the plurality of the pixels forming one color element. Note that the description "one pixel (for three colors)" denotes the case where three pixels of R, G, and B are considered as one pixel. The description "one pixel (for one color)" denotes the case where a plurality of pixels, which are provided for one color element, are collectively considered as one pixel.

Note that in the present invention, pixels may be disposed (arranged) in matrix. Here, the case where pixels are disposed (arranged) in matrix includes the case where pixels are disposed in line or in jagged line in a longitudinal direction or a lateral direction. Therefore, in the case where a full-color display is performed using color elements of three colors (e.g., RGB), stripe arrangement and delta arrangement of dots of three color elements are included. Furthermore, Bayer arrangement is included. Note that the color elements are not limited to three colors, and color elements with more than three colors may be employed. For example, RGBW (W means white), or RGB plus at least one of yellow, cyan, magenta, and the like may also be employed. Further, a display region area may be different depending on a dot of a color element. Thereby, for example, power consumption can be reduced and life of a display device can be prolonged.

Note that a transistor is a three-terminal element including a gate, a drain, and a source, in which a channel region is formed between a drain region and a source region. Current can be supplied through the drain region, the channel region, and the source region. Since the source and the drain are changed depending on a structure, an operational condition, or the like of a transistor, it is difficult to specify the source and the drain. Therefore, in the present invention, regions serving as a source and a drain are not necessarily referred to as a source and a drain; for example, they are referred to as a first terminal and a second terminal, respectively.

Note that a transistor may also be an element having at least three terminals including a base, an emitter, and a collector. Similarly in this case, the emitter and the collector may be referred to as a first terminal and a second terminal.

Note that a gate means the whole of a gate electrode and a gate wiring (also called a gate line, a gate signal line, or the like) or a part thereof. A gate electrode means a part of a conductive layer, which is overlapped with a semiconductor forming a channel region, an LDD (Lightly Doped Drain) region, and the like with a gate insulating film interposed therebetween. A gate wiring means a wiring for connecting gate electrodes of pixels or for connecting a gate electrode to another wiring.

It is to be noted that there is also a portion which serves both as a gate electrode and a gate wiring. Such a portion can be called either a gate electrode or a gate wiring. That is, there is also a region where a gate electrode and a gate wiring cannot be clearly distinguished. For example, in the case where a channel region is provided so as to overlap with an extended wiring, the overlapping region serves as a gate electrode as well as a gate wiring. Therefore, such a region can be called either a gate electrode or a gate wiring.

Further, a region formed of the same material as a gate electrode and connected to the gate electrode can also be called a gate electrode. Similarly, a region formed of the same material as a gate wiring and connected to the gate wiring can also be called a gate wiring. To be exact, such a region is, in some cases, not overlapped with a channel region or does not have a function of connecting to another gate electrode. However, due to a manufacturing process, there is a region formed of the same material as a gate electrode or a gate wiring and is connected to the gate electrode or the gate wiring. Therefore, such a region can also be called either a gate electrode or a gate wiring.

Further, for example, in a multi-gate transistor, a gate electrode of one transistor and a gate electrode of another transistor are connected by a conductive film formed of the same material as each gate electrode in many cases. Such a region, which is a region for connecting gate electrodes to each other, may be called a gate wiring; however, it can also be called a gate electrode since a multi-gate transistor can also be considered as one transistor. That is, a region which is formed of the same material as and connected to a gate electrode or a gate wiring can also be called a gate electrode or a gate wiring. Further, for example, a conductive film of a portion for connecting a gate electrode to a gate wiring can also be called either a gate electrode or a gate wiring.

Note that a gate terminal means a part of a region of a gate electrode or a region electrically connected to a gate electrode.

A source means the whole of a source region, a source electrode, and a source wiring (also called a source line, a source signal line, or the like) or a part thereof. A source region means a semiconductor region containing a P-type impurity (e.g., boron or gallium) or an N-type impurity (e.g., phosphorus or arsenic) at a high concentration. Therefore, a region containing a P-type impurity or an N-type impurity at a low concentration, i.e., an LDD (Lightly Doped Drain) region is not included in a source region. A source electrode means a part of a conductive layer, which is formed of a different material from a source region and is electrically connected to the source region. A source electrode may, however, include a source region. A source wiring means a wiring for connecting source electrodes of pixels or for connecting a source electrode to another wiring.

It is to be noted that there is also a portion which serves both as a source electrode and a source wiring. Such a portion can be called either a source electrode or a source wiring. That is, there is also a region where a source electrode and a source wiring cannot be clearly distinguished. For example, in the case where a source region is provided so as to overlap with an extending source wiring, the overlapping region serves as a source electrode as well as a source wiring. Therefore, such a region can be called either a source electrode or a source wiring.

Further, a region formed of the same material as a source electrode and connected to the source electrode or a portion for connecting source electrodes can also be called a source electrode. Further, a portion which is overlapped with a source region can also be called a source electrode. Similarly, a region formed of the same material as a source wiring and connected to the source wiring can also be called a source wiring. To be exact, such a region has, in some cases, a function of connecting to another source electrode. However, due to a manufacturing process, there is a region formed of the same material as a source electrode or a source wiring and is connected to the source electrode or the source wiring. Therefore, such a region can also be called either a source electrode or a source wiring.

Further, for example, a part of a conductive film, which connects a source electrode and a source wiring, can also be called either a source electrode or a source wiring.

Note that a source terminal means a part of a region of a source region, a source electrode, or a region electrically connected to a source electrode.

A drain is similar to the source.

Note that in the present invention, a semiconductor device means a device including a circuit including a semiconductor element (e.g., a transistor or a diode). Further, a semiconductor device may correspond to any device which functions by utilizing semiconductor characteristics.

A display device corresponds to a device including a display element (e.g., a liquid crystal element or a light-emitting element). Note that a display device may correspond to a display panel itself in which a plurality of pixels including a display element such as a liquid crystal element or an EL element and a peripheral driver circuit for driving the pixels are formed over one substrate. Further, a display device may include a peripheral driver circuit provided over a substrate by wire bonding or a bump, a so-called Chip-On-Glass (COG). Moreover, a display device may include a device provided with a flexible printed circuit (FPC) or a printed wiring board (PWB) (e.g., an IC, a resistor, a capacitor, an inductor, or a transistor). Further, a display device may include an optical sheet such as a polarizing plate or a phase differential plate. Further, a display device may include a back light unit (which may include a light guide plate, a prism sheet, a diffusion sheet, a reflection sheet, or a light source such as an LED or a cold-cathode tube).

Further, a light-emitting device corresponds to, in particular, a display device including a self-luminous display element such as an EL element or an element used for an FED. A liquid crystal display device corresponds to a display device including a liquid crystal element.

In the present invention, a description that one object is formed on or over the other object does not necessarily mean that the one object is in direct contact with the other object. The description may include the case where the two objects are not in direct contact with each other, that is, the case where another object is interposed therebetween. Therefore, for example, when it is described that a layer B is formed on (or over) a layer A, it means either case where the layer B is formed on and in direct contact with the layer A, or where another layer (e.g., a layer C or a layer D) is formed on and in direct contact with the layer A and the layer B is formed on and in direct contact with the layer C or D. Similarly, when it is described that one object is formed above the other object, it does not necessarily mean that the one object is on and in direct contact with the other object, and another object may be interposed therebetween. Therefore, for example, when it is described that a layer B is formed above a layer A, it means either case where the layer B is formed on and in direct contact with the layer A, or where another layer (e.g., a layer C or a layer D) is formed on and in direct contact with the layer A and the layer B is formed on and in direct contact with the layer C or D. Similarly, when it is described that one object is formed below or under the other object, it means either case where they are in direct contact with each other or not in contact with each other.

In accordance with the present invention, a display device including a level shifter capable of shifting levels of an input signal on a negative power source side and on a positive power source side simultaneously can be provided. Further, the display device of the present invention can be formed using transistors of the same conductivity type, thereby a display device at a low cost can be provided.

BRIEF DESCRIPTION OF THE DRAWINGS

FIGS. 47A and 47B are layout diagrams of each level shifter of the present invention.

DETAILED DESCRIPTION OF THE INVENTION

Figure 1A:
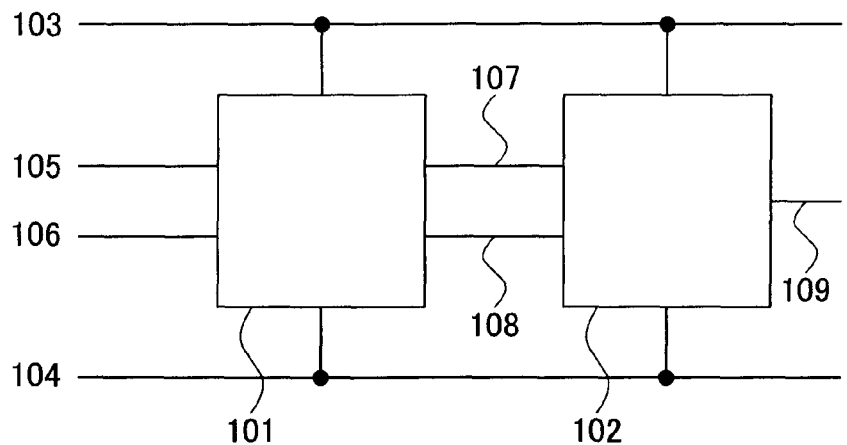
FIGS. 1A to 1C are diagrams each showing a structure of a level shifter of the present invention.

Hereinafter, embodiment modes of the present invention are described with reference to the accompanying drawings. The present invention can, however, be carried out with many different modes and it is easily understood by those skilled in the art that modes and details can be modified in various ways without departing from the purpose and the scope of the present invention. Therefore, the present invention should not be interpreted as being limited to the description of the embodiment modes. Note that in structures of the present invention described hereinafter, reference numerals are used in common, and detailed description of the same portions or portions having similar functions is not repeated.

Embodiment Mode 1

This embodiment mode describes a basic structure of a level shifter of the present invention with reference to FIG. 1A.

A level shifter shown in FIG. 1A includes circuits 101 and 102.

As shown in the level shifter in FIG. 1A, the circuit 101 is connected to wirings 103, 104, 105, 106, 107, and 108. The circuit 102 is connected to the wirings 103, 104, 107, 108, and 109.

Note that a positive power source VDD and a negative power source VSS are supplied to the wiring 103 and the wiring 104. The power source potential VDD is higher than the power source potential VSS.

Signals (hereinafter also called input signals) are supplied to the wirings 105 and 106. The circuit 101 is controlled by the signals supplied to the wirings 105 and 106.

To the wirings 107 and 108, signals (hereinafter also called offset signals) from the circuit 101 are supplied. The circuit 102 is controlled by the signals supplied to the wirings 107 and 108.

To the wiring 109, a signal (hereinafter also called an output signal) from the circuit 102 is supplied.

Each signal supplied to the wirings 105 and 106 is a binary digital signal. The potential of the digital signal in the case of an H signal (hereinafter also called an H level) is VH and in the case of an L signal (hereinafter also called an L level) is VL. The potential VH is lower than the power source potential VDD and is higher than the potential VL. The potential VL is higher than the power source potential VSS and is lower than the potential VH. That is, the relationship among the power source potentials and the signals is as follows: power source potential VDD>potential VH>potential VL>power source potential VSS.

Next, an operation of the level shifter shown in FIG. 1A is described with reference to a timing chart in FIG. 2A. In the timing chart of FIG. 2A, the signals of the wirings 105, 107, and 108 are shown. Although not shown in the drawing, a signal of which H and L levels are reverse to those of the signal of the wiring 105 corresponds to the signal of the wiring 106.

Here, the circuit 101 has a function of offset operation. Specifically, the circuit 101 offsets input signals supplied to the wirings 105 and 106 and supplies offset signals to the wirings 107 and 108. Each offset signal has the same timing as (or the reverse timing to) the signal supplied to the wiring 105, and has an amplitude voltage which is almost equivalent to the signal supplied to the wiring 105. A potential of the offset signal supplied to the wiring 107 is shifted toward the H side with respect to the input signal. A potential of the offset signal supplied to the wiring 108 is shifted toward the L side with respect to the input signal. Note that the circuit 101 is also called an offset circuit.

Figure 2A:
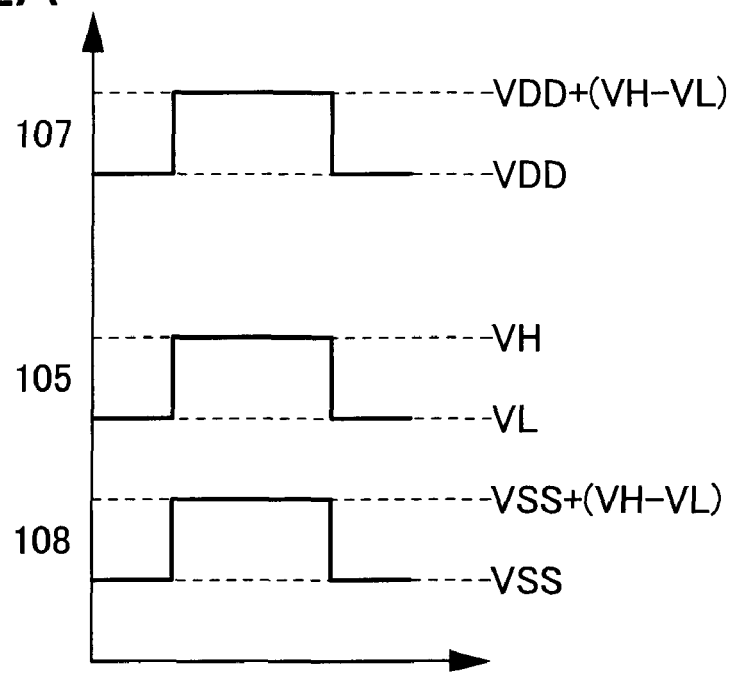
FIGS. 2A and 2B are diagrams each showing a timing chart of a level shifter of the present invention.

Therefore, as shown in the timing chart in FIG. 2A, the timing and the amplitude voltage of the signal of the wiring 107 are almost the same as those of the signal of the wiring 105, and the potential thereof is shifted toward the H side. Specifically, as for the signal of the wiring 107, a potential of an L signal is VDD and a potential of an H signal is (VDD+(VH−VL)). That is, the amplitude voltage of the signal of the wiring 107 is (VH−VL), which is almost the same as an amplitude voltage of the signal of the wiring 105.

Similarly to the signal of the wiring 107, the timing and the amplitude voltage of the signal of the wiring 108 are almost the same as those of the signal of the wiring 105, and the potential thereof is shifted toward the L side. Specifically, as for the signal of the wiring 108, a potential of an L signal is VSS and a potential of an H signal is (VSS+(VH−VL)). That is, the amplitude voltage of the signal of the wiring 108 is (VH−VL), which is almost the same as the amplitude voltage of the signal of the wiring 105.

Note that as described above, the signal of the wiring 107 and the signal of the wiring 108 may be signals of which H and L signals are reverse to those of the signal of the wiring 105.

Figure 2B:
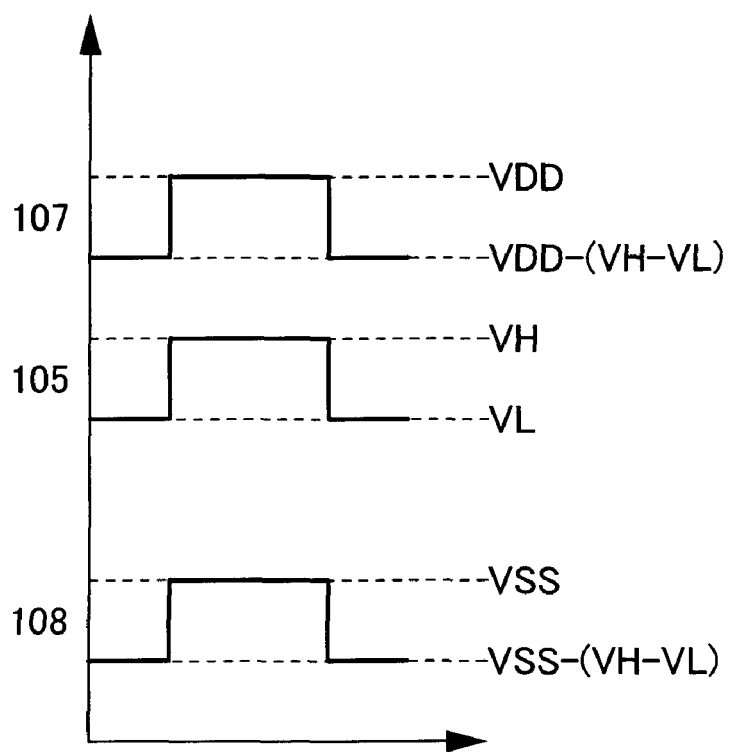

Alternatively, as shown in FIG. 2B, as for the signal of the wiring 107, the potential of the L signal may be (VDD−(VH−VL)) and the potential of the H signal may be VDD. Further, as for the signal of the wiring 108, the potential of the L signal may be (VSS−(VH−VL)). Even in the case shown in FIG. 2B, either of the amplitude voltage of the signal of the wiring 107 or the amplitude voltage of the signal of the wiring 108 is (VH−VL), which is almost the same as the amplitude voltage of the signal of the wiring 105.

Note also that the signal of the wiring 107 and the signal of the wiring 108 shown in FIG. 2B may also be signals of which H and L signals are reverse to those of the signal of the wiring 105.

Here, the circuit 102 is a logic circuit such as an inverter, a NAND circuit, or a NOR circuit. Specifically, the circuit 102 is controlled by an offset signal, and supplies an output signal to the wiring 109. The potential of the output signal is equal to the power source potential VDD in the case of an H signal and is equal to the power source potential VSS in the case of an L signal.

Note that since the amplitude voltages of the signals of the wiring 107 and the wiring 108 are small, through current of the circuit 102 is reduced to achieve low power consumption. Further, since the amplitude voltages of the inputted signals of the circuit 102 are small, noise can be reduced.

As described above, the level shifter of the present invention achieves a function as a level shifter by driving a logic circuit with an offset signal. Further, in the level shifter of the present invention, low power consumption and low noise can be realized. Further, in accordance with the level shifter of the present invention, an H level and an L level of an input signal can be shifted simultaneously with one level shifter.

Figure 1B:
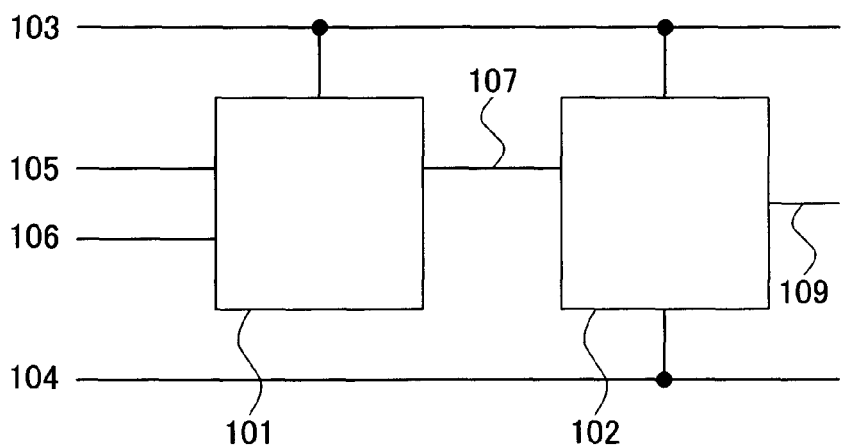

Note that as shown in FIG. 1B, the circuit 102 may also be controlled only by a signal (the signal of the wiring 107) with the potential of each signal of the wirings 105 and 106 shifted toward an H side. In the case where the circuit 102 is controlled only by the signal of the wiring 107, the power source potential VSS is not necessarily supplied to the circuit 101.

Figure 1C:
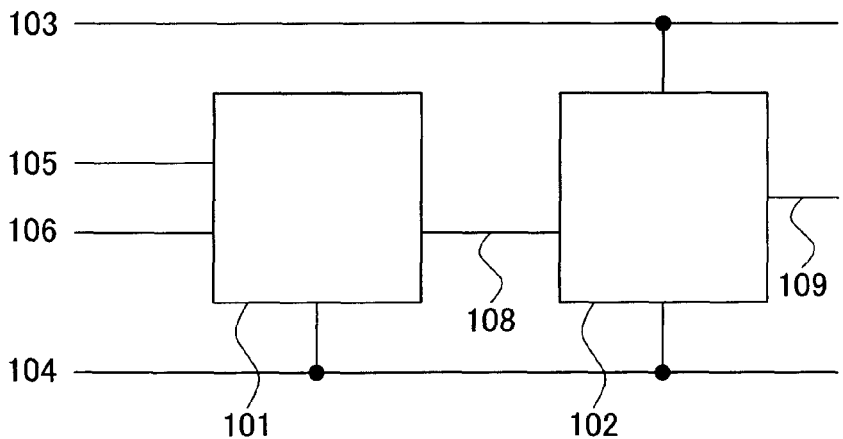

Similarly, as shown in FIG. 1C, the circuit 102 may also be controlled only by a signal (the signal of the wiring 108) with the potential of each signal of the wirings 105 and 106 shifted toward an L side. In the case where the circuit 102 is controlled only by the signal of the wiring 108, the power source potential VDD is not necessarily supplied to the circuit 101.

By controlling the circuit 102 only by the signal of the wiring 107 or the signal of the wiring 108, the circuit 101 in each of level shifters shown in FIGS. 1B and 1C can employ a simple structure.

Note that this embodiment mode can be implemented freely combining with any description in the other embodiment modes of this specification. Further, the descriptions in this embodiment mode can be freely combined to be implemented.

Embodiment Mode 2

This embodiment mode describes structure examples of the circuit 101 (the offset circuit) included in the level shifter described in Embodiment Mode 1. Note that in this embodiment mode, description is made on the case where each signal supplied to the wirings 105 and 106 is supplied to the wiring 107 after the potential is shifted toward an H side while the timing is not changed (or is reversed) and the amplitude voltage is not changed so much.

Note that in this embodiment mode and Embodiment Mode 1, reference numerals are used in common, and detailed description of the same portions and portions having similar functions is not repeated.

First, a structure example of an offset circuit is described with reference to FIG. 3A.

Figure 3A:
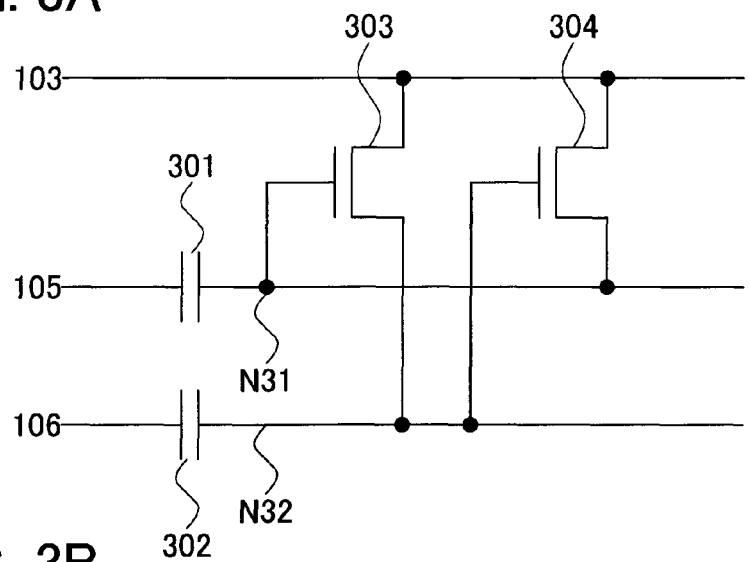
FIGS. 3A to 3C are diagrams each showing a structure of an offset circuit of a level shifter of the present invention.

An offset circuit shown in FIG. 3A includes a capacitor 301, a capacitor 302, a transistor 303, and a transistor 304.

As shown in the offset circuit in FIG. 3A, a first electrode of the capacitor 301 is connected to the wiring 105. A first electrode of the capacitor 302 is connected to the wiring 106. A gate of the transistor 303 is connected to a second electrode of the capacitor 301, a first terminal of the transistor 303 is connected to the wiring 103, and a second terminal of the transistor 303 is connected to a second electrode of the capacitor 301. A gate of the transistor 304 is connected to the second electrode of the capacitor 302, a first terminal of the transistor 304 is connected to the wiring 103, and a second terminal of the transistor 304 is connected to the second electrode of the capacitor 302. Note that a connection point of the second electrode of the capacitor 301, the gate of the transistor 303, and the second terminal of the transistor 304 is denoted by a node N31. A connection point of the second electrode of the capacitor 302, the second terminal of the transistor 303, and the gate of the transistor 304 is denoted by a node N32. Either one of the node N31 or the node N32 is connected to the wiring 107 shown in FIG. 1A.

Next, operations of the offset circuit shown in FIG. 3A are described with reference to FIGS. 3B and 3C.

Figure 3B:
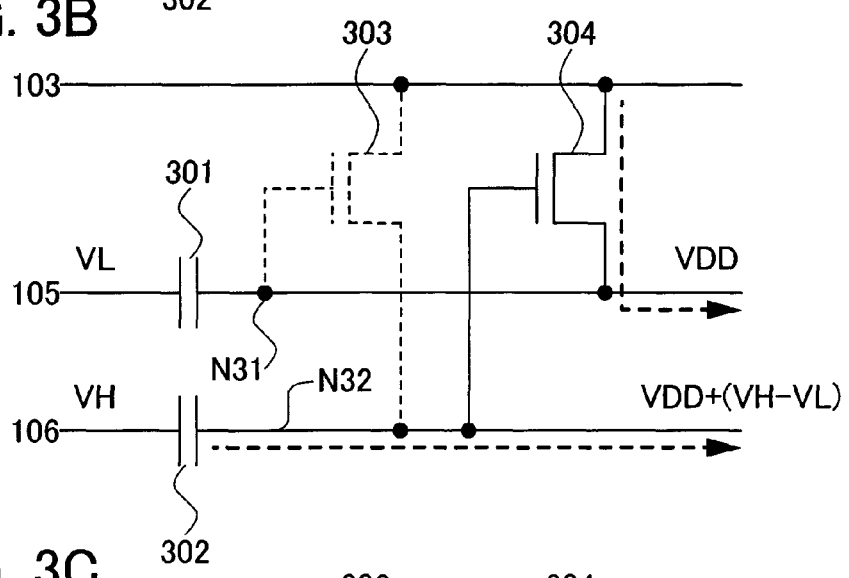

FIG. 3B shows an operation of the offset circuit shown in FIG. 3A when a signal of the wiring 105 is changed from an H signal to an L signal and a signal of the wiring 106 is changed from an L signal to an H signal.

Figure 3C:
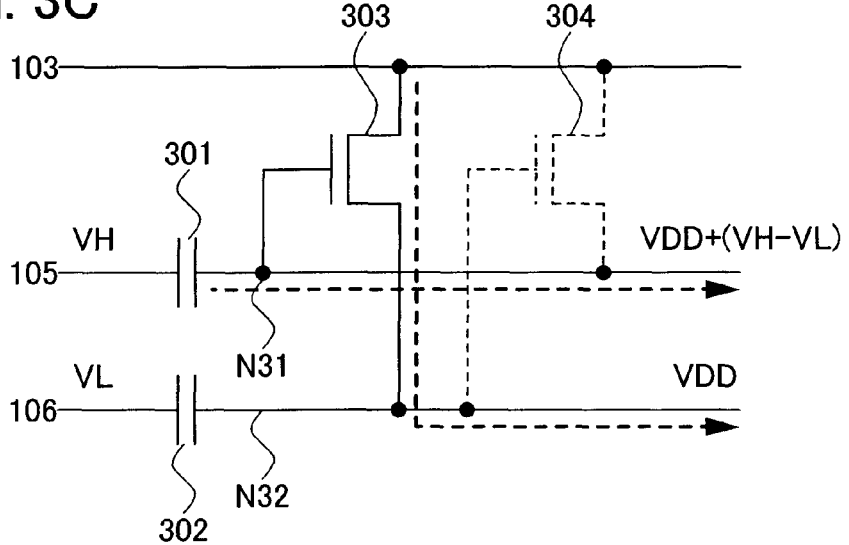

FIG. 3C shows an operation of the offset circuit shown in FIG. 3A when the signal of the wiring 105 is changed from the L signal to the H signal and the signal of the wiring 106 is changed from the H signal to the L signal. That is, the offset circuit shown in FIG. 3A repeats the operation shown in FIG. 3B and the operation shown in FIG. 3C at a certain timing. Note here that the operation shown in FIG. 3B is denoted by a first operation and the operation shown in FIG. 3C is denoted by a second operation.

Note that a value of (VH−VL) is equal to or larger than each threshold voltage of the transistors 303 and 304.

First, the first operation of the offset circuit shown in FIG. 3A is described with reference to FIG. 3B. Note here that an initial potential of the node N32 is VDD.

In an initial state, the capacitor 302 holds a potential difference (VDD−VL) between a potential VL (the L signal) of the wiring 106 and the potential VDD of the node N32. Then, when the potential of the wiring 106 is changed from VL to VH, the potential of the node N32 becomes (VDD+(VH−VL)) by capacitive coupling of the capacitor 302. Consequently, the transistor 304 is turned on.

By turning on the transistor 304, the power source potential VDD is supplied to the node N31, so that the potential of the node N31 becomes VDD. Consequently, the capacitor 301 holds the potential difference (VDD−VL) between the potential VL (the L signal) of the wiring 105 and the potential VDD of the node N31. In addition, the transistor 303 is turned off.

By turning off the transistor 303, the node N32 becomes a floating state to keep the potential (VDD+(VH−VL)).

Next, the second operation of the offset circuit shown in FIG. 3A is described with reference to FIG. 3C.

As described above, (VDD−VL) is held in the capacitor 301 by the first operation. Then, when the potential of the wiring 105 is changed from VL to VH, the potential of the node N31 becomes (VDD+(VH−VL)) by capacitive coupling of the capacitor 301. Consequently, the transistor 303 is turned on.

By turning on the transistor 303, the power source potential VDD is supplied to the node N32, so that the potential of the node N32 becomes VDD. Consequently, the capacitor 302 holds the potential difference (VDD−VL) between the potential VL (the L signal) of the wiring 106 and the potential VDD of the node N32. In addition, the transistor 304 is turned off.

By turning off the transistor 304, the node N31 becomes the floating state to keep the potential (VDD+(VH−VL)).

Here, functions of the capacitors 301 and 302 and the transistors 303 and 304 are described respectively.

First, the capacitor 301 holds the potential difference between the potential VL of the wiring 105 and the potential VDD of the node N31 in the first operation. Then, in the second operation, the capacitor 301 increases the potential of the node N31 in accordance with increase of potential of the wiring 105 by capacitive coupling.

The capacitor 302 holds the potential difference between the potential VL of the wiring 106 and the potential VDD of the node N32 in the second operation. Then, in the first operation, the capacitor 302 increases the potential of the node N32 in accordance with increase of potential of the wiring 106 by capacitive coupling.

The transistor 303 functions as a switch of selecting whether the wiring 103 and the node N32 are connected or not depending on the potential of the node N31. In addition, in the first operation, the transistor 303 is turned off so that the node N32 becomes the floating state. In the second operation, the transistor 303 is turned on so that the power source potential VDD is supplied to the node N32.

The transistor 304 functions as a switch of selecting whether the wiring 103 and the node N31 are connected or not depending on the potential of the node N32. In addition, in the first operation, the transistor 304 is turned on so that the power source potential VDD is supplied to the node N31. In the second operation, the transistor 304 is turned off so that the node N31 becomes the floating state.

By the first and second operations described above, the offset circuit shown in FIG. 3A operates as follows: In the first operation, the power source potential VDD is supplied to the node N31, and the node N32 is brought into the floating state to keep the potential (VDD+(VH−VL)); and in the second operation, the node N31 is brought into the floating state to keep the potential (VDD+(VH−VL)), and the power source potential VDD is supplied to the node N32.

Therefore, as for a signal generated from the offset circuit shown in FIG. 3A, an H signal is (VDD+(VH−VL)) and an L signal is VDD. That is, the offset circuit shown in FIG. 3A can generate a signal based on the power source potential VDD.

Note that as each of the potential of the node N32 in the first operation and the potential of the node N31 in the second operation, (VDD+(VH−VL)) is kept. In practice, however, each of the potential of the node N32 in the first operation and the potential of the node N31 in the second operation becomes lower than (VDD+(VH−VL)) due to wiring capacitance, parasitic capacitance, or the like. Therefore, in order to reduce such an effect of the wiring capacitance or the parasitic capacitance, each capacitance of the capacitors 301 and 302 may be set to be sufficiently larger than the wiring capacitance or the parasitic capacitance.

When the node N31 is connected to the wiring 107 shown in FIG. 1A, a signal of which H and L levels are the same as those of the signal supplied to the wiring 105 can be supplied to the wiring 107. Similarly, when the node N32 is connected to the wiring 107 shown in FIG. 1A, a signal of which H and L levels are reverse to those of the signal supplied to the wiring 105 can be supplied to the wiring 107.

In the case where the node N31 is connected to the wiring 107, it is preferable that the capacitance of the capacitor 302 be smaller than that of the capacitor 301. This is because, as described above, since it is described above that the capacitance of the capacitor 301 may be set to be sufficiently larger than the wiring capacitance or the parasitic capacitance, the potential of the node N32 is not necessarily (VDD+(VH−VL)) as long as the transistor 304 can be turned on. Thus the capacitance of the capacitor 302 can be smaller than that of the capacitor 301, thereby an element region of the capacitor 302 can be reduced.

In the case where the node N32 is connected to the wiring 107, it is preferable that the capacitance of the capacitor 301 be smaller than that of the capacitor 302 because of the similar reason to the case where the node N31 is connected to the wiring 107.

Note that each of the capacitors 301 and 302 may employ a structure in which an insulating layer is interposed between two electrode layers. By employing the structure in which an insulating layer is interposed between two electrode layers for each of the capacitors 301 and 302, the capacitors 301 and 302 can keep the capacitance constant regardless of an applied voltage, so that the level shifter of the present invention can be stably operated.

Further, it is preferable that an insulating layer of each of the capacitors 301 and 302 be a gate insulating film. This is because the capacitors 301 and 302 can obtain capacitance effectively since a gate insulating film is generally thinner than other insulating films (e.g., an interlayer film or a planarizing film).

Figure 4A:
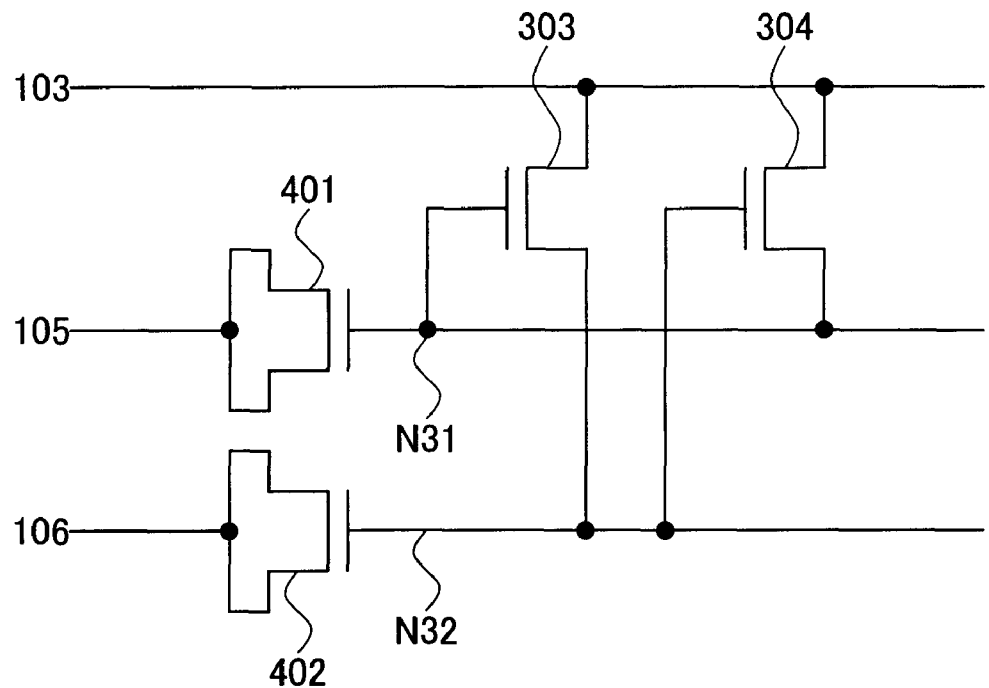
FIGS. 4A and 4B are diagrams each showing a structure of an offset circuit of a level shifter of the present invention.

Note also that a MOS capacitor may be employed as each of the capacitors 301 and 302. FIG. 4A shows a structure in the case where MOS capacitors are employed as the capacitors 301 and 302. In an offset circuit shown in FIG. 4A, an N-channel transistor 401 is used instead of the capacitor 301 and an N-channel transistor 402 is used instead of the capacitor 302. Note here that a gate of the transistor 401 is connected to the node N31, and first and second terminals of the transistor 401 are connected to the wiring 105. This is because the transistor 401 can operate as a capacitor since the potential of the node N31 is higher than that of the wiring 105 to turn on the transistor 401 so that a channel is formed in a channel region of the transistor 401. Similarly, a gate of the transistor 402 is connected to the node N32, and first and second terminals of the transistor 402 are connected to the wiring 106. This is because the transistor 402 can operate as a capacitor since the potential of the node N32 is higher than that of the wiring 106 to turn on the transistor 402 so that a channel is formed in a channel region of the transistor 402.

Figure 4B:
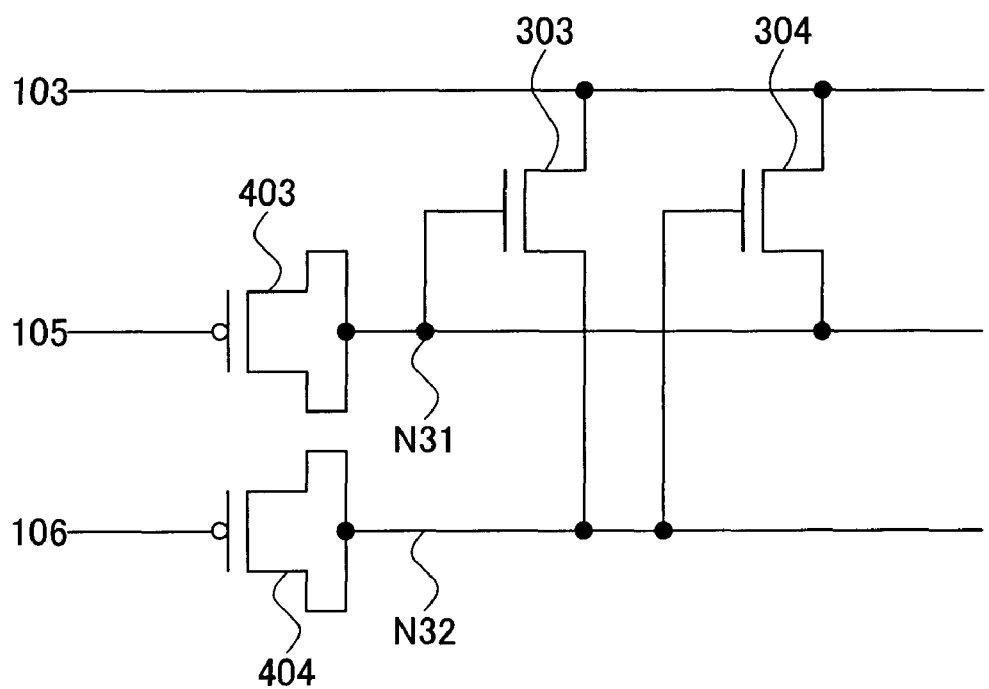

Further, as shown in FIG. 4B, a P-channel transistor may also be used as each capacitor. In an offset circuit shown in FIG. 4B, a P-channel transistor 403 is used instead of the capacitor 301 and a P-channel transistor 404 is used instead of the capacitor 302. Note here that a gate of the transistor 403 is connected to the wiring 105, and first and second terminals of the transistor 403 are connected to the node N31. This is because the transistor 403 can operate as a capacitor since the potential of the node N31 is higher than that of the wiring 105 to turn on the transistor 403 so that a channel is formed in a channel region of the transistor 403. Similarly, a gate of the transistor 404 is connected to the wiring 106, and first and second terminals of the transistor 404 are connected to the node N32. This is because the transistor 404 can operate as a capacitor since the potential of the node N32 is higher than that of the wiring 106 to turn on the transistor 404 so that a channel is formed in a channel region of the transistor 404.

Note that as described above, in FIG. 4A, in the case where the node N31 is connected to the wiring 107, it is preferable that the channel region (L×W: L is channel length and W is channel width) of the transistor 402 be smaller than that of the transistor 401. In the case where the node N32 is connected to the wiring 107, it is preferable that the channel region of the transistor 402 be larger than that of the transistor 401.

Similarly, in FIG. 4B, in the case where the node N31 is connected to the wiring 107, it is preferable that the channel region (L×W: L is channel length and W is channel width) of the transistor 404 be smaller than that of the transistor 403. In the case where the node N32 is connected to the wiring 107, it is preferable that the channel region of the transistor 404 be larger than that of the transistor 403.

Figure 5A:
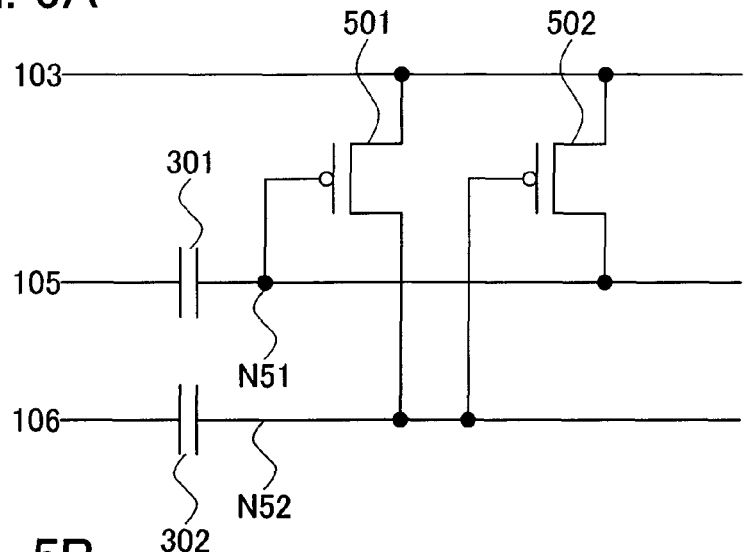
FIGS. 5A to 5C are diagrams each showing a structure of an offset circuit of a level shifter of the present invention.

Here, although the offset circuit shown in FIG. 3A includes the N-channel transistors and the capacitors, it may include P-channel transistors and capacitors. FIG. 5A shows an offset circuit including P-channel transistors and capacitors.

An offset circuit shown in FIG. 5A includes the capacitor 301, the capacitor 302, a transistor 501, and a transistor 502.

Note that the transistors 501 and 502 correspond to and have similar functions to the transistors 303 and 304 in FIG. 3A. Nodes N51 and N52 correspond to the nodes N31 and N32 in FIG. 3A.

As shown in the offset circuit in FIG. 5A, a first electrode of the capacitor 301 is connected to the wiring 105. A first electrode of the capacitor 302 is connected to the wiring 106. A gate of the transistor 501 is connected to a second electrode of the capacitor 301, a first terminal of the transistor 501 is connected to the wiring 103, and a second terminal of the transistor 501 is connected to a second electrode of the capacitor 302. A gate of the transistor 502 is connected to the second electrode of the capacitor 302, a first terminal of the transistor 502 is connected to the wiring 103, and a second terminal of the transistor 502 is connected to the second electrode of the capacitor 301. Note that a connection point of the second electrode of the capacitor 301, the gate of the transistor 501, and the second terminal of the transistor 502 is denoted by the node N51. A connection point of the second electrode of the capacitor 302, the second terminal of the transistor 501, and the gate of the transistor 502 is denoted by the node N52. Either one of the node N51 or the node N52 is connected to the wiring 107 shown in FIG. 1A.

Next, operations of the offset circuit shown in FIG. 5A are described with reference to FIGS. 5B and 5C.

Figure 5B:
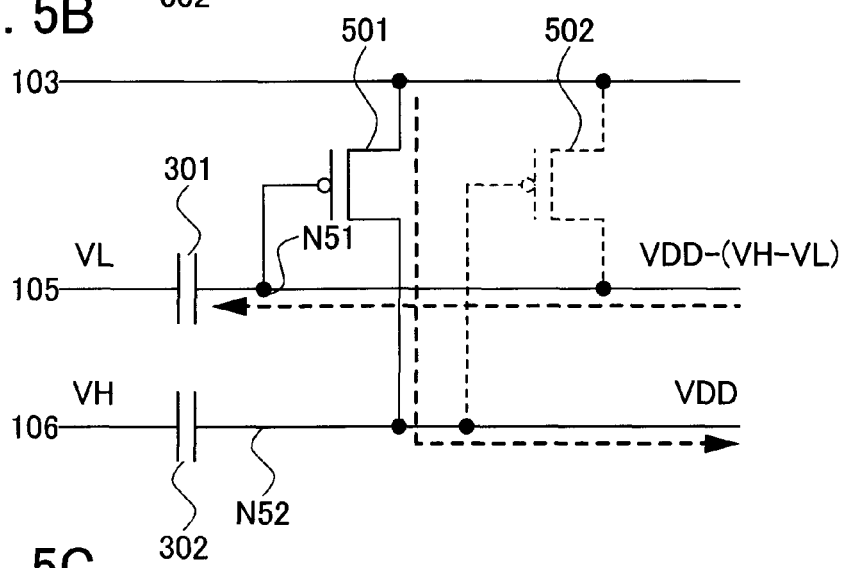

FIG. 5B shows an operation of the offset circuit shown in FIG. 5A when a signal of the wiring 105 is changed from an H signal to an L signal and a signal of the wiring 106 is changed from an L signal to an H signal.

Figure 5C:
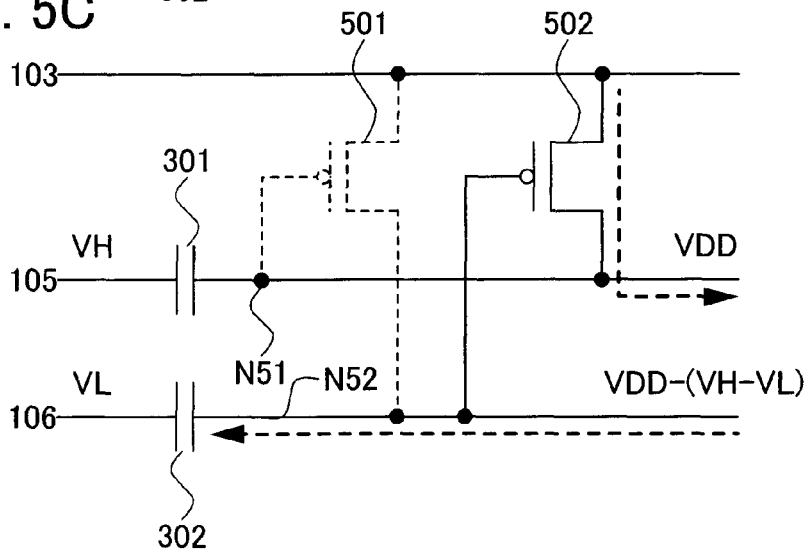

FIG. 5C shows an operation of the offset circuit shown in FIG. 5A when the signal of the wiring 105 is changed from the L signal to the H signal and the signal of the wiring 106 is changed from the H signal to the L signal. That is, the offset circuit shown in FIG. 5A repeats the operation shown in FIG. 5B and the operation shown in FIG. 5C at a certain timing. Note here that the operation shown in FIG. 5B is denoted by a first operation and the operation shown in FIG. 5C is denoted by a second operation.

First, the first operation of the offset circuit shown in FIG. 5A is described with reference to FIG. 5B. Note here that an initial potential of the node N51 is VDD.

In an initial state, the capacitor 301 holds a potential difference (VDD−VH) between a potential VH (the H signal) of the wiring 105 and the potential VDD of the node N51. Then, when the potential of the wiring 105 is changed from VH to VL, the potential of the node N51 becomes (VDD−(VH−VL)) by capacitive coupling of the capacitor 301. Consequently, the transistor 501 is turned on.

By turning on the transistor 501, the power source potential VDD is supplied to the node N52, so that the potential of the node N52 becomes VDD. Consequently, the capacitor 302 holds the potential difference (VDD−VH) between the potential VH (the H signal) of the wiring 106 and the potential VDD of the node N52. In addition, the transistor 502 is turned off.

By turning off the transistor 502, the node N51 becomes a floating state to keep the potential (VDD−(VH−VL)).

Next, the second operation of the offset circuit shown in FIG. 5A is described with reference to FIG. 5C.

As described above, (VDD−VH) is held in the capacitor 302 by the first operation. Then, when the potential of the wiring 106 is changed from VH to VL, the potential of the node N52 becomes (VDD−(VH−VL)) by capacitive coupling of the capacitor 302. Consequently, the transistor 502 is turned on.

By turning on the transistor 502, the power source potential VDD is supplied to the node N51, so that the potential of the node N51 becomes VDD. Consequently, the capacitor 301 holds the potential difference (VDD−VH) between the potential VH (the H signal) of the wiring 105 and the potential VDD of the node N51. In addition, the transistor 501 is turned off.

By turning off the transistor 501, the node N52 becomes the floating state to keep the potential (VDD−(VH−VL)).

By the first and second operations described above, the offset circuit shown in FIG. 5A operates as follows: In the first operation, the node N51 is brought into the floating state to keep the potential (VDD−(VH−VL)), and the power source potential VDD is supplied to the node N52; and in the second operation, the power source potential VDD is supplied to the node N51, and the node N52 is brought into the floating state to keep the potential (VDD−(VH−VL)).

Therefore, as for a signal generated from the offset circuit shown in FIG. 5A, an H signal is VDD and an L signal is (VDD−(VH−VL)). That is, the circuit 101 shown in FIG. 5A can generate a signal based on the power source potential VDD.

Note that, similarly to the offset circuit shown in FIG. 3A, although the potential of the L signal of the signal generated from the offset circuit shown in FIG. 5A is (VDD−(VH−VL)), it is, in practice, a little higher than (VDD−(VH−VL)).

Further, similarly to the offset circuit shown in FIG. 3A, when the node N51 is connected to the wiring 107 shown in FIG. 1A, a signal of which H and L levels are the same as those of the signal supplied to the wiring 105 can be supplied to the wiring 107. Similarly, when the node N52 is connected to the wiring 107 shown in FIG. 1A, a signal of which H and L levels are reverse to those of the signal supplied to the wiring 105 can be supplied to the wiring 107.

Further, similarly to the offset circuit shown in FIG. 3A, in the case where the node N51 is connected to the wiring 107, it is preferable that the capacitance of the capacitor 302 be smaller than that of the capacitor 301.

Further, similarly to the offset circuit shown in FIG. 3A, in the case where the node N52 is connected to the wiring 107, it is preferable that the capacitance of the capacitor 301 be smaller than that of the capacitor 302.

Figure 6A:
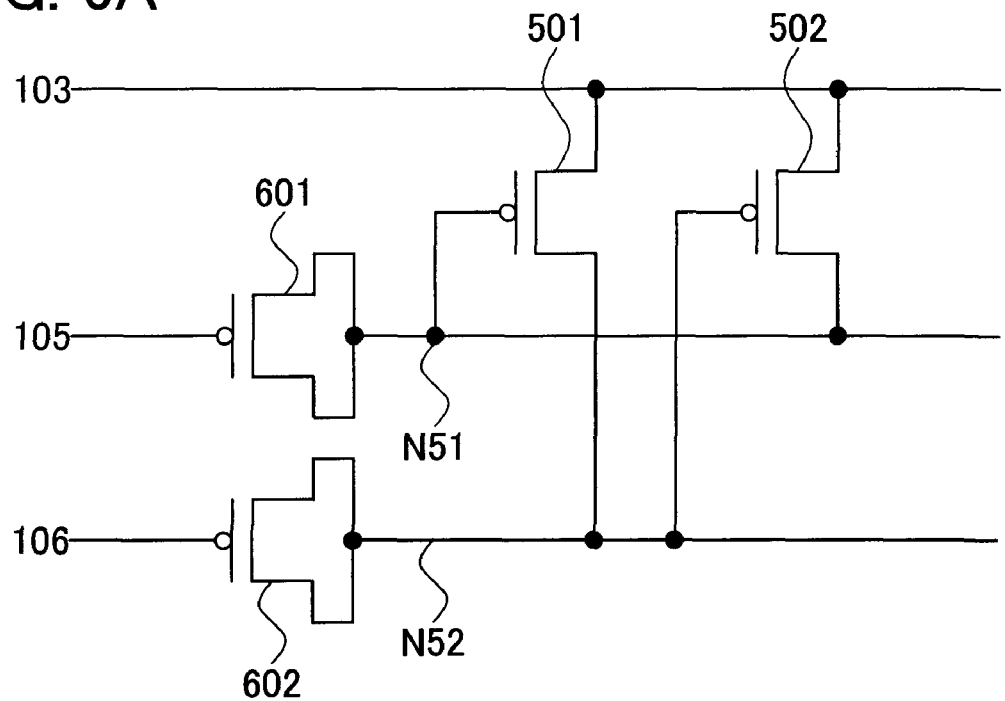
FIGS. 6A and 6B are diagrams each showing a structure of an offset circuit of a level shifter of the present invention.

Further, similarly to each offset circuit shown in FIGS. 4A and 4B, a MOS capacitor may be employed as each of the capacitors 301 and 302. As shown in FIG. 6A, a P-channel transistor 601 may be used instead of the capacitor 301 and a P-channel transistor 602 may be used instead of the capacitor 302. Note here that a gate of the transistor 601 is connected to the wiring 105, and first and second terminals of the transistor 601 are connected to the node N51. Similarly, a gate of the transistor 602 is connected to the wiring 106, and first and second terminals of the transistor 602 are connected to the node N52.

Figure 6B:
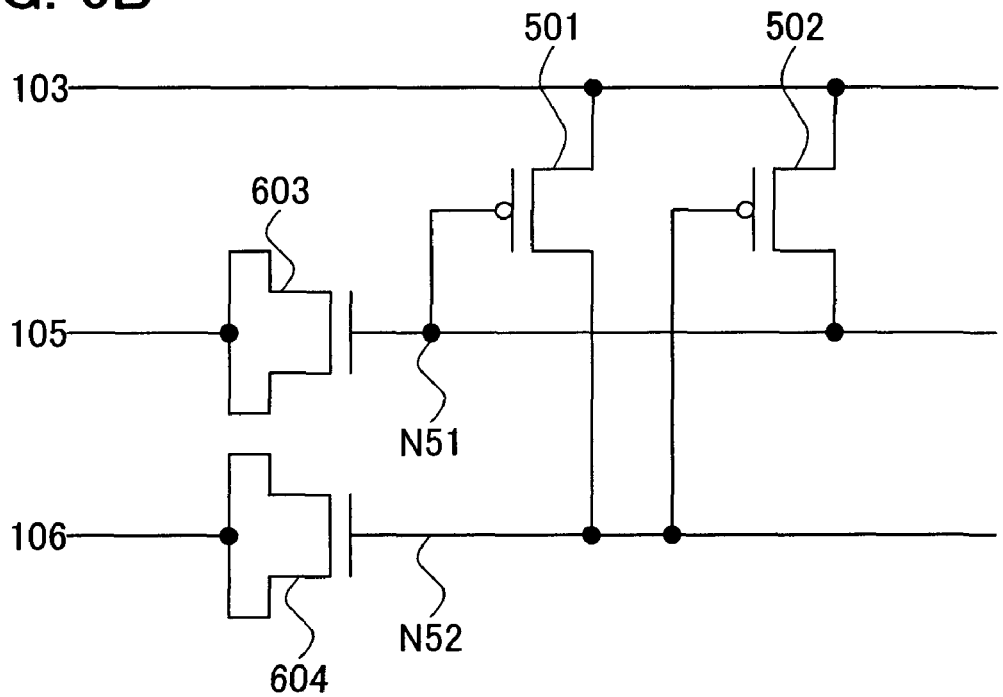

Further, similarly to each offset circuit shown in FIGS. 4A and 4B, as shown in FIG. 6B, N-channel transistors 603 and 604 can also be used as the capacitors 301 and 302. Note here that a gate of the transistor 603 is connected to the node N51, and first and second terminals of the transistor 603 are connected to the wiring 105. Similarly, a gate of the transistor 604 is connected to the node N52, and first and second terminals of the transistor 604 are connected to the wiring 106.

Further, similarly to each offset circuit shown in FIGS. 4A and 4B, in FIG. 6A, in the case where the node N51 is connected to the wiring 107, it is preferable that the channel region of the transistor 602 be smaller than that of the transistor 601. In the case where the node N52 is connected to the wiring 107, it is preferable that the channel region of the transistor 602 be larger than that of the transistor 601.

Similarly, in FIG. 6B, in the case where the node N51 is connected to the wiring 107, it is preferable that the channel region of the transistor 604 be smaller than that of the transistor 603. In the case where the node N52 is connected to the wiring 107, it is preferable that the channel region of the transistor 604 be larger than that of the transistor 603.

Note that this embodiment mode can be implemented freely combining with any description in the other embodiment modes of this specification. Further, the descriptions in this embodiment mode can be freely combined to be implemented.

Embodiment Mode 3

This embodiment mode describes structure examples of the circuit 101 (the offset circuit) included in the level shifter described in Embodiment Mode 1. Note that in this embodiment mode, description is made on the case where each signal supplied to the wirings 105 and 106 is supplied to the wiring 108 after the potential is shifted toward an L side while the timing is not changed (or is reversed) and the amplitude voltage is not changed so much.

Note that in this embodiment mode and Embodiment Modes 1 and 2, reference numerals are used in common, and detailed description of the same portions and portions having similar functions is not repeated.

First, a structure example of an offset circuit is described with reference to FIG. 7A.

Figure 7A:
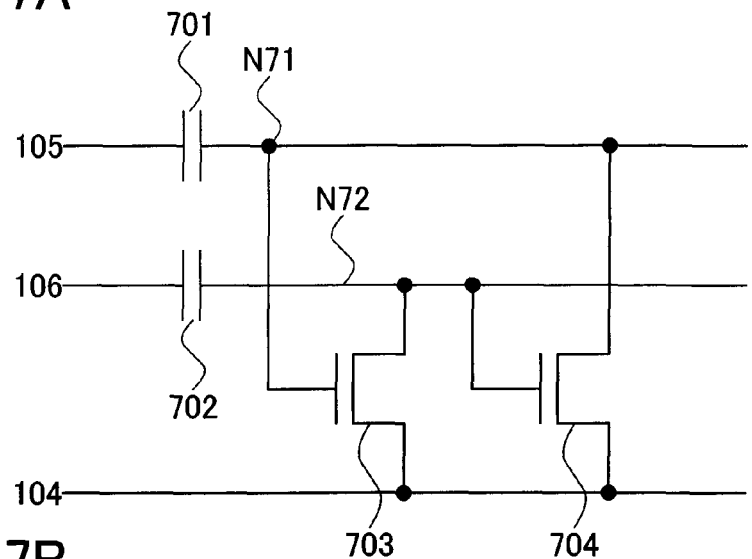
FIGS. 7A to 7C are diagrams each showing a structure of an offset circuit of a level shifter of the present invention.

An offset circuit shown in FIG. 7A includes a capacitor 701, a capacitor 702, a transistor 703, and a transistor 704.

As shown in the offset circuit in FIG. 7A, a first electrode of the capacitor 701 is connected to the wiring 105. A first electrode of the capacitor 702 is connected to the wiring 106. A gate of the transistor 703 is connected to a second electrode of the capacitor 701, a first terminal of the transistor 703 is connected to a wiring 104, and a second terminal of the transistor 703 is connected to a second electrode of the capacitor 702. A gate of the transistor 704 is connected to the second electrode of the capacitor 702, a first terminal of the transistor 704 is connected to the wiring 104, and a second terminal of the transistor 704 is connected to the second electrode of the capacitor 701. Note that a connection point of the second electrode of the capacitor 701, the gate of the transistor 703, and the second terminal of the transistor 704 is denoted by a node N71. A connection point of the second electrode of the capacitor 702, the second terminal of the transistor 703, and the gate of the transistor 704 is denoted by a node N72. Either one of the node N71 or the node N72 is connected to the wiring 108 shown in FIG. 1A.

Next, operations of the offset circuit shown in FIG. 7A are described with reference to FIGS. 7B and 7C.

Figure 7B:
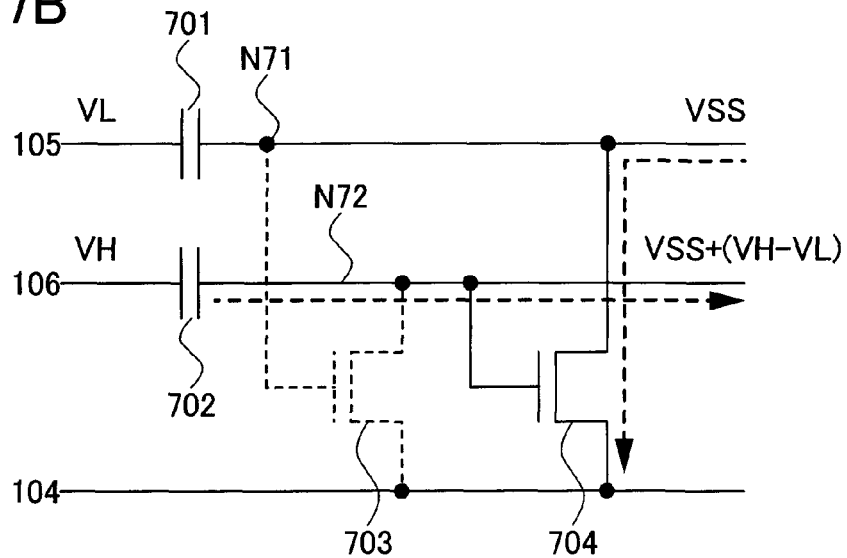

FIG. 7B shows an operation of the offset circuit shown in FIG. 7A when a signal of the wiring 105 is changed from an H signal to an L signal and a signal of the wiring 106 is changed from an L signal to an H signal.

Figure 7C:
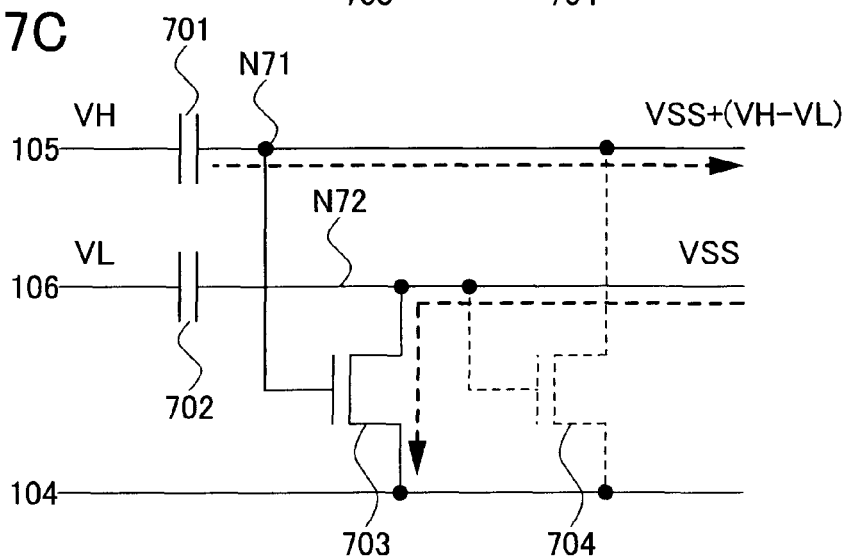

FIG. 7C shows an operation of the offset circuit shown in FIG. 7A when the signal of the wiring 105 is changed from the L signal to the H signal and the signal of the wiring 106 is changed from the H signal to the L signal. That is, the offset circuit shown in FIG. 7A repeats the operation shown in FIG. 7B and the operation shown in FIG. 7C at a certain timing. Note here that the operation shown in FIG. 7B is denoted by a first operation and the operation shown in FIG. 7C is denoted by a second operation.

Note that a value of (VH−VL) is equal to or larger than each threshold voltage of the transistors 703 and 704.

First, the first operation of the offset circuit shown in FIG. 7A is described with reference to FIG. 7B. Note here that an initial potential of the node N72 is VSS.

In an initial state, the capacitor 702 holds a potential difference (VL−VSS) between a potential VL (the L signal) of the wiring 106 and the potential VSS of the node N72. Then, when the potential of the wiring 106 is changed from VL to VH, the potential of the node N72 becomes (VSS+(VH−VL)) by capacitive coupling of the capacitor 702. Consequently, the transistor 704 is turned on.

By turning on the transistor 704, the power source potential VSS is supplied to the node N71, so that the potential of the node N71 becomes VSS. Consequently, the capacitor 701 holds the potential difference (VL−VSS) between the potential VL (the L signal) of the wiring 105 and the potential VSS of the node N71. In addition, the transistor 703 is turned off.

By turning off the transistor 703, the node N72 becomes a floating state to keep the potential (VSS+(VH−VL)).

Next, the second operation of the offset circuit shown in FIG. 7A is described with reference to FIG. 7C.

As described above, (VL−VSS) is held in the capacitor 701 by the first operation. Then, when the potential of the wiring 105 is changed from VL to VH, the potential of the node N71 becomes (VSS+(VH−VL)) by capacitive coupling of the capacitor 701. Consequently, the transistor 703 is turned on.

By turning on the transistor 703, the power source potential VSS is supplied to the node N72, so that the potential of the node N72 becomes VSS. Consequently, the capacitor 702 holds the potential difference (VL−VSS) between the potential VL (the L signal) of the wiring 106 and the potential VSS of the node N72. In addition, the transistor 704 is turned off.

By turning off the transistor 704, the node N71 becomes the floating state to keep the potential (VSS+(VH−VL)).

Here, functions of the capacitors 701 and 702 and the transistors 703 and 704 are described respectively.

First, the capacitor 701 holds the potential difference between the potential VL of the wiring 105 and the potential VSS of the node N71 in the first operation. Then, in the second operation, the capacitor 701 increases the potential of the node N71 in accordance with increase of potential of the wiring 105 by capacitive coupling.

The capacitor 702 holds the potential difference between the potential VL of the wiring 106 and the potential VSS of the node N72 in the second operation. Then, in the first operation, the capacitor 702 increases the potential of the node N72 in accordance with increase of potential of the wiring 106 by capacitive coupling.

The transistor 703 functions as a switch of selecting whether the wiring 104 and the node N72 are connected or not depending on the potential of the node N71. In addition, in the first operation, the transistor 703 is turned off so that the node N72 becomes the floating state. In the second operation, the transistor 703 is turned on so that the power source potential VSS is supplied to the node N72.

The transistor 704 functions as a switch of selecting whether the wiring 104 and the node N71 are connected or not depending on the potential of the node N72. In addition, in the first operation, the transistor 704 is turned on so that the power source potential VSS is supplied to the node N71. In the second operation, the transistor 704 is turned off so that the node N71 becomes the floating state.

By the first and second operations described above, the offset circuit shown in FIG. 7A operates as follows: In the first operation, the power source potential VSS is supplied to the node N71, and the node N72 is brought into the floating state to keep the potential (VSS+(VH−VL)); and in the second operation, the node N71 is brought into the floating state to keep the potential (VSS+(VH−VL)), and the power source potential VSS is supplied to the node N72.

Therefore, as for a signal generated from the offset circuit shown in FIG. 7A, an H signal is (VSS+(VH−VL)) and an L signal is VSS. That is, the offset circuit shown in FIG. 7A can generate a signal based on the power source potential VSS.

Note that as each of the potential of the node N72 in the first operation and the potential of the node N71 in the second operation, (VSS+(VH−VL)) is kept. In practice, however, each of the potential of the node N72 in the first operation and the potential of the node N71 in the second operation becomes lower than (VSS+(VH−VL)) due to wiring capacitance, parasitic capacitance, or the like. Therefore, in order to reduce such an effect of the wiring capacitance or the parasitic capacitance, each capacitance of the capacitors 701 and 702 may be set to be sufficiently larger than the wiring capacitance or the parasitic capacitance.

When the node N71 is connected to the wiring 108 shown in FIG. 1A, a signal of which H and L levels are the same as those of the signal supplied to the wiring 105 can be supplied to the wiring 108. Similarly, when the node N72 is connected to the wiring 108 shown in FIG. 1A, a signal of which H and L levels are reverse to those of the signal supplied to the wiring 105 can be supplied to the wiring 108.

In the case where the node N71 is connected to the wiring 108, it is preferable that the capacitance of the capacitor 702 be smaller than that of the capacitor 701. This is because, as described above, since it is described above that the capacitance of the capacitor 701 may be set to be sufficiently larger than the wiring capacitance or the parasitic capacitance, the potential of the node N72 is not necessarily (VSS+(VH−VL)) as long as the transistor 704 can be turned on. Thus the capacitance of the capacitor 702 can be smaller than that of the capacitor 701, thereby an element region of the capacitor 702 can be reduced.

In the case where the node N72 is connected to the wiring 108, it is preferable that the capacitance of the capacitor 701 be smaller than that of the capacitor 702 because of the similar reason to the case where the node N71 is connected to the wiring 108.

Note that each of the capacitors 701 and 702 may employ a structure in which an insulating layer is interposed between two electrode layers. By employing the structure in which an insulating layer is interposed between two electrode layers for each of the capacitors 701 and 702, the capacitors 701 and 702 can keep the capacitance constant regardless of an applied voltage, so that the level shifter of the present invention can be stably operated.

Further, it is preferable that an insulating layer of each of the capacitors 701 and 702 be a gate insulating film. This is because the capacitors 701 and 702 can obtain capacitance effectively since a gate insulating film is generally thinner than other insulating films (e.g., an interlayer film or a planarizing film).

Figure 8A:
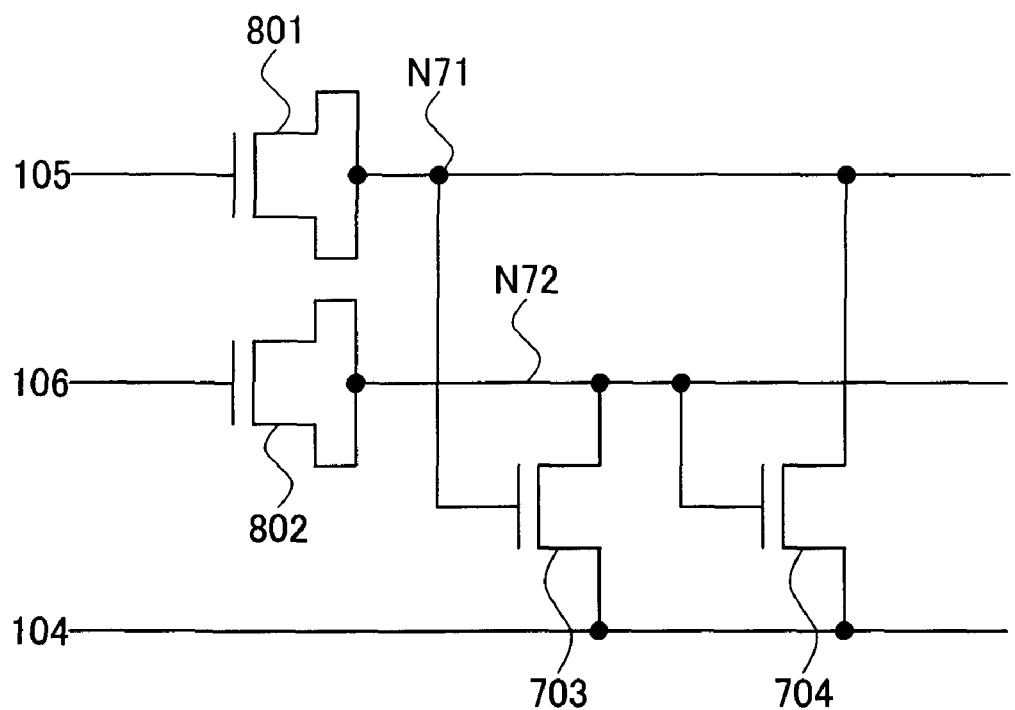
FIGS. 8A and 8B are diagrams each showing a structure of an offset circuit of a level shifter of the present invention.

Note also that a MOS capacitor may be employed as each of the capacitors 701 and 702. FIG. 8A shows a structure in the case where MOS capacitors are employed as the capacitors 701 and 702. In an offset circuit shown in FIG. 8A, an N-channel transistor 801 is used instead of the capacitor 701 and an N-channel transistor 802 is used instead of the capacitor 702. Note here that a gate of the transistor 801 is connected to the wiring 105, and first and second terminals of the transistor 801 are connected to the node N71. This is because the transistor 801 can operate as a capacitor since the potential of the wiring 105 is higher than that of the node N71 to turn on the transistor 801 so that a channel is formed in a channel region of the transistor 901. Similarly, a gate of the transistor 802 is connected to the wiring 106, and first and second terminals of the transistor 802 are connected to the node N72. This is because the transistor 802 can operate as a capacitor since the potential of the wiring 106 is higher than that of the node N72 to turn on the transistor 802 so that a channel is formed in a channel region of the transistor 802.

Further, as shown in FIG. 6B, a P-channel transistor may also be used as each capacitor. In an offset circuit shown in FIG. 6B, a P-channel transistor 803 is used instead of the capacitor 701 and a P-channel transistor 804 is used instead of the capacitor 702. Note here that a gate of the transistor 803 is connected to the node N71, and first and second terminals of the transistor 803 are connected to the wiring 105. This is because the transistor 803 can operate as a capacitor since the potential of the node N71 is lower than that of the wiring 105 to turn on the transistor 803 so that a channel is formed in a channel region of the transistor 803. Similarly, a gate of the transistor 804 is connected to the node N72, and first and second terminals of the transistor 804 are connected to the wiring 106. This is because the transistor 804 can operate as a capacitor since the potential of the node N72 is lower than that of the wiring 106 to turn on the transistor 804 so that a channel is formed in a channel region of the transistor 804.

Note that as described above, in FIG. 8A, in the case where the node N71 is connected to the wiring 108, it is preferable that the channel region (L×W: L is channel length and W is channel width) of the transistor 802 be smaller than that of the transistor 801. In the case where the node N72 is connected to the wiring 108, it is preferable that the channel region of the transistor 802 be larger than that of the transistor 801.

Figure 8B:
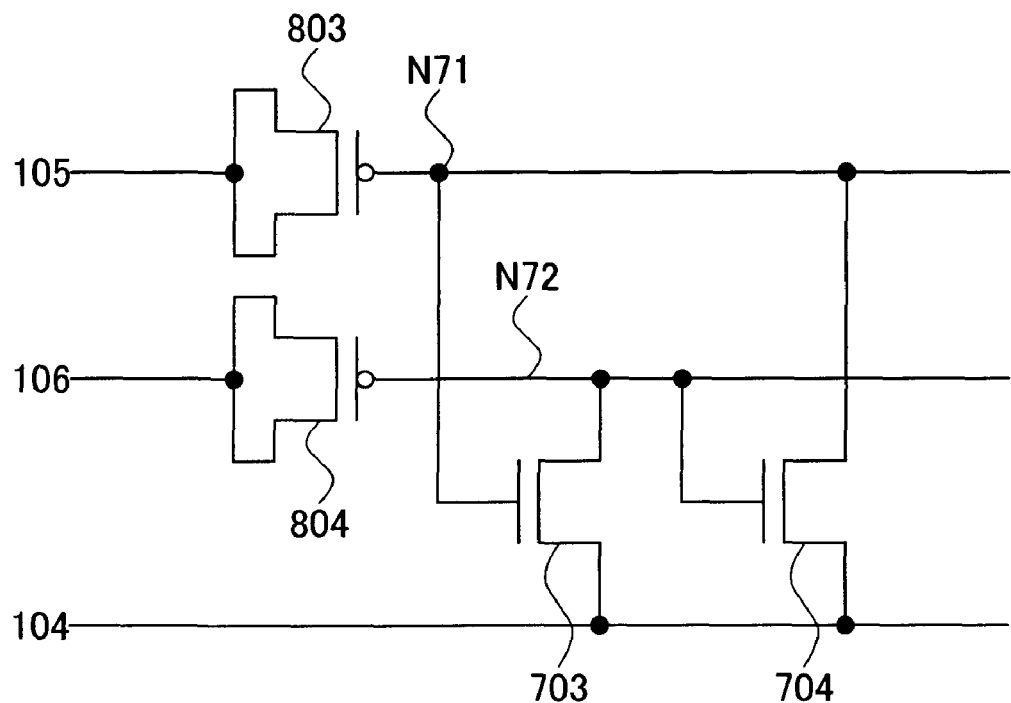

Similarly, in FIG. 8B, in the case where the node N71 is connected to the wiring 108, it is preferable that the channel region (L×W: L is channel length and W is channel width) of the transistor 804 be smaller than that of the transistor 803. In the case where the node N72 is connected to the wiring 108, it is preferable that the channel region of the transistor 804 be larger than that of the transistor 803.

Figure 9A:
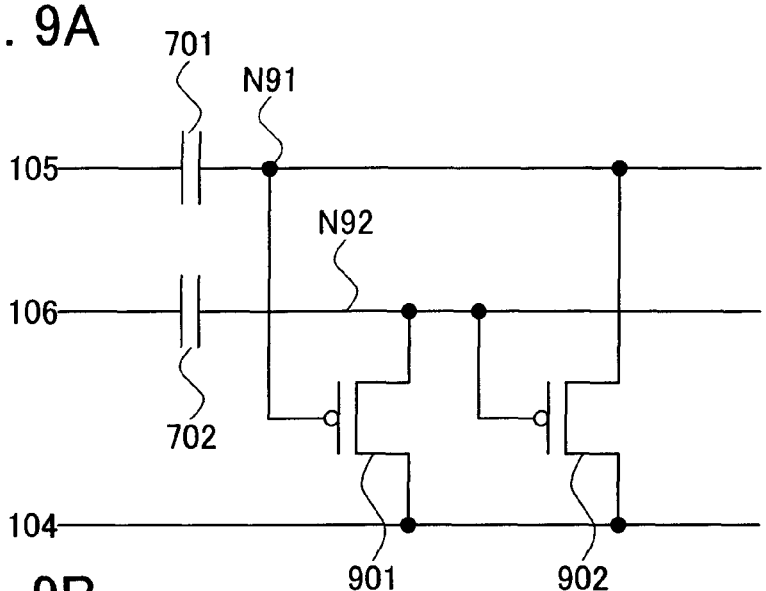
FIGS. 9A to 9C are diagrams each showing a structure of an offset circuit of a level shifter of the present invention.

Here, although the offset circuit shown in FIG. 7A includes the N-channel transistors and the capacitors, it may include P-channel transistors and capacitors. FIG. 9A shows an offset circuit including P-channel transistors and capacitors.

An offset circuit shown in FIG. 9A includes the capacitor 701, the capacitor 702, a transistor 901, and a transistor 902.

Note that the transistors 901 and 902 correspond to and have similar functions to the transistors 703 and 704 in FIG. 7A. Nodes N91 and N92 correspond to the nodes N71 and N72 in FIG. 7A.

As shown in the offset circuit in FIG. 9A, a first electrode of the capacitor 701 is connected to the wiring 105. A first electrode of the capacitor 702 is connected to the wiring 106. A gate of the transistor 901 is connected to a second electrode of the capacitor 701, a first terminal of the transistor 901 is connected to the wiring 104, and a second terminal of the transistor 901 is connected to a second electrode of the capacitor 702. A gate of the transistor 902 is connected to the second electrode of the capacitor 702, a first terminal of the transistor 902 is connected to the wiring 104, and a second terminal of the transistor 902 is connected to the second electrode of the capacitor 701. Note that a connection point of the second electrode of the capacitor 701, the gate of the transistor 901, and the second terminal of the transistor 902 is denoted by the node N91. A connection point of the second electrode of the capacitor 702, the second terminal of the transistor 901, and the gate of the transistor 902 is denoted by the node N92. Either one of the node N91 or the node N92 is connected to the wiring 108 shown in FIG. 1A.

Next, operations of the offset circuit shown in FIG. 9A are described with reference to FIGS. 9B and 9C.

Figure 9B:
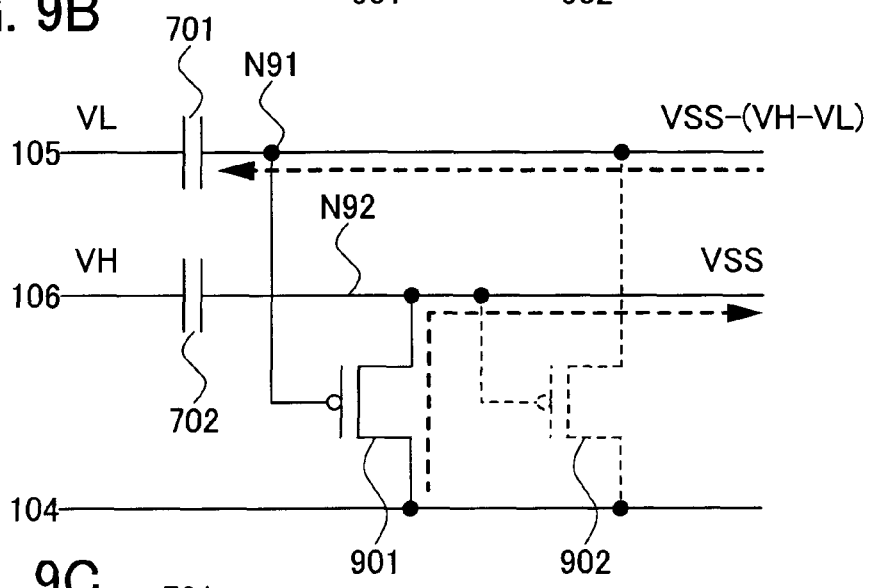

FIG. 9B shows an operation of the offset circuit shown in FIG. 9A when a signal of the wiring 105 is changed from an H signal to an L signal and a signal of the wiring 106 is changed from an L signal to an H signal.

Figure 9C:
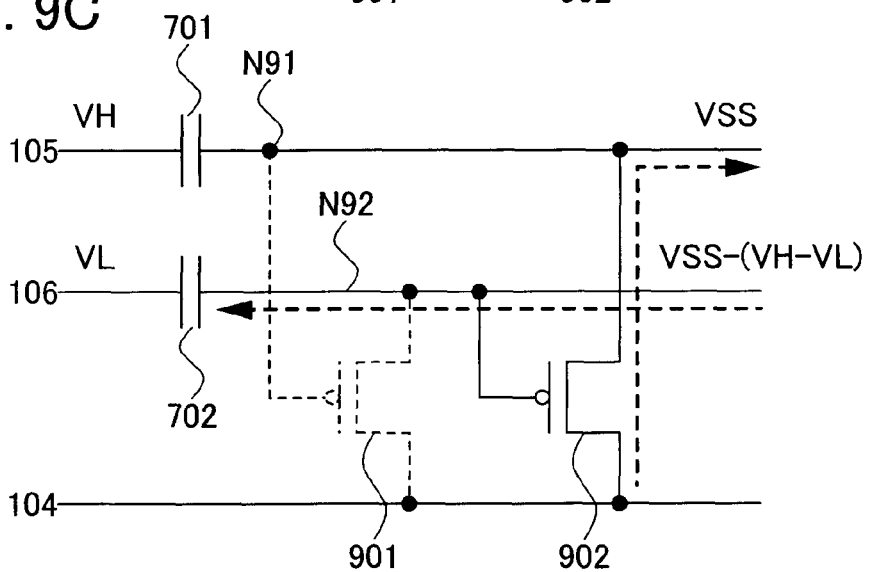

FIG. 9C shows an operation of the offset circuit shown in FIG. 9A when the signal of the wiring 105 is changed from the L signal to the H signal and the signal of the wiring 106 is changed from the H signal to the L signal. That is, the offset circuit shown in FIG. 9A repeats the operation shown in FIG. 9B and the operation shown in FIG. 9C at a certain timing. Note here that the operation shown in FIG. 9B is denoted by a first operation and the operation shown in FIG. 9C is denoted by a second operation.

First, the first operation of the offset circuit shown in FIG. 9A is described with reference to FIG. 9B. Note here that an initial potential of the node N91 is VSS.

In an initial state, the capacitor 701 holds a potential difference (VH−VSS) between a potential VH (the H signal) of the wiring 105 and the potential VSS of the node N91. Then, when the potential of the wiring 105 is changed from VH to VL, the potential of the node N91 becomes (VSS−(VH−VL)) by capacitive coupling of the capacitor 701. Consequently, the transistor 901 is turned on.

By turning on the transistor 901, the power source potential VSS is supplied to the node N92, so that the potential of the node N92 becomes VSS. Consequently, the capacitor 702 holds the potential difference (VH−VSS) between the potential VH (the H signal) of the wiring 106 and the potential VSS of the node N92. In addition, the transistor 902 is turned off.

By turning off the transistor 902, the node N91 becomes a floating state to keep the potential (VSS−(VH−VL)).

Next, the second operation of the offset circuit shown in FIG. 9A is described with reference to FIG. 9C.

As described above, (VH−VSS) is held in the capacitor 702 by the first operation. Then, when the potential of the wiring 106 is changed from VH to VL, the potential of the node N92 becomes (VSS−(VH−VL)) by capacitive coupling of the capacitor 702. Consequently, the transistor 902 is turned on.

By turning on the transistor 902, the power source potential VSS is supplied to the node N91, so that the potential of the node N91 becomes VSS. Consequently, the capacitor 701 holds the potential difference (VH−VSS) between the potential VH (the H signal) of the wiring 105 and the potential VSS of the node N91. In addition, the transistor 901 is turned off.

By turning off the transistor 901, the node N92 becomes the floating state to keep the potential (VSS−(VH−VL)).

By the first and second operations described above, the offset circuit shown in FIG. 9A operates as follows: In the first operation, the node N91 is brought into the floating state to keep the potential (VSS−(VH−VL)), and the power source potential VSS is supplied to the node N92; and in the second operation, the power source potential VSS is supplied to the node N91, and the node N92 is brought into the floating state to keep the potential (VSS−(VH−VL)).

Therefore, as for a signal generated from the offset circuit shown in FIG. 9A, an H signal is VSS and an L signal is (VSS−(VH−VL)). That is, the offset circuit shown in FIG. 9A can generate a signal based on the power source potential VSS.

Note that, similarly to the offset circuit shown in FIG. 7A, although the potential of the L signal of the signal generated from the offset circuit shown in FIG. 9A is (VSS−(VH−VL)), it is, in practice, a little higher than (VSS−(VH−VL)).

Further, similarly to the offset circuit shown in FIG. 7A, when the node N91 is connected to the wiring 108 shown in FIG. 1A, a signal of which H and L levels are the same as those of the signal supplied to the wiring 105 can be supplied to the wiring 108. Similarly, when the node N92 is connected to the wiring 108 shown in FIG. 1A, a signal of which H and L levels are reverse to those of the signal supplied to the wiring 105 can be supplied to the wiring 108.

Further, similarly to the offset circuit shown in FIG. 7A, in the case where the node N91 is connected to the wiring 108, it is preferable that the capacitance of the capacitor 702 be smaller than that of the capacitor 701.

Further, similarly to the offset circuit shown in FIG. 7A, in the case where the node N92 is connected to the wiring 108, it is preferable that the capacitance of the capacitor 701 be smaller than that of the capacitor 702.

Figure 10A:
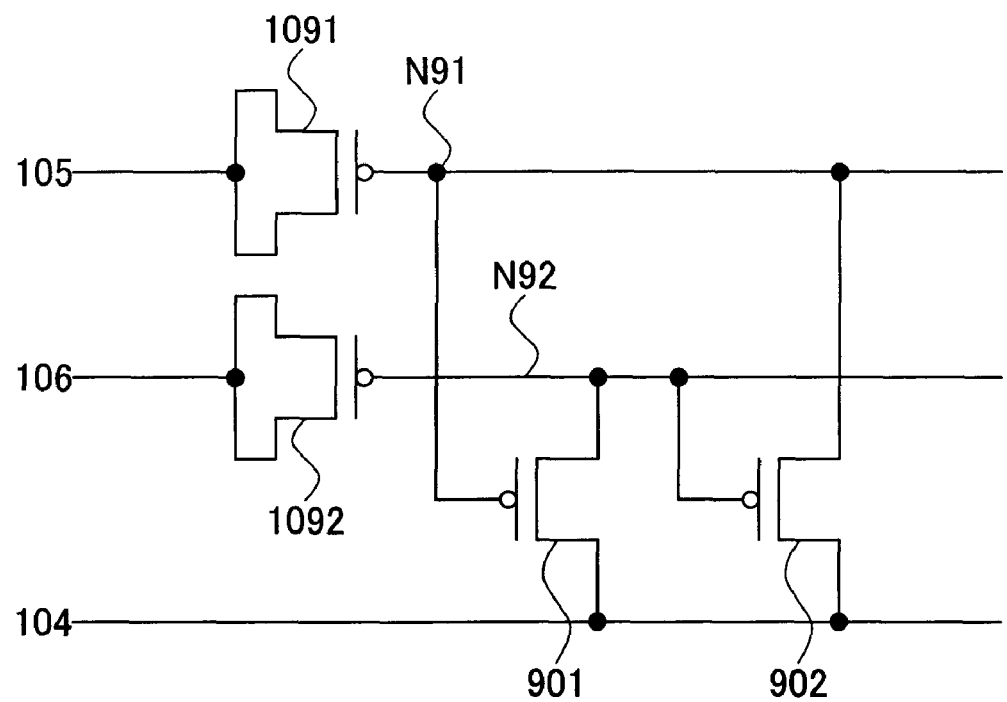
FIGS. 10A and 10B are diagrams each showing a structure of an offset circuit of a level shifter of the present invention.

Further, similarly to each offset circuit shown in FIGS. 8A and 8B, a MOS capacitor may be employed as each of the capacitors 701 and 702. As shown in FIG. 10A, a P-channel transistor 1091 may be used instead of the capacitor 701 and a P-channel transistor 1092 may be used instead of the capacitor 702. Note here that a gate of the transistor 1091 is connected to the node N91, and first and second terminals of the transistor 1091 are connected to the wiring 105. Similarly, a gate of the transistor 1092 is connected to the node N92, and first and second terminals of the transistor 1092 are connected to the wiring 106.

Figure 10B:
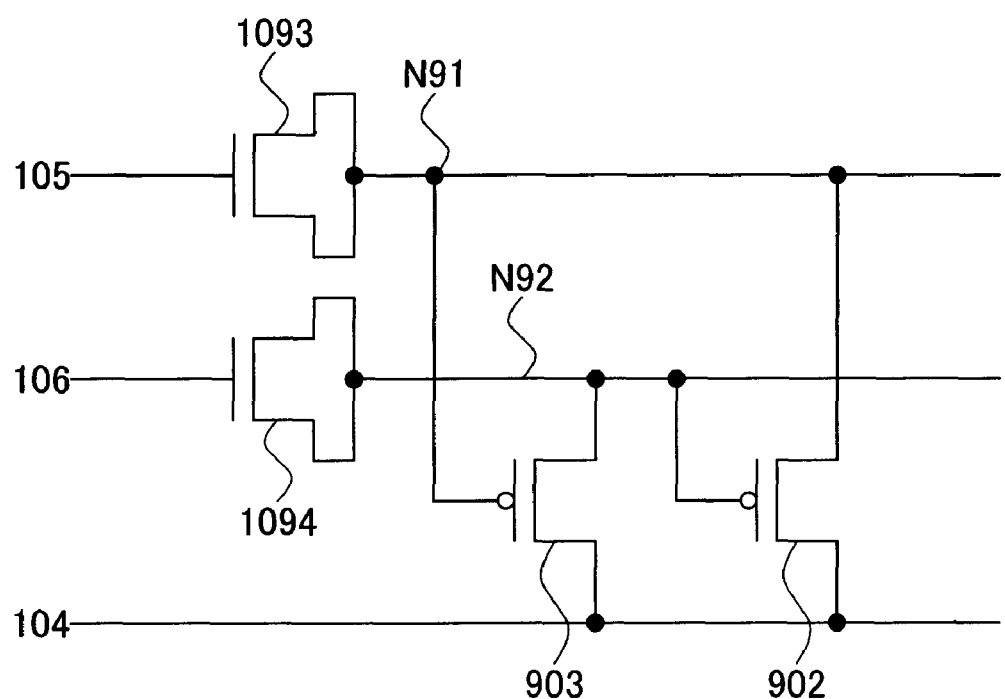

Further, similarly to each offset circuit shown in FIGS. 8A and 8B, as shown in FIG. 10B, N-channel transistors 1093 and 1094 can also be used as the capacitors 701 and 702. Note here that a gate of the transistor 1093 is connected to the wiring 105, and first and second terminals of the transistor 1093 are connected to the node N91. Similarly, a gate of the transistor 1094 is connected to the wiring 106, and first and second terminals of the transistor 1094 are connected to the node N92.

Further, similarly to each offset circuit shown in FIGS. 8A and 8B, in FIG. 10A, in the case where the node N91 is connected to the wiring 108, it is preferable that the channel region of the transistor 1092 be smaller than that of the transistor 1091. In the case where the node N92 is connected to the wiring 108, it is preferable that the channel region of the transistor 1092 be larger than that of the transistor 1091.

Similarly, in FIG. 10B, in the case where the node N91 is connected to the wiring 108, it is preferable that the channel region of the transistor 1094 be smaller than that of the transistor 1093. In the case where the node N92 is connected to the wiring 108, it is preferable that the channel region of the transistor 1094 be larger than that of the transistor 1093.

Note that this embodiment mode can be implemented freely combining with any description in the other embodiment modes of this specification. Further, the descriptions in this embodiment mode can be freely combined to be implemented.

Embodiment Mode 4

This embodiment mode describes structure examples of the circuit 101 (the offset circuit) included in the level shifter described in Embodiment Mode 1. Note that in this embodiment mode, description is made on the case where each signal supplied to the wirings 105 and 106 is supplied to the wirings 107 and 108 after each potential is shifted toward an H side and an L side while the timing is not changed (or is reversed) and the amplitude voltage is not changed so much.

Note that in this embodiment mode and Embodiment Modes 1 to 3, reference numerals are used in common, and detailed description of the same portions and portions having similar functions is not repeated.

First, a structure example of an offset circuit is described with reference to FIG. 11.

Figure 11:
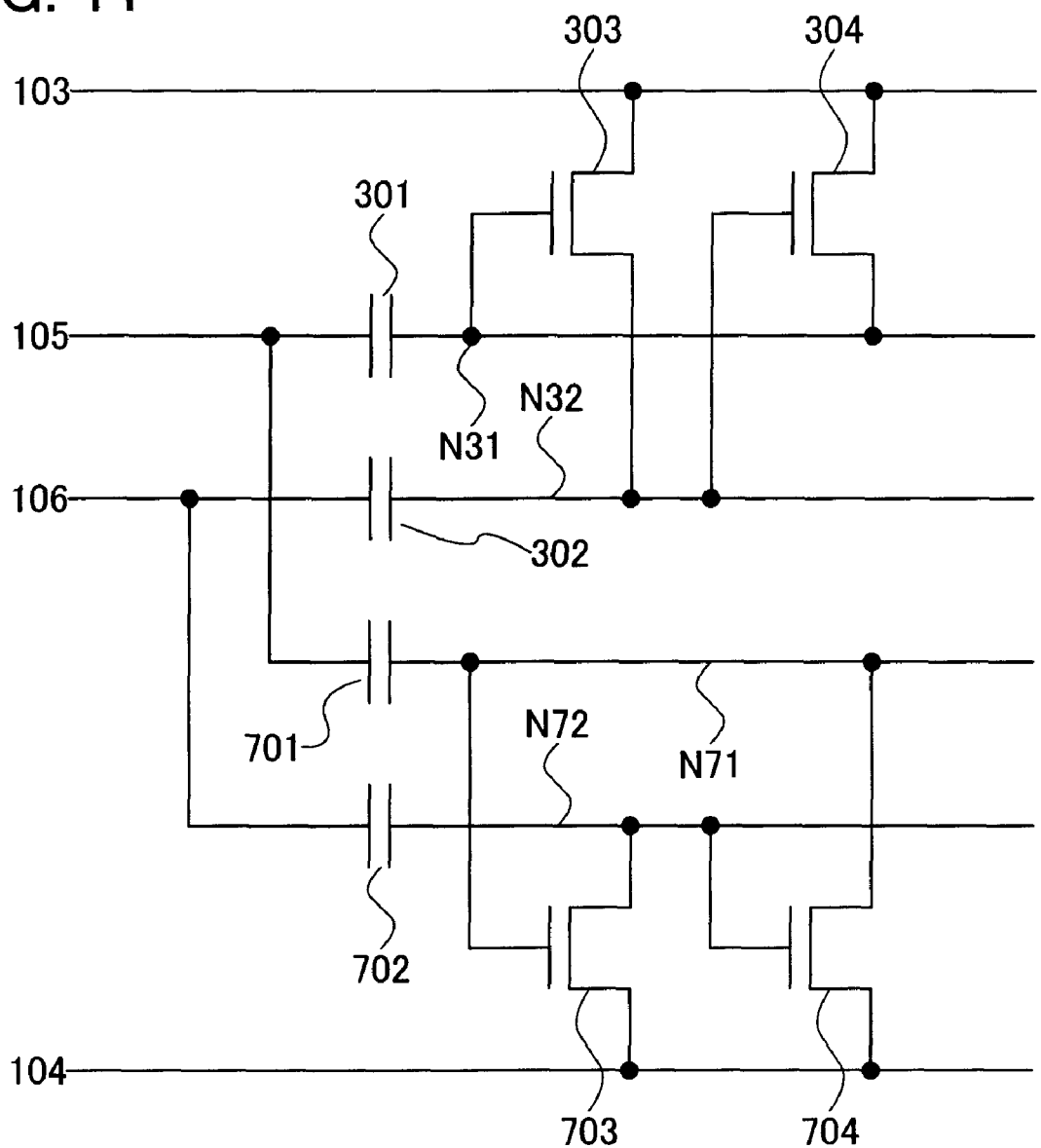
FIG. 11 is a diagram showing a structure of an offset circuit of a level shifter of the present invention.

An offset circuit shown in FIG. 11 includes the capacitor 301, the capacitor 302, the transistor 303, the transistor 304, the capacitor 701, the capacitor 702, the transistor 703, and the transistor 704.

As shown in the offset circuit in FIG. 11, a first electrode of the capacitor 301 is connected to the wiring 105. A first electrode of the capacitor 302 is connected to the wiring 106. A gate of the transistor 303 is connected to a second electrode of the capacitor 301, a first terminal of the transistor 303 is connected to the wiring 103, and a second terminal of the transistor 303 is connected to a second electrode of the capacitor 302. A gate of the transistor 304 is connected to the second electrode of the capacitor 302, a first terminal of the transistor 304 is connected to the wiring 103, and a second terminal of the transistor 304 is connected to the second electrode of the capacitor 301. A first electrode of the capacitor 702 is connected to the wiring 106. A gate of the transistor 703 is connected to a second electrode of the capacitor 701, a first terminal of the transistor 703 is connected to the wiring 104, and a second terminal of the transistor 703 is connected to a second electrode of the capacitor 702. A gate of the transistor 704 is connected to the second electrode of the capacitor 702, a first terminal of the transistor 704 is connected to the wiring 104, and a second terminal of the transistor 704 is connected to the second electrode of the capacitor 701.

Note that the connection point of the second electrode of the capacitor 301, the gate of the transistor 303, and the second terminal of the transistor 304 is denoted by the node N31. The connection point of the second electrode of the capacitor 302, the second terminal of the transistor 303, and the gate of the transistor 304 is denoted by the node N32. The connection point of the second electrode of the capacitor 701, the gate of the transistor 703, and the second terminal of the transistor 704 is denoted by the node N71. The connection point of the second electrode of the capacitor 702, the second terminal of the transistor 703, and the gate of the transistor 704 is denoted by the node N72.

Either one of the node N31 or the node N32 is connected to the wiring 107 shown in FIG. 1A. Either one of the node N71 or the node N72 is connected to the wiring 108 shown in FIG. 1A.

The offset circuit shown in FIG. 3A includes the capacitor 301, the capacitor 302, the transistor 303, and the transistor 304. The offset circuit shown in FIG. 7A includes the capacitor 701, the capacitor 702, the transistor 703, and the transistor 704.

As described above, the power source potential VDD and the power source potential VSS are supplied to the wirings 103 and 104. As for the signal of the wiring 105, H and L levels are reverse to those of the signal of the wiring 106.

Operations of the offset circuit shown in FIG. 11 are similar to those in FIGS. 3A and 7A, thus description thereof is omitted.

Figure 12:
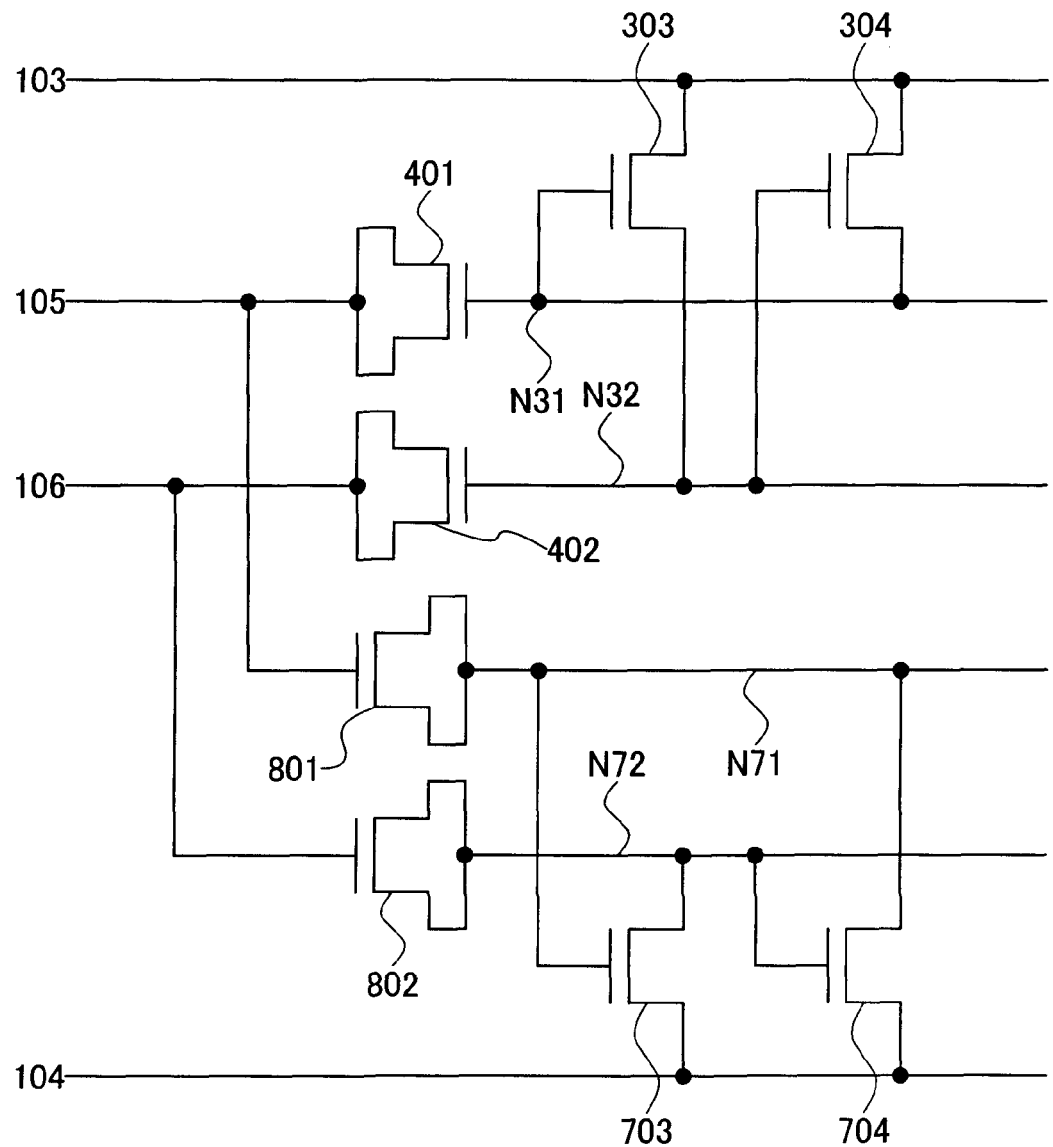
FIG. 12 is a diagram showing a structure of an offset circuit of a level shifter of the present invention.

Note also that as described above, a MOS capacitor may be employed as each of the capacitors 301, 302, 701, and 702. FIG. 12 shows a structure in the case where MOS capacitors are employed as the capacitors 301, 302, 701, and 702.

As shown in an offset circuit in FIG. 12, the transistors 401, 402, 801, and 802 can be used instead of the capacitors 301, 302, 701, and 702, respectively. Note that the transistors 401, 402, 801, and 802 are N-channel transistors.

Note here that a gate of the transistor 401 is connected to the node N31, and first and second terminals of the transistor 401 are connected to the wiring 105. A gate of the transistor 402 is connected to the node N32, and first and second terminals of the transistor 402 are connected to the wiring 106. A gate of the transistor 801 is connected to the wiring 105, and first and second terminals of the transistor 801 are connected to the node N71. A gate of the transistor 802 is connected to the wiring 106, and first and second terminals of the transistor 802 are connected to the node N72.

Figure 13:
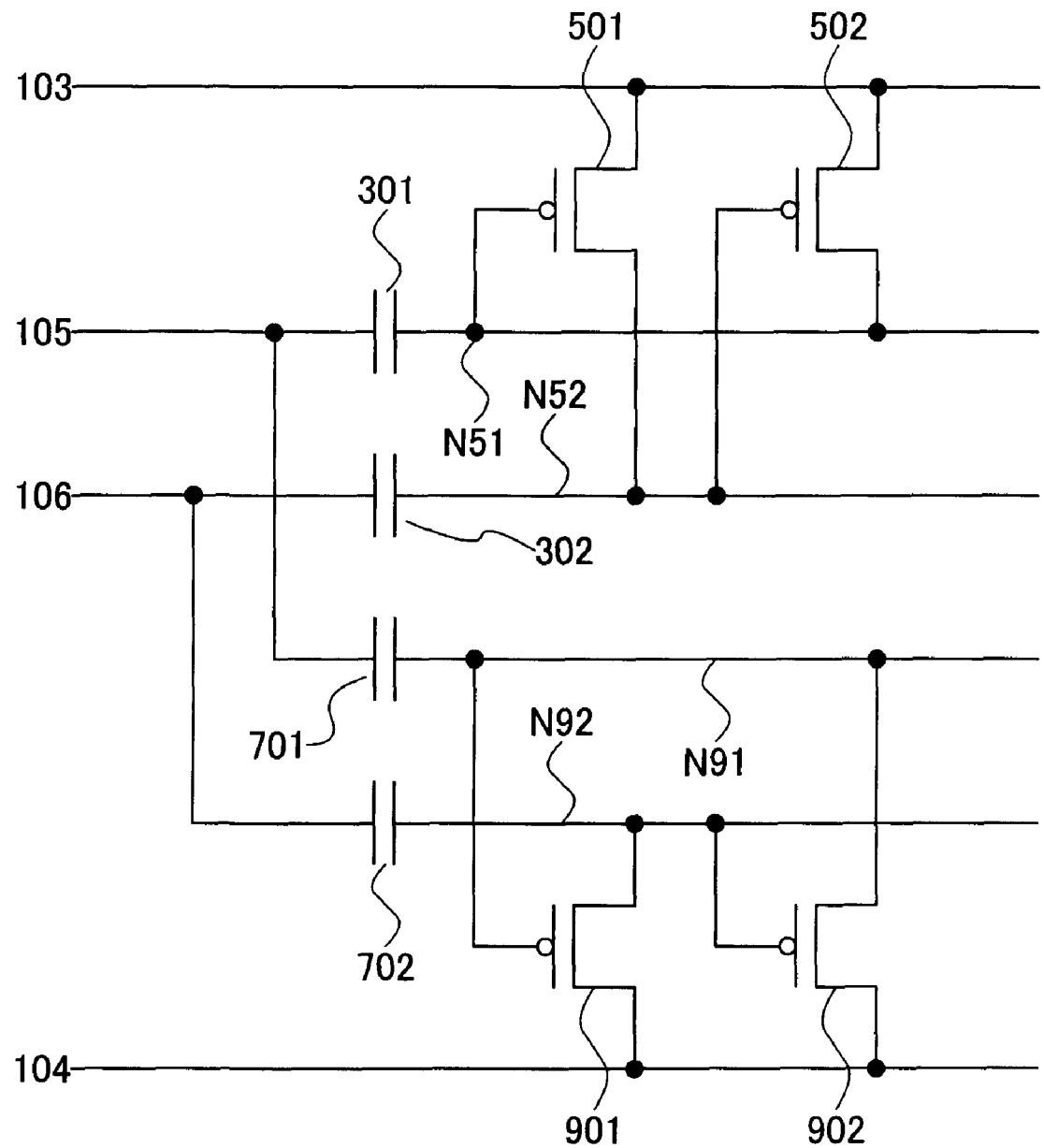
FIG. 13 is a diagram showing a structure of an offset circuit of a level shifter of the present invention.

Here, although the offset circuit shown in FIG. 11 includes the N-channel transistors and the capacitors, it may include P-channel transistors and capacitors. FIG. 13 shows an offset circuit including P-channel transistors and capacitors.

An offset circuit shown in FIG. 13 includes the capacitor 301, the capacitor 302, the transistor 501, the transistor 502, the capacitor 701, the capacitor 702, the transistor 901, and the transistor 902.

As shown in the offset circuit in FIG. 13, a first electrode of the capacitor 301 is connected to the wiring 105. A first electrode of the capacitor 302 is connected to the wiring 106. A gate of the transistor 501 is connected to a second electrode of the capacitor 301, a first terminal of the transistor 501 is connected to the wiring 103, and a second terminal of the transistor 501 is connected to a second electrode of the capacitor 302. A gate of the transistor 502 is connected to the second electrode of the capacitor 302, a first terminal of the transistor 502 is connected to the wiring 103, and a second terminal of the transistor 502 is connected to the second electrode of the capacitor 301. A first electrode of the capacitor 702 is connected to the wiring 106. A gate of the transistor 901 is connected to a second electrode of the capacitor 701, a first terminal of the transistor 901 is connected to the wiring 104, and a second terminal of the transistor 901 is connected to the second electrode of the capacitor 702. A gate of the transistor 902 is connected to a second electrode of the capacitor 702, a first terminal of the transistor 902 is connected to the wiring 104, and a second terminal of the transistor 902 is connected to the second electrode of the capacitor 701.

Note that the connection point of the second electrode of the capacitor 301, the gate of the transistor 501, and the second terminal of the transistor 502 is denoted by the node N51. The connection point of the second electrode of the capacitor 302, the second terminal of the transistor 501, and the gate of the transistor 502 is denoted by the node N52. The connection point of the second electrode of the capacitor 701, the gate of the transistor 901, and the second terminal of the transistor 902 is denoted by the node N91. The connection point of the second electrode of the capacitor 702, the second terminal of the transistor 901, and the gate of the transistor 902 is denoted by the node N92.

Either one of the node N51 or the node N52 is connected to the wiring 107 shown in FIG. 1A. Either one of the node N91 or the node N92 is connected to the wiring 108 shown in FIG. 1A.

The offset circuit shown in FIG. 5A includes the capacitor 301, the capacitor 302, the transistor 503, and the transistor 504. The offset circuit shown in FIG. 9A includes the capacitor 701, the capacitor 702, the transistor 903, and the transistor 904.

As described above, the power source potential VDD and the power source potential VSS are supplied to the wirings 103 and 104. As for the signal of the wiring 105, H and L levels are reverse to those of the signal of the wiring 106.

Operations of the offset circuit shown in FIG. 13 are similar to those in FIGS. 5A and 9A, thus description thereof is omitted.

Figure 14:
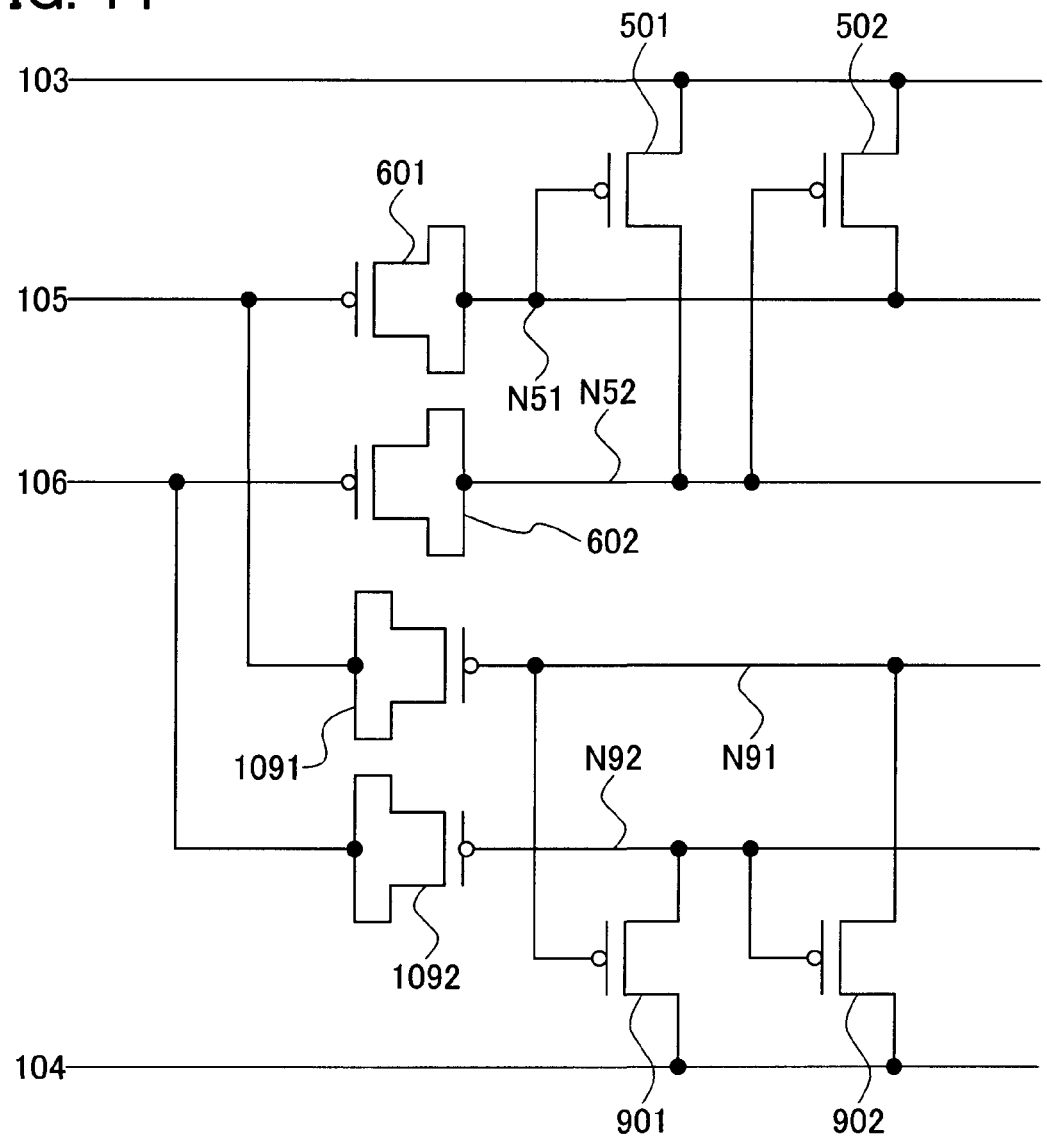
FIG. 14 is a diagram showing a structure of an offset circuit of a level shifter of the present invention.

Note also that as described above, a MOS capacitor may be employed as each of the capacitors 301, 302, 701, and 702. FIG. 14 shows a structure in the case where MOS capacitors are employed as the capacitors 301, 302, 701, and 702.

As shown in an offset circuit shown in FIG. 14, the transistors 601, 602, 1091, and 1092 can be used instead of the capacitors 301, 302, 701, and 702, respectively. Note that the transistors 601, 602, 1091, and 1092 are P-channel transistors.

Note here that a gate of the transistor 601 is connected to the wiring 105, and first and second terminals of the transistor 601 are connected to the node N51. A gate of the transistor 602 is connected to the wiring 106, and first and second terminals of the transistor 602 are connected to the node N52. A gate of the transistor 1091 is connected to the node N91, and first and second terminals of the transistor 1091 are connected to the wiring 105. A gate of the transistor 1092 is connected to the node N92, and first and second terminals of the transistor 1092 are connected to the wiring 106.

Note that this embodiment mode can be implemented freely combining with any description in the other embodiment modes of this specification. Further, the descriptions in this embodiment mode can be freely combined to be implemented.

Embodiment Mode 5

This embodiment mode describes specific structures of the level shifter described in Embodiment Mode 1.

Note that in this embodiment mode and Embodiment Modes 1 to 4, reference numerals are used in common, and detailed description of the same portions and portions having similar functions is not repeated.

First, a specific structure example of a level shifter of the present invention is described with reference to FIG. 15.

Figure 15:
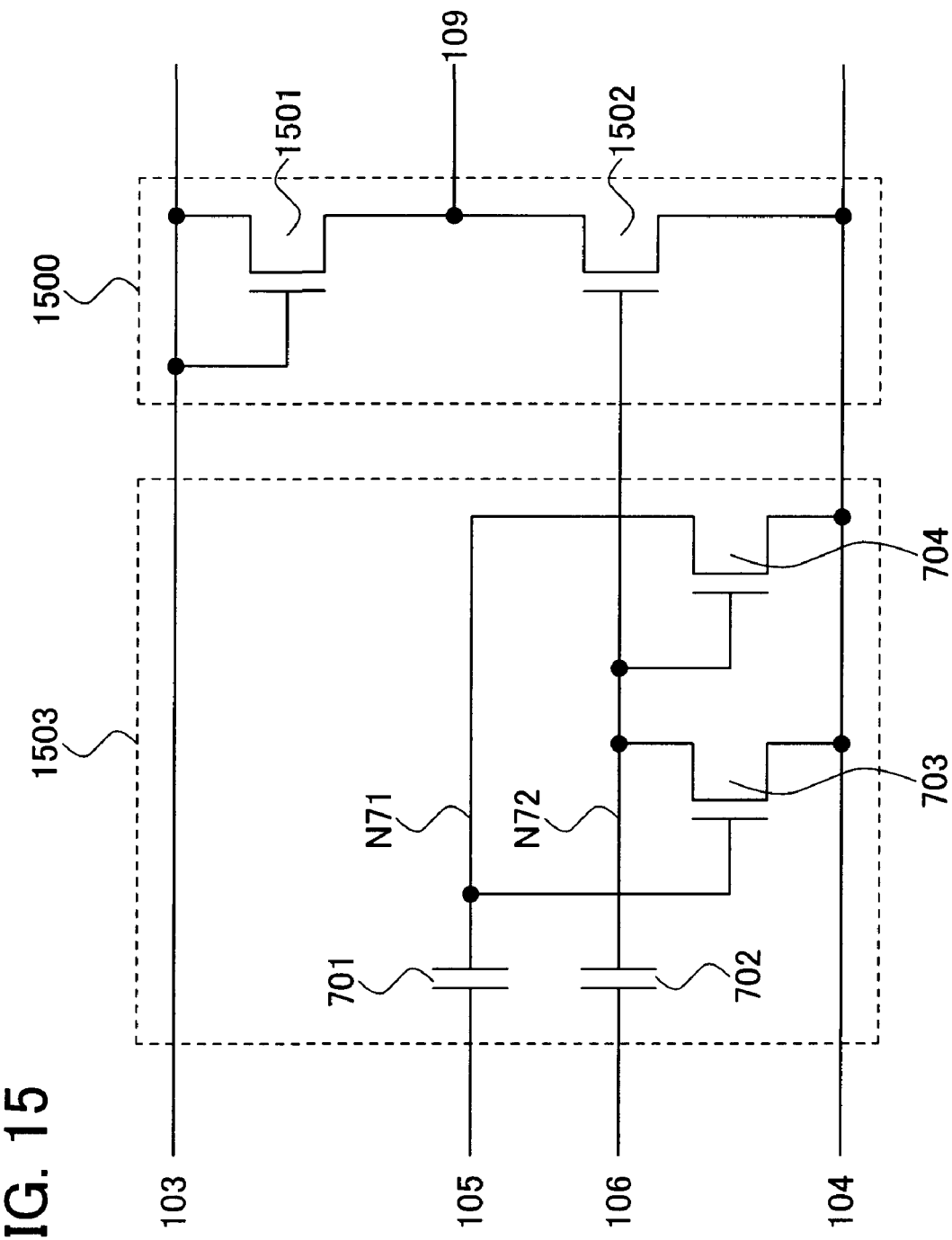
FIG. 15 is a diagram showing a structure of a level shifter of the present invention.

A level shifter shown in FIG. 15 includes the capacitor 701, the capacitor 702, the transistor 703, the transistor 704, a transistor 1501, and a transistor 1502.

As shown in the level shifter in FIG. 15, a first electrode of the capacitor 701 is connected to the wiring 105. A first electrode of the capacitor 702 is connected to the wiring 106. A gate of the transistor 703 is connected to a second electrode of the capacitor 701, a first terminal of the transistor 703 is connected to the wiring 104, and a second terminal of the transistor 703 is connected to a second electrode of the capacitor 702. A gate of the transistor 704 is connected to a second electrode of the capacitor 702, a first terminal of the transistor 704 is connected to the wiring 104, and a second terminal of the transistor 704 is connected to the second electrode of the capacitor 701. Note that a connection point of the second electrode of the capacitor 701, the gate of the transistor 703, and the second terminal of the transistor 704 is denoted by the node N71. A connection point of the second electrode of the capacitor 702, the second terminal of the transistor 703, and the gate of the transistor 704 is denoted by the node N72. A gate of the transistor 1502 is connected to the node N72, a first terminal of the transistor 1502 is connected to the wiring 104, and a second terminal of the transistor 1502 is connected to the wiring 109. A gate of the transistor 1501 is connected to the wiring 103, a first terminal of the transistor 1501 is connected to the wiring 103, and a second terminal of the transistor 1502 is connected to the wiring 109.

An offset circuit 1503 includes the capacitor 701, the capacitor 702, the transistor 703, and the transistor 704. The offset circuit 1503 is similar to the offset circuit shown in FIG. 7A.

A logic circuit 1500 includes the transistor 1501 and the transistor 1502. The logic circuit 1500 corresponds to the circuit 102 shown in FIGS. 1A to 1C.

Note that the transistors 1501 and 1502 are N-channel transistors. Therefore, since the level shifter shown in FIG. 15 can be formed by using the transistors of only the N-channel type, amorphous silicon can be used for a semiconductor layer in the level shifter shown in FIG. 15 so that a manufacturing process can be simplified. Consequently, manufacturing cost can be reduced and a yield can be improved. Further, a large semiconductor device can also be manufactured.

Further, in the level shifter shown in FIG. 15, the manufacturing process can be simplified even if polysilicon or single crystalline silicon is used for the semiconductor layer.

Next, operations of the level shifter shown in FIG. 15 are described with reference to timing charts of FIGS. 16A to 16C. However, timing of potential change in the timing charts shown in FIGS. 16A to 16C can be determined as appropriate, and is not limited to that in the timing charts of FIGS. 16A to 16C.

Figure 16A:
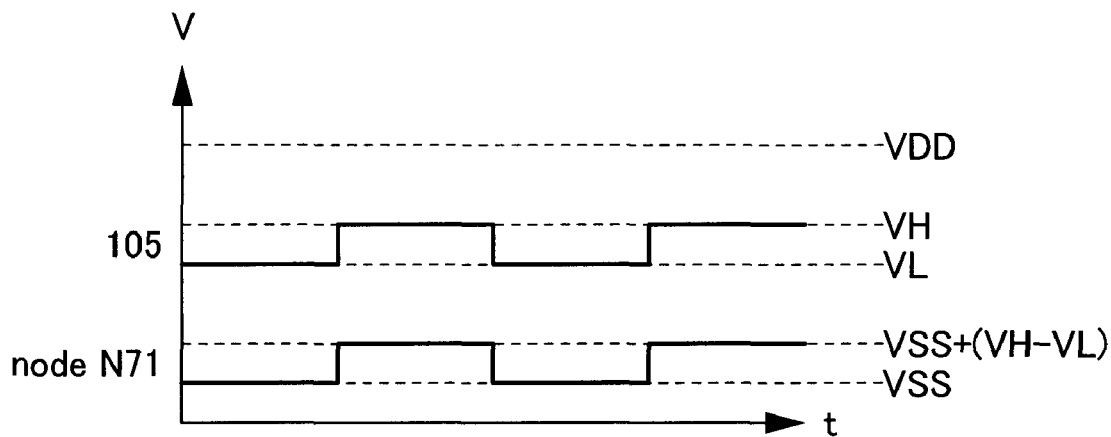
FIGS. 16A to 16C are diagrams each showing a timing chart of a level shifter of the present invention.
Figure 16B:
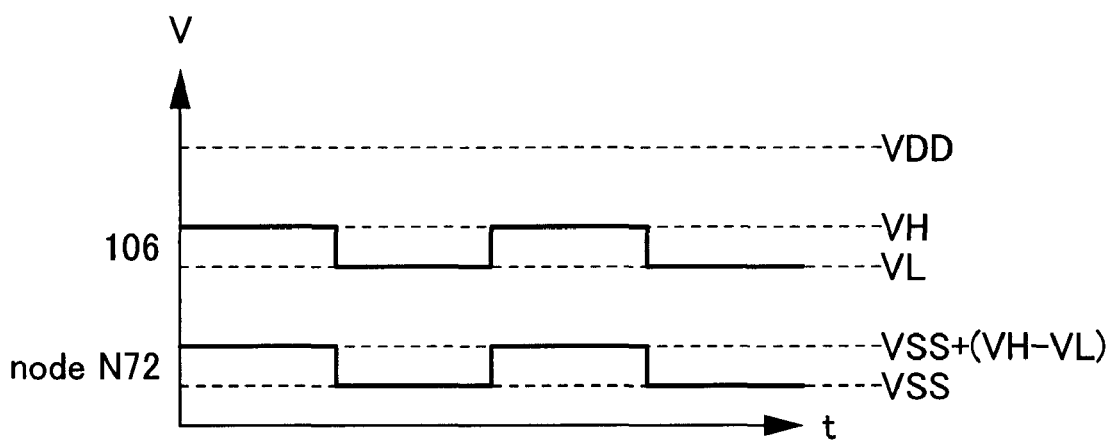
Figure 16C:
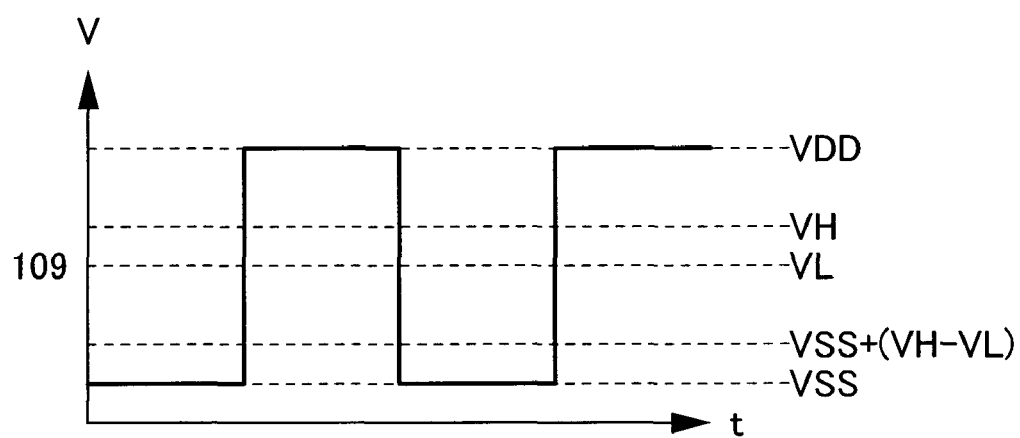

In the timing chart shown in FIG. 16A, a signal (a potential) supplied to the wiring 105 and a potential of the node N71 are shown. In the timing chart shown in FIG. 16B, a signal (a potential) supplied to the wiring 106 and a potential of the node N72 are shown. In the timing chart shown in FIG. 16C, a signal (a potential) supplied to the wiring 109 is shown.

Figure 17:
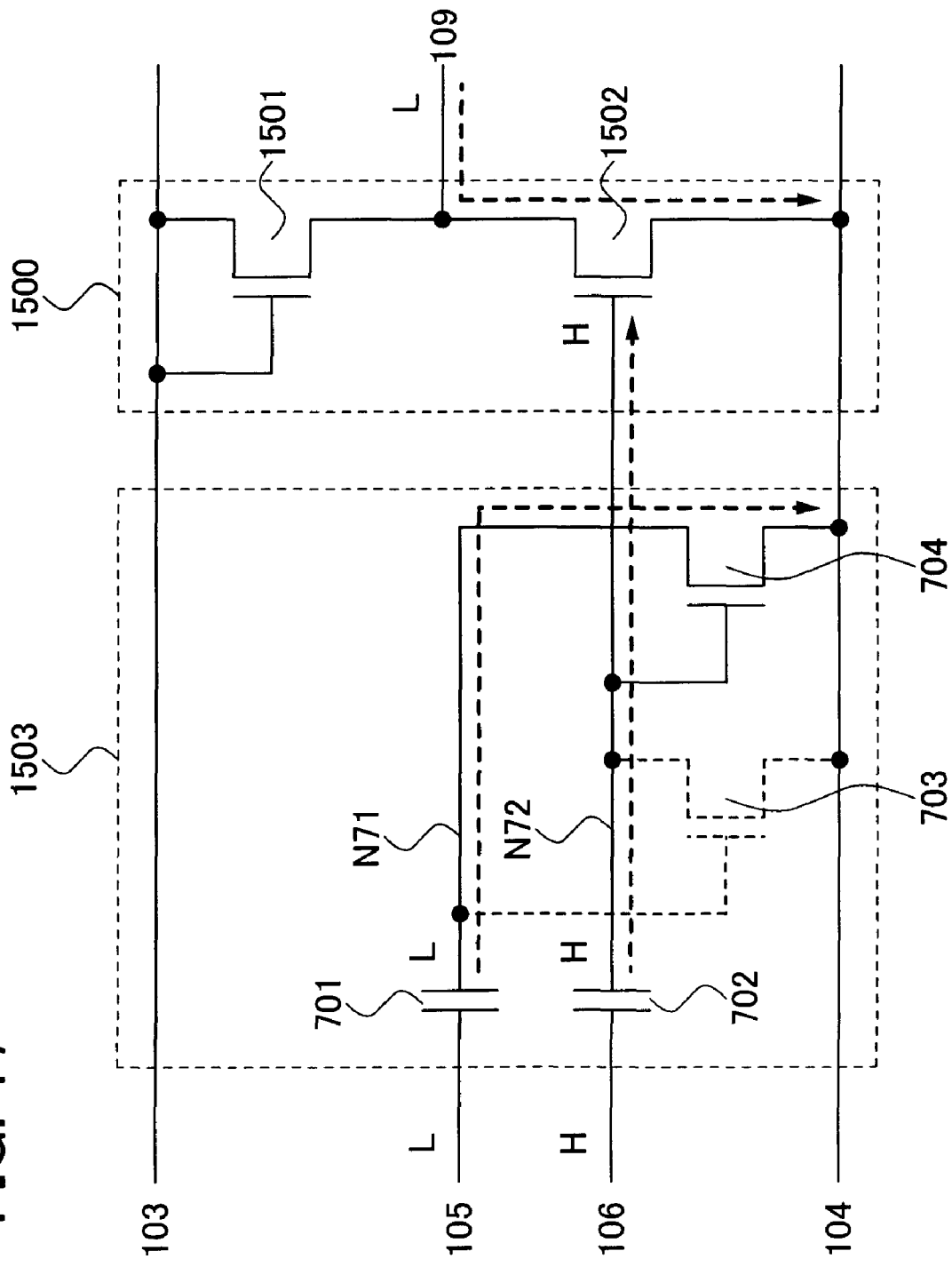
FIG. 17 is a diagram showing a structure of a level shifter of the present invention.
Figure 18:
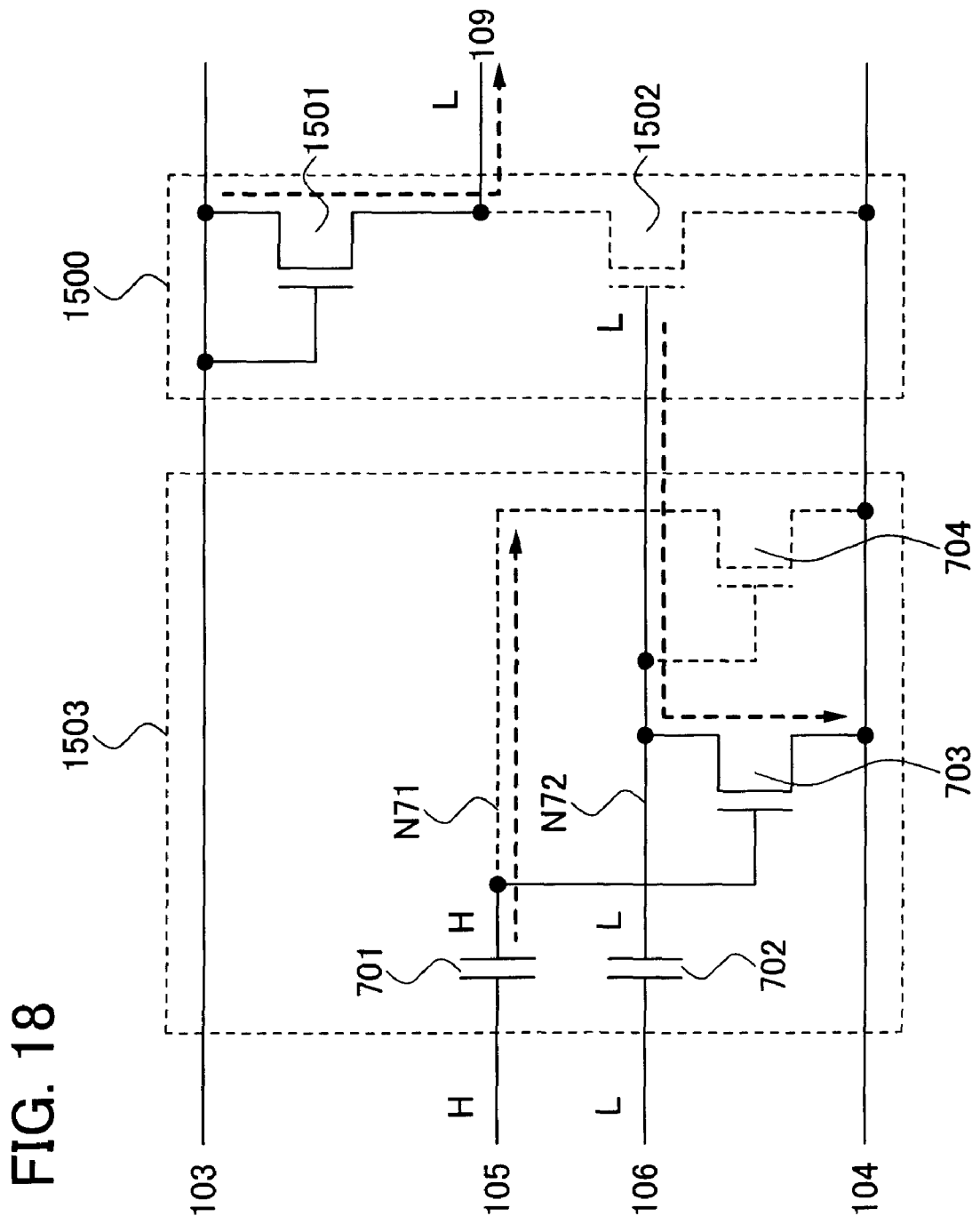
FIG. 18 is a diagram showing a structure of a level shifter of the present invention.

FIG. 17 shows an operation of the level shifter shown in FIG. 15 when an L signal is supplied to the wiring 105 and an H signal is supplied to the wiring 106. FIG. 18 shows an operation of the level shifter shown in FIG. 15 when an H signal is supplied to the wiring 105 and an L signal is supplied to the wiring 106. Note here that the operation shown in FIG. 17 is denoted by a first operation and the operation shown in FIG. 18 is denoted by a second operation.

Since operations of the offset circuit 1503 are similar to those of the offset circuit shown in FIG. 7A, specific description thereof is omitted.

First, the first operation of the level shifter shown in FIG. 15 is described with reference to the timing charts shown in FIGS. 16A to 16C and FIG. 17.

When the wiring 105 becomes an L level, the potential of the node N71 becomes VSS. On the other hand, when the wiring 106 becomes an H level, the potential of the node N72 becomes (VSS+(VH−VL)). Consequently, the transistor 1502 is turned on, and the power source potential VSS is supplied to the wiring 109, so that an L signal is outputted from the wiring 109. Note that the potential of the wiring 109 is determined by operating points of the transistors 1501 and 1502, thus it is a little higher than the power source potential VSS.

Next, the second operation of the level shifter shown in FIG. 15 is described with reference to the timing charts shown in FIGS. 16A to 16C and FIG. 18.

When the wiring 105 becomes an H level, the potential of the node N71 becomes (VSS+(VH−VL)). On the other hand, when the wiring 106 becomes an L level, the potential of the node N72 becomes VSS. Consequently, the transistor 1502 is turned off, and the power source potential VDD is supplied to the wiring 109, so that the potential of the wiring 109 is increased. This potential increase of the wiring 109 continues until the potential of the wiring 109 becomes a potential (VDD−Vth1501) obtained by subtracting a threshold voltage Vth1501 of the transistor 1501 from the power source potential VDD and the transistor 1501 is turned off. Accordingly, the potential of the wiring 109 becomes (VDD−Vth1501), and an H signal is outputted from the wiring 109.

Here, functions of the logic circuit 1500 and the offset circuit 1503 are described.

First, the offset circuit 1503 has a similar function to the offset circuit shown in FIG. 7A. Further, the offset circuit 1503 generates an offset signal of which H-signal and L-signal potentials are (VSS+(VH−VL)) and VSS from a control signal of which H-signal and L-signal potentials are VH and VL, and supplies the offset signal to the logic circuit 1500.

The logic circuit 1500 generates an output signal of which H-signal and L-signal potentials are (VDD−Vth1501) and approximately VSS, respectively, from the offset signal of which H-signal and L-signal potentials are (VSS+(VH−VL)) and VSS, respectively, and supplies the output signal to the wiring 109.

Here, functions of the transistors 1501 and 1502 are described.

First, the transistor 1501 has a function as a diode. Input terminals thereof are the gate and the first terminal, and an output terminal thereof is the second terminal. The transistor 1501 is any element having a resistance component. By using a resistor instead of the transistor 1501, the potential of the wiring 109 can be made equal to the power source potential VDD in the second operation in the logic circuit 1500.

The transistor 1502 has a function as a switch of selecting whether the wiring 104 and the wiring 109 are connected to each other or not depending on the potential of the node N72. The transistor 1502 is turned on and supplies the power source potential VSS to the wiring 109 in the first operation.

By the above-described first and second operations, the level shifter shown in FIG. 15 can shift each control signal supplied to the wirings 105 and 106 such that the H-signal potential is shifted from VH to VDD and the L-signal potential is shifted from VL to VSS, and then output through the wiring 109.

Since the gate voltage of the transistor 1502 is (VSS+(VH−VL)) in the first operation and is VSS in the second operation, through current of the logic circuit 1500 is reduced. This is because the amplitude voltage of the gate of the transistor 1502 is small (VH−VL). Therefore, power consumption of a semiconductor device including the level shifter shown in FIG. 15 is reduced because through current of the logic circuit 1500 is small.

Further, since the amplitude voltage of the gate of the transistor 1502 is small, noise generated in the logic circuit 1500 is reduced. This is because noise generated through parasitic capacitance between the gate and the second terminal (the wiring 109) of the transistor 1502 becomes small.

Note also that as described above, a MOS capacitor may be employed as each of the capacitors 701 and 702. Further, in the case of the level shifter shown in FIG. 15, it is preferable to use an N-channel transistor for each capacitor similarly to the offset circuit shown in FIG. 8A. This is because by forming each capacitor using an N-channel transistor, amorphous silicon can be used for a semiconductor layer in the level shifter shown in FIG. 15 so that a manufacturing process can be simplified. Consequently, manufacturing cost can be reduced and a yield can be improved. Further, a large semiconductor device can also be manufactured.

Further, in the level shifter shown in FIG. 15, the manufacturing process can be simplified even if polysilicon or single crystalline silicon is used for the semiconductor layer.

Figure 19:
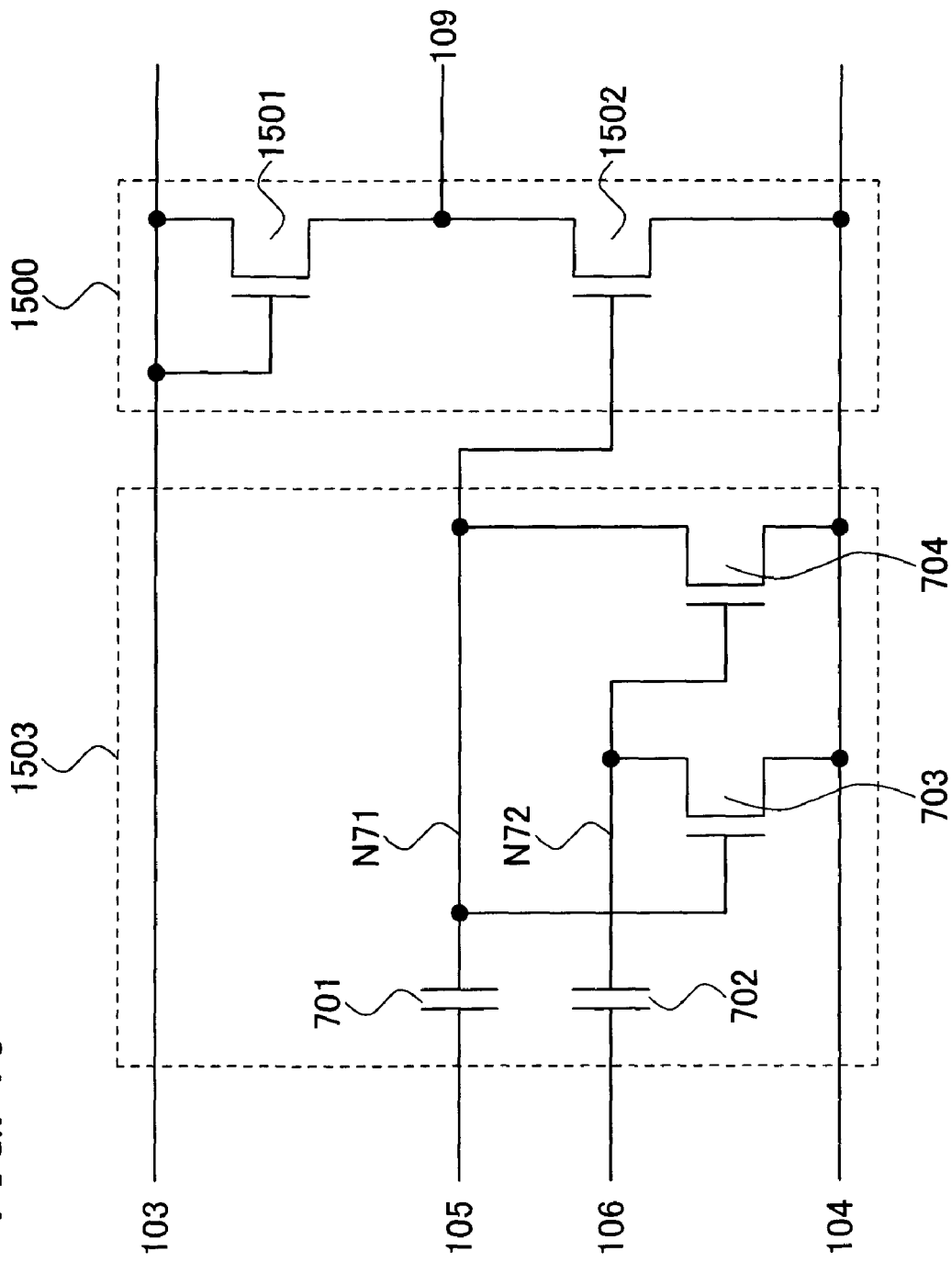
FIG. 19 is a diagram showing a structure of a level shifter of the present invention.
Figure 20A:
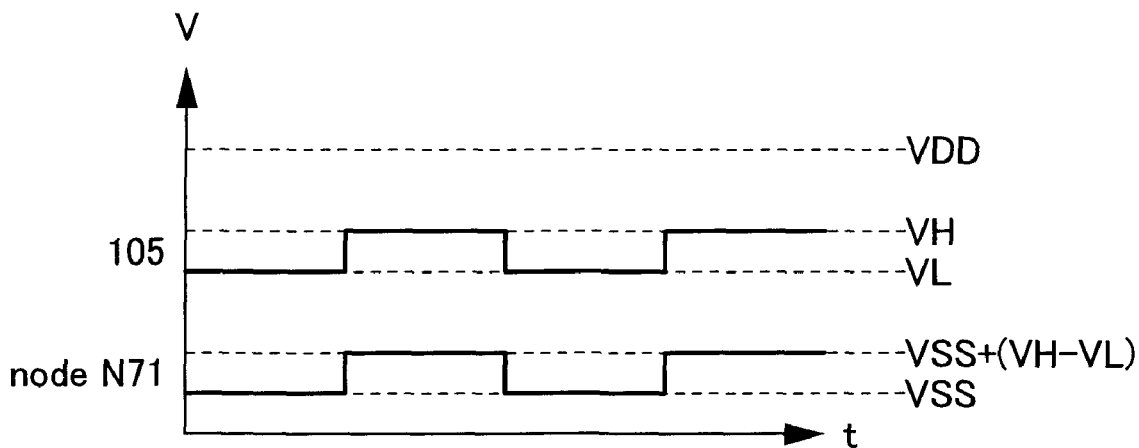
FIGS. 20A to 20C are diagrams each showing a timing chart of a level shifter of the present invention.
Figure 20B:
Figure 20C:
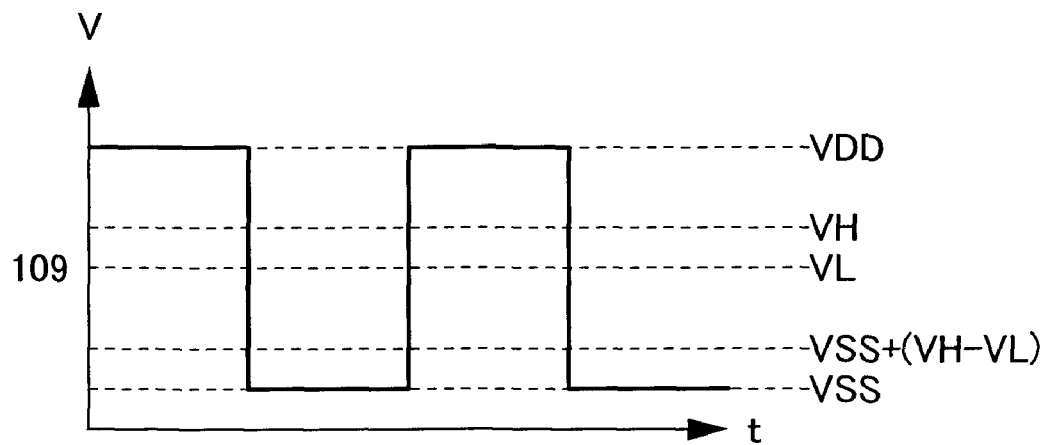

Note that as shown in FIG. 19, the gate of the transistor 1502 may also be connected to the node N71 in the level shifter shown in FIG. 15. In the case where the gate of the transistor 1502 is connected to the node N71 (FIG. 19), H and L levels of the signal (the potential) of the wiring 109 are reverse to those in the case where the gate of the transistor 1502 is connected to the node N72 (FIG. 15) as shown in timing charts in FIGS. 20A to 20C. Operations of a level shifter shown in FIG. 19 are similar to those of the level shifter shown in FIG. 15. Therefore, whether the gate of the transistor 1502 is connected to the node N71 or the node N72 can be determined as appropriate.

Figure 29:
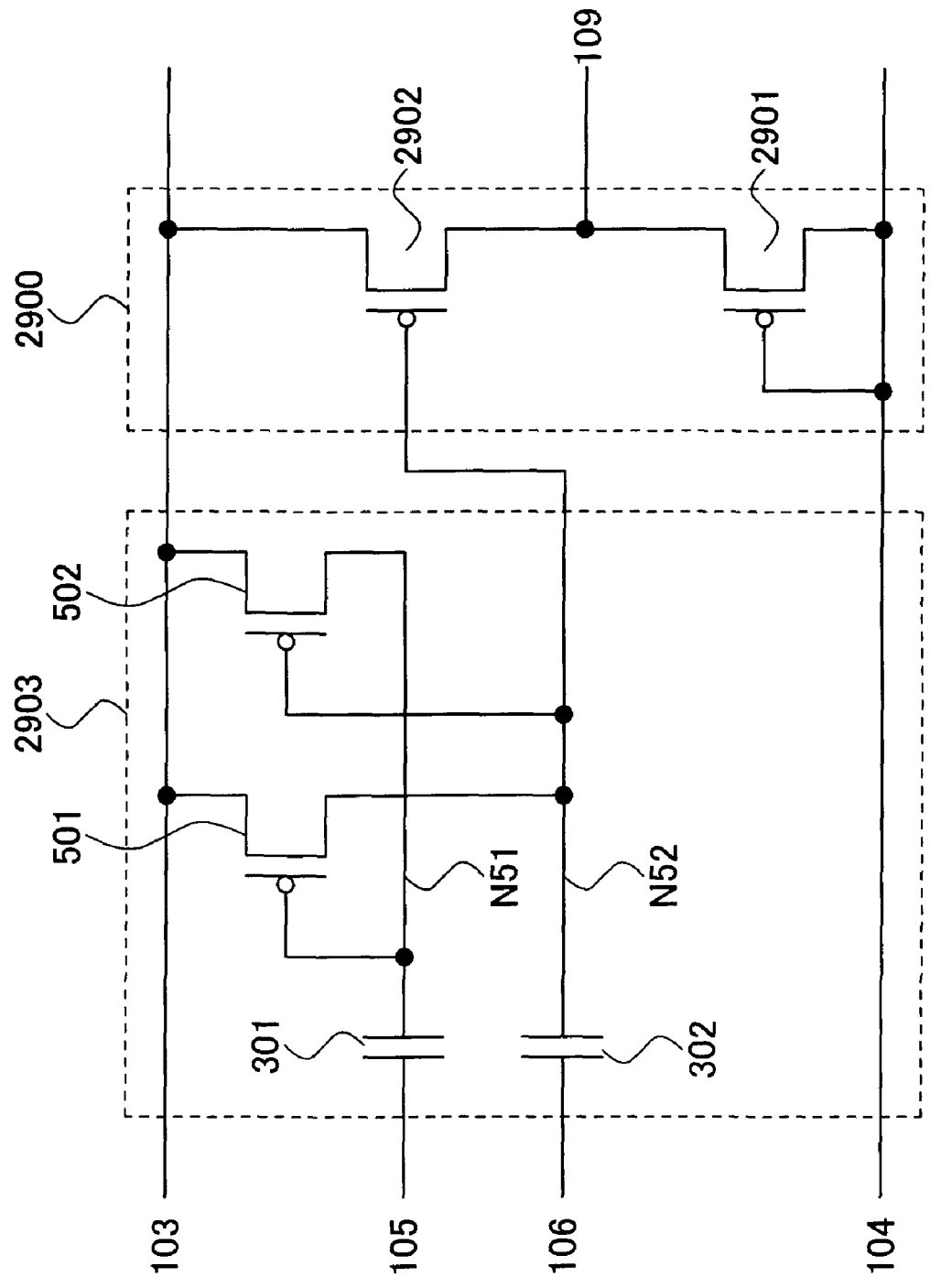
FIG. 29 is a diagram showing a structure of a level shifter of the present invention.

Here, although the level shifter shown in FIG. 15 includes the N-channel transistors and the capacitors, it may include P-channel transistors and capacitors. FIG. 29 shows a level shifter including P-channel transistors and capacitors.

A level shifter shown in FIG. 29 includes the capacitor 301, the capacitor 302, the transistor 501, the transistor 502, a transistor 2901, and a transistor 2902.

Note that the capacitor 301, the capacitor 302, the transistor 501, the transistor 502, the transistor 2901, and the transistor 2902 correspond to and have similar functions to the capacitor 701, the capacitor 702, the transistor 703, the transistor 704, the transistor 1501, and the transistor 1502 in FIG. 15 respectively. A logic circuit 2900 and an offset circuit 2903 correspond to and have similar functions to the logic circuit 1500 and the offset circuit 1503 in FIG. 15 respectively. The nodes N51 and N52 correspond to the nodes N71 and N72 in FIG. 15 respectively.

As shown in the level shifter in FIG. 29, a first electrode of the capacitor 301 is connected to the wiring 105. A first electrode of the capacitor 302 is connected to the wiring 106. A gate of the transistor 501 is connected to a second electrode of the capacitor 301, a first terminal of the transistor 501 is connected to the wiring 103, and a second terminal of the transistor 501 is connected to a second electrode of the capacitor 302. A gate of the transistor 502 is connected to the second electrode of the capacitor 302, a first terminal of the transistor 502 is connected to the wiring 103, and a second terminal of the transistor 502 is connected to the second electrode of the capacitor 301. Note that a connection point of the second electrode of the capacitor 301, the gate of the transistor 501, and the second terminal of the transistor 502 is denoted by the node N51. A connection point of the second electrode of the capacitor 302, the second terminal of the transistor 501, and the gate of the transistor 502 is denoted by the node N52. A gate of the transistor 2902 is connected to the node N52, a first terminal of the transistor 2902 is connected to the wiring 103, and a second terminal of the transistor 2902 is connected to the wiring 109. A gate of the transistor 2901 is connected to the wiring 104, a first terminal of the transistor 2901 is connected to the wiring 104, and a second terminal of the transistor 2901 is connected to the wiring 109.

Next, operations of the level shifter shown in FIG. 29 are described with reference to timing charts of FIGS. 30A to 30C. However, timing of potential change in the timing charts shown in FIGS. 30A to 30C can be determined as appropriate, and is not limited to that in the timing charts of FIGS. 30A to 30C.

Figure 30A:
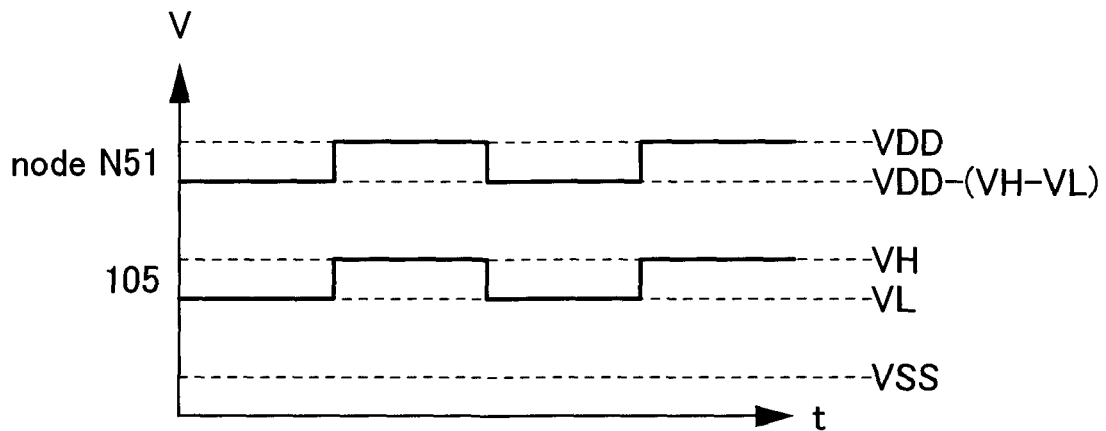
FIGS. 30A to 30C are diagrams each showing a timing chart of a level shifter of the present invention.
Figure 30B:
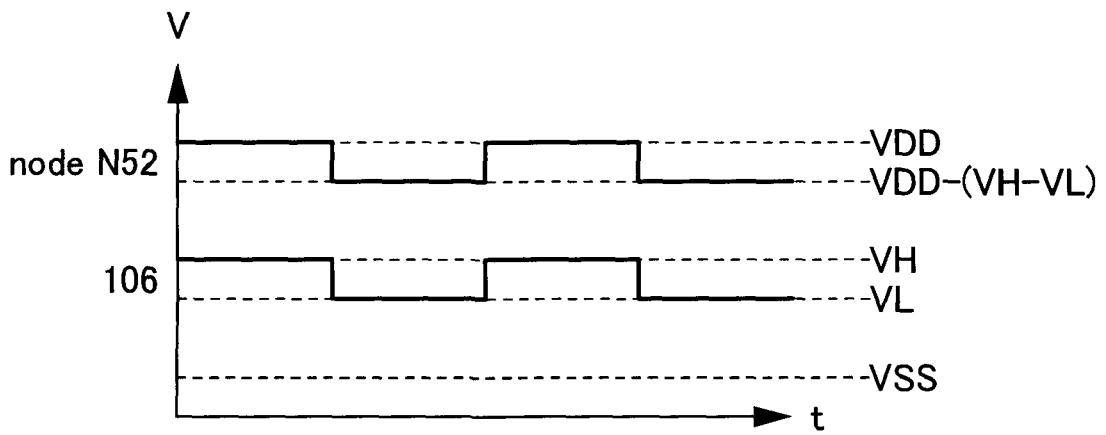
Figure 30C:
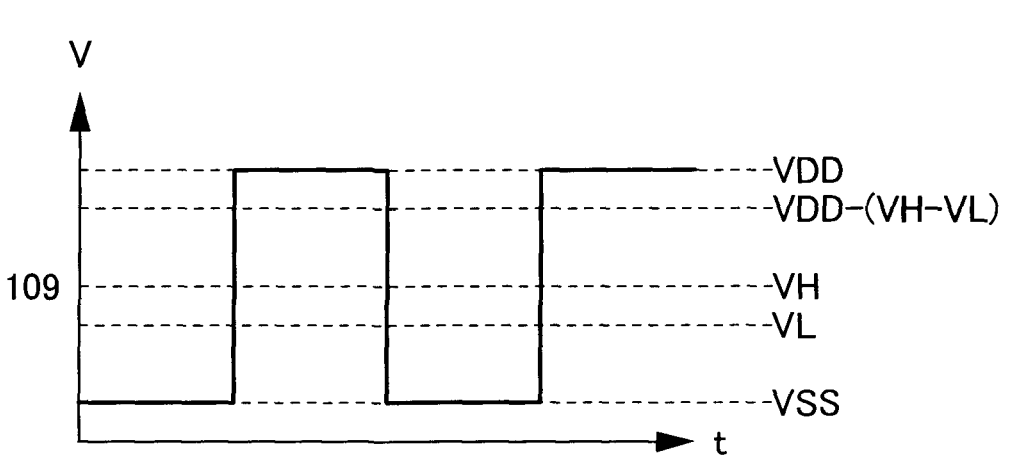

In the timing chart shown in FIG. 30A, a signal (a potential) supplied to the wiring 105 and a potential of the node N51 are shown. In the timing chart shown in FIG. 30B, a signal (a potential) supplied to the wiring 106 and a potential of the node N52 are shown. In the timing chart shown in FIG. 30C, a signal (a potential) supplied to the wiring 109 is shown.

Figure 31:
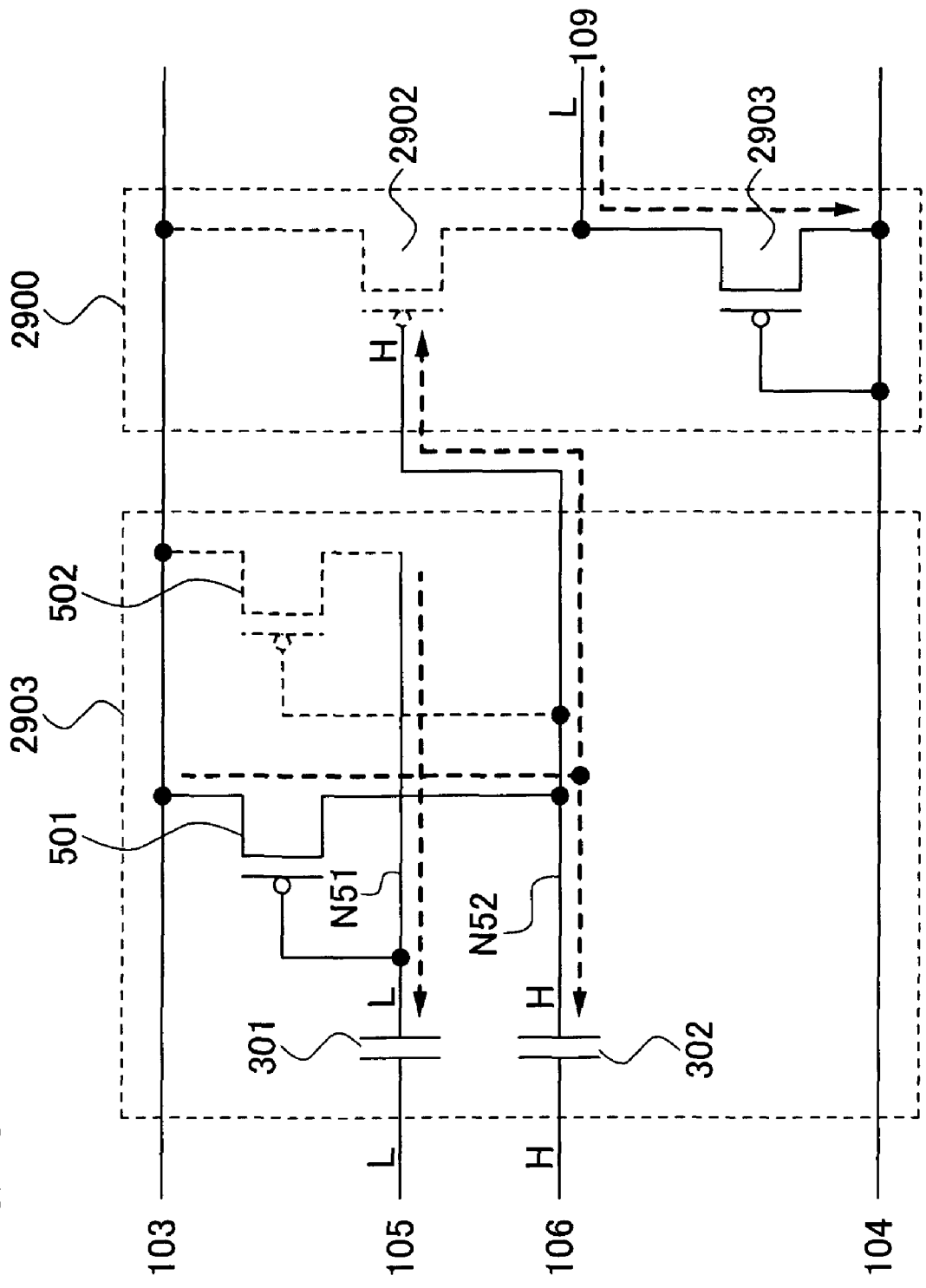
FIG. 31 is a diagram showing a structure of a level shifter of the present invention.
Figure 32:
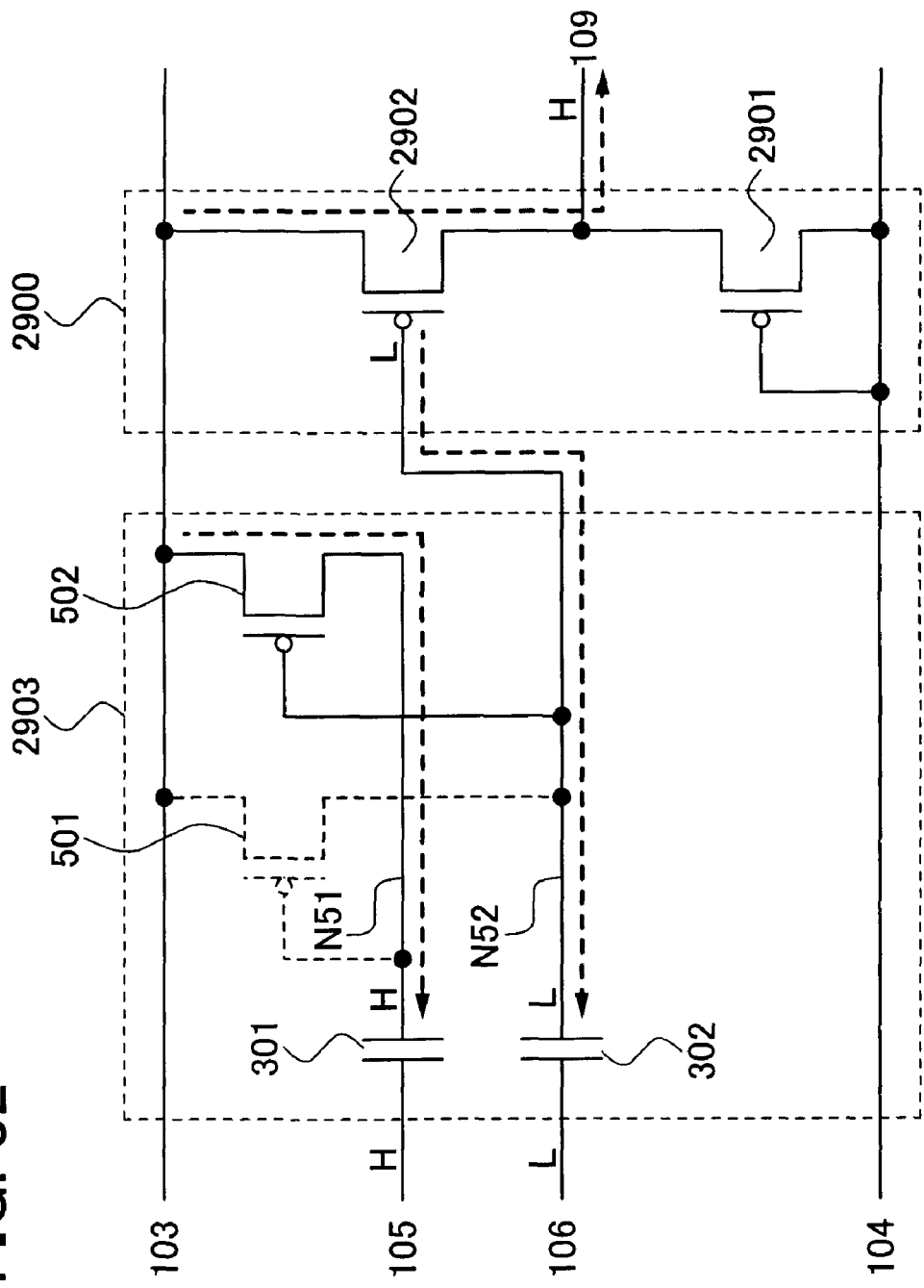
FIG. 32 is a diagram showing a structure of a level shifter of the present invention.

FIG. 31 shows an operation of the level shifter shown in FIG. 29 when an L signal is supplied to the wiring 105 and an H signal is supplied to the wiring 106. FIG. 32 shows an operation of the level shifter shown in FIG. 29 when an H signal is supplied to the wiring 105 and an L signal is supplied to the wiring 106. Note here that the operation shown in FIG. 31 is denoted by a first operation and the operation shown in FIG. 32 is denoted by a second operation.

Since operations of the offset circuit 2903 are similar to those of the offset circuit shown in FIG. 5A, specific description thereof is omitted.

First, the first operation of the level shifter shown in FIG. 29 is described with reference to the timing charts shown in FIGS. 30A to 30C and FIG. 31.

When the wiring 105 becomes an L level, the potential of the node N51 becomes (VDD−(VH−VL)). On the other hand, when the wiring 106 becomes an H level, the potential of the node N52 becomes VDD. Consequently, the transistor 2902 is turned off, and the power source potential VSS is supplied to the wiring 109, so that the potential of the wiring 109 is decreased. This potential decrease of the wiring 109 continues until the potential of the wiring 109 becomes a potential (VSS+|Vth2901|) obtained by adding an absolute value of a threshold voltage Vth2901 of the transistor 2901 to the power source potential VSS, and then, the transistor 2901 is turned off. Accordingly, the potential of the wiring 109 becomes (VSS+|Vth2901|), and an L signal is outputted from the wiring 109.

Next, the second operation of the level shifter shown in FIG. 29 is described with reference to the timing charts shown in FIGS. 30A to 30C and FIG. 32.

When the wiring 105 becomes an H level, the potential of the node N51 becomes VDD. On the other hand, when the wiring 106 becomes an L level, the potential of the node N52 becomes (VDD−(VH−VL)). Consequently, the transistor 2902 is turned on, and the power source potential VDD is supplied to the wiring 109, so that an H signal is outputted from the wiring 109. Note that the potential of the wiring 109 is determined by operating points of the transistors 2901 and 2902, thus it is a little lower than the power source potential VDD.

By the above-described first and second operations, the level shifter shown in FIG. 29 can shift each control signal supplied to the wirings 105 and 106 such that the H-signal potential is shifted from VH to VDD and the L-signal potential is shifted from VL to VSS, and then output through the wiring 109.

Since the gate voltage of the transistor 2902 is VDD in the first operation and is (VDD−(VH−VL)) in the second operation, through current of the logic circuit 2900 is reduced. This is because the amplitude voltage of the gate of the transistor 2902 is small (VH−VL). Therefore, power consumption of a semiconductor device including the level shifter shown in FIG. 29 is reduced because through current of the logic circuit 2900 is small.

Further, since the amplitude voltage of the gate of the transistor 2902 is small, noise generated in the logic circuit 2900 is reduced. This is because noise generated through parasitic capacitance between the gate and the second terminal (the wiring 109) of the transistor 2902 becomes small.

Note also that as described above, a MOS capacitor may be employed as each of the capacitors 301 and 302. Further, in the case of the level shifter shown in FIG. 29, it is preferable to use a P-channel transistor for each capacitor similarly to the offset circuit shown in FIG. 6A.

Figure 33:
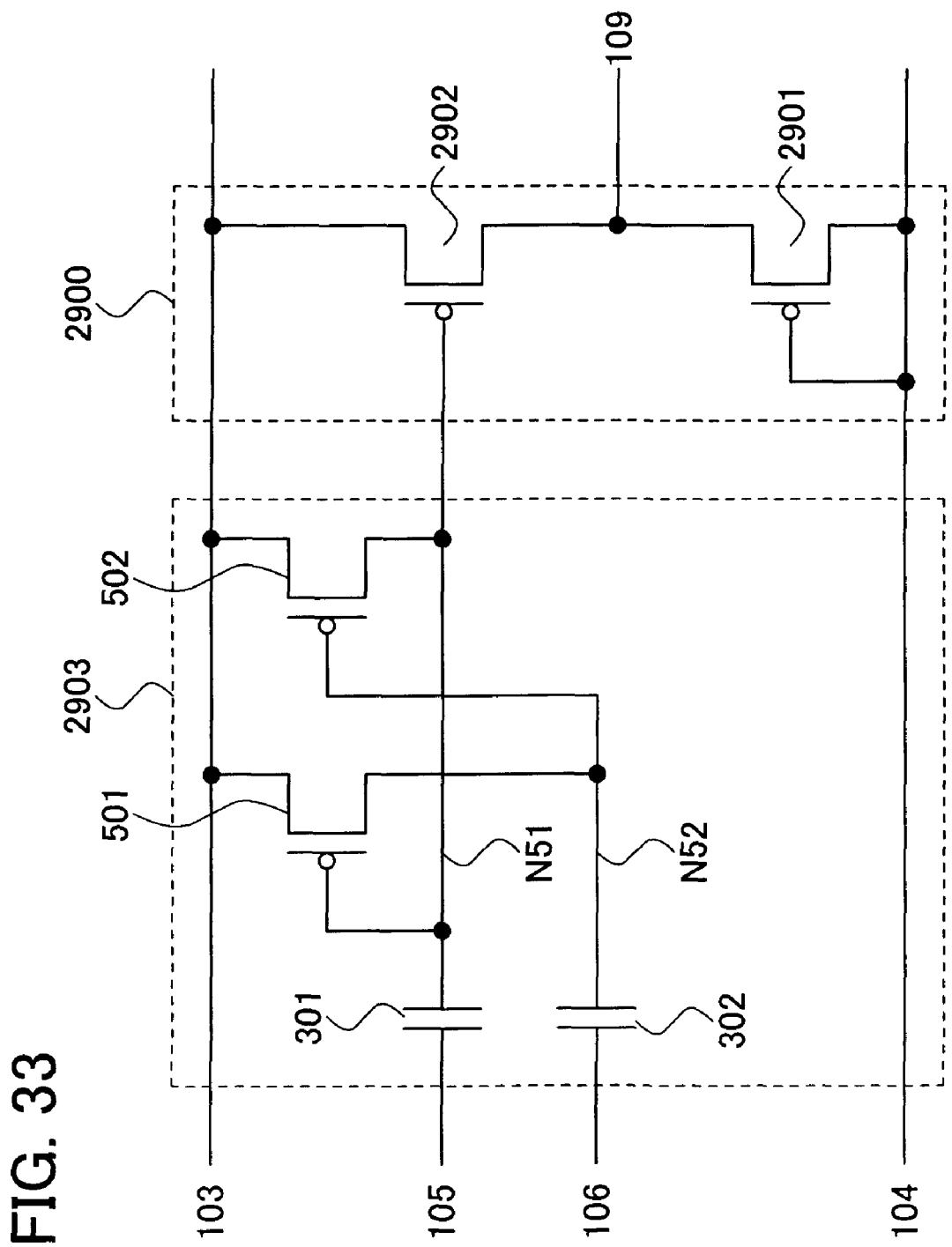
FIG. 33 is a diagram showing a structure of a level shifter of the present invention.
Figure 34A:
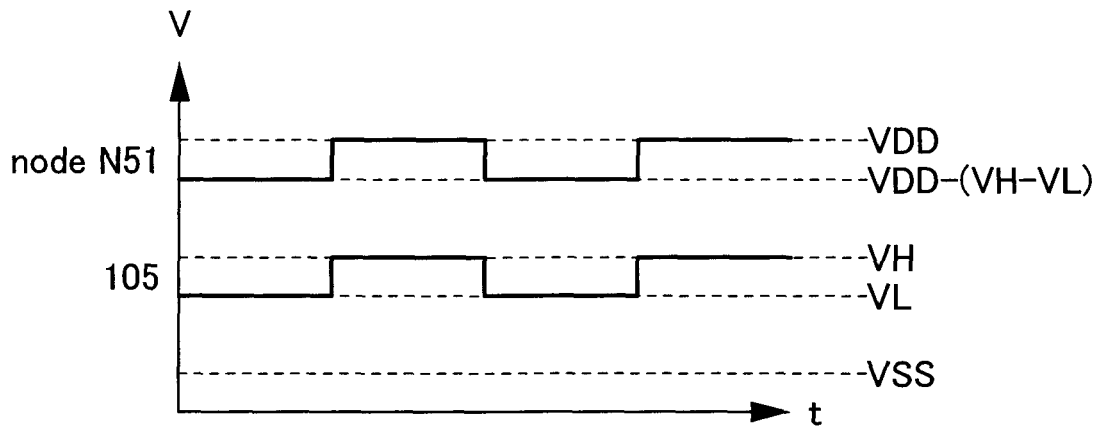
FIGS. 34A to 34C are diagrams each showing a timing chart of a level shifter of the present invention.
Figure 34B:
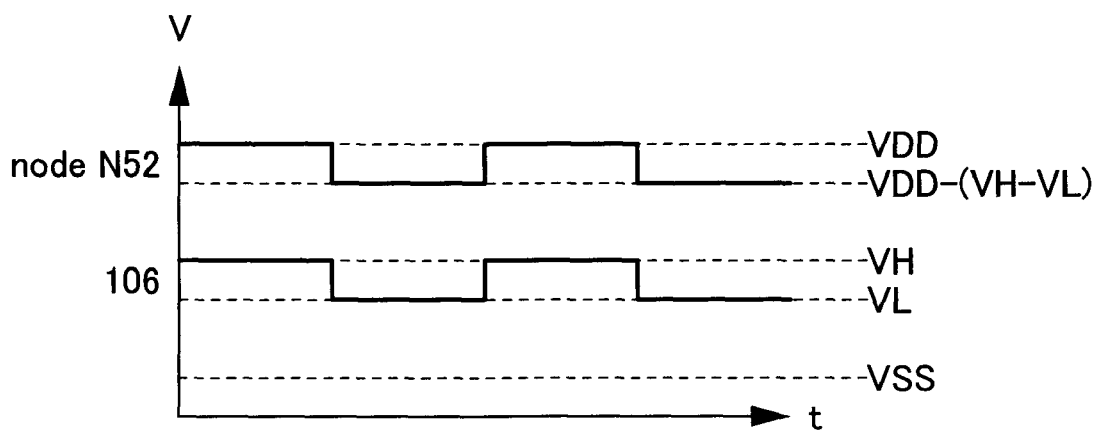
Figure 34C:
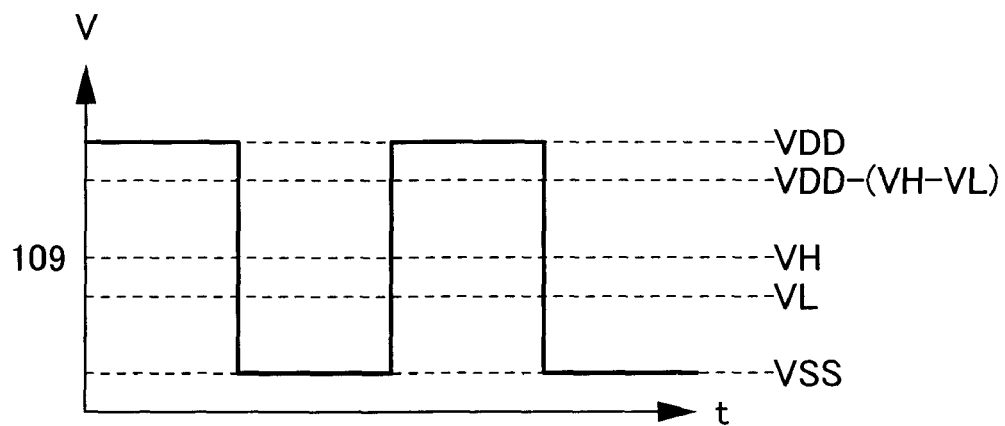

Note that as shown in FIG. 33, the gate of the transistor 2902 may also be connected to the node N51 in the level shifter shown in FIG. 29. Timing charts in the case where the gate of the transistor 2902 is connected to the node N51 are shown in FIGS. 34A to 34C.

Note that this embodiment mode can be implemented freely combining with any description in the other embodiment modes of this specification. Further, the descriptions in this embodiment mode can be freely combined to be implemented.

Embodiment Mode 6

This embodiment mode describes specific structures of the level shifter described in Embodiment Mode 1, which are different from Embodiment Mode 5.

Note that in this embodiment mode and Embodiment Modes 1 to 5, reference numerals are used in common, and detailed description of the same portions and portions having similar functions is not repeated.

First, a specific structure example of a level shifter of the present invention is described with reference to FIG. 21.

Figure 21:
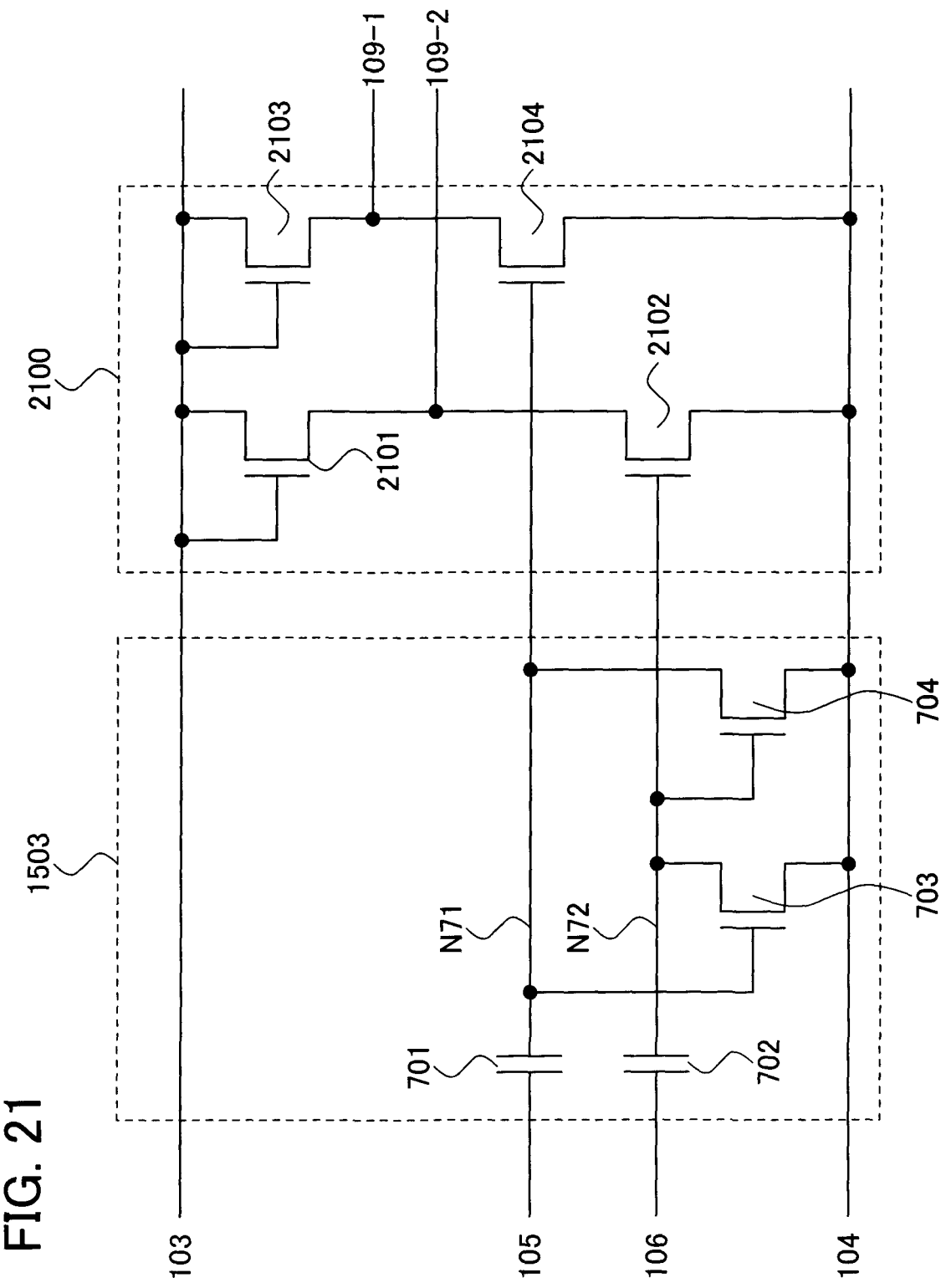
FIG. 21 is a diagram showing a structure of a level shifter of the present invention.
Figure 22A:
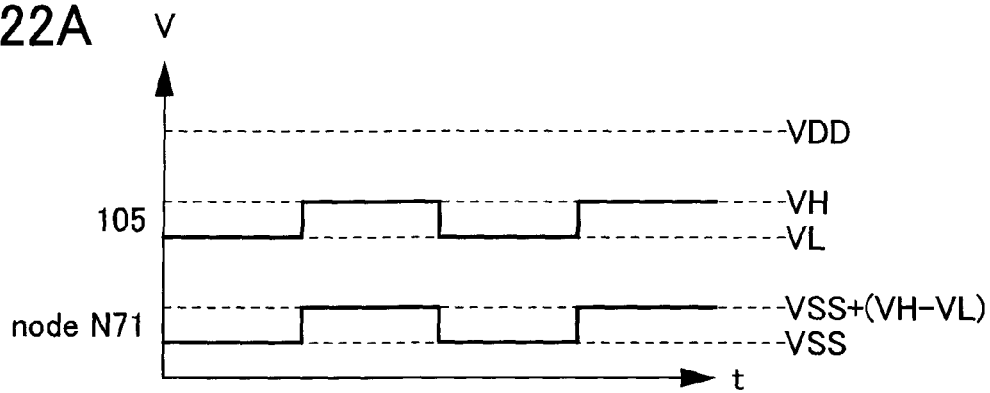
FIGS. 22A to 22D are diagrams each showing a timing chart of a level shifter of the present invention.
Figure 22B:
Figure 22C:
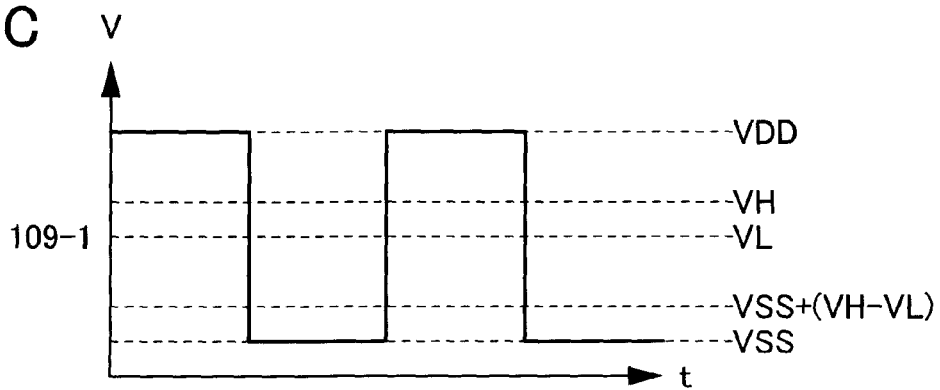
Figure 22D:
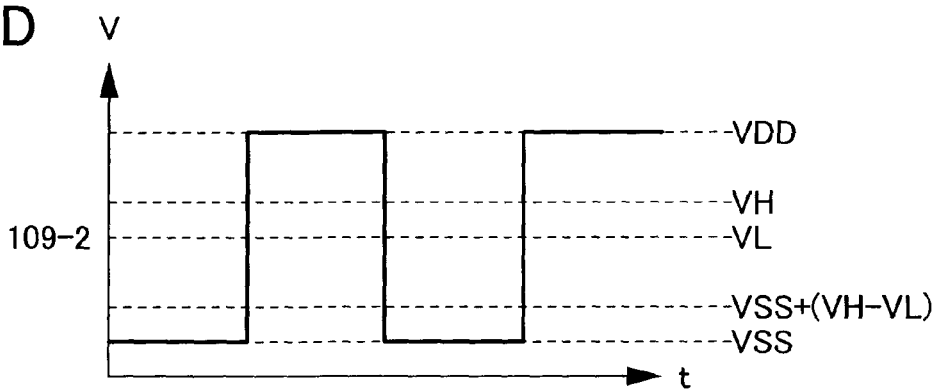

A level shifter shown in FIG. 21 includes the capacitor 701, the capacitor 702, the transistor 703, the transistor 704, a transistor 2101, a transistor 2102, a transistor 2103, and a transistor 2104.

As shown in the level shifter in FIG. 21, a gate of the transistor 2101 is connected to the wiring 103, a first terminal of the transistor 2101 is connected to the wiring 103, and a second terminal of the transistor 2101 is connected to a wiring 109-2. A gate of the transistor 2102 is connected to the node N72, a first terminal of the transistor 2102 is connected to the wiring 104, and a second terminal of the transistor 2102 is connected to the wiring 109-2. A gate of the transistor 2103 is connected to the wiring 103, a first terminal of the transistor 2103 is connected to the wiring 103, and a second terminal of the transistor 2103 is connected to a wiring 109-1. A gate of the transistor 2104 is connected to the node N71, a first terminal of the transistor 2104 is connected to the wiring 104, and a second terminal of the transistor 2104 is connected to the wiring 109-1.

The logic circuit 1500 shown in FIG. 15 includes the transistor 2101 and the transistor 2102. Similarly, the logic circuit 1500 shown in FIG. 15 includes the transistor 2103 and the transistor 2104. A logic circuit 2100 includes the transistors 2101, 2102, 2103, and 2104.

Note that the transistors 2101, 2102, 2103, and 2104 are N-channel transistors. Therefore, since the level shifter shown in FIG. 21 can be formed by using the transistors of only the N-channel type, amorphous silicon can be used for a semiconductor layer in the level shifter shown in FIG. 21 so that a manufacturing process can be simplified. Consequently, manufacturing cost can be reduced and a yield can be improved. Further, a large semiconductor device can also be manufactured.

Further, in the level shifter shown in FIG. 21, the manufacturing process can be simplified even if polysilicon or single crystalline silicon is used for the semiconductor layer.

Next, operations of the level shifter shown in FIG. 21 are described with reference to timing charts of FIGS. 22A to 22D. However, timing of potential change in the timing charts shown in FIGS. 22A to 22D can be determined as appropriate, and is not limited to that in the timing charts of FIGS. 22A to 22D.

Figure 23:
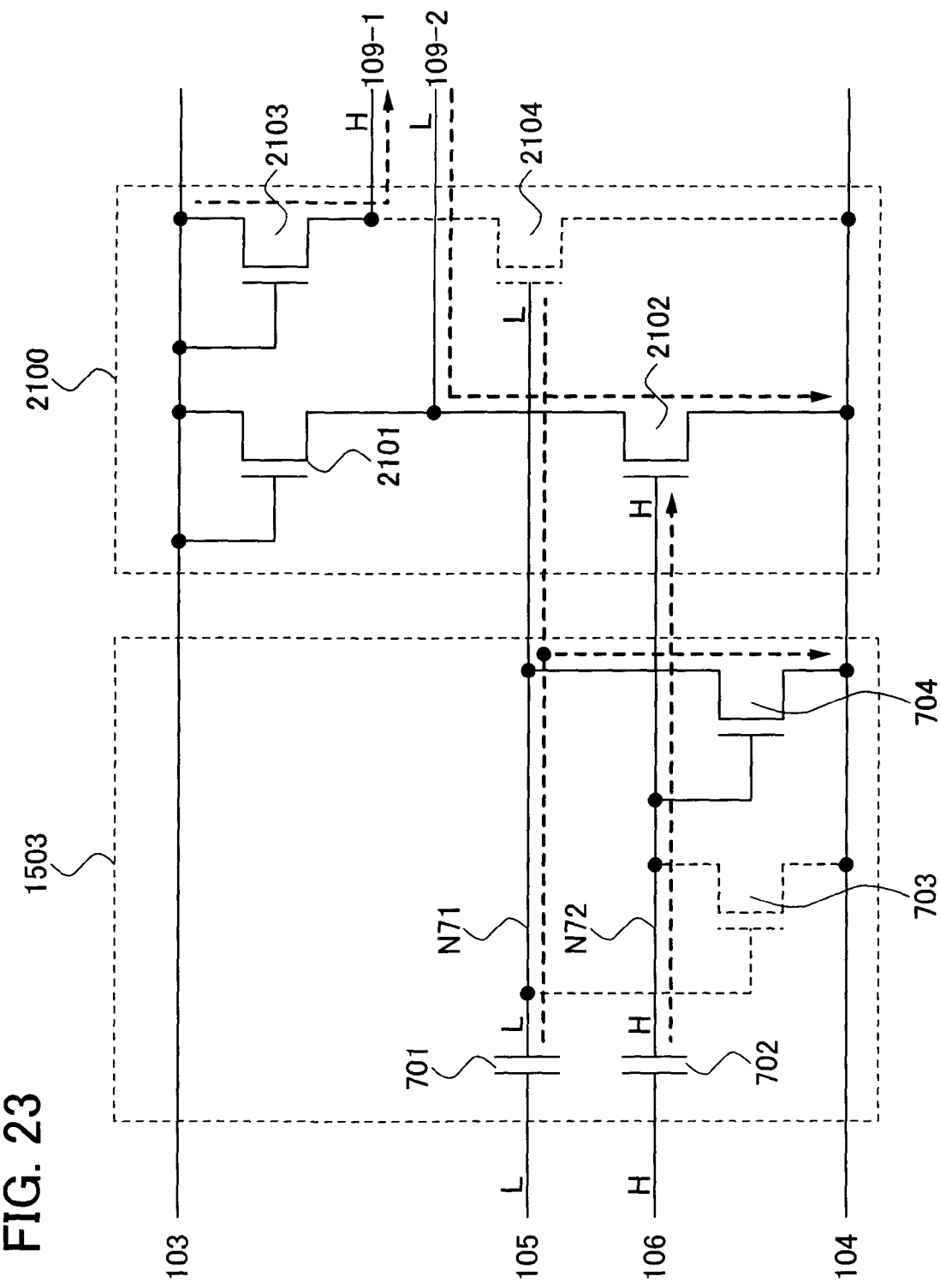
FIG. 23 is a diagram showing a structure of a level shifter of the present invention.
Figure 24:
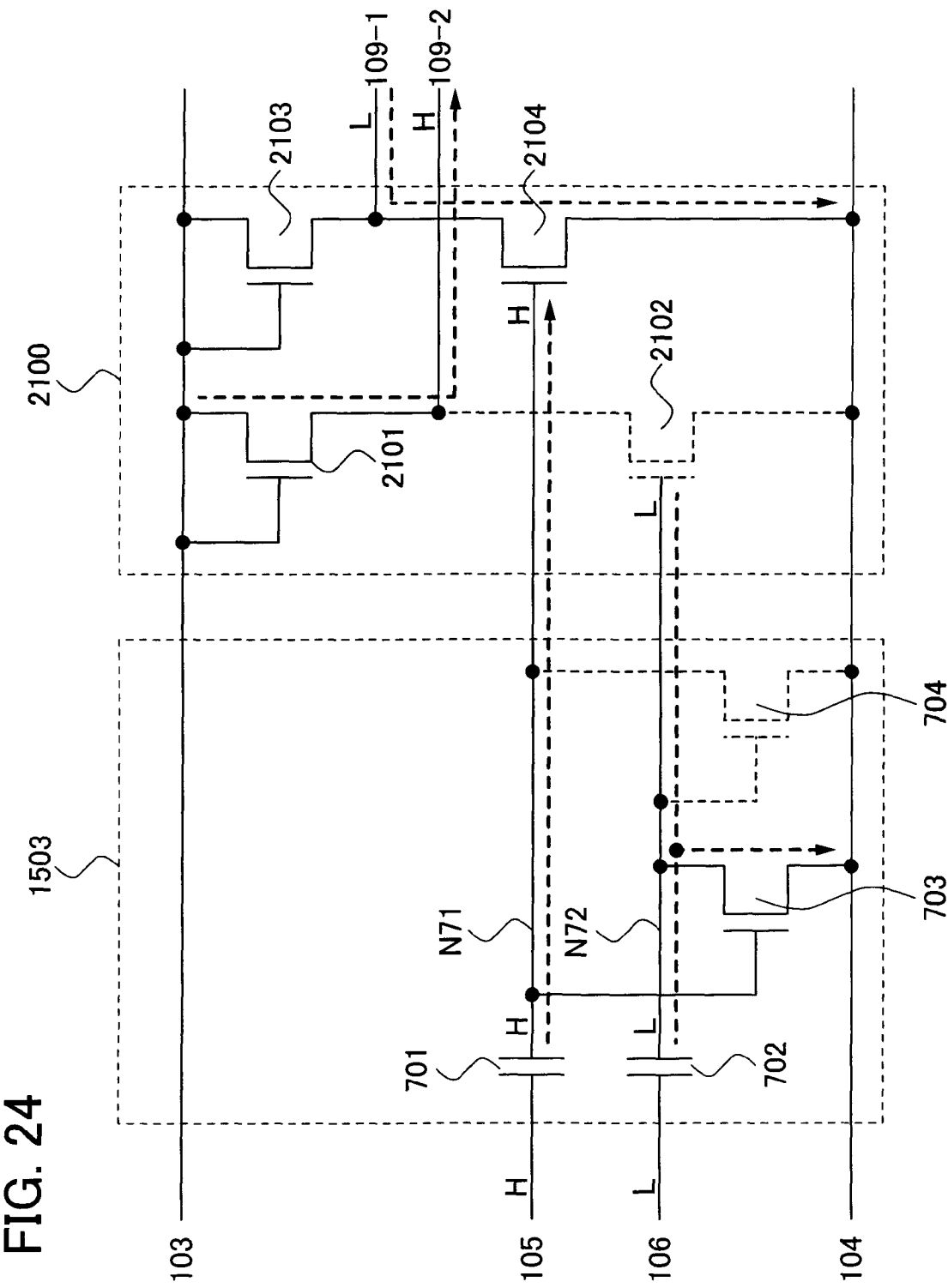
FIG. 24 is a diagram showing a structure of a level shifter of the present invention.

FIG. 23 shows an operation of the level shifter shown in FIG. 21 when an L signal is supplied to the wiring 105 and an H signal is supplied to the wiring 106. FIG. 24 shows an operation of the level shifter shown in FIG. 21 when an H signal is supplied to the wiring 105 and an L signal is supplied to the wiring 106. Note here that the operation shown in FIG. 23 is denoted by a first operation and the operation shown in FIG. 24 is denoted by a second operation.

Since operations of the offset circuit 1503 are similar to those of the offset circuit shown in FIG. 7A, specific description thereof is omitted.

Further, since operations of a circuit including the transistors 2101 and 2102 and a circuit including the transistors 2103 and 2104 are similar to those of the logic circuit 1500 shown in FIG. 15, specific description thereof is omitted.

First, the first operation of the level shifter shown in FIG. 21 is described with reference to the timing charts shown in FIGS. 22A to 22D and FIG. 23.

In the first operation, as shown in FIG. 23, an H signal is outputted from the wiring 109-1 and an L signal is outputted from the wiring 109-2. Note that the potential of the wiring 109-1 is, similarly to the logic circuit 1500 shown in FIG. 15, a potential (VDD−Vth2103) obtained by subtracting a threshold voltage Vth2103 of the transistor 2103 from the power source potential VDD. Further, the potential of the wiring 109-2 is, similarly to the logic circuit 1500 shown in FIG. 15, determined by operating points of the transistors 2101 and 2102, thus it is a little higher than the power source potential VSS.

Next, the second operation of the level shifter shown in FIG. 21 is described with reference to the timing charts shown in FIGS. 22A to 22D and FIG. 24.

In the second operation, as shown in FIG. 24, an L signal is outputted from the wiring 109-1 and an H signal is outputted from the wiring 109-2. Note that the potential of the wiring 109-1 is, similarly to the logic circuit 1500 shown in FIG. 15, determined by operating points of the transistors 2103 and 2104, thus it is a little higher than the power source potential VSS. Further, the potential of the wiring 109-2 is, similarly to the logic circuit 1500 shown in FIG. 15, a potential (VDD−Vth2101) obtained by subtracting a threshold voltage Vth2101 of the transistor 2101 from the power source potential VDD.

Here, functions of the logic circuit 2100 are described.

The logic circuit 2100 includes two logic circuits 1500 shown in FIG. 15, and outputs two reversed signals through the wirings 109-1 and 109-2 respectively.

Here, functions of the transistors 2101 to 2104 are described.

First, the transistor 2101 has a function as a diode. Input terminals thereof are the gate and the first terminal, and an output terminal thereof is the second terminal. The transistor 2101 is any element having a resistance component. By using a resistor instead of the transistor 2101, the potential of the wiring 109-2 can be made equal to the power source potential VDD in the second operation in the logic circuit 2100.

The transistor 2102 has a function as a switch of selecting whether the wiring 104 and the wiring 109-2 are connected to each other or not depending on the potential of the node N72. The transistor 2102 is turned on and supplies the power source potential VSS to the wiring 109-2 in the first operation.

The transistor 2103 has a function as a diode. Input terminals thereof are the gate and the first terminal, and an output terminal thereof is the second terminal. The transistor 2103 is any element having a resistance component. By using a resistor instead of the transistor 2103, the potential of the wiring 109-1 can be made equal to the power source potential VDD in the first operation in the logic circuit 2100.

The transistor 2104 has a function as a switch of selecting whether the wiring 104 and the wiring 109-1 are connected to each other or not depending on the potential of the node N71. The transistor 2104 is turned on and supplies the power source potential VSS to the wiring 109-1 in the first operation.

By the above-described first and second operations, the level shifter shown in FIG. 21 can shift each control signal supplied to the wirings 105 and 106 such that the H-signal potential is shifted from VH to VDD and the L-signal potential is shifted from VL to VSS, and then output through the wirings 109-1 and 109-2.

The level shifter shown in FIG. 21 can output two signals each of which H and L levels are revered through the wirings 109-1 and 109-2 respectively.

Since the gate voltage of the transistor 2102 is (VSS+(VH−VL)) in the first operation and VSS in the second operation, through current of the logic circuit 2100 is reduced. This is because the amplitude voltage of the gate of the transistor 2102 is small (VH−VL). Therefore, power consumption of a semiconductor device including the level shifter shown in FIG. 21 is reduced because through current of the logic circuit 2100 is small.

Similarly to the transistor 2102, since the gate voltage of the transistor 2104 is VSS in the first operation and is (VSS+(VH−VL)) in the second operation, through current of the logic circuit 2100 is reduced. This is because the amplitude voltage of the gate of the transistor 2104 is small (VH−VL). Therefore, power consumption of a semiconductor device including the level shifter shown in FIG. 21 is reduced because through current of the logic circuit 2100 is small.

Further, since the amplitude voltage of the gate of the transistor 2102 is small, noise generated in the logic circuit 2100 is reduced. This is because noise generated through parasitic capacitance between the gate and the second terminal (the wiring 109-2) of the transistor 2102 becomes small.

Similarly to the transistor 2102, since the amplitude voltage of the gate of the transistor 2104 is small, noise generated in the logic circuit 2100 is reduced. This is because noise generated through parasitic capacitance between the gate and the second terminal (the wiring 109-1) of the transistor 2104 becomes small.

Further, it is preferable that capacitance of the capacitors 701 and 702 be almost equal to each other. This is because if capacitance of the capacitors 701 and 702 are equal to each other, timing deviations such as output-signal delays of the wirings 109-1 and 109-2 can be equal to each other.

Note also that as described above, a MOS capacitor may be employed as each of the capacitors 701 and 702. Further, in the case of the level shifter shown in FIG. 21, it is preferable to use an N-channel transistor for each capacitor similarly to the offset circuit shown in FIG. 8A. This is because by forming each capacitor using an N-channel transistor, amorphous silicon can be used for a semiconductor layer in the level shifter shown in FIG. 21 so that a manufacturing process can be simplified. Consequently, manufacturing cost can be reduced and a yield can be improved. Further, a large semiconductor device can also be manufactured.

Further, in the level shifter shown in FIG. 21, the manufacturing process can be simplified even if polysilicon or single crystalline silicon is used for the semiconductor layer.

Figure 35:
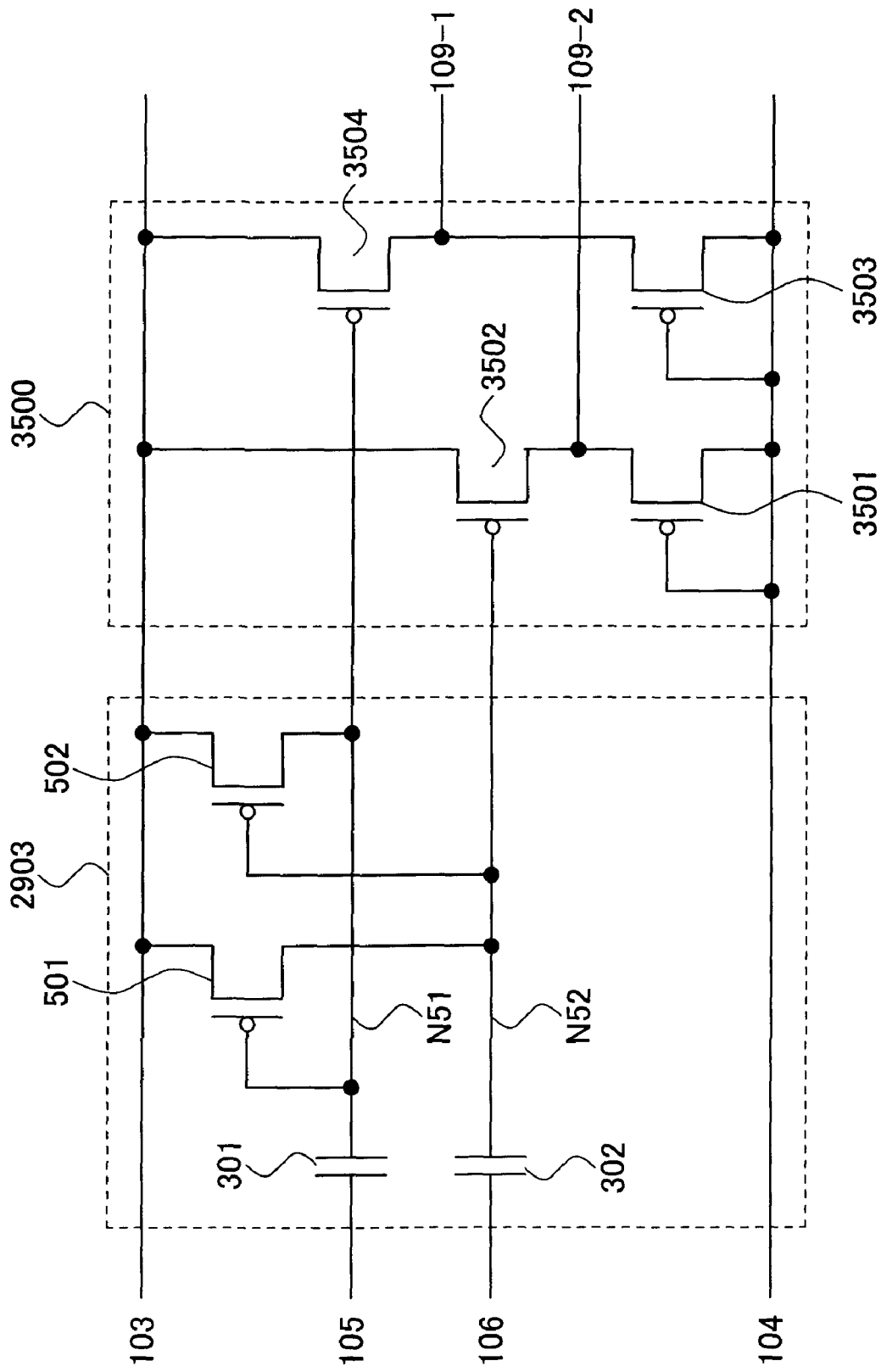
FIG. 35 is a diagram showing a structure of a level shifter of the present invention.
Figure 36A:
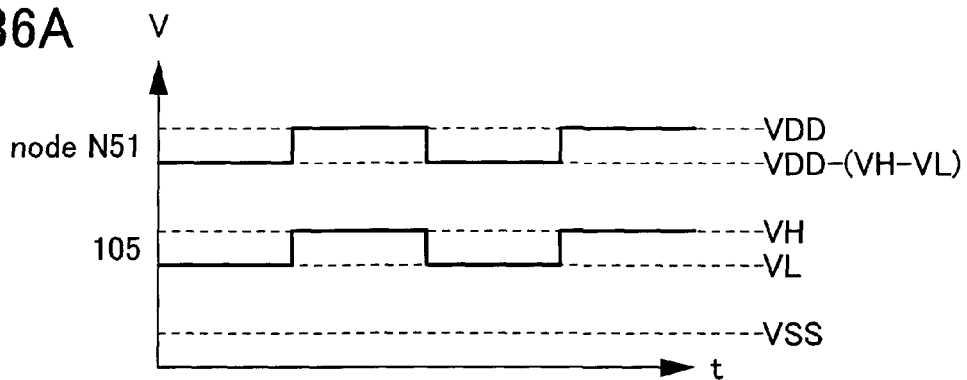
FIGS. 36A to 36D are diagrams each showing a timing chart of a level shifter of the present invention.
Figure 36B:
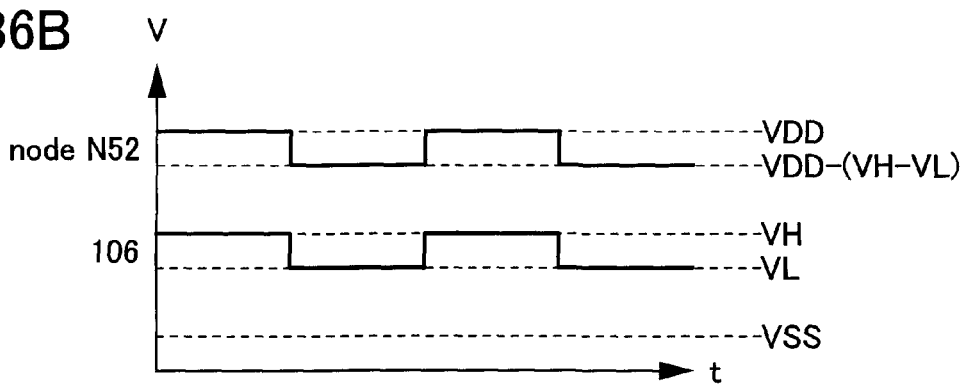
Figure 36C:
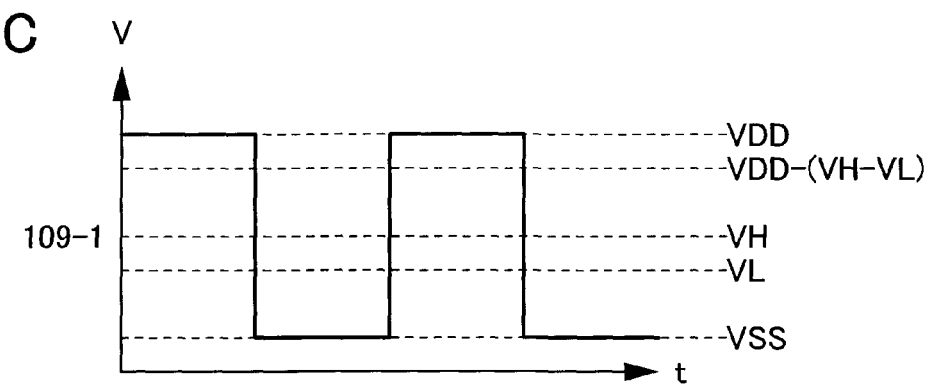
Figure 36D:
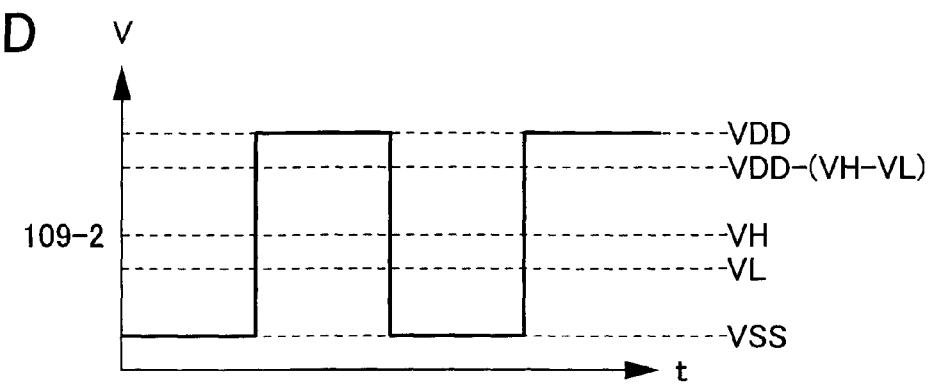

Here, although the level shifter shown in FIG. 21 includes the N-channel transistors and the capacitors, it may include P-channel transistors and capacitors. FIG. 35 shows a level shifter including P-channel transistors and capacitors.

A level shifter shown in FIG. 35 includes the capacitor 701, the capacitor 702, the transistor 501, the transistor 502, a transistor 3501, a transistor 3502, a transistor 3503, and a transistor 3504.

Note that the capacitor 301, the capacitor 302, the transistor 501, the transistor 502, the transistor 3501, the transistor 3502, the transistor 3503, and the transistor 3504 correspond to and have similar functions to the capacitor 701, the capacitor 702, the transistor 703, the transistor 704, the transistor 2101, the transistor 2102, the transistor 2103, and the transistor 2104 in FIG. 21 respectively. The offset circuit 2903 and a logic circuit 3500 correspond to and have similar functions to the offset circuit 1503 and the logic circuit 2100 in FIG. 21 respectively. The nodes N51 and N52 correspond to the nodes N71 and N72 in FIG. 21.

As shown in the level shifter in FIG. 35, a gate of the transistor 3501 is connected to the wiring 104, a first terminal of the transistor 3501 is connected to the wiring 104, and a second terminal of the transistor 3501 is connected to the wiring 109-2. A gate of the transistor 3502 is connected to the node N52, a first terminal of the transistor 3502 is connected to the wiring 103, and a second terminal of the transistor 3502 is connected to the wiring 109-2. A gate of the transistor 3503 is connected to the wiring 104, a first terminal of the transistor 3503 is connected to the wiring 104, and a second terminal of the transistor 3503 is connected to the wiring 109-1. A gate of the transistor 3504 is connected to the node N51, a first terminal of the transistor 3504 is connected to the wiring 103, and a second terminal of the transistor 3504 is connected to the wiring 109-1.

Next, operations of the level shifter shown in FIG. 35 are described with reference to timing charts of FIGS. 36A to 36D. However, timing of potential change in the timing charts shown in FIGS. 36A to 36D can be determined as appropriate, and is not limited to that in the timing charts of FIGS. 36A to 36D.

Figure 37:
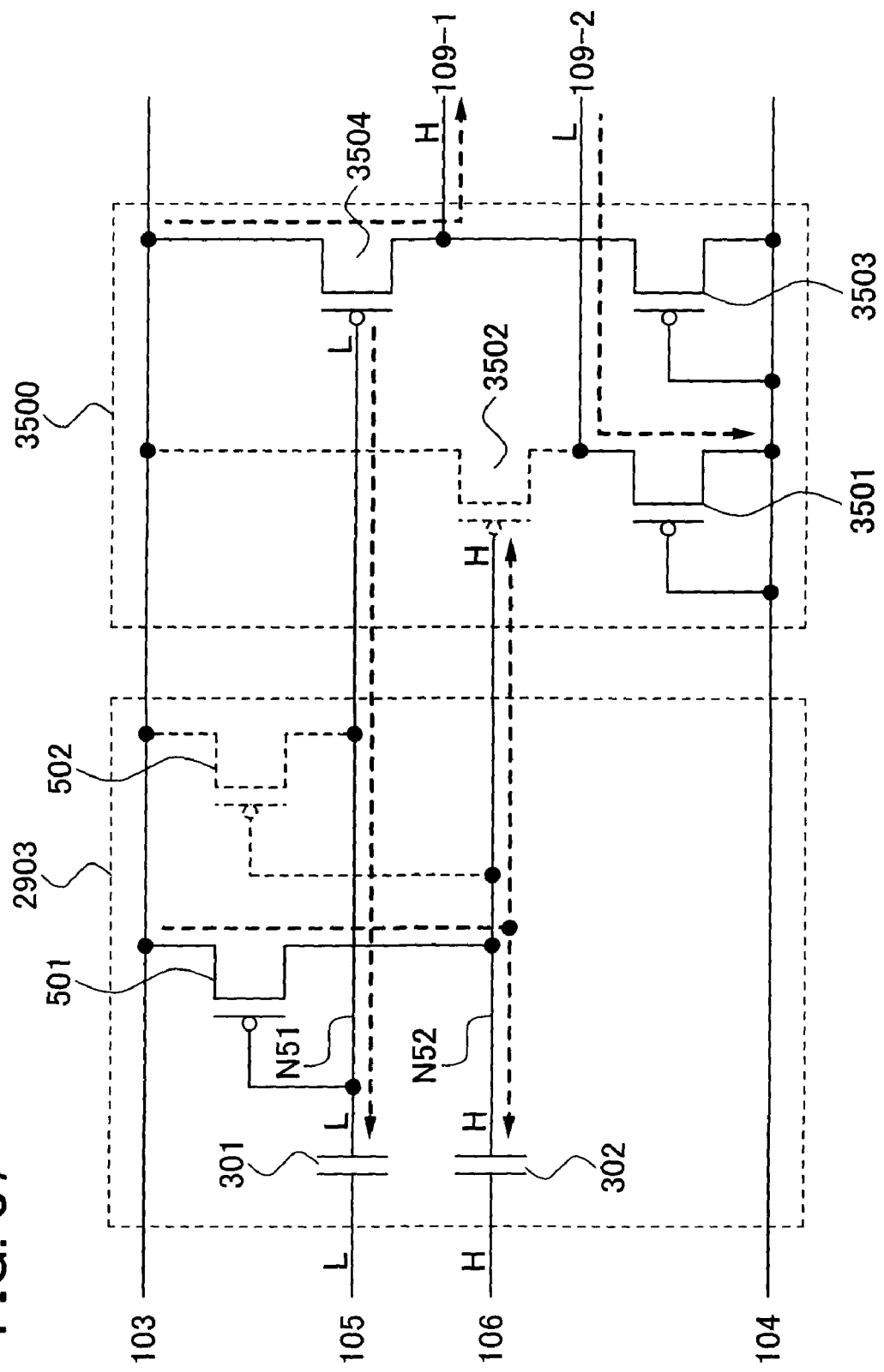
FIG. 37 is a diagram showing a structure of a level shifter of the present invention.
Figure 38:
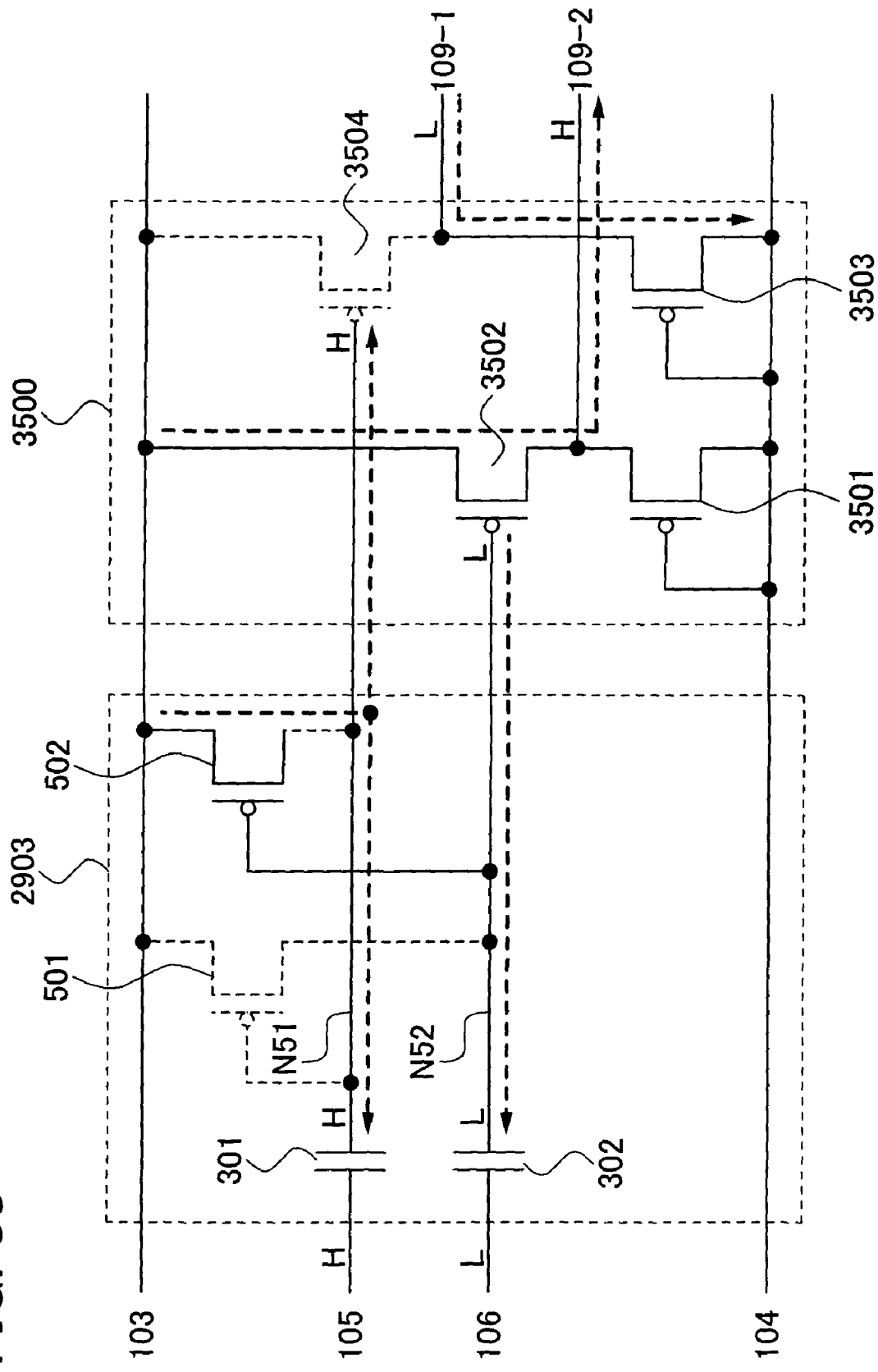
FIG. 38 is a diagram showing a structure of a level shifter of the present invention.

FIG. 37 shows an operation of the level shifter shown in FIG. 35 when an L signal is supplied to the wiring 105 and an H signal is supplied to the wiring 106. FIG. 38 shows an operation of the level shifter shown in FIG. 35 when an H signal is supplied to the wiring 105 and an L signal is supplied to the wiring 106. Note here that the operation shown in FIG. 37 is denoted by a first operation and the operation shown in FIG. 38 is denoted by a second operation.

Since operations of the offset circuit 2903 are similar to those of the offset circuit shown in FIG. 5A, specific description thereof is omitted.

Further, since operations of a circuit including the transistors 3501 and 3502 and a circuit including the transistors 3503 and 3504 are similar to those of the logic circuit 2900 shown in FIG. 29, specific description thereof is omitted.

First, the first operation of the level shifter shown in FIG. 35 is described with reference to the timing charts shown in FIGS. 36A to 36D and FIG. 37.

In the first operation, as shown in FIG. 37, an H signal is outputted from the wiring 109-1 and an L signal is outputted from the wiring 109-2. Note that the potential of the wiring 109-1 is, similarly to the logic circuit 2900 shown in FIG. 29, determined by operating points of the transistors 3503 and 3504, thus it is a little lower than the power source potential VDD. Further, the potential of the wiring 109-2 is, similarly to the logic circuit 2900 shown in FIG. 29, a potential (VSS+|Vth3501|) obtained by adding an absolute value of a threshold voltage Vth3501 of the transistor 3501 to the power source potential VSS.

Next, the second operation of the level shifter shown in FIG. 35 is described with reference to the timing charts shown in FIGS. 36A to 36D and FIG. 38.

In the second operation, as shown in FIG. 38, an L signal is outputted from the wiring 109-1 and an H signal is outputted from the wiring 109-2. Note that the potential of the wiring 109-1 is, similarly to the logic circuit 2900 shown in FIG. 29, a potential (VSS+|Vth3503|) obtained by adding an absolute value of a threshold voltage Vth3503 of the transistor 3503 to the power source potential VSS. Further, the potential of the wiring 109-2 is, similarly to the logic circuit 2900 shown in FIG. 29, determined by operating points of the transistors 3501 and 3502, thus it is a little lower than the power source potential VDD.

By the above-described first and second operations, the level shifter shown in FIG. 35 can shift each control signal supplied to the wirings 105 and 106 such that the H-signal potential is shifted from VH to VDD and the L-signal potential is shifted from VL to VSS, and then output through the wirings 109-1 and 109-2.

The level shifter shown in FIG. 35 can output two signals each of which H and L levels are revered through the wirings 109-1 and 109-2.

Since the gate voltage of the transistor 3502 is VDD in the first operation and is (VDD−(VH−VL)) in the second operation, through current of the logic circuit 3500 is reduced. This is because the amplitude voltage of the gate of the transistor 3502 is small (VH−VL). Therefore, power consumption of a semiconductor device including the level shifter shown in FIG. 35 is reduced because through current of the logic circuit 3500 is small.

Similarly to the transistor 3502, since the gate voltage of the transistor 3504 is (VDD−(VH−VL)) in the first operation and is VDD in the second operation, through current of the logic circuit 3500 is reduced. This is because the amplitude voltage of the gate of the transistor 3504 is small (VH−VL). Therefore, power consumption of a semiconductor device including the level shifter shown in FIG. 35 is reduced because through current of the logic circuit 3500 is small.

Further, since the amplitude voltage of the gate of the transistor 3502 is small, noise generated in the logic circuit 3500 is reduced. This is because noise generated through parasitic capacitance between the gate and the second terminal (the wiring 109-2) of the transistor 3502 becomes small.

Similarly to the transistor 3502, since the amplitude voltage of the gate of the transistor 3504 is small, noise generated in the logic circuit 3500 is reduced. This is because noise generated through parasitic capacitance between the gate and the second terminal (the wiring 109-1) of the transistor 3504 becomes small.

Further, it is preferable that capacitance of the capacitors 301 and 302 be almost equal to each other. This is because if capacitance of the capacitors 301 and 302 are equal to each other, timing deviations such as output-signal delays of the wirings 109-1 and 109-2 can be equal to each other.

Note also that as described above, a MOS capacitor may be employed as each of the capacitors 301 and 302. Further, in the case of the level shifter shown in FIG. 35, it is preferable to use a P-channel transistor for each capacitor similarly to the offset circuit shown in FIG. 6A.

Note that this embodiment mode can be implemented freely combining with any description in the other embodiment modes of this specification. Further, the descriptions in this embodiment mode can be freely combined to be implemented.

Embodiment Mode 7

This embodiment mode describes specific structures of the level shifter described in Embodiment Mode 1, which are different from Embodiment Modes 5 and 6.

Note that in this embodiment mode and Embodiment Modes 1 to 6, reference numerals are used in common, and detailed description of the same portions and portions having similar functions is not repeated.

First, a specific structure example of a level shifter of the present invention is described with reference to FIG. 25.

A level shifter shown in FIG. 35 includes the capacitor 701, the capacitor 702, the transistor 703, the transistor 704, a transistor 2501, a transistor 2502, a transistor 2503, and a transistor 2504.

As shown in the level shifter in FIG. 35, a first terminal of the transistor 2501 is connected to the wiring 103, and a second terminal of the transistor 2501 is connected to the wiring 109. A gate of the transistor 2502 is connected to the node N72, a first terminal of the transistor 2502 is connected to the wiring 104, and a second terminal of the transistor 2502 is connected to the wiring 109. A gate of the transistor 2503 is connected to the wiring 103, a first terminal of the transistor 2503 is connected to the wiring 103, and a second terminal of the transistor 2503 is connected to a gate of the transistor 2501. A gate of the transistor 2504 is connected to the node N72, a first terminal of the transistor 2504 is connected to the wiring 104, and a second terminal of the transistor 2504 is connected to the gate of the transistor 2501. Note that a connection point of the gate of the transistor 2501, the second terminal of the transistor 2503, and the second terminal of the transistor 2504 is denoted by a node N251.

A logic circuit 2500 includes the transistors 2501 to 2504. The logic circuit 2500 corresponds to the circuit 102 shown in FIGS. 1A to 1C.

Note that the transistors 2501 to 2504 are N-channel transistors. Therefore, since the level shifter shown in FIG. 25 can be formed by using the transistors of only the N-channel type, amorphous silicon can be used for a semiconductor layer in the level shifter shown in FIG. 25 so that a manufacturing process can be simplified. Consequently, manufacturing cost can be reduced and a yield can be improved. Further, a large semiconductor device can also be manufactured.

Figure 25:
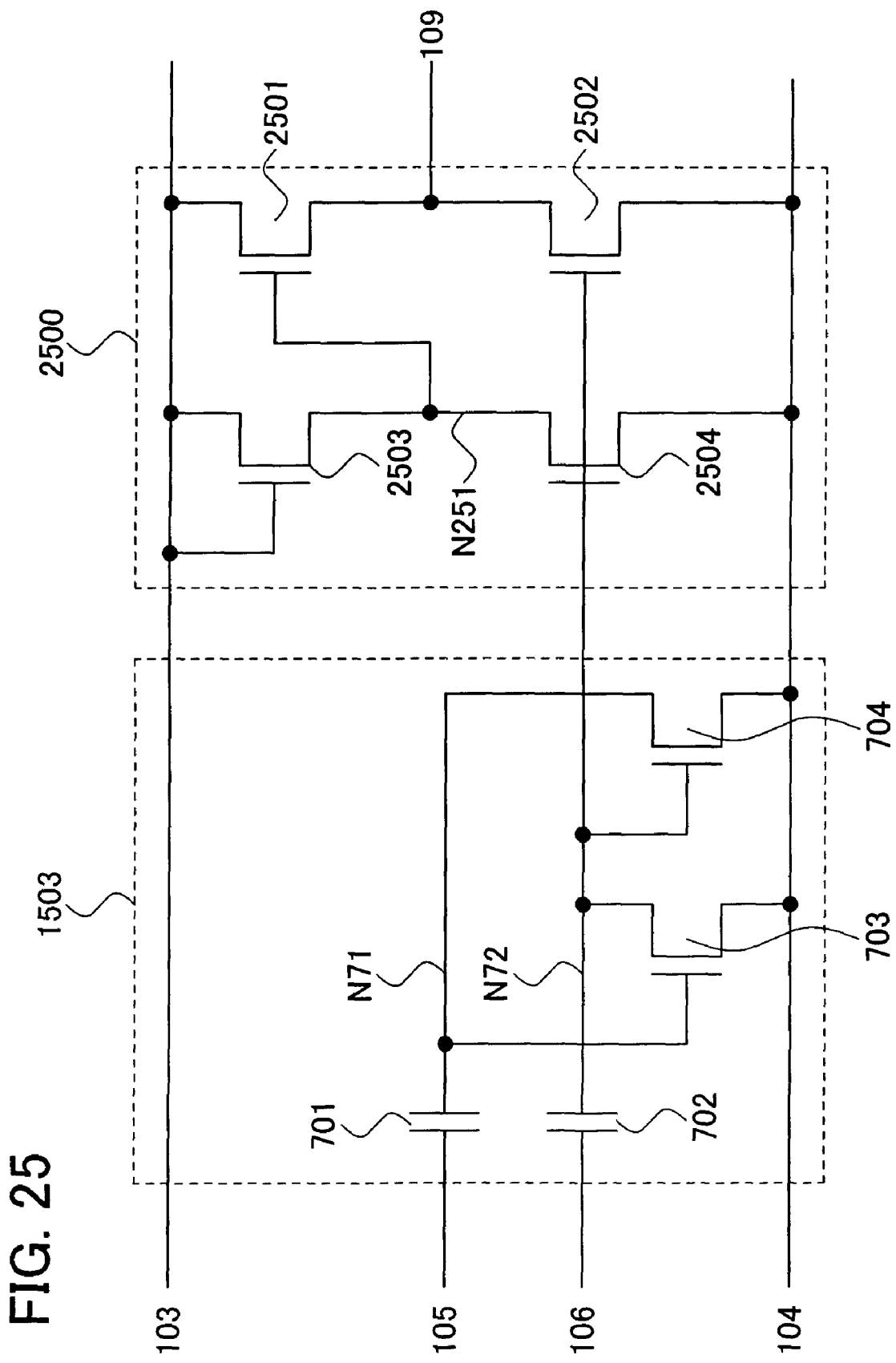
FIG. 25 is a diagram showing a structure of a level shifter of the present invention.

Further, in the level shifter shown in FIG. 25, the manufacturing process can be simplified even if polysilicon or single crystalline silicon is used for the semiconductor layer.

Next, operations of the level shifter shown in FIG. 25 are, similarly to the level shifter shown in FIG. 15, described with reference to the timing charts of FIGS. 16A to 16C. However, timing of potential change in the timing charts shown in FIGS. 16A to 16C can be determined as appropriate, and is not limited to that in the timing charts of FIGS. 16A to 16C.

Figure 26:
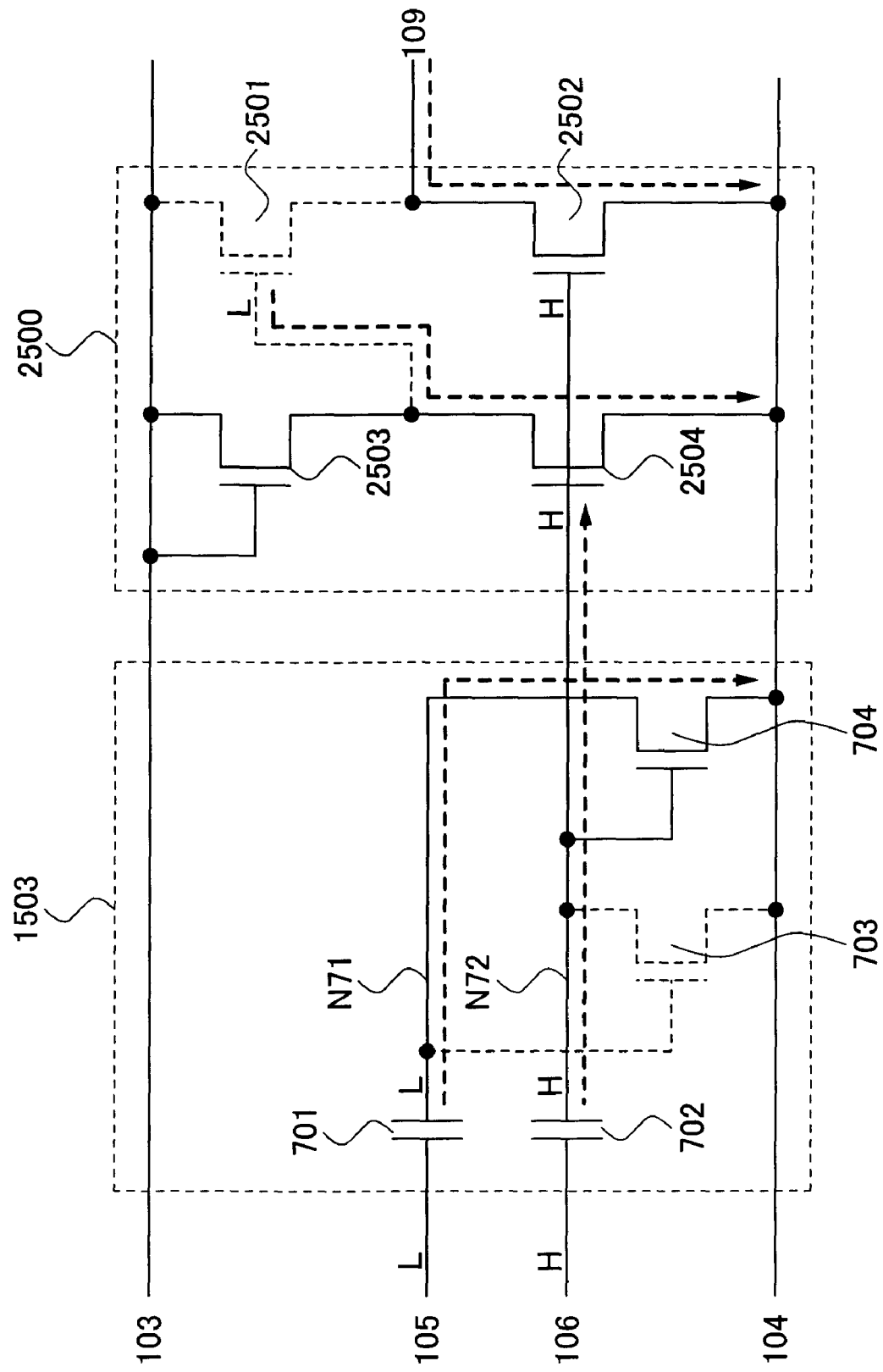
FIG. 26 is a diagram showing a structure of a level shifter of the present invention.
Figure 27:
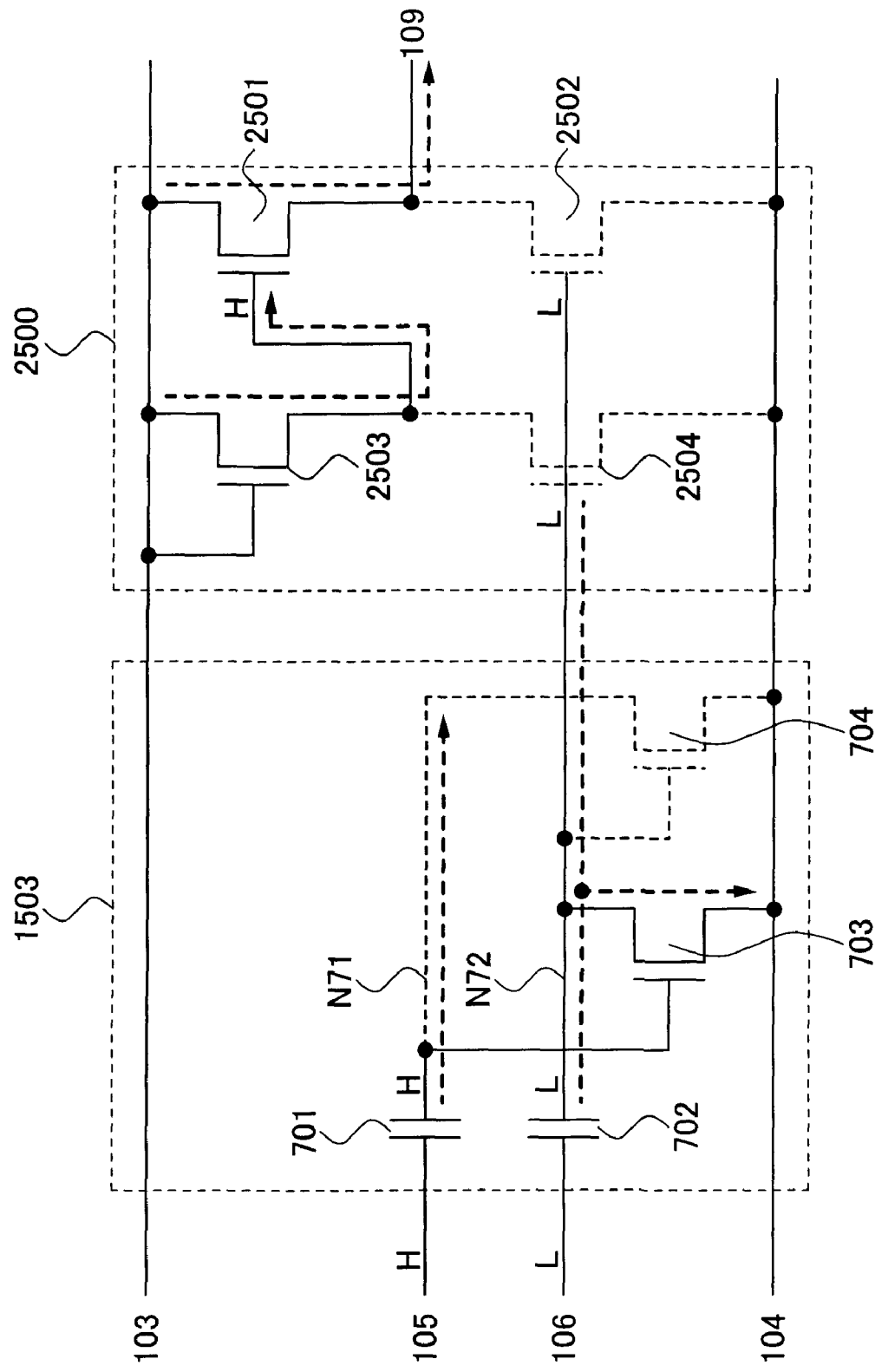
FIG. 27 is a diagram showing a structure of a level shifter of the present invention.

FIG. 26 shows an operation of the level shifter shown in FIG. 25 when an L signal is supplied to the wiring 105 and an H signal is supplied to the wiring 106. FIG. 27 shows an operation of the level shifter shown in FIG. 25 when an H signal is supplied to the wiring 105 and an L signal is supplied to the wiring 106. Note here that the operation shown in FIG. 26 is denoted by a first operation and the operation shown in FIG. 27 is denoted by a second operation.

Since operations of the offset circuit 1503 are similar to those of the offset circuit shown in FIG. 7A, specific description thereof is omitted.

First, the first operation of the level shifter shown in FIG. 25 is described with reference to the timing charts shown in FIGS. 16A to 16C and FIG. 26.

When the wiring 105 becomes an L level, the potential of the node N71 becomes VSS. On the other hand, when the wiring 106 becomes an H level, the potential of the node N72 becomes (VSS+(VH−VL)). Consequently, the transistors 2502 and 2504 are turned on. Since the transistor 2504 is turned on, the power source potential VSS is supplied to the node N251, so that the potential of the node N251 is decreased. Note that the potential of the node N251 is determined by operating points of the transistors 2503 and 2504, thus it is a little higher than the power source potential VSS. Since the node N251 becomes an L level, the transistor 2501 is turned off. In addition, since the transistor 2502 is turned on, the power source potential VSS is supplied to the wiring 109, so that the potential of the wiring 109 is decreased. The potential of the wiring 109 is decreased to the power source potential VSS, and an L signal is outputted from the wiring 109.

Next, the second operation of the level shifter shown in FIG. 25 is described with reference to the timing charts shown in FIGS. 16A to 16C and FIG. 27.

When the wiring 105 becomes an H level, the potential of the node N71 becomes (VSS+(VH−VL)). On the other hand, when the wiring 106 becomes an L level, the potential of the node N72 becomes VSS. Consequently, the transistors 2502 and 2504 are turned off. Since the transistor 2504 is turned off, the power source potential VDD is supplied to the node N251, so that the potential of the node N251 is increased. At the same time as the potential increase of the node N251, the transistor 2501 is turned on, and the power source potential VDD is supplied to the wiring 109, so that the potential of the wiring 109 is also increased. When the potential of the node N251 becomes a value (VDD−Vth2503) which is obtained by subtracting a threshold voltage Vth2503 of the transistor 2503 from the power source potential VDD, the transistor 2503 is turned off and the node N251 becomes the floating state. However, the potential increase of the wiring 109 continues even after the potential of the node N251 becomes (VDD−Vth2503). Therefore, the potential of the node N251 continues to increase by capacitive coupling of parasitic capacitance between the gate (the node N251) and the second terminal (the wiring 109) of the transistor 2501. The potential increase of the node N251 continues until the potential increase of the wiring 109 is stopped, so that the potential of the node N251 becomes a value equal to or higher than a value (VDD+Vth2501) which is obtained by adding a threshold voltage Vth2501 of the transistor 2501 to the power source potential VDD. Note that the potential increase of the wiring 109 is stopped when the potential of the wiring 109 becomes equal to the power source potential VDD. This is so-called bootstrap. Accordingly, the potential of the wiring 109 becomes equal to the power source potential VDD, and an H signal is outputted from the wiring 109.

Here, a function of the logic circuit 2500 is described.

The logic circuit 2500 has a function of selecting which one of the power source potential VDD and the power source potential VSS is supplied to the wiring 109. In the case of supplying the power source potential VDD to the wiring 109, the gate potential of the transistor 2501 is made to equal to or higher than (VDD+Vth2501), thereby the potential of the wiring 109 becomes equal to the power source potential VDD by bootstrap.

Here, functions of the transistors 2501 to 2504 are described.

First, the transistor 2501 has a function as a switch of selecting whether the wiring 103 and the wiring 109 are connected to each other or not depending on the potential of the node N251. The transistor 2501 is turned on and supplies the power source potential VDD to the wiring 109 in the second operation.

The transistor 2502 has a function as a switch of selecting whether the wiring 104 and the wiring 109 are connected to each other or not depending on the potential of the node N72. The transistor 2502 supplies the power source potential VSS to the wiring 109 in the first operation.

The transistor 2503 has a function as a diode. Input terminals thereof are the gate and the first terminal, and an output terminal thereof is the second terminal.

The transistor 2504 has a function as a switch of selecting whether the wiring 104 and the node N251 are connected to each other or not depending on the potential of the node N72. The transistor 2504 supplies the power source potential VSS to the node N251 in the first operation.

By the above-described first and second operations, the level shifter shown in FIG. 25 can make the potential of the wiring 109 equal to the power source potential VSS in the first operation and can make the potential of the wiring 109 equal to the power source potential VDD in the second operation.

Further, similarly to the logic circuit 1500 shown in FIG. 15, since each amplitude voltage of the gates of the transistors 2502 and 2504 is small, through current of the logic circuit 2500 can be reduced.

Further, similarly to the logic circuit 1500 shown in FIG. 15, since each amplitude voltage of the gates of the transistors 2502 and 2504 is small, noise generated in the logic circuit 2500 is reduced.

Note also that as described above, a MOS capacitor can be employed as each of the capacitors 701 and 702. Further, in the case of the level shifter shown in FIG. 25, it is preferable to use an N-channel transistor for each capacitor similarly to the offset circuit shown in FIG. 8A. This is because by forming each capacitor using an N-channel transistor, amorphous silicon can be used for a semiconductor layer in the level shifter shown in FIG. 25 so that a manufacturing process can be simplified. Consequently, manufacturing cost can be reduced and a yield can be improved. Further, a large semiconductor device can also be manufactured.

Further, in the level shifter shown in FIG. 25, the manufacturing process can be simplified even if polysilicon or single crystalline silicon is used for the semiconductor layer.

Figure 28:
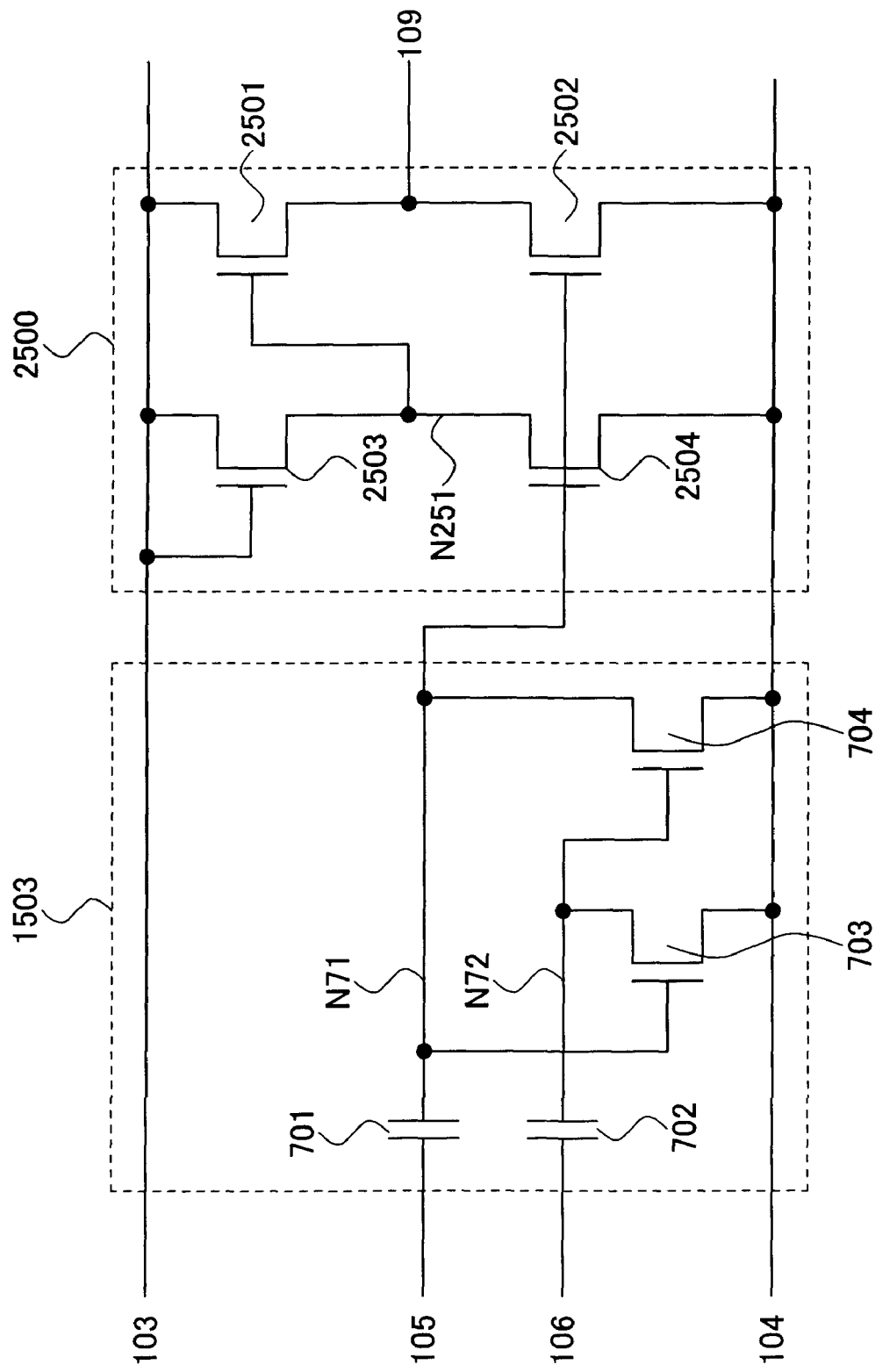
FIG. 28 is a diagram showing a structure of a level shifter of the present invention.

Note that as shown in FIG. 28, the gates of the transistors 2502 and 2504 may also be connected to the node N71 in the level shifter shown in FIG. 25. In the case where the gates of the transistors 2502 and 2504 are connected to the node N71 (FIG. 28), H and L levels of the signal (the potential) of the wiring 109 are reverse to those in the case where the gates of the transistors 2502 and 2504 are connected to the node N72 (FIG. 25) as shown in the timing charts in FIGS. 20A to 20C. Operations of a level shifter shown in FIG. 28 are similar to those of the level shifter shown in FIG. 25. Therefore, whether the gates of the transistors 2502 and 2504 are connected to the node N71 or the node N72 can be determined as appropriate.

Further, although not shown, two logic circuits may also be connected to each of the nodes N71 and N72. By using two logic circuits 2500, two signals each of which H and L levels are revered can be outputted. In the case where two logic circuits are connected to each of the nodes N71 and N72, similarly to the level shifter shown in FIG. 21, it is preferable that capacitance of the capacitors 701 and 702 be almost equal to each other.

Figure 39:
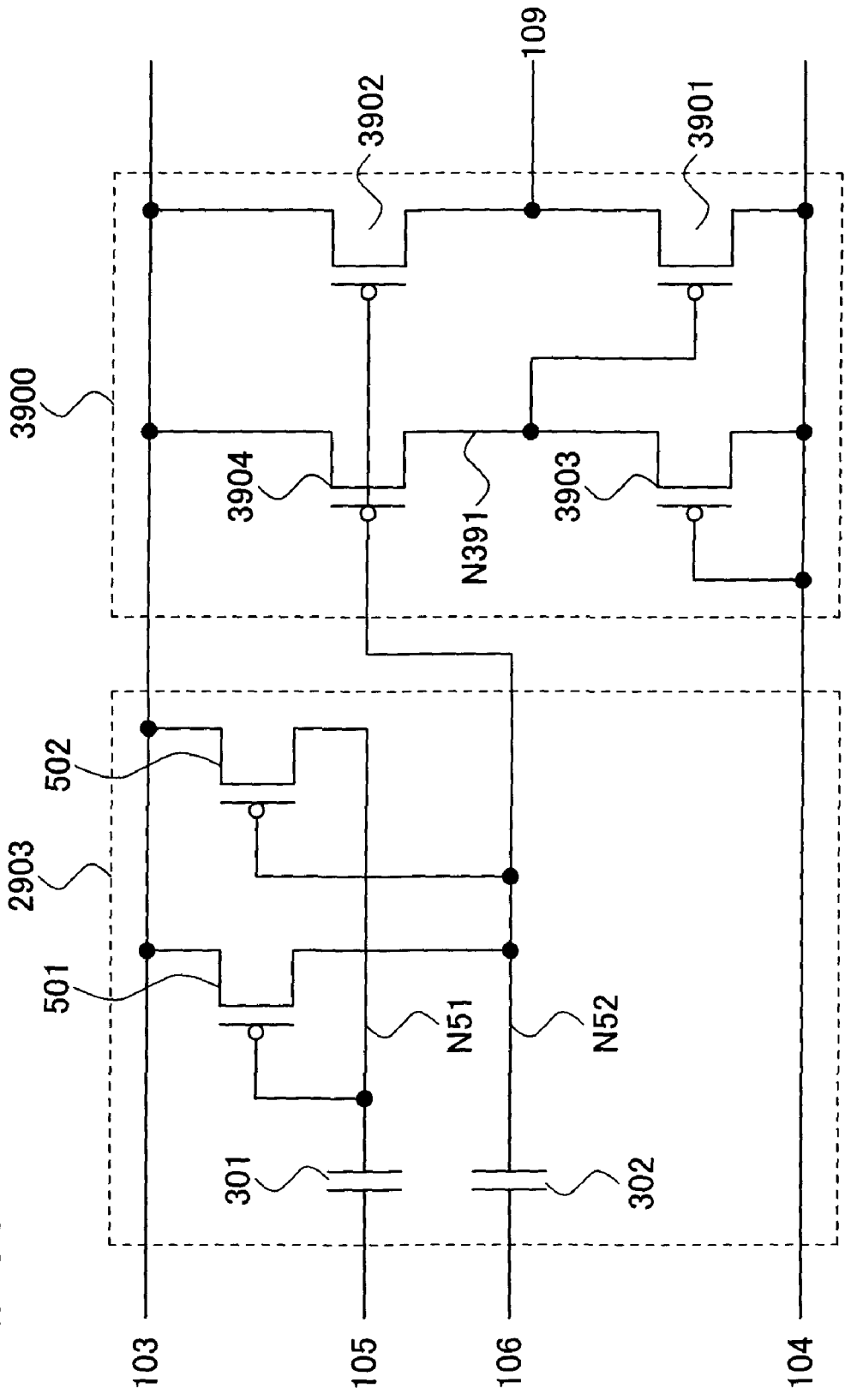
FIG. 39 is a diagram showing a structure of a level shifter of the present invention.

Here, although the level shifter shown in FIG. 25 includes the N-channel transistors and the capacitors, it may include P-channel transistors and capacitors. FIG. 39 shows a level shifter including P-channel transistors and capacitors.

A level shifter shown in FIG. 39 includes the capacitor 301, the capacitor 302, the transistor 501, the transistor 502, a transistor 3901, a transistor 3902, a transistor 3903, and a transistor 3904.

Note that the capacitor 301, the capacitor 302, the transistor 501, the transistor 502, the transistor 3901, the transistor 3902, the transistor 3903, and the transistor 3904 correspond to and have similar functions to the capacitor 701, the capacitor 702, the transistor 703, the transistor 704, the transistor 2501, the transistor 2502, the transistor 2503, and the transistor 2504 in FIG. 25 respectively. A logic circuit 3900 and the offset circuit 2903 correspond to and have similar functions to the logic circuit 2500 and the offset circuit 1503 in FIG. 25 respectively. The nodes N51 and N52 correspond to the nodes N71 and N72 in FIG. 25.

A gate of the transistor 3902 is connected to the node N52, a first terminal of the transistor 3902 is connected to the wiring 103, and a second terminal of the transistor 3902 is connected to the wiring 109. A first terminal of the transistor 3901 is connected to the wiring 104, and a second terminal of the transistor 3901 is connected to the wiring 109. A gate of the transistor 3903 is connected to the wiring 104, a first terminal of the transistor 3903 is connected to the wiring 104, and a second terminal of the transistor 3903 is connected to a gate of the transistor 3901. A gate of the transistor 3904 is connected to the node N52, a first terminal of the transistor 3904 is connected to the wiring 103, and a second terminal of the transistor 3904 is connected to the gate of the transistor 3901. Note that a connection point of the gate of the transistor 3901, the second terminal of the transistor 3903, and the second terminal of the transistor 3904 is denoted by a node N391.

Next, operations of the level shifter shown in FIG. 39 are, similarly to the level shifter shown in FIG. 29, described with reference to the timing charts of FIGS. 30A to 30C. However, timing of potential change in the timing charts shown in FIGS. 30A to 30C can be determined as appropriate, and is not limited to that in the timing charts of FIGS. 30A to 30C.

Figure 40:
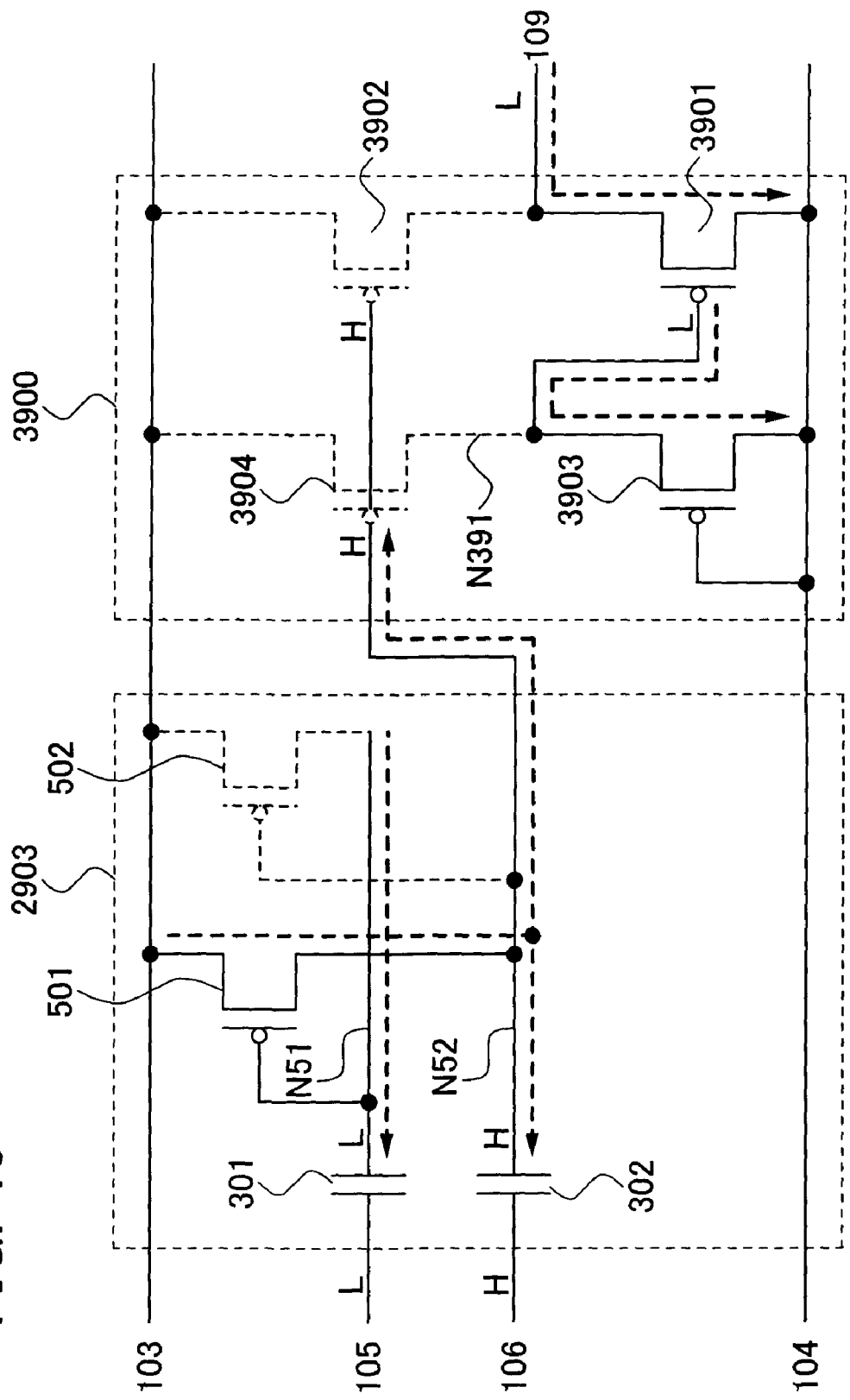
FIG. 40 is a diagram showing a structure of a level shifter of the present invention.
Figure 41:
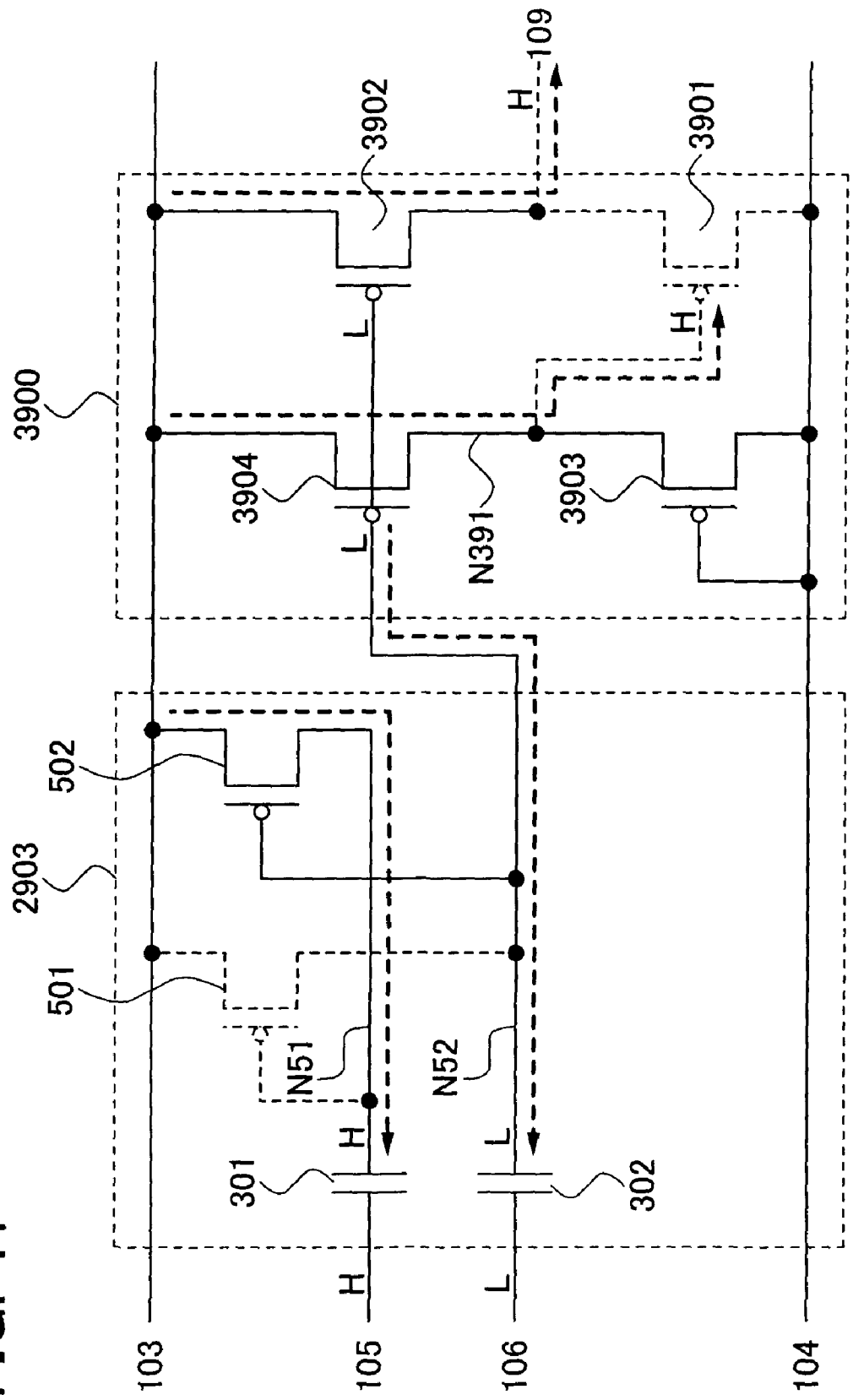
FIG. 41 is a diagram showing a structure of a level shifter of the present invention.

FIG. 40 shows an operation of the level shifter shown in FIG. 39 when an L signal is supplied to the wiring 105 and an H signal is supplied to the wiring 106. FIG. 41 shows an operation of the level shifter shown in FIG. 39 when an H signal is supplied to the wiring 105 and an L signal is supplied to the wiring 106. Note here that the operation shown in FIG. 40 is denoted by a first operation and the operation shown in FIG. 41 is denoted by a second operation.

Since operations of the offset circuit 2903 are similar to those of the offset circuit shown in FIG. 5A, specific description thereof is omitted.

First, the first operation of the level shifter shown in FIG. 39 is described with reference to the timing charts shown in FIGS. 30A to 30C and FIG. 40.

When the wiring 105 becomes an L level, the potential of the node N51 becomes (VDD−(VH−VL)). On the other hand, when the wiring 106 becomes an H level, the potential of the node N52 becomes VDD. Consequently, the transistors 3902 and 3904 are turned off. Since the transistor 3904 is turned off, the power source potential VSS is supplied to the node N391, so that the potential of the node N391 is decreased. At the same time as the potential decrease of the node N391, the transistor 3901 is turned on, and the power source potential VSS is supplied to the wiring 109, so that the potential of the wiring 109 is also decreased. When the potential of the node N391 becomes a value (VSS+|Vth3903|) which is obtained by adding an absolute value of a threshold voltage Vth3903 of the transistor 3903 to the power source potential VSS, the transistor 3903 is turned off and the node N391 becomes the floating state. However, the potential decrease of the wiring 109 continues even after the potential of the node N391 becomes (VSS+|Vth3903|). Therefore, the potential of the node N391 continues to decrease by capacitive coupling of parasitic capacitance between the gate (the node N391) and the second terminal (the wiring 109) of the transistor 3901. The potential decrease of the node N391 continues until the potential decrease of the wiring 109 is stopped, so that the potential of the node N391 becomes a value equal to or lower than a value (VSS+|Vth3901|) which is obtained by adding an absolute value of a threshold voltage Vth3901 of the transistor 3901 to the power source potential VSS. Note that the potential decrease of the wiring 109 is stopped when the potential of the wiring 109 becomes equal to the power source potential VSS. This is so-called bootstrap. Accordingly, the potential of the wiring 109 becomes equal to the power source potential VSS, and an L signal is outputted from the wiring 109.

Next, the second operation of the level shifter shown in FIG. 39 is described with reference to the timing charts shown in FIGS. 30A to 30C and FIG. 41.

When the wiring 105 becomes an H level, the potential of the node N51 becomes VDD. On the other hand, when the wiring 106 becomes an L level, the potential of the node N52 becomes (VDD−(VH−VL)). Consequently, the transistors 3902 and 3904 are turned on. Since the transistor 3902 is turned on, the power source potential VDD is supplied to the node N391, so that the potential of the node N391 is increased. Note that the potential of the node N391 is determined by operating points of the transistors 3903 and 3904, thus it is a little lower than the power source potential VDD. Since the node N391 becomes an L level, the transistor 3901 is turned off. In addition, since the transistor 3902 is turned on, the power source potential VDD is supplied to the wiring 109, so that the potential of the wiring 109 is increased. The potential of the wiring 109 is increased to the power source potential VDD, and an H signal is outputted from the wiring 109.

By the above-described first and second operations, the level shifter shown in FIG. 39 can make the potential of the wiring 109 equal to the power source potential VSS in the first operation and can make the potential of the wiring 109 equal to the power source potential VDD in the second operation.

Further, similarly to the logic circuit 3900 shown in FIG. 39, since each amplitude voltage of the gates of the transistors 3902 and 3904 is small, through current of the logic circuit 3900 can be reduced.

Further, similarly to the logic circuit 3900 shown in FIG. 39, since each amplitude voltage of the gates of the transistors 3902 and 3904 is small, noise generated in the logic circuit 3900 is reduced.

Note also that as described above, a MOS capacitor can be employed as each of the capacitors 301 and 302. Further, in the case of the level shifter shown in FIG. 39, it is preferable to use a P-channel transistor for each capacitor similarly to the offset circuit shown in FIG. 6A.

Figure 42:
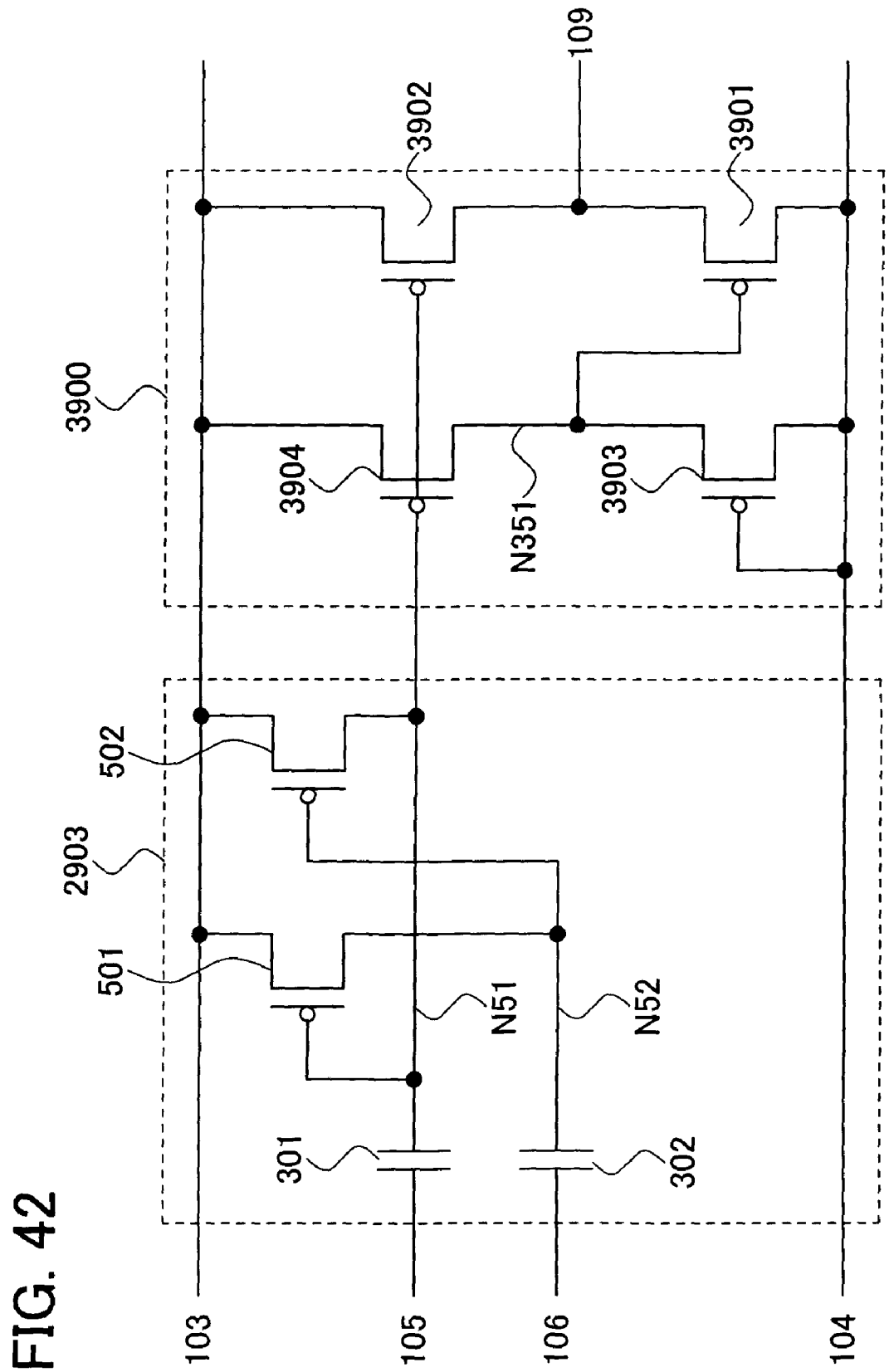
FIG. 42 is a diagram showing a structure of a level shifter of the present invention.

Further, as shown in FIG. 42, the gates of the transistors 3902 and 3904 may also be connected to the node N51 in the level shifter shown in FIG. 39. Timing charts in the case where the gates of the transistors 3902 and 3904 are connected to the node N51 are shown in FIGS. 36A to 36D.

Note that this embodiment mode can be implemented freely combining with any description in the other embodiment modes of this specification. Further, the descriptions in this embodiment mode can be freely combined to be implemented.

Embodiment Mode 8

This embodiment mode describes layout diagrams of the level sifter of the present invention.

First, a layout diagram of the level shifter shown in FIG. 15 is described with reference to FIG. 43.

Figure 43:
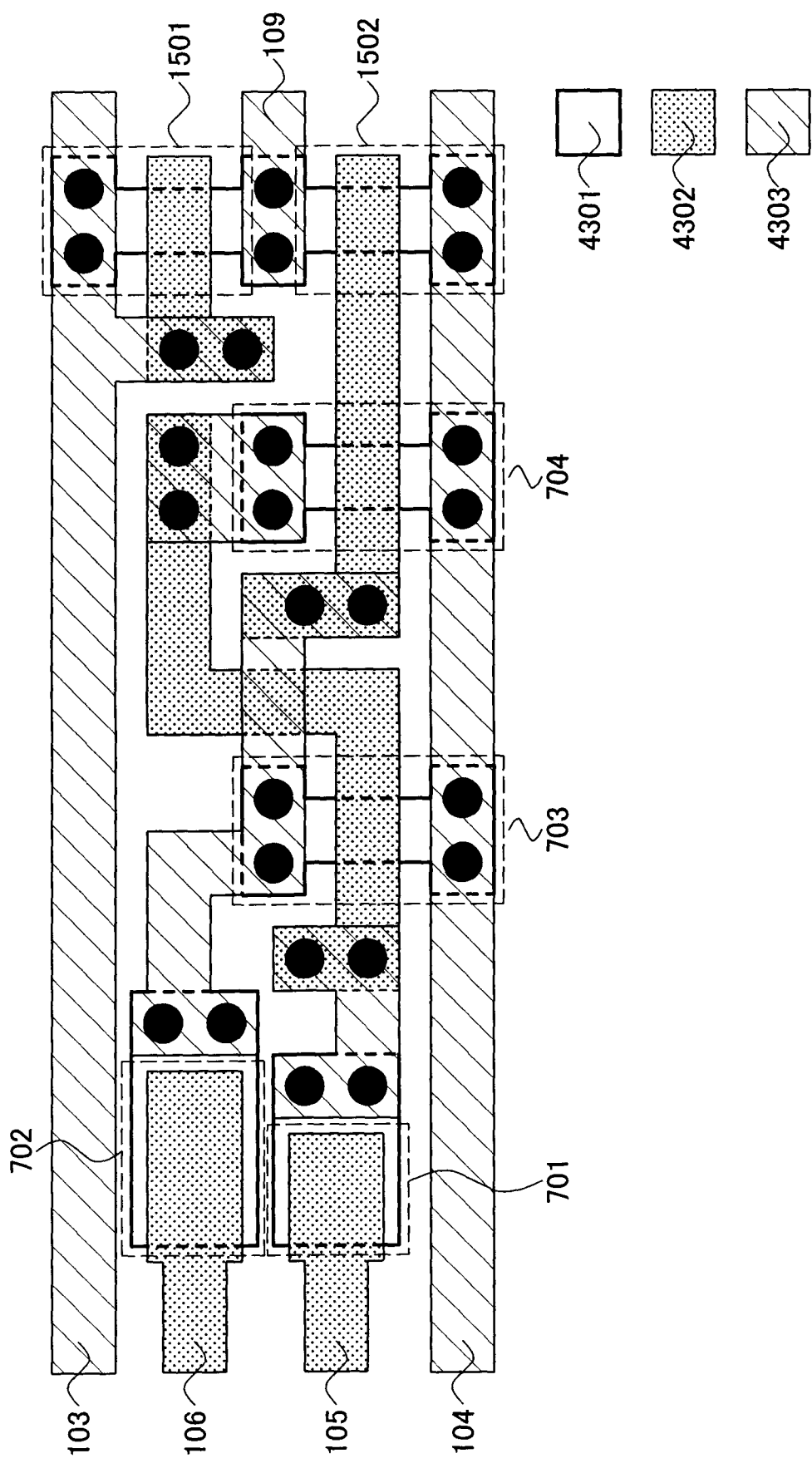
FIG. 43 is a layout diagram of a level shifter of the present invention.

The layout diagram in FIG. 43 is shown in the case where a semiconductor layer 4301, a first conductive layer 4302, and a second conductive layer 4303 are formed. Note that the first conductive layer 4302 functions as a gate electrode, and the second conductive layer 4303 functions as a wiring layer.

In the layout diagram shown in FIG. 43, a polycrystalline semiconductor (polysilicon) is used for the semiconductor layer 4301 of each transistor.

In the layout diagram shown in FIG. 43, the capacitor 701, the capacitor 702, the transistor 703, the transistor 704, the transistor 1501, and the transistor 1502 are provided. The wirings 103, 104, 105, 106, and 109 are similar to those described in FIG. 15.

The transistors 703, 704, 1501, and 1502 are N-channel transistors.

The capacitor 702 is formed of the semiconductor layer 4301 and the first conductive layer 4302 (the gate electrode). That is, the capacitor 702 functions as a MOS capacitor. Since the potential of the first conductive layer 4302 of the capacitor 702 is higher than that of the semiconductor layer 4301 thereof as described above, a channel is formed in a channel region of the semiconductor layer 4301. Thus the capacitor 702 can obtain large capacitance.

Similarly to the capacitor 702, the capacitor 701 is formed of the semiconductor layer 4301 and the first conductive layer 4302 (the gate electrode). That is, the capacitor 701 also functions as a MOS capacitor. Since the potential of the first conductive layer 4302 of the capacitor 701 is higher than that of the semiconductor layer 4301 thereof as described above, a channel is formed in a channel region of the semiconductor layer 4301. Thus the capacitor 701 can obtain large capacitance.

Next, a layout diagram of the level shifter shown in FIG. 29 is described with reference to FIG. 44.

Figure 44:
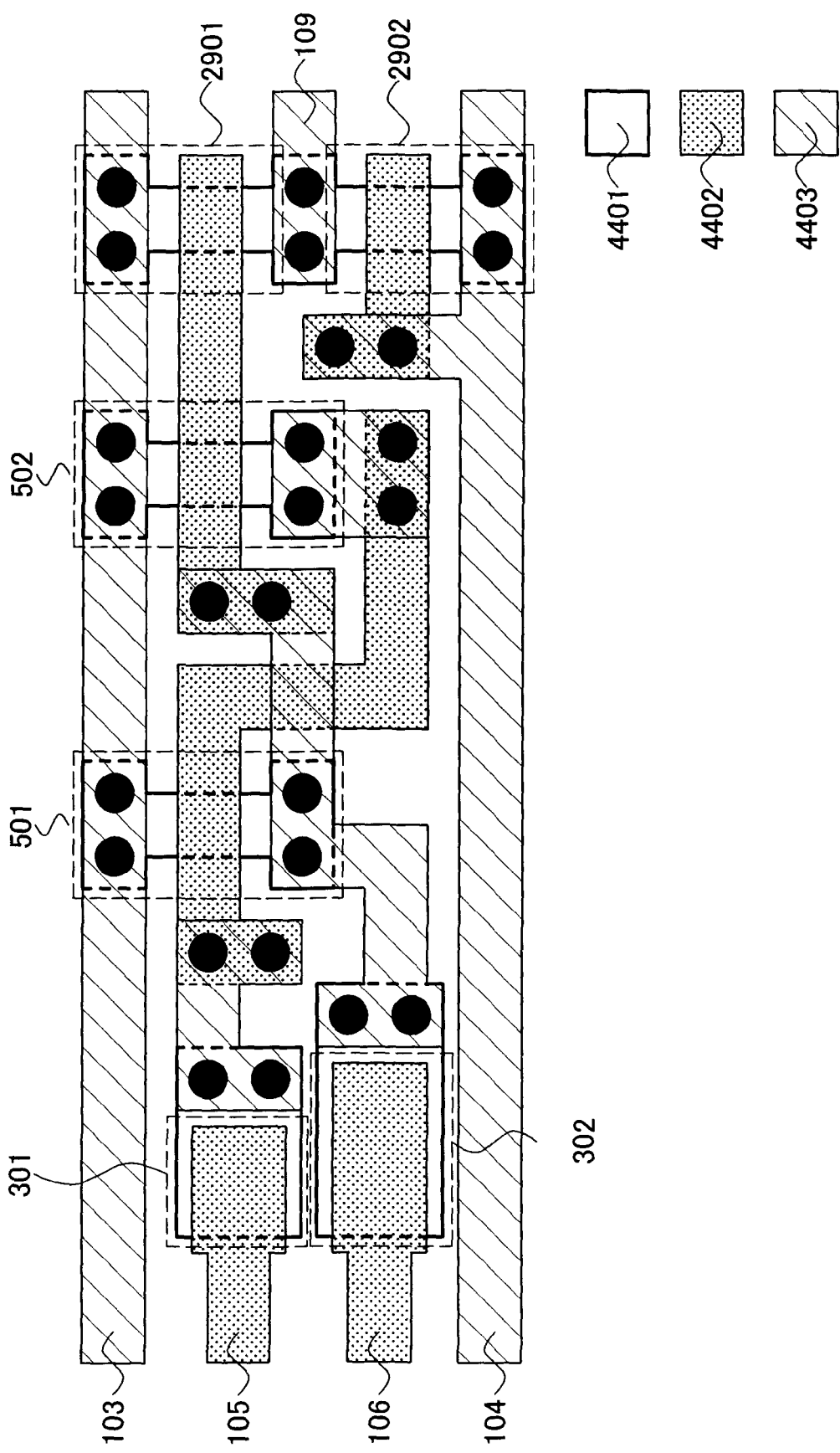
FIG. 44 is a layout diagram of a level shifter of the present invention.

The layout diagram in FIG. 44 is shown in the case where a semiconductor layer 4401, a first conductive layer 4402, and a second conductive layer 4403 are formed. Note that the first conductive layer 4402 functions as a gate electrode, and the second conductive layer 4403 functions as a wiring layer.

In the layout diagram shown in FIG. 44, a polycrystalline semiconductor (polysilicon) is used for the semiconductor layer 4401 of each transistor.

In the layout diagram shown in FIG. 44, the capacitor 301, the capacitor 302, the transistor 501, the transistor 502, the transistor 2901, and the transistor 2902 are provided. The wirings 103, 104, 105, 106, and 109 are similar to those described in FIG. 29.

The transistors 501, 502, 2901, and 2902 are P-channel transistors.

The capacitor 301 is formed of the semiconductor layer 4401 and the first conductive layer 4402 (the gate electrode). That is, the capacitor 301 functions as a MOS capacitor. Since the potential of the first conductive layer 4402 of the capacitor 301 is lower than that of the semiconductor layer 4401 thereof as described above, a channel is formed in a channel region of the semiconductor layer 4401. Thus the capacitor 301 can obtain large capacitance.

Similarly to the capacitor 301, the capacitor 302 is formed of the semiconductor layer 4401 and the first conductive layer 4402 (the gate electrode). That is, the capacitor 302 also functions as a MOS capacitor. Since the potential of the first conductive layer 4402 of the capacitor 302 is lower than that of the semiconductor layer 4401 thereof as described above, a channel is formed in a channel region of the semiconductor layer 4401. Thus the capacitor 302 can obtain large capacitance.

Next, a layout diagram of the level shifter shown in FIG. 15, which is a different example from FIG. 43, is described with reference to FIG. 45.

Figure 45:
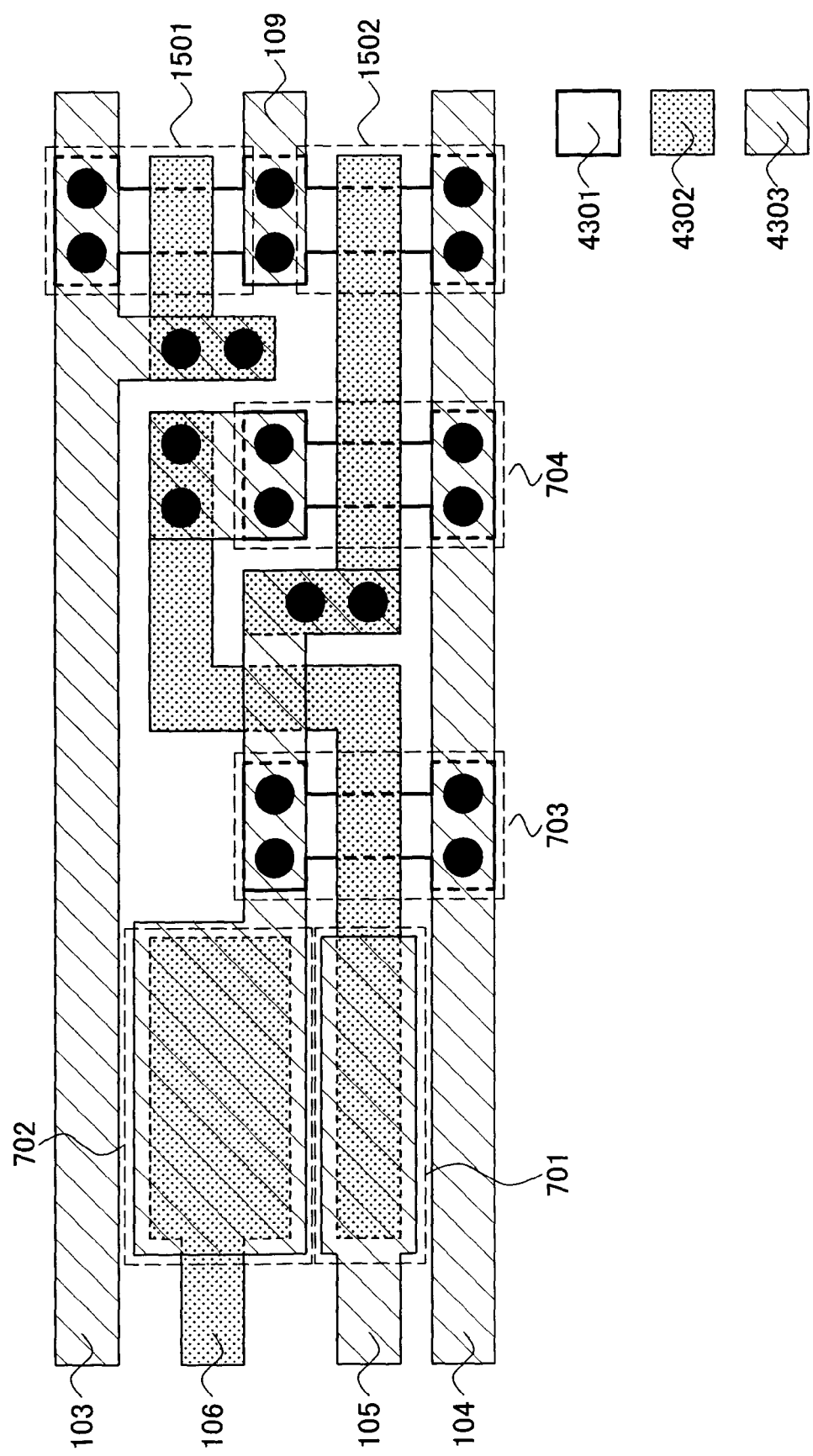
FIG. 45 is a layout diagram of a level shifter of the present invention.

A layout diagram in FIG. 45 is shown in the case where the semiconductor layer 4301, the first conductive layer 4302, and the second conductive layer 4303 are formed. Note that the first conductive layer 4302 functions as a gate electrode, and the second conductive layer 4303 functions as a wiring layer.

In the layout diagram shown in FIG. 45, a polycrystalline semiconductor (polysilicon) is used for the semiconductor layer 4301 of each transistor.

In the layout diagram shown in FIG. 45, the capacitor 701, the capacitor 702, the transistor 703, the transistor 704, the transistor 1501, and the transistor 1502 are provided. The wirings 103, 104, 105, 106, and 109 are similar to those described in FIG. 15.

The transistors 703, 704, 1501, and 1502 are N-channel transistors.

The capacitor 702 is formed of the first conductive layer 4302 and the second conductive layer 4303. This is because since the first conductive layer 4302 and the second conductive layer 4303 are formed of conductive materials, capacitance of the capacitor 702 is not changed depending on a voltage applied. Consequently, a level shifter shown in FIG. 45 can be stably operated.

The capacitor 701 is formed of the first conductive layer 4302 and the second conductive layer 4303. This is because since the first conductive layer 4302 and the second conductive layer 4303 are formed of conductive materials, capacitance of the capacitor 701 is not changed depending on a voltage applied. Consequently, the level shifter shown in FIG. 45 can be stably operated.

Further, a first electrode of the capacitor 701 and a second electrode of the capacitor 702 are formed of the second conductive layer 4303, and a second electrode of the capacitor 701 and a first electrode of the capacitor 702 are formed of the first conductive layer 4302. This is because a layout area of the level shifter shown in FIG. 45 can be reduced. Specifically, the layout area of the level shifter shown in FIG. 45 can be made smaller in the case where the second electrode of the capacitor 701 is formed of the first conductive layer 4302 than in the case where the second electrode of the capacitor 701 is formed of the second conductive layer 4303 because the second electrode of the capacitor 701 is connected to a gate of the transistor 703. Similarly, the layout area of the level shifter shown in FIG. 45 can be made smaller in the case where the second electrode of the capacitor 702 is formed of the second conductive layer 4303 than in the case where the second electrode of the capacitor 701 is formed of the first conductive layer 4302 because the second electrode of the capacitor 702 is connected to a second terminal of the transistor 703.

Next, a layout diagram of the level shifter shown in FIG. 29, which is a different example from FIG. 44, is described with reference to FIG. 46.

Figure 46:
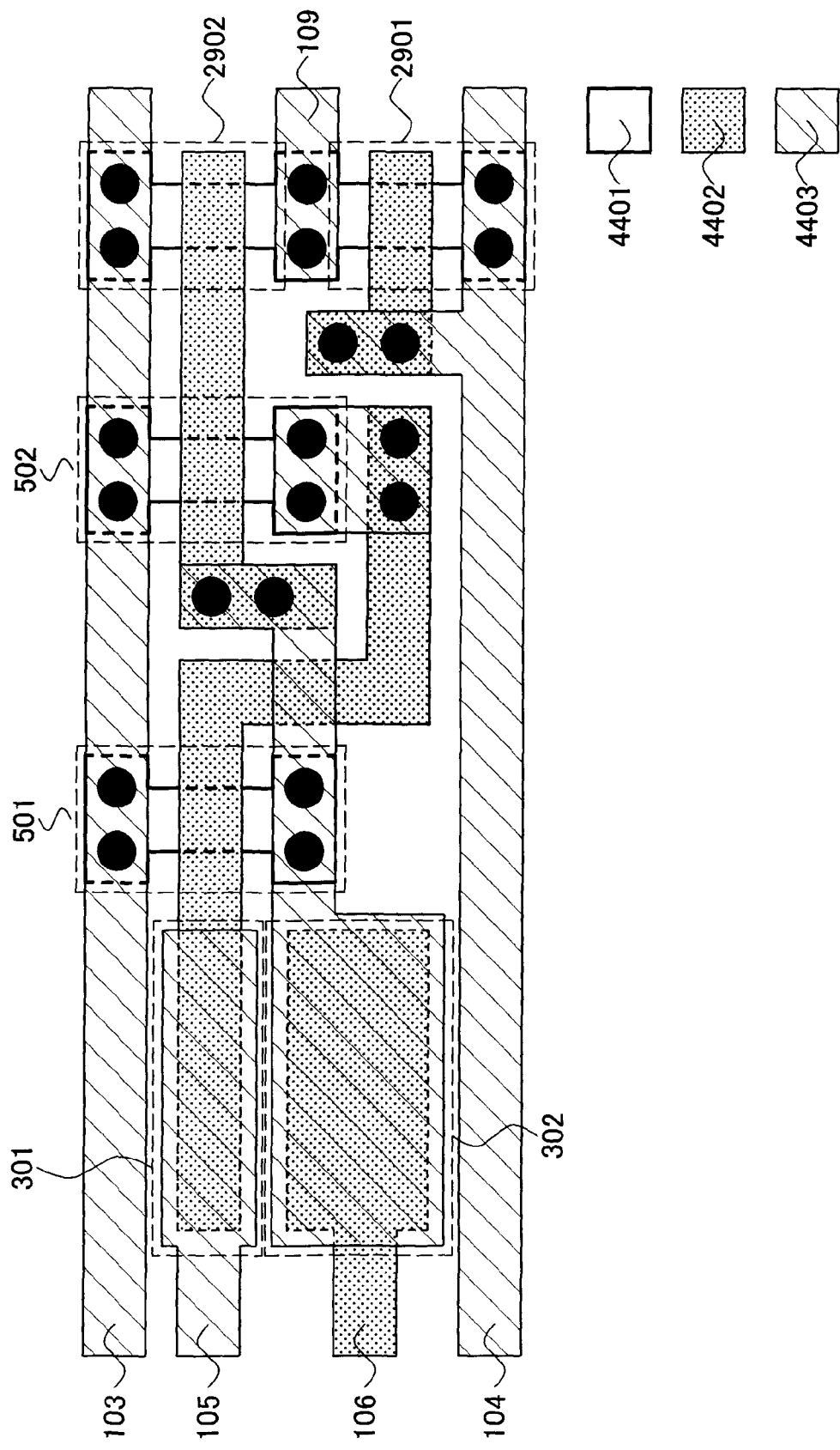
FIG. 46 is a layout diagram of a level shifter of the present invention.

The layout diagram in FIG. 46 is shown in the case where the semiconductor layer 4401, the first conductive layer 4402, and the second conductive layer 4403 are formed. Note that the first conductive layer 4402 functions as a gate electrode, and the second conductive layer 4403 functions as a wiring layer.

In the layout diagram shown in FIG. 46, a polycrystalline semiconductor (polysilicon) is used for the semiconductor layer 4401 of each transistor.

In the layout diagram shown in FIG. 46, the capacitor 301, the capacitor 302, the transistor 501, the transistor 502, the transistor 2901, and the transistor 2902 are provided. The wirings 103, 104, 105, 106, and 109 are similar to those described in FIG. 29.

The transistors 501, 502, 2901, and 2902 are P-channel transistors.

The capacitor 302 is formed of the first conductive layer 4402 and the second conductive layer 4403. This is because since the first conductive layer 4402 and the second conductive layer 4403 are formed of conductive materials, capacitance of the capacitor 302 is not changed depending on a voltage applied. Consequently, a level shifter shown in FIG. 46 can be stably operated.

The capacitor 301 is formed of the first conductive layer 4402 and the second conductive layer 4403. This is because since the first conductive layer 4402 and the second conductive layer 4403 are formed of conductive materials, capacitance of the capacitor 301 is not changed depending on a voltage applied. Consequently, the level shifter shown in FIG. 46 can be stably operated.

Further, a first electrode of the capacitor 301 and a second electrode of the capacitor 302 are formed of the second conductive layer 4403, and a second electrode of the capacitor 301 and a first electrode of the capacitor 302 are formed of the first conductive layer 4402. This is because a layout area of the level shifter shown in FIG. 46 can be reduced. Specifically, the layout area of the level shifter shown in FIG. 46 can be made smaller in the case where the second electrode of the capacitor 301 is formed of the first conductive layer 4402 than in the case where the second electrode of the capacitor 301 is formed of the second conductive layer 4403 because the second electrode of the capacitor 301 is connected to a gate of the transistor 501. Similarly, the layout area of the level shifter shown in FIG. 46 can be made smaller in the case where the second electrode of the capacitor 302 is formed of the second conductive layer 4403 than in the case where the second electrode of the capacitor 301 is formed of the first conductive layer 4402 because the second electrode of the capacitor 302 is connected to a second terminal of the transistor 501.

Next, a layout diagram of the level shifter shown in FIG. 15 is described with reference to FIG. 47A.

The layout diagram in FIG. 47A is shown in the case where a semiconductor layer 4701, a first conductive layer 4702, a second conductive layer 4703, and a third conductive layer 4704 are formed. Note that the first conductive layer 4702 functions as a gate electrode, the second conductive layer 4703 functions as a wiring layer, and the third conductive layer 4704 functions as a high-resistance wiring layer.

In the layout diagram shown in FIG. 47A, an amorphous semiconductor (amorphous silicon) is used for the semiconductor layer 4701 of each transistor.

In the layout diagram shown in FIG. 47A, the capacitor 701, the capacitor 702, the transistor 703, the transistor 704, the transistor 1501, and the transistor 1502 are provided. The wirings 103, 104, 105, 106, and 109 are similar to those described in FIG. 15.

The capacitor 702 is formed of the semiconductor layer 4701 and the first conductive layer 4702 (the gate electrode). That is, the capacitor 702 functions as a MOS capacitor. Since the potential of the first conductive layer 4702 of the capacitor 702 is higher than that of the semiconductor layer 4701 thereof as described above, a channel is formed in a channel region of the semiconductor layer 4701. Thus the capacitor 702 can obtain large capacitance.

Similarly to the capacitor 702, the capacitor 701 is formed of the semiconductor layer 4701 and the first conductive layer 4702 (the gate electrode). That is, the capacitor 701 also functions as a MOS capacitor. Since the potential of the first conductive layer 4702 of the capacitor 701 is higher than that of the semiconductor layer 4701 thereof as described above, a channel is formed in the channel region of the semiconductor layer 4701. Thus the capacitor 701 can obtain large capacitance.

Next, a layout diagram of the level shifter shown in FIG. 15, which is a different example from FIG. 47A, is described with reference to FIG. 47B.

The layout diagram in FIG. 47B is shown in the case where the semiconductor layer 4701, the first conductive layer 4702, the second conductive layer 4703, and the third conductive layer 4704 are formed. Note that the first conductive layer 4702 functions as a gate electrode, the second conductive layer 4703 functions as a wiring layer, and the third conductive layer 4704 functions as a high-resistance wiring layer.

In the layout diagram shown in FIG. 47B, an amorphous semiconductor (amorphous silicon) is used for the semiconductor layer 4701 of each transistor.

In the layout diagram shown in FIG. 47B, the capacitor 701, the capacitor 702, the transistor 703, the transistor 704, the transistor 1501, and the transistor 1502 are provided. The wirings 103, 104, 105, 106, and 109 are similar to those described in FIG. 15.

The capacitor 702 is formed of the first conductive layer 4702 and the second conductive layer 4703. This is because since the first conductive layer 4702 and the second conductive layer 4703 are formed of conductive materials, capacitance of the capacitor 702 is not changed depending on a voltage applied. Consequently, a level shifter shown in FIG. 47B can be stably operated.

The capacitor 701 is formed of the first conductive layer 4702 and the second conductive layer 4703. This is because since the first conductive layer 4702 and the second conductive layer 4703 are formed of conductive materials, capacitance of the capacitor 701 is not changed depending on a voltage applied. Consequently, the level shifter shown in FIG. 47B can be stably operated.

Further, a first electrode of the capacitor 701 and a second electrode of the capacitor 702 are formed of the second conductive layer 4703, and a second electrode of the capacitor 701 and a first electrode of the capacitor 702 are formed of the first conductive layer 4702. This is because a layout area of the level shifter shown in FIG. 47B can be reduced. Specifically, the layout area of the level shifter shown in FIG. 47B can be made smaller in the case where the second electrode of the capacitor 701 is formed of the first conductive layer 4702 than in the case where the second electrode of the capacitor 701 is formed of the second conductive layer 4703 because the second electrode of the capacitor 701 is connected to a gate of the transistor 703. Similarly, the layout area of the level shifter shown in FIG. 47B can be made smaller in the case where the second electrode of the capacitor 702 is formed of the second conductive layer 4703 than in the case where the second electrode of the capacitor 701 is formed of the first conductive layer 4702 because the second electrode of the capacitor 702 is connected to a second terminal of the transistor 703.

Note that this embodiment mode can be implemented freely combining with any description in the other embodiment modes of this specification. Further, the descriptions in this embodiment mode can be freely combined to be implemented.

Embodiment Mode 9

Figure 62A:
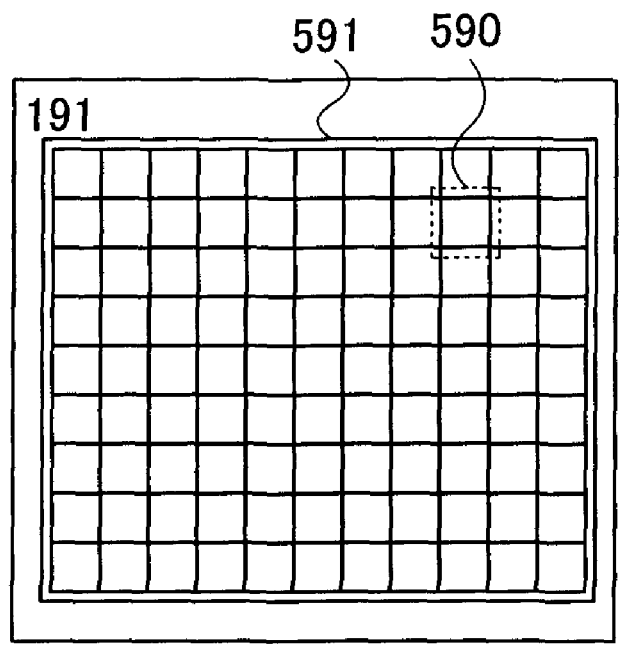
FIGS. 62A and 62B are diagrams each showing a structure of a display panel of the present invention.
Figure 62B:
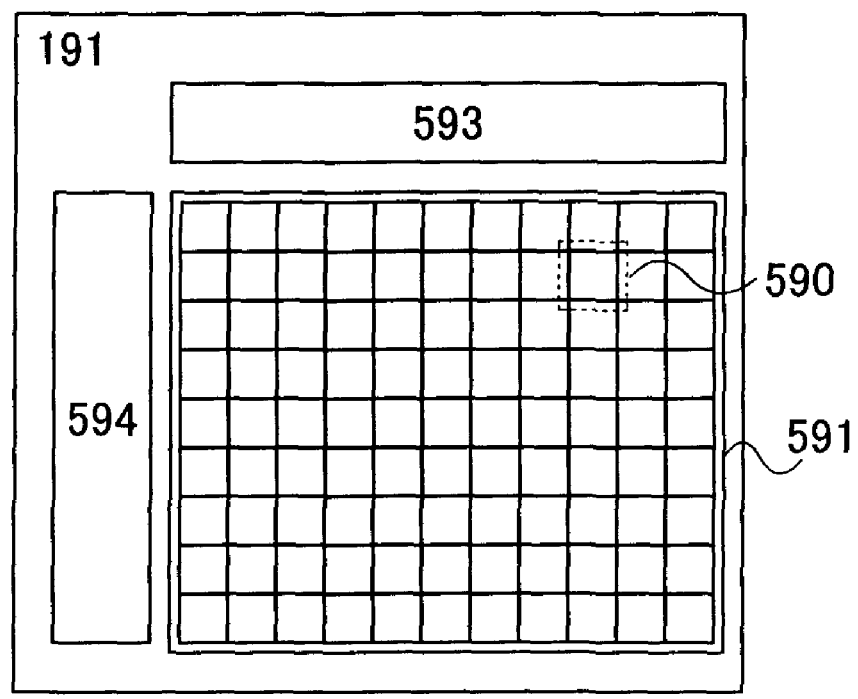

Embodiment Mode 9 describes examples of a panel in which a plurality of pixels are formed with reference to FIGS. 62A and 62B. In FIG. 62A, a panel 191 includes a pixel portion 591 including a plurality of pixels 590 arranged in matrix. The pixel portion 591 can employ an active matrix structure in which a switching element such as a thin film transistor is provided for each pixel 590. As a display medium of each pixel 590, either a light-emitting element such as an electroluminescence element or a liquid crystal element may be provided.

Further, as shown in FIG. 62B, a driver circuit for driving the pixel portion 591 may also be provided over the same substrate as the pixel portion 591. In FIG. 62B, the same portions as FIG. 62A are denoted by the same reference numerals, and description thereof is omitted. In FIG. 62B, a source driver 593 and a gate driver 594 are shown as driver circuits. The present invention is not limited to this, and a driver circuit may be provided in addition to the source driver 593 and the gate driver 594. Such a driver circuit may be formed over a substrate and may be mounted on another substrate over which the pixel portion 591 is formed. For example, the pixel portion 591 may be formed using thin film transistors over a glass substrate and such a driver circuit may be formed over a single crystalline substrate, and an IC chip of the driver circuit may be connected over the glass substrate by COG (Chip On Glass) or alternatively, the IC chip may be connected over the glass substrate by TAB (Tape Automated Bonding) or connected to the glass substrate by using a printed circuit board.

Further, such a driver circuit may also be formed using thin film transistors formed over the same substrate as the pixel portion 591 and in the same process as the thin film transistor included in each pixel 590. A channel formation region of each thin film transistor may be formed either of a polycrystalline semiconductor or an amorphous semiconductor.

Note that this embodiment mode can be implemented freely combining with any description in the other embodiment modes of this specification. Further, the descriptions in this embodiment mode can be freely combined to be implemented.

Embodiment Mode 10

Figure 63A:
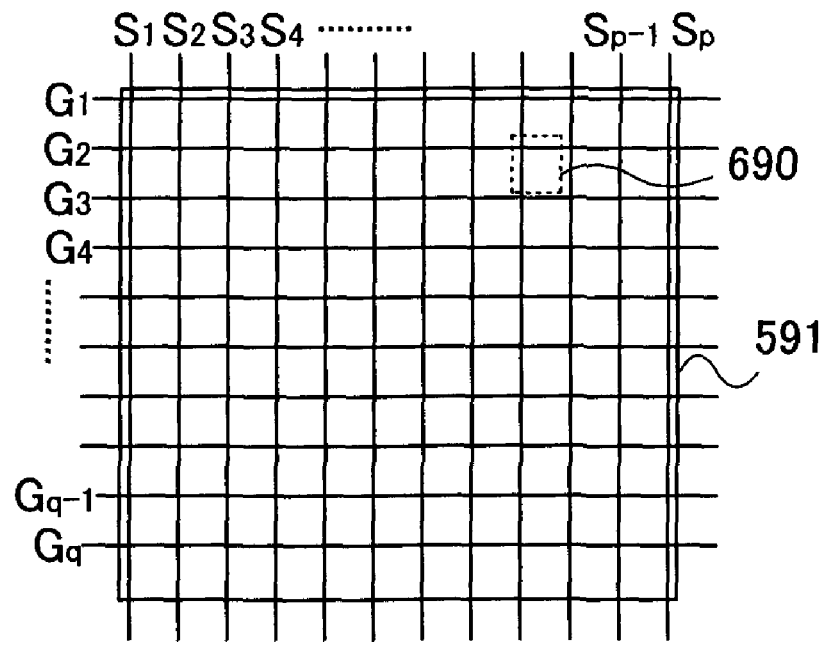
FIGS. 63A and 63B are diagrams respectively showing a structure of a display panel and a configuration of an EL pixel of the present invention.

FIG. 63A shows a structure example of the pixel portion 591 shown in FIG. 62A or 62B (hereinafter referred to as a first pixel structure). The pixel portion 591 includes a plurality of source signal lines S1 to Sp (p is a natural number), a plurality of scan lines G1 to Gq (q is a natural number) provided so as to intersect the plurality of source signal lines S1 to Sp, and a pixel 690 which is provided for each intersection of the source signal lines S1 to Sp and the scan lines G1 to Gq.

Figure 63B:
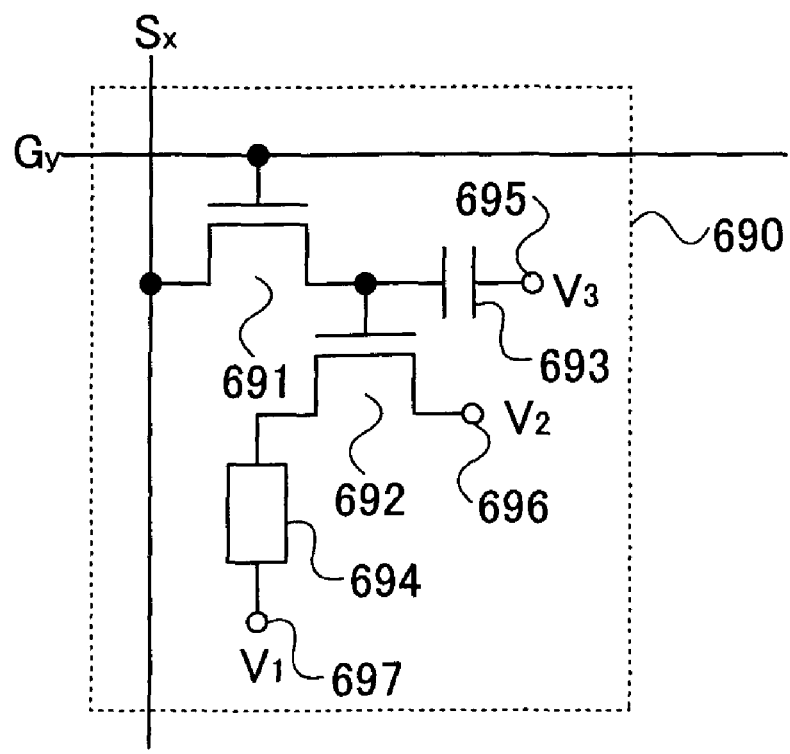

A configuration of the pixel 690 shown in FIG. 63A is shown in FIG. 63B. FIG. 63B shows the pixel 690 formed at an intersection of one Sx (x is a natural number equal to or smaller than p) of the plurality of source signal lines S1 to Sp and one Gy (y is a natural number equal to or smaller than q) of the plurality of scan lines G1 to Gq. The pixel 690 includes a first transistor 691, a second transistor 692, a capacitor 693, and a light-emitting element 694. In this embodiment mode, as the light-emitting element 694, an element which includes a pair of electrodes and emits light when current flows between the pair of electrodes is used. Further, as the capacitor 693, parasitic capacitance of the second transistor 692, or the like may also be actively used. Each of the first transistor 691 and the second transistor 692 may be either an N-channel transistor or a P-channel transistor. As each transistor for forming the pixel 690, a thin film transistor can be used.

A gate of the transistor 691 is connected to the scan line Gy, one of a source and a drain thereof is connected to the source signal line Sx, and the other of the source and the drain thereof is connected to a gate of the second transistor 692 and one electrode of the capacitor 693. The other electrode of the capacitor 693 is connected to a node 695 to which a potential V3 is supplied. One of a source and a drain of the second transistor 692 is connected to one electrode of the light-emitting element 694, and the other of the source and the drain thereof is connected to a node 696 to which a potential V2 is supplied. The other electrode of the light-emitting element 694 is connected to a node 697 to which a potential V1 is supplied.

A display method of the pixel portion 591 shown in FIGS. 63A and 63B is described.

One of the plurality of scan lines G1 to Gq is selected, and during the time in which the scan line is selected, image signals are inputted into all of the plurality of source signal lines S1 to Sp. In this manner, image signals are inputted into pixels of one row in the pixel portion 591. The plurality of scan lines G1 to Gq are selected sequentially and during each time, the similar operation is performed, so that image signals are inputted into all the pixels 690 in the pixel portion 591.

Described is an operation of the pixel 690 in which one Gy of the plurality of scan lines G1 to Gq is selected and an image signal is inputted from one Sx of the plurality of source signal lines S1 to Sp. When the scan line Gy is selected, the first transistor 691 is turned on. ON state of a transistor means that the source and the drain are electrically connected, and OFF state of the transistor means that the source and the drain are not electrically connected. When the first transistor 691 becomes ON state, the image signal inputted into the source signal line Sx is inputted into the gate of the second transistor 692 through the first transistor 691. Whether the second transistor 692 becomes ON state or OFF state is selected in accordance with the inputted image signal. When ON state of the second transistor 692 is selected, drain current of the second transistor 692 flows to the light-emitting element 694 and the light-emitting element 694 emits light.

The potential V2 and the potential V3 are kept such that a potential difference between them is always constant when the second transistor 692 becomes ON state. The potential V2 and the potential V3 may be the same potential. In the case where the potential V2 and the potential V3 are the same potential, the node 695 and the node 696 may be connected to the same wiring. The potential V1 and the potential V2 are set to have a predetermined potential difference when light emission of the light-emitting element 694 is selected. Thus current flows to the light-emitting element 694 and the light-emitting element 694 emits light.

Each wiring or electrode is formed of a material of the following: one element or a plurality of elements selected from aluminum (Al), tantalum (Ta), titanium (Ti), molybdenum (Mo), tungsten (W), neodymium (Nd), chromium (Cr), nickel (Ni), platinum (Pt), gold (Au), silver (Ag), copper (Cu), magnesium (Mg), scandium (Sc), cobalt (Co), zinc (Zn), niobium (Nb), silicon (Si), phosphorus (P), boron (B), arsenic (As), gallium (Ga), indium (In), tin (Sn), and oxygen (O); a compound or an alloy material containing one element or a plurality of elements selected from the above elements (e.g., Indium Tin Oxide (ITO), Indium Zinc Oxide (IZO), ITO containing silicon oxide (ITSO), zinc oxide (ZnO), aluminum-neodymium (Al—Nd), or magnesium-silver (Mg—Ag)); a material combining any of the above-described compounds; and the like. Further, a compound of silicon and any of the above-described ones (silicide) (e.g., aluminum-silicon, molybdenum-silicon, or nickel silicide) or a compound of nitrogen and any of the above-described ones (e.g., titanium nitride, tantalum nitride, or molybdenum nitride) can also be used. Note that silicon (Si) may contain an N-type impurity (e.g., phosphorus) or a P-type impurity (e.g., boron) at a high concentration; by containing such an impurity, the conductivity is improved or the similar action to any conductor is performed, thereby utilizing the silicon as a wiring or an electrode more easily. Note that any of single crystalline silicon, polycrystalline silicon (polysilicon), and amorphous silicon can be used as the silicon. Resistance can be reduced by using single crystalline silicon or polycrystalline silicon, and manufacturing can be performed through a simple manufacturing process by using amorphous silicon. Note that, in the case of using aluminum or silver, because of its high conductivity, signal delay can be reduced, and patterning can be easily performed to perform microfabrication because it is easy to be etched. Further, also in the case of using copper, signal delay can be reduced because of its high conductivity. In the case of using molybdenum, a problem such as a material defect does not occur in the manufacturing process even if molybdenum is in contact with an oxide semiconductor such as ITO or IZO, or silicon, patterning or etching can be performed easily, and the heat resistance is high. In the case of using titanium also, a problem such as a material defect does not occur in the manufacturing process even if titanium is in contact with an oxide semiconductor such as ITO or IZO or silicon, and the heat resistance is high. Further, tungsten or neodymium is also preferable because of its high heat resistance. In particular, an alloy of neodymium and aluminum is preferable in that the heat resistance is improved and a hillock of aluminum can be suppressed. Further, silicon is preferable in that it can be formed at the same time as a semiconductor layer included in a transistor and the heat resistance is high. Further, Indium Tin Oxide (ITO), Indium Zinc Oxide (IZO), ITO containing silicon oxide (ITSO), zinc oxide (ZnO), or silicon (Si) which has a light-transmitting property is preferable when it is used for a portion though which light is transmitted; for example, they can be used for a pixel electrode or a common electrode.

Note that each wiring or electrode may employ either a single layer structure or a multi-layer structure using any of the above-described materials. By employing a single layer structure, the manufacturing process can be simplified, the number of process days can be reduced, and cost can be reduced. Alternatively, by employing a multi-layer structure, advantages of the materials can be utilized while disadvantages thereof can be decreased, thereby high-performance wiring or electrode can be formed. For example, by containing a low-resistance material (e.g., aluminum) in the multi-layer structure, the resistance of the wiring can be reduced. Further, by containing a high heat resistance material in the multi-layer structure (e.g., a stacked-layer structure in which a low heat resistance material having an advantage is sandwiched using a high heat resistance material), the heat resistance can be improved as the whole of the wiring or the electrode. For example, it is preferable to employ a stacked-layer structure in which a layer containing aluminum is sandwiched by layers containing molybdenum or titanium. Note that when a wiring or an electrode has a portion which is directly in contact with a wiring or an electrode formed of another material, they may have an adverse effect on each other. For example, one material is mixed into the other material to change properties of both the materials, thereby, for example, an original purpose cannot be achieved or a problem occurs at the time of manufacturing so that normal manufacturing cannot be performed. In this case, such a problem can be solved by sandwiching or covering one layer by another layer. For example, when Indium Tin Oxide (ITO) and aluminum are in contact with each other, titanium or molybdenum is preferably sandwiched therebetween. Similarly, also when silicon and aluminum are made to be in contact with each other, titanium or molybdenum is preferably sandwiched therebetween.

Note that this embodiment mode can be implemented freely combining with any description in the other embodiment modes of this specification. Further, the descriptions in this embodiment mode can be freely combined to be implemented.

Embodiment Mode 11

Figure 64A:
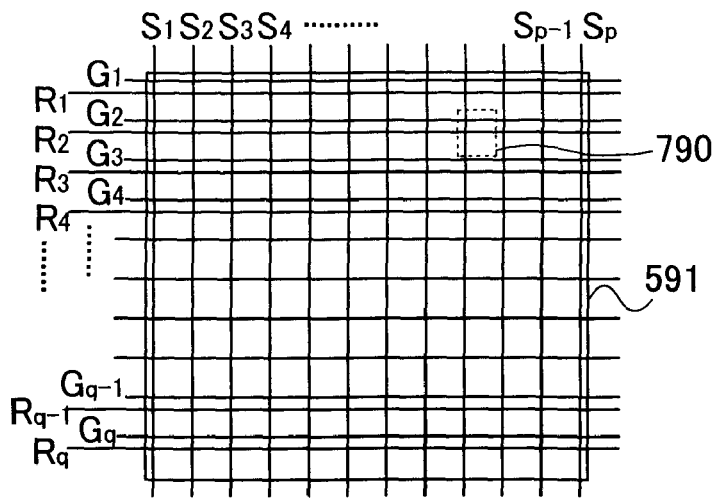
FIG. 64A is a diagram showing a structure of a display panel and FIGS. 64B and 64C are diagrams each showing a configuration of an EL pixel of the present invention.

FIG. 64A shows a structure example of the pixel portion 591 shown in FIG. 62A or 62B (hereinafter referred to as a second pixel structure), which is different from the first pixel structure described in Embodiment Mode 10. The pixel portion 591 includes a plurality of source signal lines S1 to Sp (p is a natural number), a plurality of scan lines G1 to Gq (q is a natural number) and a plurality of scan lines R1 to Rq provided so as to intersect the plurality of source signal lines S1 to Sp, and a pixel 790 which is provided for each intersection of the source signal lines S1 to Sp and the scan lines G1 to Gq.

Figure 64B:
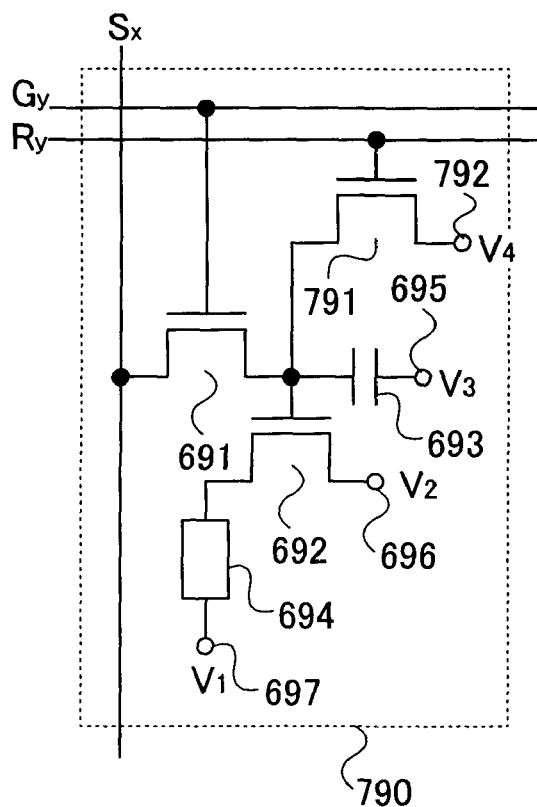

A configuration of the pixel 790 shown in FIG. 64A is shown in FIG. 64B. FIG. 64B shows the pixel 790 formed at an intersection of one Sx (x is a natural number equal to or smaller than p) of the plurality of source signal lines S1 to Sp, one Gy (y is a natural number equal to or smaller than q) of the plurality of scan lines G1 to Gq, and one Ry of the plurality of scan lines R1 to Rq. Note that the same portions as FIG. 63B are denoted by the same reference numerals in the pixel structure shown in FIG. 64B, and description thereof is omitted. The pixel 790 in FIG. 64B is different from the pixel 690 in FIG. 63B in that a third transistor 791 is further provided. The third transistor 791 may be either an N-channel transistor or a P-channel transistor. As each transistor for forming the pixel 790, a thin film transistor can be used.

A gate of the third transistor 791 is connected to the scan line Ry, one of a source and a drain thereof is connected to a gate of the second transistor 692 and one electrode of the capacitor 693, and the other of the source and the drain thereof is connected to a node 792 to which a potential V4 is supplied.

A display method of the pixel portion 591 shown in FIGS. 64A and 64B is described.

A method by which the light-emitting element 694 emits light is the same as that described in Embodiment Mode 10. In accordance with the pixel structure shown in FIGS. 64A and 64B, since the scan line Ry and the third transistor 791 are provided, no-light emission state of the light-emitting element 694 can be obtained regardless of the image signal imputed from the source line Sx. By a signal inputted into the scan line Ry, time for light emission of the light-emitting element 694 in the pixel 790 can be set. In this manner, a light-emitting period which is shorter than a period during which all the scan lines G1 to Gq are selected sequentially can be set. In this manner, a short subframe period can be set in the case where display is performed by a time-division gray scale method, thereby display in a high gray-scale level can be performed.

The potential V4 may be set such that the second transistor 692 becomes OFF state when the third transistor 791 becomes ON state. For example, the potential V4 can be set such that it becomes equal to the potential V3 when the third transistor 791 becomes ON state. By setting the potentials V3 and V4 to the same potential, electrical charges held in the capacitor 693 are discharged, and a gate-source voltage of the second transistor 692 becomes zero, thereby turning off the second transistor 692. In the case where the potential V3 and the potential V4 are the same potential, the node 695 and the node 792 may be connected to the same wiring.

Note that an arrangement of the third transistor 791 is not limited to that shown in FIG. 64B. For example, the third transistor 791 may also be provided in series with the second transistor 692. In such a configuration, current to flow into the light-emitting element 694 is shut off and no-light emission state of the light-emitting element 694 can be obtained by making the third transistor 791 OFF state with a signal inputted into the scan line Ry.

Figure 64C:
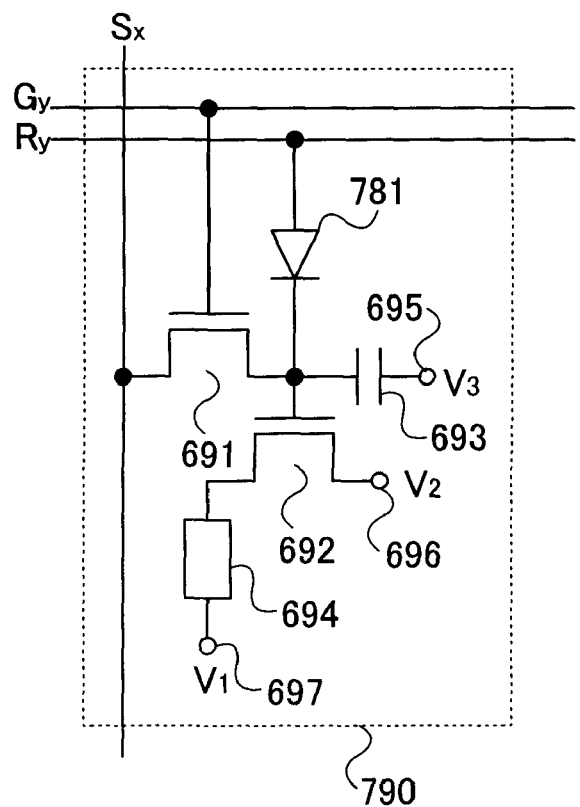

A diode can also be used instead of the third transistor 791 shown in FIG. 64B. FIG. 64C shows a configuration of a pixel in which a diode is used instead of the third transistor 791. Note that the same portions as FIG. 64B are denoted by the same reference numerals in the pixel structure shown in FIG. 64C, and description thereof is omitted. One electrode of a diode 781 is connected to the scan line Ry, and the other electrode thereof is connected to a gate of the second transistor 692 and one electrode of the capacitor 693.

In the diode 781, current flows from one electrode to the other electrode. The second transistor 692 is a P-channel transistor. By increasing the potential of one electrode of the diode 781, the potential of the gate of the second transistor 692 is increased so that the second transistor 692 can become OFF state.

Although current flows from one electrode of the diode 781 connected to the scan line Ry to the other electrode thereof connected to the gate of the second transistor 692 and the second transistor 692 is a P-channel transistor, the present invention is not limited to this. A configuration in which current flows from the other electrode of the diode 781 connected to the gate of the second transistor 692 to the one electrode thereof connected to the scan line Ry and the second transistor 692 is an N-channel transistor may also be used. In the case where the second transistor 692 is an N-channel transistor, by decreasing the potential of the one electrode of the diode 781, the potential of the gate of the second transistor 692 is decreased so that the second transistor 692 can become OFF state.

As the diode 781, a diode-connected transistor may also be used. The diode-connected transistor means a transistor with the gate and the drain connected to each other. As the diode-connected transistor, either a P-channel transistor or an N-channel transistor may be used.

Note that this embodiment mode can be implemented freely combining with any description in the other embodiment modes of this specification. Further, the descriptions in this embodiment mode can be freely combined to be implemented.

Embodiment Mode 12

Figure 65A:
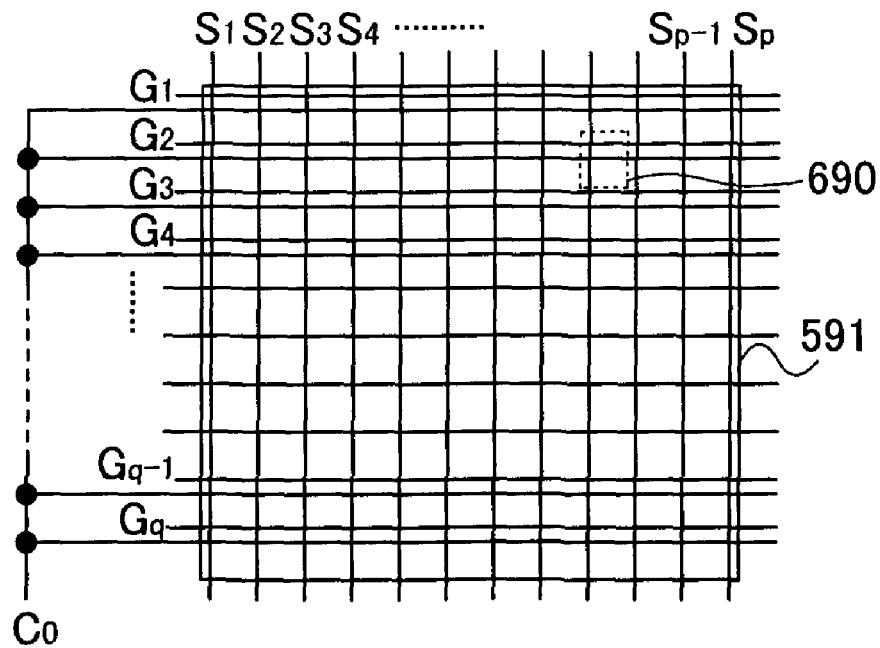
FIGS. 65A and 65B are diagrams respectively showing a structure of a display panel and a configuration of a liquid crystal pixel of the present invention.

FIG. 65A shows a structure example of the pixel portion 591 shown in FIG. 62A or 62B (hereinafter referred to as a third pixel structure). The pixel portion 591 includes a plurality of source signal lines S1 to Sp (p is a natural number), a plurality of scan lines G1 to Gq (q is a natural number) provided so as to intersect the plurality of source signal lines S1 to Sp, and the pixel 690 which is provided for each intersection of the source signal lines S1 to Sp and the scan lines G1 to Gq.

Figure 65B:
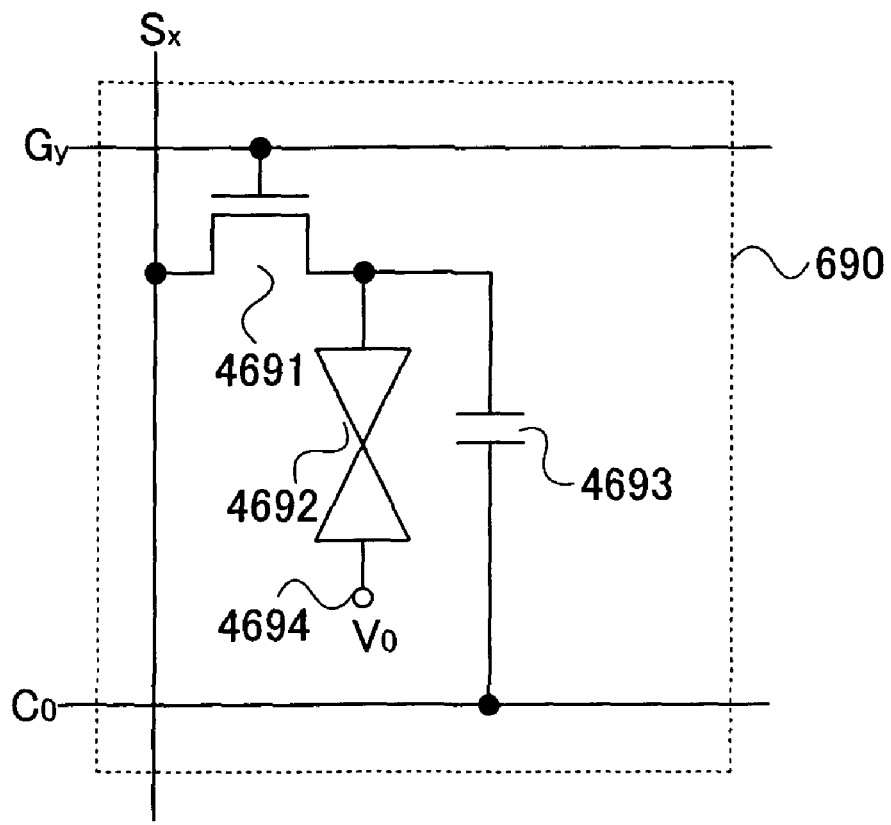

A configuration of the pixel 690 shown in FIG. 65A is shown in FIG. 65B. FIG. 65B shows the pixel 690 formed at an intersection of one Sx (x is a natural number equal to or smaller than p) of the plurality of source signal lines S1 to Sp and one Gy (y is a natural number equal to or smaller than q) of the plurality of scan lines G1 to Gq. Further, a capacitance line C0 is provided for each row. The pixel 690 includes a transistor 4691, a liquid crystal element 4692, and a capacitor 4693. The transistor 4691 may be either an N-channel transistor or a P-channel transistor. As each transistor for forming the pixel 690, a thin film transistor can be used.

A gate of the transistor 4691 is connected to the scan line Gy, one of a source and a drain thereof is connected to the source signal line Sx, and the other of the source and the drain thereof is connected to one electrode of the liquid crystal element 4692 and one electrode of the capacitor 4693. The other electrode of the liquid crystal element 4692 is connected to a node 4694 to which a potential V0 is supplied. The other electrode of the capacitor 4693 is connected to the capacitance line C0. To the capacitance line C0, the same potential as the potential V0 supplied to the node 4694 is supplied.

A display method of the pixel portion 591 shown in FIGS. 65A and 65B is described.

One of the plurality of scan lines G1 to Gq is selected, and during the time in which the scan line is selected, image signals are inputted into all of the plurality of source signal lines S1 to Sp. In this manner, image signals are inputted into pixels of one row in the pixel portion 591. The plurality of scan lines G1 to Gq are selected sequentially and during each time, the similar operation is performed, so that image signals are inputted into all the pixels 690 in the pixel portion 591.

Described is an operation of the pixel 690 in which one Gy of the plurality of scan lines G1 to Gq is selected and an image signal is inputted from one Sx of the plurality of source signal lines S1 to Sp. When the scan line Gy is selected, the transistor 4691 becomes ON state. ON state of a transistor means that the source and the drain are electrically connected, and OFF state of the transistor means that the source and the drain are not electrically connected. When the transistor 4691 becomes ON state, the image signal inputted into the source signal line Sx is inputted into the one electrode of the liquid crystal element 4692 and the one electrode of the capacitor 4693 through the transistor 4691. In this manner, a voltage (which corresponds to a potential difference between the potential of the inputted image signal and the potential V0 of the node 4694) is applied between the pair of electrodes of the liquid crystal element 4692, thereby transmittance of the liquid crystal element 4692 is changed.

Note that this embodiment mode can be implemented freely combining with any description in the other embodiment modes of this specification. Further, the descriptions in this embodiment mode can be freely combined to be implemented.

Embodiment Mode 13

Figure 48A:
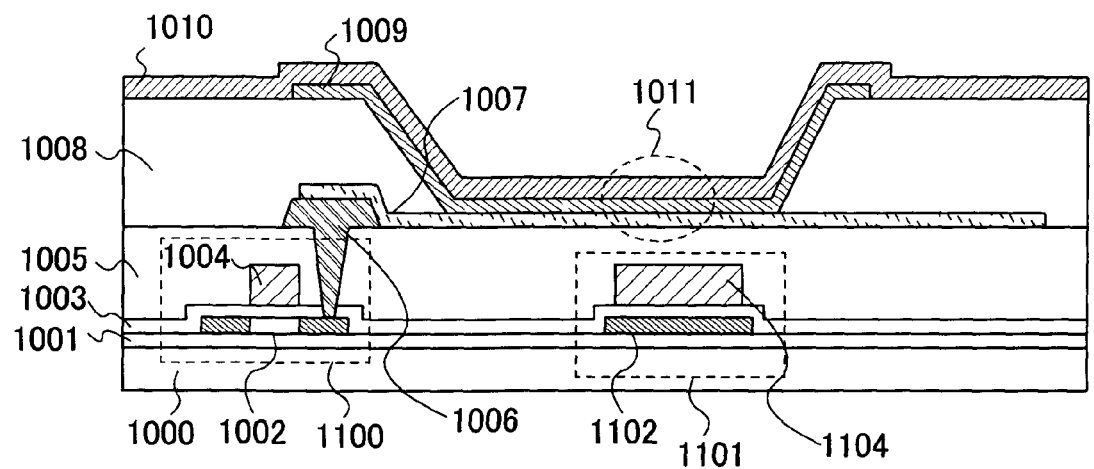
FIGS. 48A and 48B are diagrams each showing a cross-sectional diagram of a pixel of the present invention.
Figure 48B:
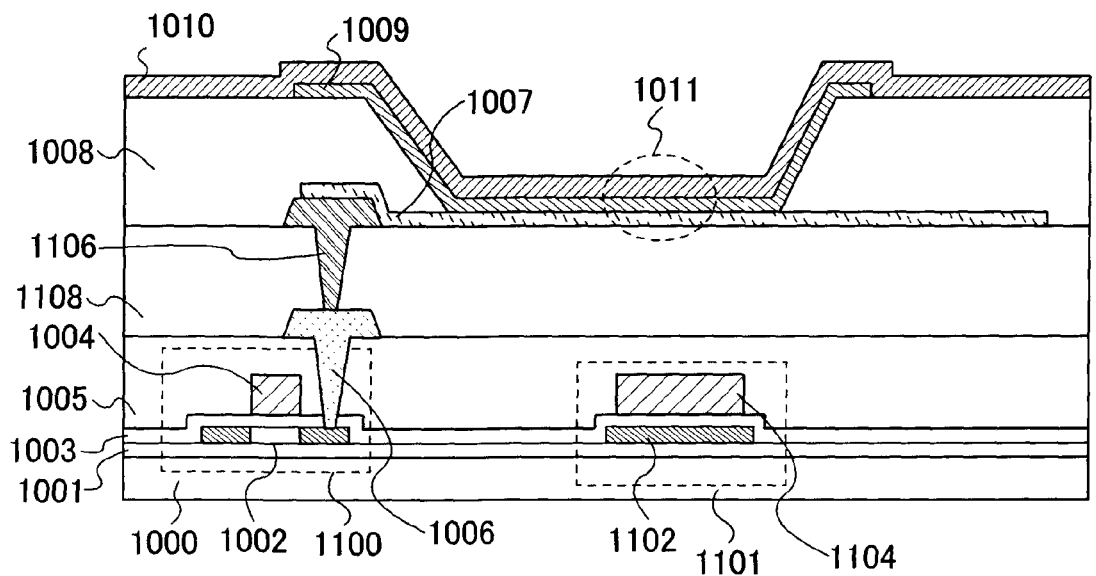

This embodiment mode describes an example of a pixel actually manufactured. Each of FIGS. 48A and 48B is a cross-sectional diagram of a pixel of the panel described in each of Embodiment Modes 11 and 12. An example of a light-emitting device in which a TFT is used as a switching element disposed in the pixel and a light-emitting element is used as a display medium disposed in the pixel is shown.

In FIGS. 48A and 48B, 1000 denotes a substrate, 1001 denotes a base film, 1002 denotes a semiconductor layer, 1102 denotes a semiconductor layer, 1003 denotes a first insulating film, 1004 denotes a gate electrode, 1104 denotes an electrode, 1005 denotes a second insulating film, 1006 denotes an electrode, 1007 denotes a first electrode, 1008 denotes a third insulating film, 1009 denotes a light-emitting layer, and 1010 denotes a second electrode. Reference numeral 1100 denotes a TFT, 1011 denotes a light-emitting element, and 1101 denotes a capacitor In FIGS. 48A and 48B, the TFT 1100 and the capacitor 1101 are typically shown as elements for forming each pixel. A structure shown in FIG. 48A is described.

As the substrate 1000, a glass substrate made of barium borosilicate glass, alumino borosilicate glass, or the like, a quartz substrate, a ceramic substrate, or the like can be used. Further, a metal substrate containing stainless steel or a semiconductor substrate with an insulating film formed thereon may also be used. A substrate formed of a flexible synthetic resin such as plastic may also be used. A surface of the substrate 1000 may be planarized by polishing such as CMP.

As the base film 1001, an insulating film of silicon oxide, silicon nitride, silicon nitride oxide, or the like can be used. The base film 1001 can prevent diffusion of alkaline metals such as Na or alkaline earth metals contained in the substrate 1000 into the semiconductor layer 1002, which would otherwise adversely affect the characteristics of the TFT 1100. Although the base film 1001 employs a single layer structure in FIGS. 48A and 48B, it may employ a multi-layer structure of two or more layers. Note that the base film 1001 is not necessarily provided in the case where diffusion of impurities does not matter, such as in the case of using a quartz substrate.

As the semiconductor layer 1002 and the semiconductor layer 1102, patterned crystalline semiconductor film or amorphous semiconductor film can be used. The crystalline semiconductor film can be obtained by crystallizing an amorphous semiconductor film. As the crystallization method, laser crystallization, thermal crystallization using RTA or an annealing furnace, thermal crystallization using metal elements which promote crystallization, or the like can be used. The semiconductor layer 1002 includes a channel formation region and a pair of impurity regions doped with impurity elements which impart conductivity type. Note that impurity regions (LDD regions) which are doped with the aforementioned impurity elements at a lower concentration may also be provided between the channel formation region and the pair of impurity regions. The semiconductor layer 1102 may be entirely doped with impurity elements which impart conductivity type.

The first insulating film 1003 can be formed of silicon oxide, silicon nitride, silicon nitride oxide, or the like, and either a single layer structure or a stacked-layer structure can be employed.

Note that the first insulating film 1003 may be formed of a film containing hydrogen so as to hydrogenate the semiconductor layer 1002.

The gate electrode 1004 and the electrode 1104 may be formed of one kind of element selected from Ta, W, Ti, Mo, Al, Cu, Cr, and Nd, or an alloy or a compound containing such elements. Further, either a single layer structure or a stacked-layer structure thereof can be employed.

The TFT 1100 includes the semiconductor layer 1002, the gate electrode 1004, and the first insulating film 1003 sandwiched between the semiconductor layer 1002 and the gate electrode 1004. Although only the TFT 1100 connected to the first electrode 1007 of the light-emitting element 1011 is shown as a TFT for forming each pixel in FIGS. 48A and 48B, a plurality of TFTs may also be provided. Further, although the TFT 1100 is described as a top-gate transistor in this embodiment mode, the TFT 1100 may also be either a bottom-gate transistor having a gate electrode below a semiconductor layer, or a dual-gate transistor having gate electrodes above and below a semiconductor layer.

The capacitor 1101 is formed to have the first insulating film 1003 as a dielectric, and a pair of electrodes which are the semiconductor layer 1102 and the electrode 1104 facing each other with the first insulating film 1003 interposed therebetween. Although the semiconductor layer 1102 which is formed at the same time as the semiconductor layer 1002 of the TFT 1100 is used as one of the pair of electrodes of the capacitor and the electrode 1104 which is formed at the same time as the gate electrode 1004 of the TFT 1100 is used as the other electrode of the capacitor included in each pixel shown in FIGS. 48A and 48B, the present invention is not limited to this structure.

As the second insulating film 1005, a single layer or a stacked layer using an inorganic insulating film or an organic insulating film can be used. As the inorganic insulating film, a silicon oxide film formed by CVD, a silicon oxide film formed by SOG (Spin On Glass), or the like can be used. As the organic insulating film, a film of polyimide, polyamide, BCB (benzocyclobutene), acrylic, a positive photosensitive organic resin, a negative photosensitive organic resin, or the like can be used.

Further, the second insulating film 1005 may also be formed of a material having a skeletal structure with a bond of silicon (Si) and oxygen (O). As a substituent of such a material, an organic group containing at least hydrogen (e.g., an alkyl group or aromatic hydrocarbon) is used. Alternatively, a fluoro group may be used as the substituent or both the fluoro group and the organic group containing at least hydrogen may be used as the substituent.

Note that a surface of the second insulating film 1005 may be nitrided by high-density plasma treatment. High-density plasma is generated by using microwaves with a high frequency, e.g., 2.45 GHz. Note that as the high-density plasma, plasma with an electron density of $1\times10^{11}$ cm$^{-3}$ or more and an electron temperature of equal to or more than 0.2 eV and equal to or less than 2.0 eV (preferably, equal to or more than 0.5 eV and equal to or less than 1.5 eV) is used. Since the high-density plasma which is low in electron temperature as described above has low kinetic energy of active species, a less defective film with little plasma damage can be formed as compared with that formed by conventional plasma treatment. In performing high-density plasma treatment, the substrate 1000 is set at a temperature of 350 to 450° C. In addition, the distance between an antenna for generating microwaves and the substrate 1000 in an apparatus for generating high-density plasma is set to 20 to 80 mm (preferably, 20 to 60 mm).

The surface of the second insulating film 1005 is nitrided by performing the above-described high-density plasma treatment under an atmosphere containing nitrogen (N) and a rare gas (containing at least one of He, Ne, Ar, Kr, and Xe), an atmosphere containing nitrogen, hydrogen (H), and a rare gas, or an atmosphere containing NH$_3$ and a rare gas. In the surface of the second insulating film 1005 formed by such nitridation treatment with high-density plasma, elements such as H, He, Ne, Ar, Kr, or Xe are mixed. For example, by using a silicon oxide film or a silicon oxynitride film as the second insulating film 1005 and treating the surface of the film with high-density plasma, a silicon nitride film is formed. Hydrogen contained in the silicon nitride film formed in this manner may be used for hydrogenating the semiconductor layer 1002 of the TFT 1100. Note that this hydrogenation treatment may be combined with the above-described hydrogenation treatment using hydrogen contained in the first insulating film 1003.

Note that an insulating film may be further formed over the nitride film formed by the high-density plasma treatment, for forming the second insulating film 1005.

The electrode 1006 can be formed of one kind of elements selected from Al, W, Mo, Ti, Pt, Cu, Ta, Au, and Mn, or an alloy containing two or more kinds of elements selected from Al, Ni, C, W, Mo, Ti, Pt, Cu, Ta, Au, and Mn. Further, either a single layer structure or a stacked-layer structure can be employed.

One or both of the first electrode 1007 and the second electrode 1010 can be formed as a light-transmissive electrode. The light-transmissive electrode can be formed of indium oxide containing tungsten oxide (IWO), indium oxide containing tungsten oxide and zinc oxide (IWZO), indium oxide containing titanium oxide (ITiO), indium tin oxide containing titanium oxide (ITTiO), or the like. Needless to say, indium tin oxide (ITO), indium zinc oxide (IZO), indium tin oxide doped with silicon oxide (ITSO), or the like may also be used.

Light-emitting elements are classified into a light-emitting element to which a DC voltage is applied to emit light (hereinafter referred to as a DC drive light-emitting element) and a light-emitting element to which an AC voltage is applied to emit light (hereinafter referred to as an AC drive light-emitting element).

In a DC drive light-emitting element, a light-emitting layer is preferably formed of a plurality of layers having different functions, such as a hole injecting/transporting layer, a light-emitting layer, and an electron injecting/transporting layer.

The hole injecting/transporting layer is preferably formed of a composite material of an organic compound material having a hole transporting property and an inorganic compound material which exhibits an electron accepting property with respect to the organic compound material. By employing such a structure, a large number of hole carriers are generated in the organic compound which inherently has few carriers, thereby an extremely excellent hole injecting/transporting property can be obtained. Due to such an effect, a driving voltage can be reduced than in a conventional structure. Further, since the hole injecting/transporting layer can be formed thick without increasing the driving voltage, short circuits of the light-emitting element due to dust or the like can be also suppressed.

As an organic compound material having a hole transporting property, there are the following, and the present invention is not limited to this: 4,4',4''-tris[N-(3-methylphenyl)-N-phenylamino]triphenylamine (abbreviation: MTDATA); 1,3,5-tris[N,N-di(m-tolyl)amino]benzene (abbreviation: m-MTDAB); N,N'-diphenyl-N,N'-bis(3-methylphenyl)-1,1'-biphenyl-4,4'-diamine (abbreviation: TPD); 4,4'-bis[N-(1-naphthyl)-N-phenylamino]biphenyl (abbreviation: NPB); or the like.

As an inorganic compound material which exhibits an electron accepting property, there are the following: titanium oxide, zirconium oxide, vanadium oxide, molybdenum oxide, tungsten oxide, rhenium oxide, ruthenium oxide, zinc oxide, or the like. In particular, vanadium oxide, molybdenum oxide, tungsten oxide, and rhenium oxide are preferable since they can be deposited in vacuum and are easy to be handled.

The electron injecting/transporting layer is formed of an organic compound material having an electron transporting property. Specifically, there are the following, and the present invention is not limited to this: tris(8-quinolinolato)aluminum (abbreviation: Alq$_3$); tris(4-methyl-8-quinolinolato)aluminum (abbreviation: Almq$_3$); or the like.

In the DC drive light-emitting element, the light-emitting layer can be formed of the following: 9,10-di(2-naphthyl)anthracene (abbreviation: DNA); 9,10-di(2-naphthyl)-2-tert-butylanthracene (abbreviation: t-BuDNA); 4,4'-bis(2,2-diphenylvinyl)biphenyl (abbreviation: DPVBi); coumarin 30; coumarin 6; coumarin 545; coumarin 545T; perylene; rubrene; periflanthene; 2,5,8,11-tetra(tert-butyl)perylene (abbreviation: TBP); 9,10-diphenylanthracene (abbreviation: DPA); 5,12-diphenyltetracene; 4-(dicyanomethylene)-2-methyl-[p-(dimethylamino)styryl]-4H-pyran (abbreviation: DCM1); 4-(dicyanomethylene)-2-methyl-6-[2-(julolidine-9-yl)ethenyl]-4H-pyran (abbreviation: DCM2); 4-(dicyanomethylene)-2,6-bis[p-(dimethylamino)styryl]-4H-pyran (abbreviation: BisDCM); or the like. Alternatively, the following compounds capable of generating phosphorescence can be used: bis[2-(4',6'-difluorophenyl)pyridinato-N,C$^{2'}$]iridium (picolinate) (abbreviation: FIrpic); bis{2-[3',5'-bis(trifluoromethyl)phenyl]pyridinato-N,C$^{2'}$}iridium(picolinate) (abbreviation: Ir(CF$_3$ ppy)$_2$(pic)); tris(2-phenylpyridinato-N,C$^{2'}$)iridium (abbreviation: Ir(ppy)$_3$); bis(2-phenylpyridinato-N,C$^{2'}$)iridium(acetylacetonate) (abbreviation: Ir(ppy)$_2$(acac)); bis[2-(2'-thienyl)pyridinato-N,C$^{3'}$]iridium (acetylacetonate) (abbreviation: Ir(thp)$_2$(acac)); bis(2-phenylquinolinato-N,C$^{2'}$)iridium(acetylacetonate) (abbreviation: Ir(pq)$_2$(acac)); bis[2-(2'-benzothienyl)pyridinato-N,C$^{3'}$]iridium(acetylacetonate) (abbreviation: Ir(btp)$_2$(acac)); or the like.

Further alternatively, the light-emitting layer can be formed of an electroluminescent polymeric material such as a polyparaphenylene-vinylene-based material, a polyparaphenylene-based material, a polythiophene-based material, or a polyfluorene-based material.

The other of the first electrode 1007 and the second electrode 1010 may be formed of a material which does not transmit light. For example, it may be formed of an alkaline metal such as Li or Cs, an alkaline earth metal such as Mg, Ca, or Sr, an alloy containing any of them (e.g., MgAg, AlLi, or MgIn), a compound containing any of them (e.g., CaF$_2$ or calcium nitride), or a rare earth metal such as Yb or Er.

The third insulating film 1008 can be formed of a similar material to the second insulating film 1005. The third insulating film 1008 is formed on the periphery of the first electrode 1007 so as to cover end portions of the first electrode 1007, and has a function of separating the light-emitting layer 1009 per pixel.

The light-emitting layer 1009 is formed of a single layer or a plurality of layers. In the case where the light-emitting layer 1009 is formed of a plurality of layers, the layers can be classified into a hole injecting layer, a hole transporting layer, a light-emitting layer, an electron transporting layer, an electron injecting layer, or the like, in terms of the carrier transporting properties. Note that each boundary between adjacent layers is not necessarily clear, and there may be the case where materials forming the adjacent layers are partially mixed with each other, which makes the interface between the adjacent layers unclear. Each layer can be formed of an organic material or an inorganic material. As the organic material, either a high molecular material or a low molecular material can be used.

The light-emitting element 1011 is formed of the light-emitting layer 1009, the first electrode 1007 and the second electrode 1010 which overlap each other with the light-emitting element 1009 interposed therebetween. One of the first electrode 1007 and the second electrode 1010 corresponds to an anode, and the other thereof corresponds to a cathode. The light-emitting element 1011 emits light when a forward-bias voltage which is higher than the threshold voltage is applied between the anode and the cathode and current flows from the anode to the cathode.

On the other hand, in the case of an AC drive light-emitting element, a double-insulating structure in which a light-emitting layer sandwiched between two insulating films is provided between a pair of electrodes is employed, and light emission can be obtained by applying AC voltage between the pair of electrodes. In the AC drive light-emitting element, the light-emitting layer can be formed of ZnS, SrS, BaAl$_2$S$_4$, or the like. Each insulating film by which the light-emitting layer is sandwiched can be formed of Ta$_2$O$_5$, SiO$_2$, Y$_2$O$_3$, BaTiO$_3$, SrTiO$_3$, silicon nitride, or the like.

A structure of FIG. 48B is described next. Note that the same portions as FIG. 48A are denoted by the same reference numerals, and description thereof is omitted.

FIG. 48B shows a structure in which an insulating film 1108 is provided between the second insulating film 1005 and the third insulating film 1008 in FIG. 48A. The electrode 1006 and the first electrode 1007 are connected by an electrode 1106 in a contact hole formed in the insulating film 1108.

Note that the electrode 1106 is not necessarily provided. That is, the first electrode 1007 may also be connected directly to the electrode 1006 without providing the electrode 1106. Thus a process for forming the electrode 1106 can be omitted, thereby cost can be reduced.

In the case where the first electrode 1007 is connected directly to the electrode 1006 without providing the electrode 1106, however, coverage of the first electrode 1007 may be deteriorated to be broken depending on a material or a manufacturing method of the first electrode 1007. In such a case, it is advantageous that the electrode 1006 and the first electrode 1007 are connected by the electrode 1106 in the contact hole formed in the insulating film 1108 as is in FIG. 48B.

The insulating film 1108 can employ a similar structure to the second insulating film 1005. The electrode 1106 can employ a similar structure to the electrode 1006.

Note that this embodiment mode can be implemented freely combining with any description in the other embodiment modes of this specification. Further, the descriptions in this embodiment mode can be freely combined to be implemented.

Embodiment Mode 14

Figure 49:
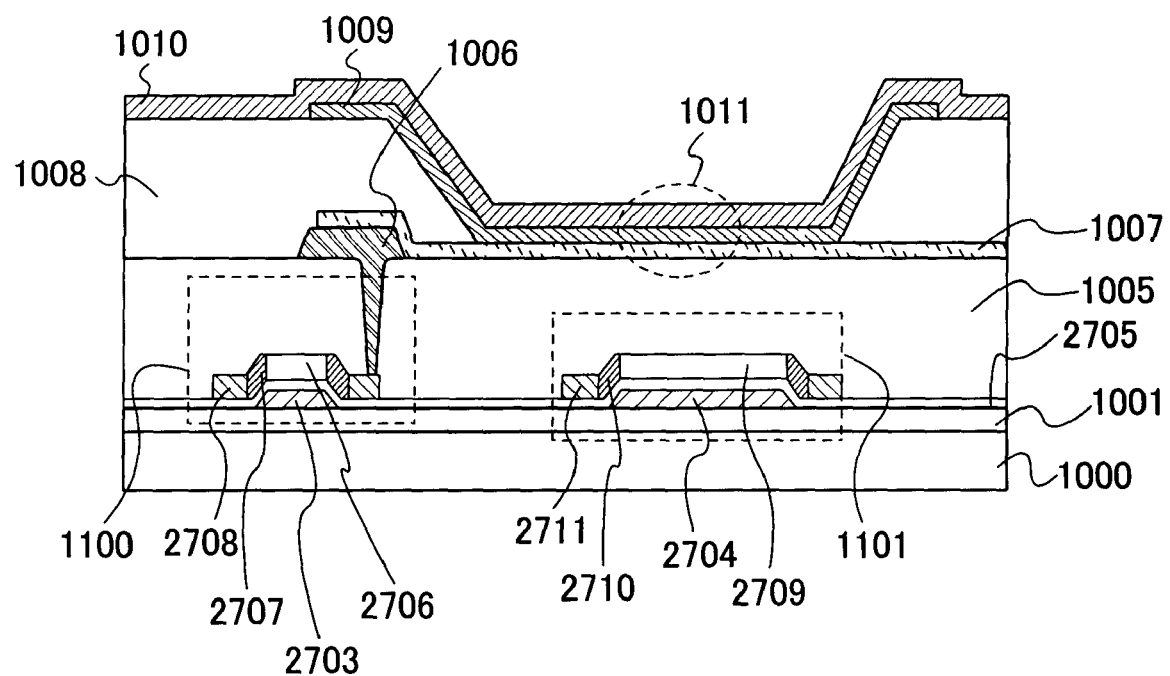
FIG. 49 is a cross-sectional diagram of a pixel of the present invention.

This embodiment mode describes an example of a pixel actually manufactured. FIG. 49 is a cross-sectional diagram of a pixel of the panel described in each of Embodiment Modes 9 to 11. An example of a light-emitting device in which a TFT is used as a switching element disposed in the pixel and a light-emitting element is used as a display medium disposed in the pixel is shown. Note that the same portions as FIGS. 48A and 48B described in Embodiment Mode 13 are denoted by the same reference numerals, and description thereof is omitted.

A pixel shown in FIG. 49 is different from the structure shown in FIG. 48A in Embodiment Mode 13, in each structure of the TFT 1100 and the capacitor 1101. In the example, a bottom-gate TFT is used as the TFT 1100. The TFT 1100 includes a gate electrode 2703, a semiconductor layer including a channel formation region 2706, LDD regions 2707, and impurity regions 2708, and a first insulating film 2705 between the gate electrode 2703 and the semiconductor layer. The first insulating film 2705 functions as a gate insulating film of the TFT 1100. The impurity regions 2708 become a source region and a drain region of the TFT 1100.

The capacitor 1101 is formed to have the first insulating film 2705 as a dielectric, and a pair of electrodes which are the semiconductor layer 1102 and the electrode 2704 facing each other with the first insulating film 2705 interposed therebetween. The semiconductor layer includes a channel formation region 2709, LDD regions 2710, and impurity regions 2711. Although the semiconductor layer which is formed at the same time as the semiconductor layer which becomes an active layer of the TFT 1100 is used as one of the pair of electrodes of the capacitor and the electrode 2704 which is formed at the same time as the gate electrode 2703 of the TFT 1100 is used as the other electrode of the capacitor included in each pixel shown in FIG. 49, the present invention is not limited to this structure.

Each of the semiconductor layer including the channel formation region 2706, the LDD regions 2707, and the impurity regions 2708, and the semiconductor layer including the channel formation region 2709, the LDD regions 2710, and the impurity regions 2711 can be formed of the same material as the semiconductor layer 1002 or the semiconductor layer 1102 in FIGS. 48A and 48B. The first insulating film 2705 can be formed of the same material as the first insulating film 1003 in FIGS. 48A and 48B. Each of the gate electrode 2703 and the electrode 2704 can be formed of the same material as the gate electrode 1004 in FIGS. 48A and 48B.

Each of the channel formation regions 2706 and 2709 may also be doped with impurity elements which impart conductivity type.

Note that this embodiment mode can be implemented freely combining with any description in the other embodiment modes of this specification. Further, the descriptions in this embodiment mode can be freely combined to be implemented.

Embodiment Mode 15

This embodiment mode describes an example of a pixel actually manufactured. FIG. 50 is a cross-sectional diagram of a pixel of the panel described in Embodiment Mode 11. An example of a light-emitting device in which a TFT is used as a switching element disposed in the pixel and a light-emitting element is used as a display medium disposed in the pixel is shown. Note that the same portions as FIGS. 48A and 48B described in Embodiment Mode 13 are denoted by the same reference numerals, and description thereof is omitted.

Figure 50A:
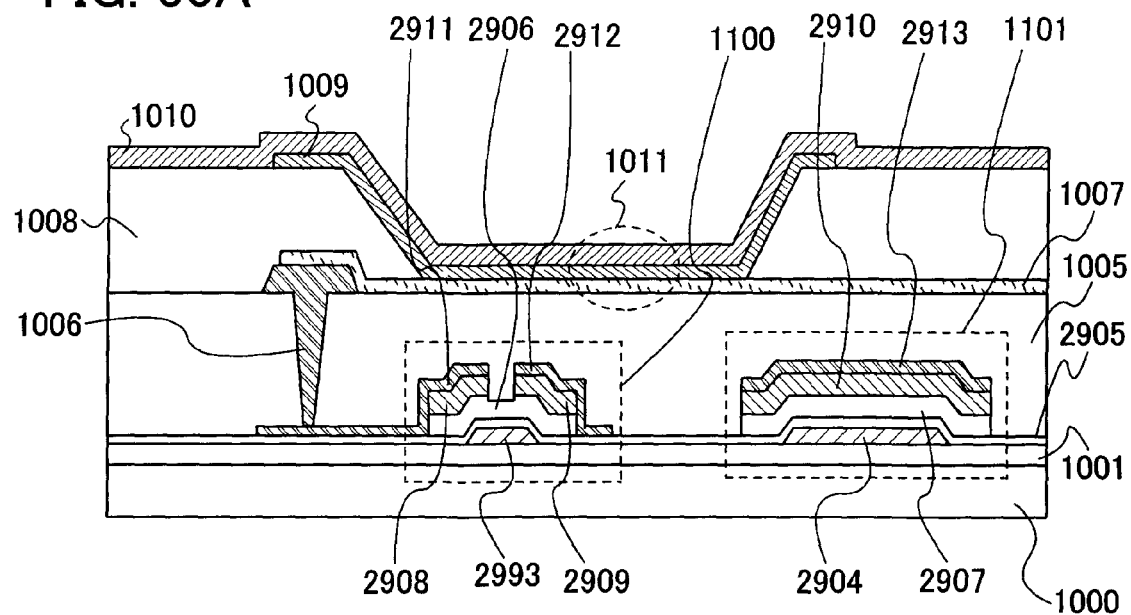
FIGS. 50A and 50B are diagrams each showing a cross-sectional diagram of a pixel of the present invention.
Figure 50B:
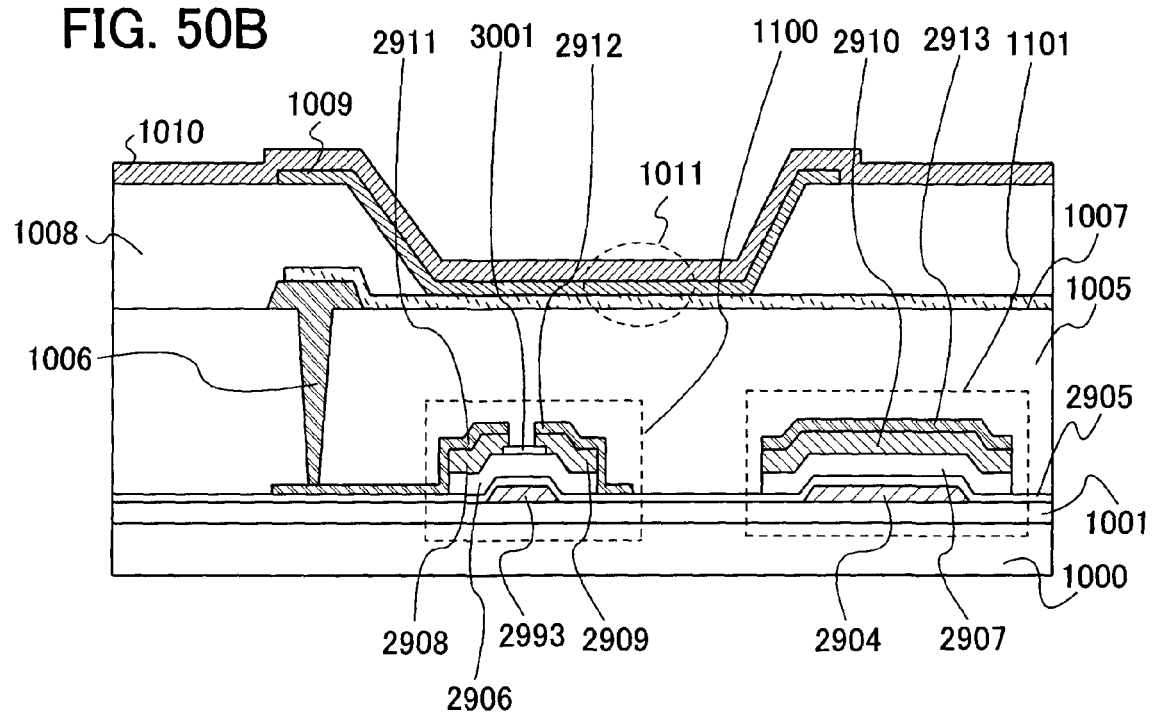

Each pixel shown in FIGS. 50A and 50B is different from the structure shown in FIG. 48A in Embodiment Mode 13, in each structure of the TFT 1100 and the capacitor 1101. In an example shown in FIG. 50A, a bottom-gate TFT of a channel etch type is used as the TFT 1100. In an example shown in FIG. 50B, a bottom-gate TFT of a channel protection type is used as the TFT 1100. The TFT of a channel protection type 1100 shown in FIG. 50B is different from the TFT of a channel etch type 1100 shown in FIG. 50A, in that an insulator 3001 to be an etching mask is provided over a region for forming a channel in a semiconductor film 2906.

In FIGS. 50A and 50B, the TFT 1100 includes a gate electrode 2993, a first insulating film 2905 over the gate electrode 2993, the semiconductor layer 2906 over the first insulating film 2905, and N-type semiconductor layers 2908 and 2909 over the semiconductor layer 2906. The first insulating film 2905 functions as a gate insulating film of the TFT 1100. The N-type semiconductor layers 2908 and 2909 become a source and a drain of the TFT 1100. Over the N-type semiconductor layers 2908 and 2909, electrodes 2911 and 2912 are formed. One end portion of the electrode 2911 is extended to a region where the semiconductor layer 2906 does not exist, and an electrode 1006 is formed in the region where the semiconductor layer 2906 does not exist, so as to be in contact with a top portion of the electrode 2911.

The capacitor 1101 is formed to have the first insulating film 2905 as a dielectric, an electrode 2904 as one electrode, a semiconductor layer 2907 which faces the electrode 2904 with the first insulating film 2905 interposed therebetween, an N-type semiconductor layer 2910 over the semiconductor layer 2907, and an electrode 2913 over the N-type semiconductor layer 2910 as the other electrode. The electrode 2904 can be formed at the same time as the gate electrode 2993. The semiconductor layer 2907 can be formed at the same time as the semiconductor layer 2906. The N-type semiconductor layer 2910 can be formed at the same time as the N-type semiconductor layers 2908 and 2909. The electrode 2913 can be formed at the same time as the electrodes 2911 and 2912.

Each of the gate electrode 2993 and the electrode 2904 can be formed of the same material as the gate electrode 1004 in FIGS. 48A and 48B. As each of the semiconductor layers 2906 and 2907, an amorphous semiconductor film can be used. The first insulating film 2905 can be formed of the same material as the first insulating film 1003 in FIGS. 48A and 48B. Each of the electrodes 2911, 2912, and 2913 can be formed of the same material as the electrode 1006. As each of the N-type semiconductor layers 2910, 2908, and 2909, a semiconductor film containing N-type impurities can be used.

Note that this embodiment mode can be implemented freely combining with any description in the other embodiment modes of this specification. Further, the descriptions in this embodiment mode can be freely combined to be implemented.

Embodiment Mode 16

Figure 51A:
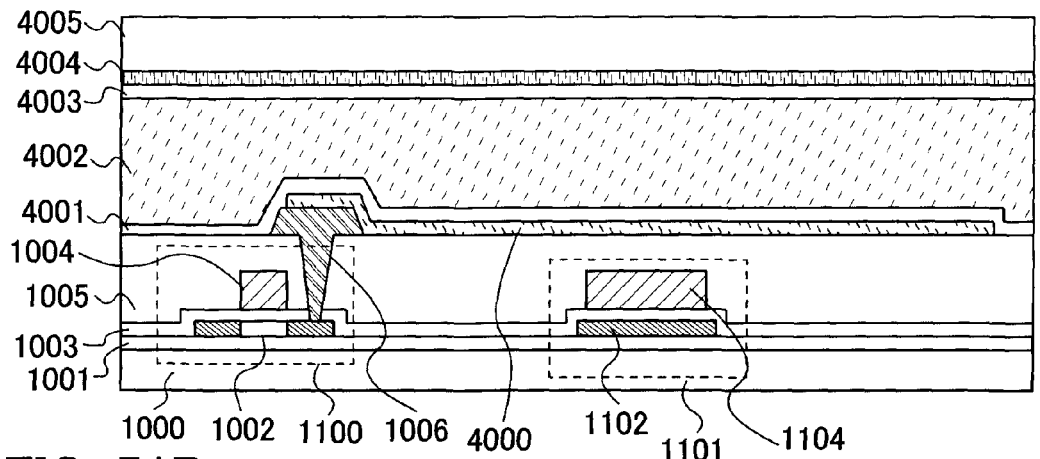
FIGS. 51A to 51C are diagrams each showing a cross-sectional diagram of a pixel of the present invention.
Figure 51B:
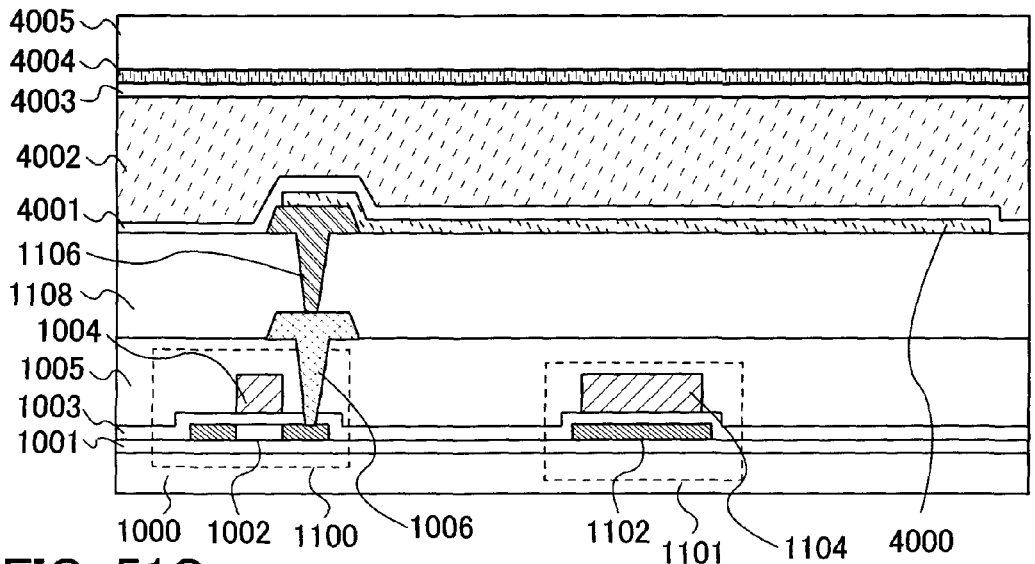
Figure 51C:
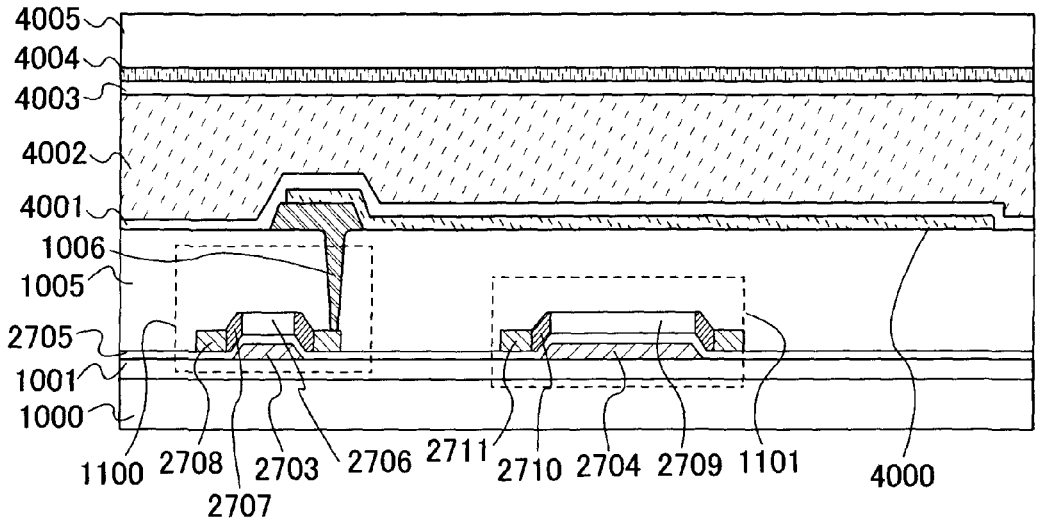

This embodiment mode describes an example of a pixel actually manufactured. FIGS. 51A to 51C are cross-sectional diagrams of a pixel of the panel described in Embodiment Mode 11. An example in which a TFT is used as a switching element disposed in the pixel and a liquid crystal element is used as a display medium disposed in the pixel is shown.

In each pixel shown in FIGS. 51A to 51C, a liquid crystal element is provided instead of the light-emitting element 1011 in each of the structures shown in FIGS. 48A and 48B described in Embodiment Mode 13 and the structure shown in FIG. 49 described in Embodiment Mode 14. Note that the same portions as FIGS. 48A, 48B, and 49 are denoted by the same reference numerals, and description thereof is omitted.

The liquid crystal element is formed of a first electrode 4000, an alignment film 4001 formed over the first electrode 4000, liquid crystals 4002, an alignment film 4003, and a second electrode 4004. By applying a voltage between the first electrode 4000 and the second electrode 4004, alignment of the liquid crystals is changed so that transmittance of the liquid crystal element is changed. The second electrode 4004 and the alignment film 4003 are provided for a counter substrate 4005.

One or both of the first electrode 4000 and the second electrode 4004 can be formed as a light-transmissive electrode. The light-transmissive electrode can be formed of indium oxide containing tungsten oxide (IWO), indium oxide containing tungsten oxide and zinc oxide (IWZO), indium oxide containing titanium oxide (ITiO), indium tin oxide containing titanium oxide (ITTiO), or the like. Needless to say, indium tin oxide (ITO), indium zinc oxide (IZO), indium tin oxide doped with silicon oxide (ITSO), or the like may also be used. The other of the first electrode 4000 and the second electrode 4004 may also be formed of a material which does not transmit light. For example, it may be formed of an alkaline metal such as Li or Cs, an alkaline earth metal such as Mg, Ca, or Sr, an alloy containing any of them (e.g., MgAg, AlLi, or MgIn), a compound containing any of them (e.g., $CaF_2$ or calcium nitride), or a rare earth metal such as Yb or Er.

As the liquid crystals 4002, known liquid crystals can be used as appropriate. For example, ferroelectric liquid crystals or anti-ferroelectric liquid crystals may be used as the liquid crystals 4002. Further, as a driving mode of the liquid crystals, a TN (Twisted Nematic) mode, a MVA (Multi-domain Vertical Alignment) mode, an ASM (Axially Symmetric aligned Micro-cell) mode, an OCB (Optically Compensated Bend) mode, or the like can be used as appropriate.

Although the pair of electrodes for applying voltage to the liquid crystals 4002 (the first electrode 4000 and the second electrode 4004) are formed over different substrates, the present invention is not limited to this. The second electrode 4004 may be formed over the substrate 1000, and then an IPS (In-Plane-Switching) mode may be used as the driving mode of the liquid crystals. Further, either one or both of the alignment films 4001 and 4003 is not necessarily provided depending on the liquid crystals 4002.

Note that this embodiment mode can be implemented freely combining with any description in the other embodiment modes of this specification. Further, the descriptions in this embodiment mode can be freely combined to be implemented.

Embodiment Mode 17

Figure 52A:
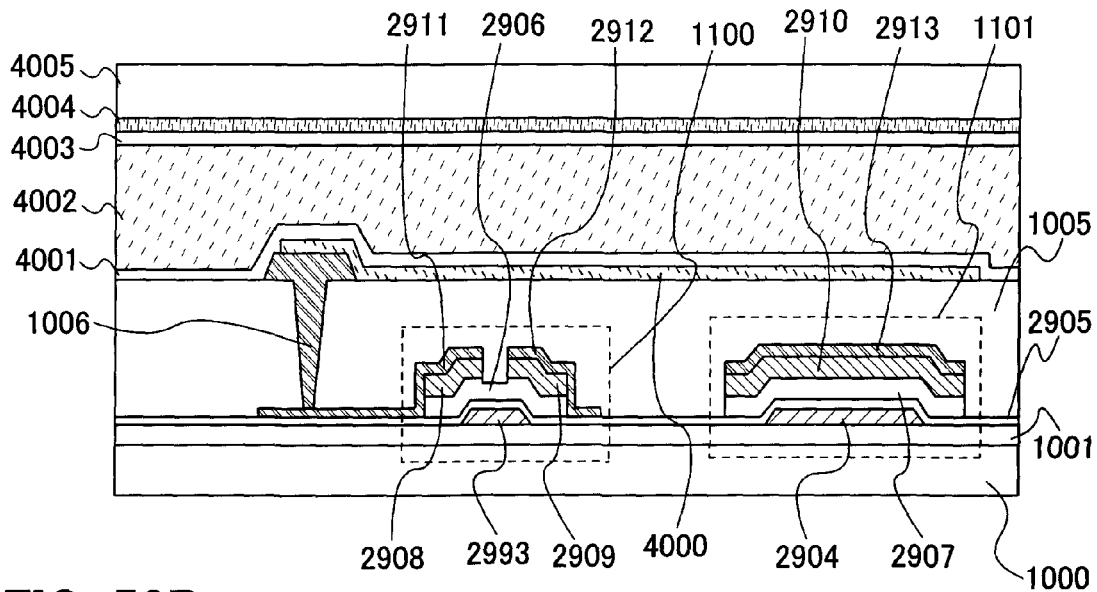
FIGS. 52A and 52B are diagrams each showing a cross-sectional diagram of a pixel of the present invention.
Figure 52B:
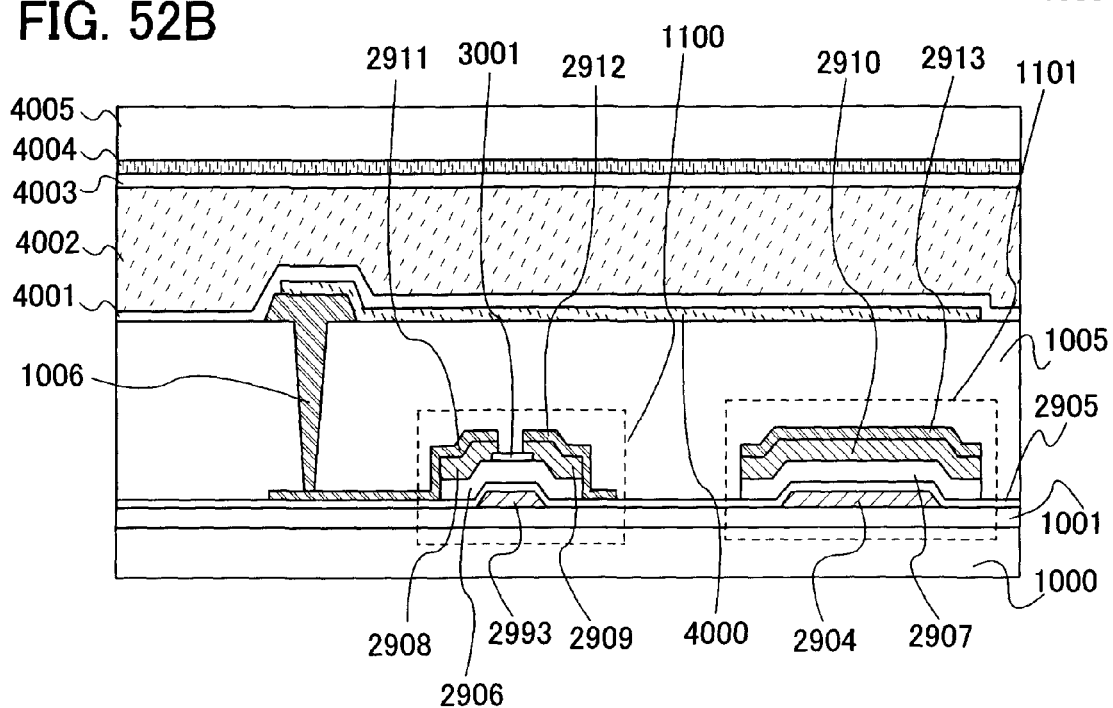

This embodiment mode describes an example of a pixel actually manufactured. FIGS. 52A and 52B are cross-sectional diagrams of a pixel of the panel described in Embodiment Mode 13. An example in which a TFT is used as a switching element disposed in the pixel and a liquid crystal element is used as a display medium disposed in the pixel is shown.

In each pixel shown in FIGS. 52A and 52B, a liquid crystal element is provided instead of the light-emitting element 1011 in each structure shown in FIGS. 50A and 50B in Embodiment Mode 15. Note that the same portions as FIGS. 50A and 50B are denoted by the same reference numerals, and description thereof is omitted. Further, a structure of the liquid crystal element, and the like are similar to those in each structure shown in FIGS. 51A to 50C described in Embodiment Mode 16, thus description thereof is omitted.

Note that this embodiment mode can be implemented freely combining with any description in the other embodiment modes of this specification. Further, the descriptions in this embodiment mode can be freely combined to be implemented.

Embodiment Mode 18

Figure 53A:
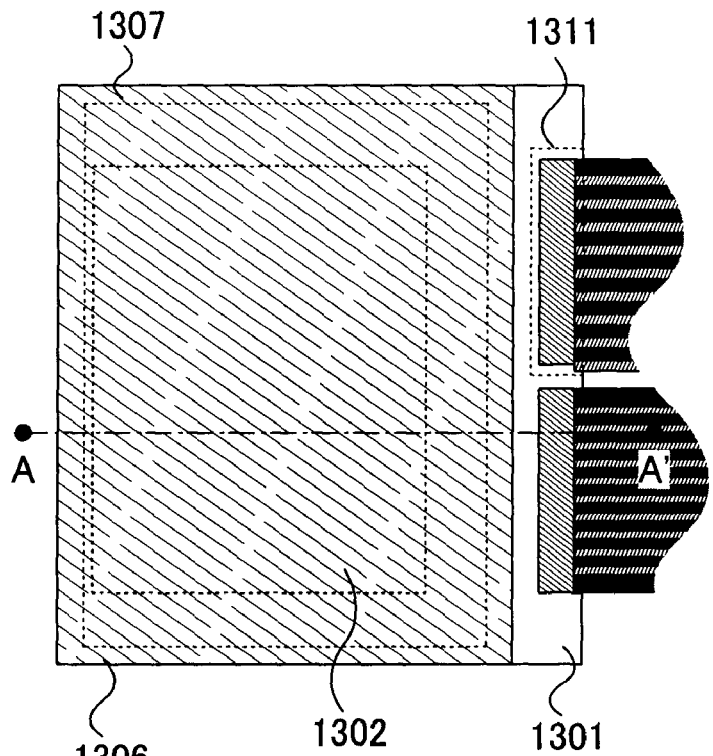
FIGS. 53A to 53C are diagrams each showing a display module of the present invention.
Figure 53B:
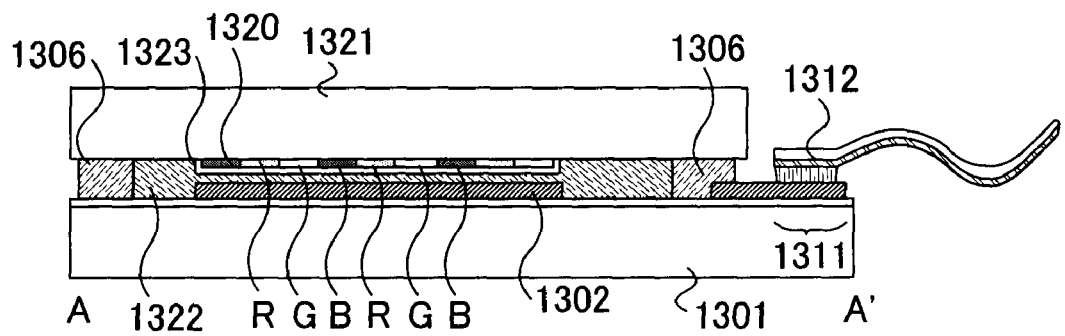
Figure 53C:
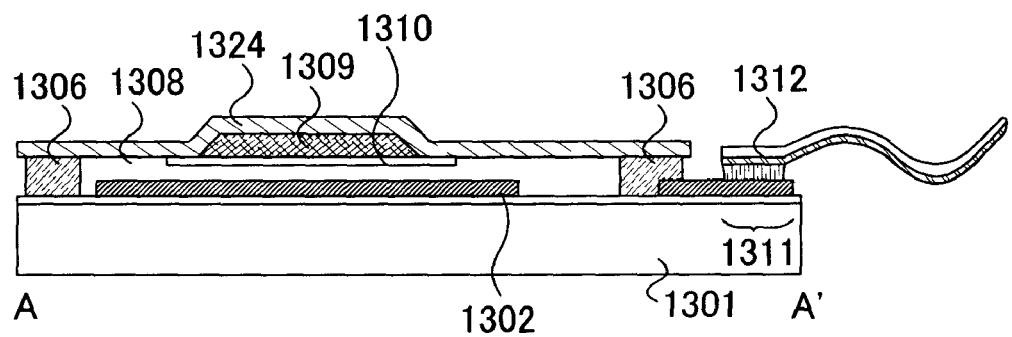

This embodiment mode describes a structure of sealing of a substrate including pixels with reference to FIGS. 53A to 53C. FIG. 53A is a top diagram of a panel formed by sealing a substrate including pixels, and FIGS. 53B and 53C are cross-sectional diagrams taken along a line A-A' in FIG. 53A. A sealing method is different in FIGS. 53B and 53C.

In FIGS. 53A to 53C, a pixel portion 1302 having a plurality of pixels is provided over a substrate 1301, and a sealing material 1306 is provided to surround the pixel portion 1302, and a sealing material 1307 is attached thereto. For a structure of each pixel, the structure described in Embodiment Mode 14, 15, or 16 can be employed.

In a display panel in FIG. 53B, the sealing material 1307 in FIG. 53A corresponds to a counter substrate 1321. The counter substrate 1321 which is transparent is attached using the sealing material 1306 as an adhesive layer, thereby a hermetically-sealed space 1322 is formed by the substrate 1301, the counter substrate 1321, and the sealing material 1306. The counter substrate 1321 is provided with a color filter 1320 and a protective film 1323 for protecting the color filter. Light emitted from light-emitting elements which are disposed in the pixel portion 1302 is discharged to outside through the color filters 1320. The hermetically-sealed space 1322 is filled with an inert resin, liquid, or the like. Note that as the resin for filling the hermetically-sealed space 1322, a light-transmissive resin in which a moisture absorbent is dispersed may be used. Further, the same materials may be used for the sealing material 1306 and for filling the hermetically-sealed space 1322, so that the adhesion of the counter substrate 1321 and the sealing of the pixel portion 1302 may be performed at the same time.

In a display panel shown in FIG. 53C, the sealing material 1307 in FIG. 53A corresponds to a sealing material 1324. The sealing material 1324 is attached using the sealing material 1306 as an adhesive layer, thereby a hermetically-sealed space 1308 is formed by the substrate 1301, the sealing material 1306, and the sealing material 1324. The sealing material 1324 is provided with a moisture absorbent 1309 in advance in its depressed portion, and the moisture absorbent 1309 functions to keep a clean atmosphere in the hermetically-sealed space 1308 by adsorbing moisture, oxygen, or the like, and to suppress degradation of the light-emitting elements. The depressed portion is covered with a fine-meshed cover material 1310. The cover material 1310 transmits air and moisture, and the moisture absorbent 1309 does not transmit them. Note that the hermetically-sealed space 1308 may be filled with a rare gas such as nitrogen or argon, and can also be filed with an inert resin or liquid.

An input terminal portion 1311 for transmitting signals to the pixel portion 1302 and the like is provided over the substrate 1301. Signals such as video signals are transmitted to the input terminal portion 1311 through an FPC (Flexible Printed Circuit) 1312. At the input terminal portion 1311, wirings formed over the substrate 1301 are electrically connected to wirings provided in the FPC 1312 with the use of a resin in which conductors are dispersed (an anisotropic conductive resin: ACF).

A driver circuit for inputting signals to the pixel portion 1302 may be formed over the same substrate 1301 as the pixel portion 1302. Alternatively, the driver circuit for inputting signals to the pixel portion 1302 may be formed in an IC chip to be connected onto the substrate 1301 by COG (Chip On Glass), or the IC chip may be disposed on the substrate 1301 by TAB (Tape Automated Bonding) or a printed board.

Note that this embodiment mode can be implemented freely combining with any description in the other embodiment modes of this specification. Further, the descriptions in this embodiment mode can be freely combined to be implemented.

Embodiment Mode 19

The present invention can be applied to a display module where a circuit for inputting signals to a panel is mounted on the panel.

Figure 54:
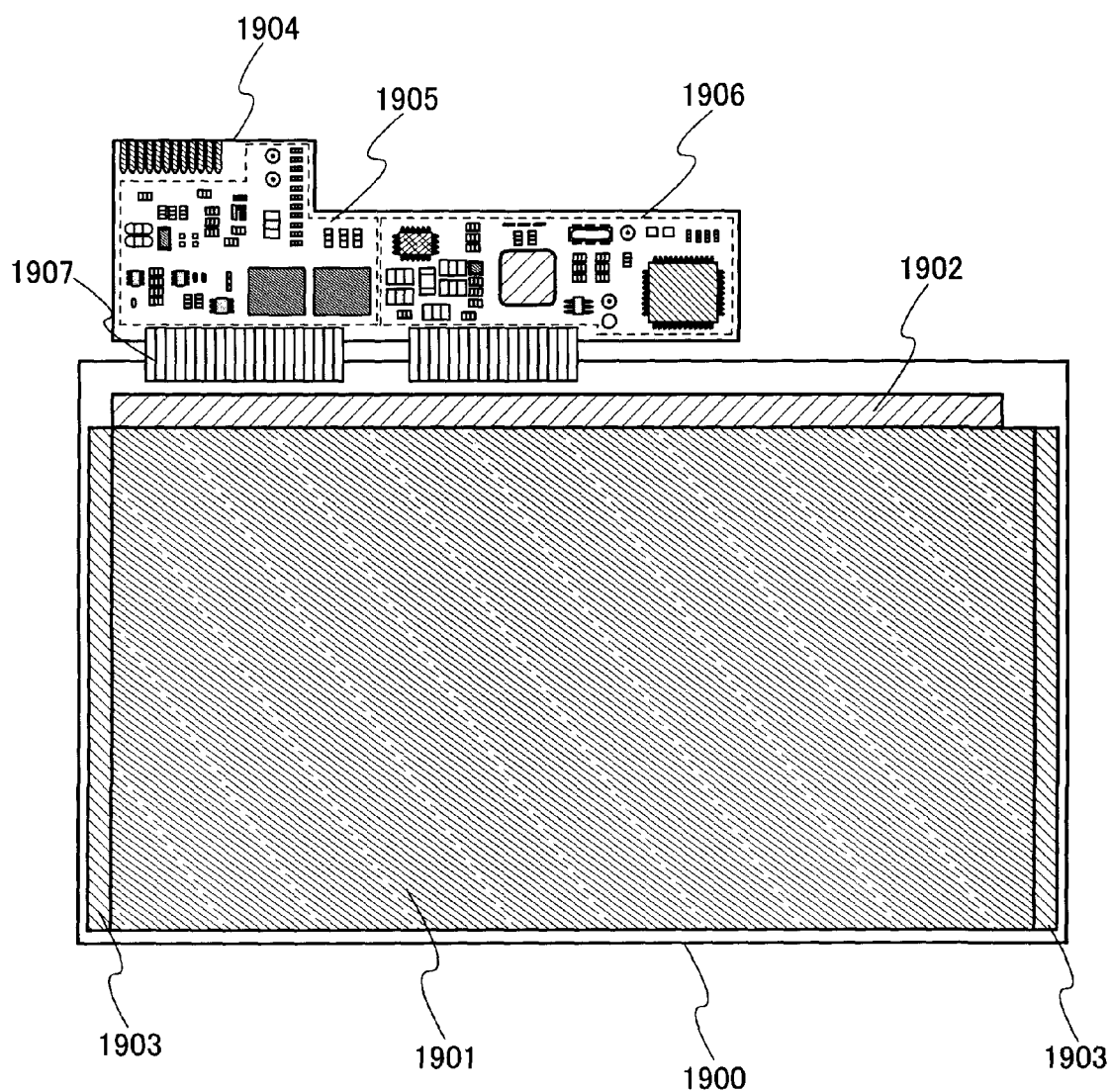
FIG. 54 is a diagram showing a display module of the present invention.

FIG. 54 shows a display module where a panel 1900 is combined with a circuit board 1904. Although a controller 1905, a signal dividing circuit 1906, and the like are formed over the circuit board 1904 in FIG. 54, circuits formed over the circuit board 1904 are not limited to these. Any circuit which can generate signals for controlling the panel may be formed.

Signals outputted from these circuits formed over the circuit board 1904 are inputted into the panel 1900 through connecting wirings 1907.

The panel 1900 includes a pixel portion 1901, a source driver 1902, and a gate driver 1903. A structure of the panel 1900 may be similar to that described in any one of Embodiment Modes 9 to 12. Although the source driver 1902 and the gate driver 1903 are formed over the same substrate as the pixel portion 1901 in FIG. 54, the display module of the present invention is not limited to this. Such a structure may also be employed that only the gate driver 1903 is formed over the same substrate as the pixel portion 1901, while the source driver is formed over a circuit board. Alternatively, both of the source driver and the gate driver may be formed over a circuit board.

Display portions of various electronic apparatuses can be formed by incorporating such a display module.

Note that this embodiment mode can be implemented freely combining with any description in the other embodiment modes of this specification. Further, the descriptions in this embodiment mode can be freely combined to be implemented.

Embodiment Mode 20

The present invention can be applied to various electronic apparatuses. The electronic apparatuses include a camera (e.g., a video camera or a digital camera), a projector, a head-mounted display (a goggle display), a navigation system, a car stereo, a personal computer, a game machine, a portable information terminal (e.g., a mobile computer, a portable phone, or an electronic book), an image reproducing device provided with a recording medium, and the like. As an example of the image reproducing device provided with a recording medium, a device for reproducing a recording medium such as a digital versatile disk (DVD) and having a display portion for displaying the reproduced image can be given. FIGS. 55A to 55D show examples of the electronic apparatuses.

Figure 55A:
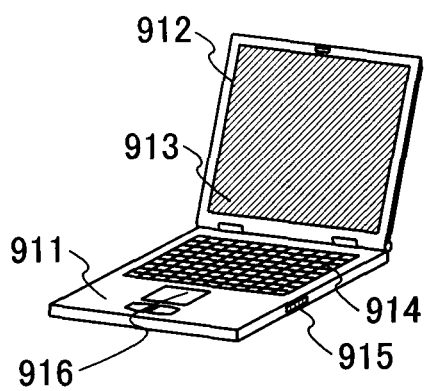
FIGS. 55A to 55D are diagrams for showing application of an electronic apparatus of the present invention.

FIG. 55A shows a laptop computer, which includes a main body 911, a housing 912, a display portion 913, a keyboard 914, an external connecting port 915, a pointing device 916, and the like. The present invention is applied to the display portion 913. With the present invention, power consumption of the display portion can be reduced.

Figure 55B:
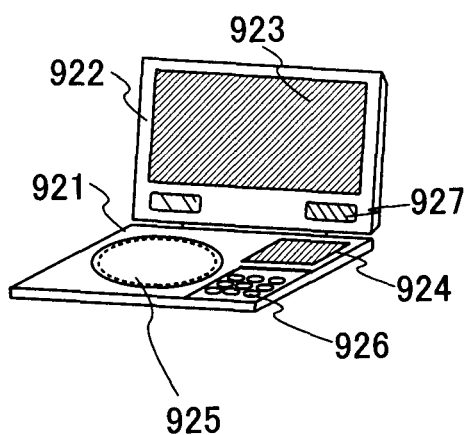

FIG. 55B shows an image reproducing device provided with a recording medium (specifically, a DVD reproducing device), which includes a main body 921, a housing 922, a first display portion 923, a second display portion 924, a recording medium (e.g., DVD) reading portion 925, an operating key 926, a speaker portion 927, and the like. The first display portion 923 mainly displays image data, while the second display portion 924 mainly displays text data. The present invention is applied to the first display portion 923 and the second display portion 924. With the present invention, power consumption of the display portion can be reduced.

Figure 55C:
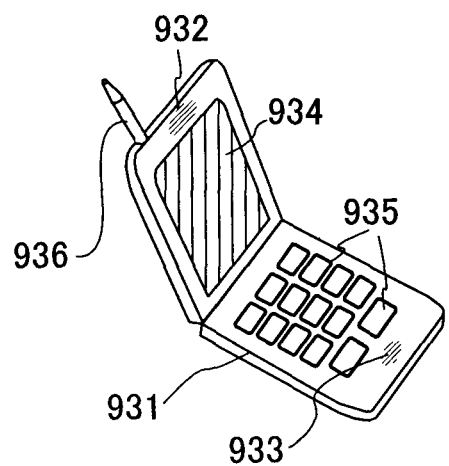

FIG. 55C shows a portable phone, which includes a main body 931, an audio output portion 932, an audio input portion 933, a display portion 934, operating switches 935, an antenna 936, and the like. The present invention is applied to the display portion 934. With the present invention, power consumption of the display portion can be reduced.

Figure 55D:
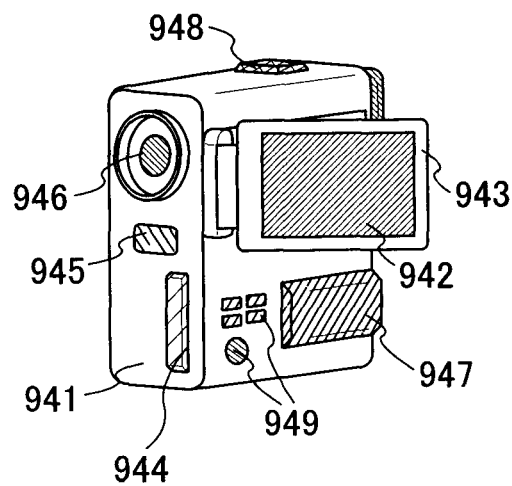

FIG. 55D shows a camera, which includes a main body 941, a display portion 942, a housing 943, an external connecting port 944, a remote controlling portion 945, an image receiving portion 946, a battery 947, an audio input portion 948, operating keys 949, and the like. The present invention is applied to the display portion 942. With the present invention, power consumption of the display portion can be reduced.

Note that this embodiment mode can be implemented freely combining with any description in the other embodiment modes of this specification. Further, the descriptions in this embodiment mode can be freely combined to be implemented.

Embodiment Mode 21

This embodiment mode describes application examples using a display panel in which a display device employing the pixel structure of the present invention is used in a display portion, with reference to the drawings of application modes. The display panel in which the display device employing the pixel structure of the present invention is used in the display portion can also be incorporated in a mobile object, a construction product, or the like.

Figure 56A:
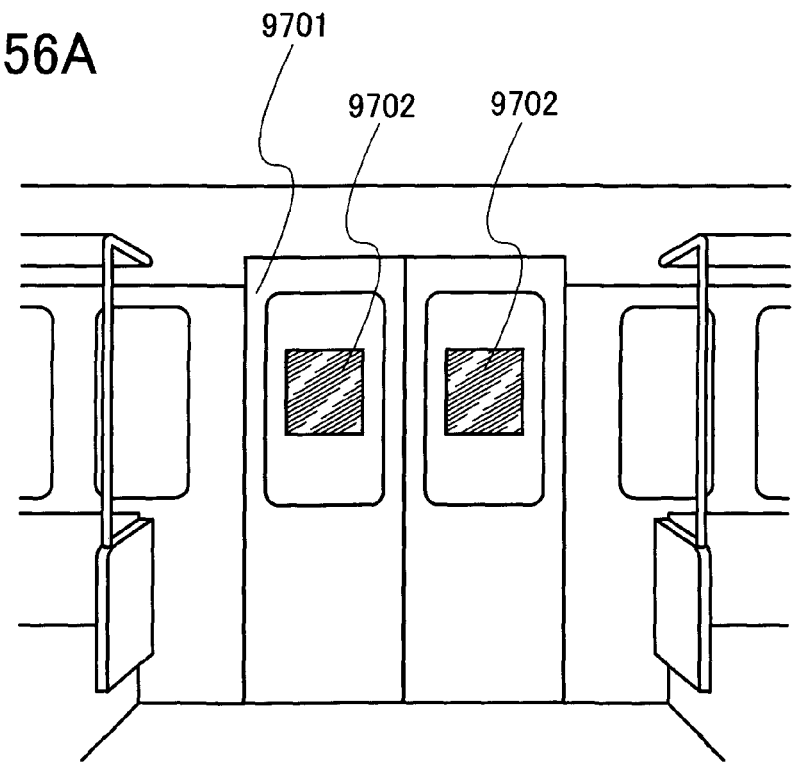
FIGS. 56A and 56B are diagrams for showing application of an electronic apparatus of the present invention.
Figure 56B:
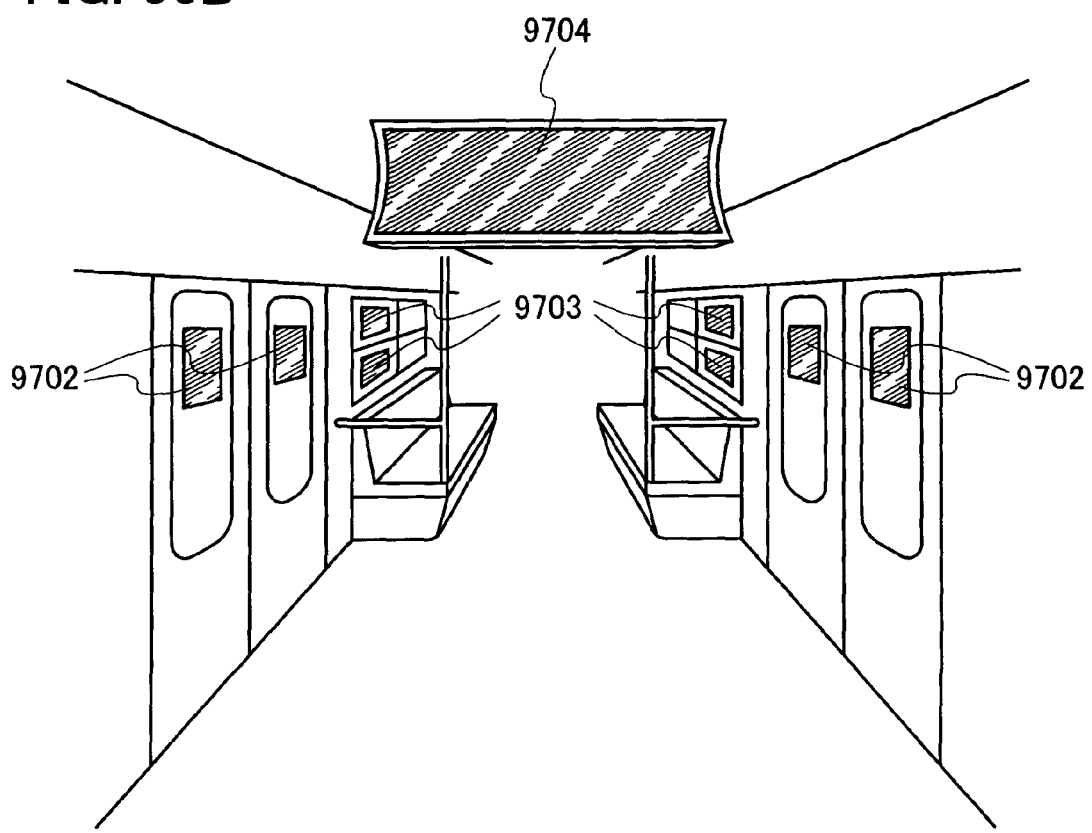

As examples of the display panel in which the display device employing the pixel structure of the present invention is used in the display portion, mobile objects with a display device incorporated are shown in FIGS. 56A and 56B. FIG. 56A shows an example of a mobile object with a display device incorporated, in which a display panel 9702 is used in a glass of a glass door on a main body 9701 of a train vehicle. The display panel 9702 in which the display device employing the pixel structure of the present invention is used in the display portion shown in FIG. 56A can easily switch an image displayed on the display portion by an outside signal. Therefore, by switching an image on the display panel for each time zone when the category of passengers is changed, advertising effectiveness can be further expected.

The display panel in which the display device employing the pixel structure of the present invention is used in the display portion can be not only applied to the glass door on the main body of the train vehicle as shown in FIG. 56A, but also applied to any place by changing the shape. One example thereof is shown in FIG. 56B.

FIG. 56B shows the interior of a train vehicle. In FIG. 56B, in addition to the display panel 9702 in the glass door shown in FIG. 56A, a display panel 9703 provided for a glass window and a display panel 9704 hanging from the ceiling are shown. Since the display panel 9703 having the pixel structure of the present invention includes a self-luminous display element, an outside view can also be seen from the train by performing no display at times other than rush hour, whereas an advertising image is displayed at rush hour. Further, the display panel 9704 having the pixel structure of the present invention can display an image while bending the display panel itself by being provided with a switching element such as an organic transistor over a film substrate and driving a self-luminous display element.

Further, as an application example of a mobile object which incorporates the display device using the display panel in which the display device employing the pixel structure of the present invention is used in the display portion, another application mode is described with reference to FIG. 57.

Figure 57:
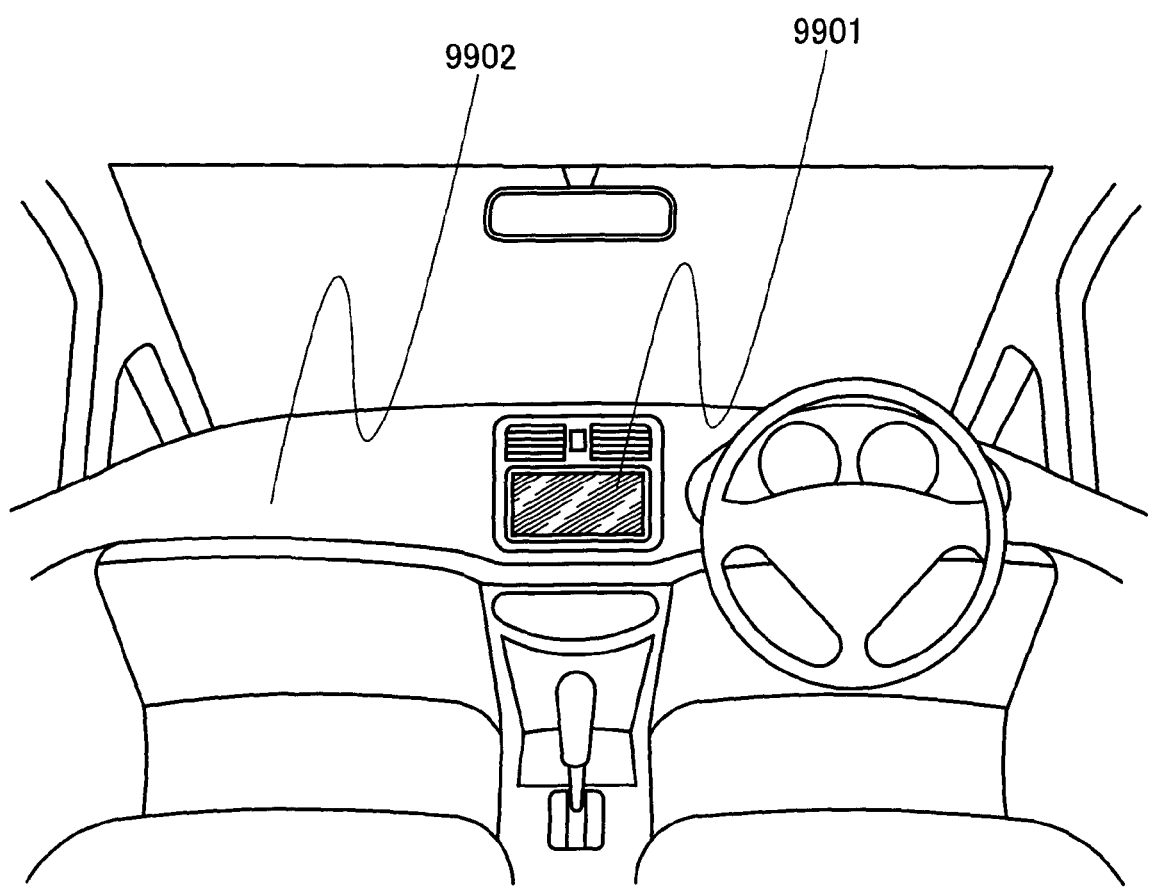
FIG. 57 is a diagram for showing application of an electronic apparatus of the present invention.

As one example of the display panel in which the display device employing the pixel structure of the present invention is used in the display portion, a mobile object with a display device incorporated is shown in FIG. 57. FIG. 57 shows an example in which a display panel 9902 is attached to be incorporated into an automobile body 9901, as an example of the mobile object with the display device incorporated. The display panel 9902 in which the display device employing the pixel structure of the present invention is used in the display portion is attached to be incorporated into the automobile body, and has a function of on-demand display of operation of the automobile body or information inputted from inside or outside the automobile body, and further has a function of navigation to a destination.

Note that the display panel in which the display device employing the pixel structure of the present invention is used in the display portion can be not only applied to the front portion of the automobile body shown in FIG. 57, but also applied to any place such as a glass window or a door, by changing the shape.

Further, as an application example of a mobile object which incorporates the display device using the display panel in which the display device employing the pixel structure of the present invention is used in the display portion, another application mode is described with reference to FIGS. 58A and 58B.

Figure 58A:
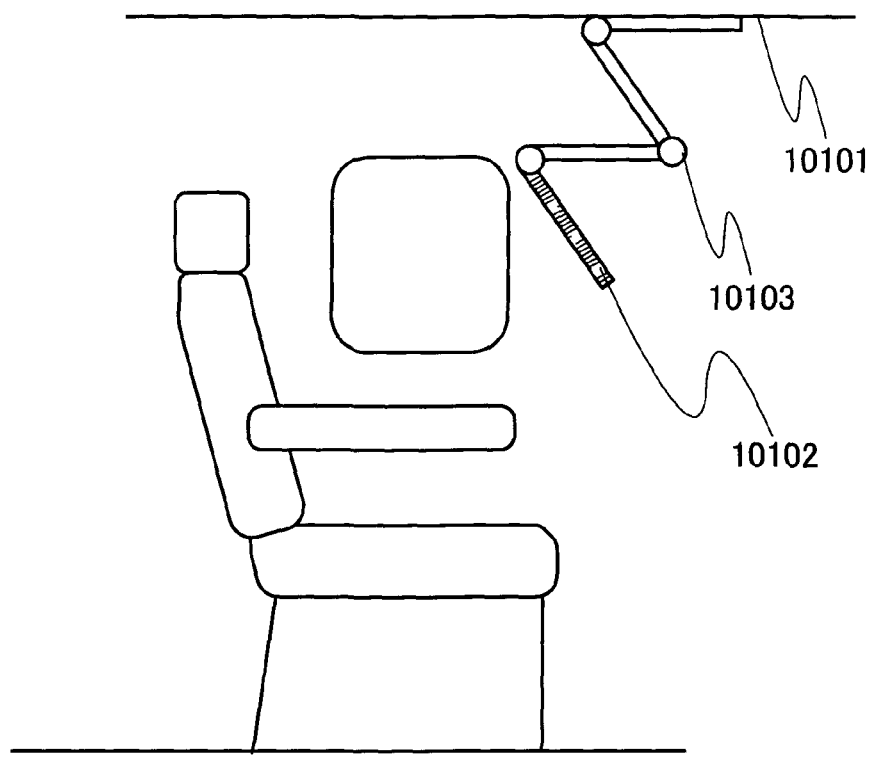
FIGS. 58A and 58B are diagrams for showing application of an electronic apparatus of the present invention.
Figure 58B:
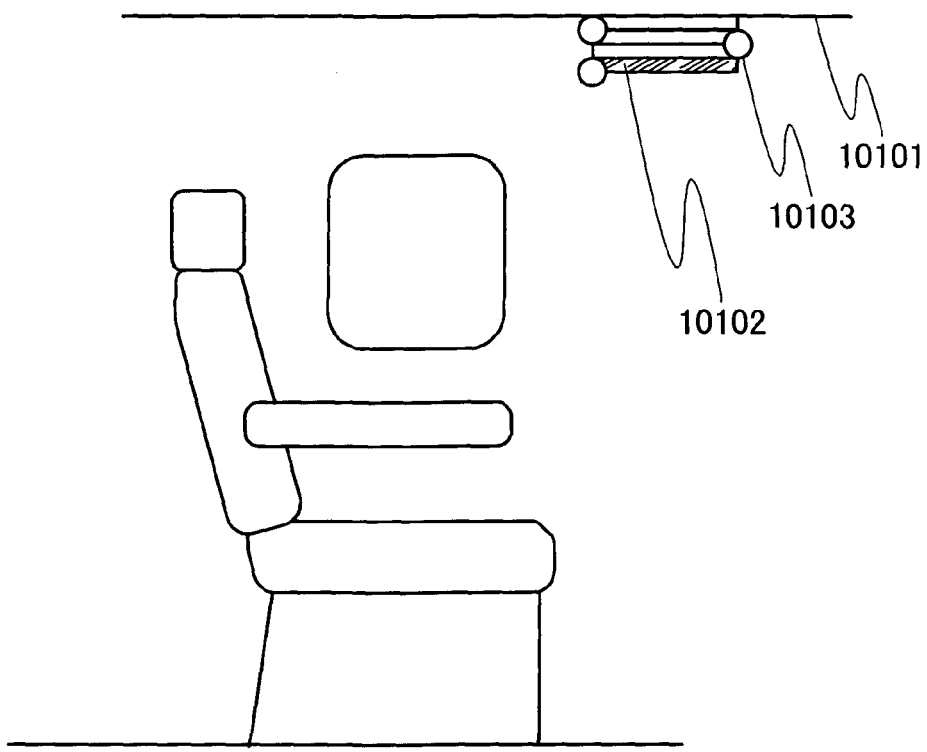

As one example of the display panel in which the display device employing the pixel structure of the present invention is used in the display portion, a mobile object with a display device incorporated is shown in FIGS. 58A and 58B. FIG. 58A shows an example in which a display panel 10102 is attached to be incorporated in a ceiling portion in a cabin inside a plane body 10101, as an example of the mobile object with the display device incorporated. The display panel 10102 in which the display device employing the pixel structure of the present invention is used in the display portion is attached to be incorporated to the plane body 10101 by hinges 10103. The hinges 10103 stretch or fold, thereby passengers can see the display panel 10102. The display panel 10102 can display information and can be utilized as advertising or entertainment means when it is operated by passengers. Further, with the display panel 10102 stored in the plane body 10101 by folding the hinges as shown in FIG. 58B, safety in takeoff and landing can be improved. Further, by lighting a display element of the display panel in case of emergency, the display panel 10102 can also be used as a sign lighting of the plane body 10101.

Note that the display panel in which the display device employing the pixel structure of the present invention is used in the display portion can be not only applied to the ceiling portion of the plane body 10101 shown in FIGS. 58A and 58B, but also applied to any place such as a seat or a door, by changing the shape. For example, by providing the display panel on the back side of a seat in front of your seat, the display panel may be operated and seen.

Although the train vehicle body, the automobile body, and the plane body are described as the examples of the mobile object in this embodiment mode, the present invention is not limited to these, and the present invention can be applied widely, such as to a two-wheeled motor vehicle, a four-wheeled motor vehicle (including an automobile, a bus, and the like), a train (including a monorail, a railway, and the like), or boats and ships. By employing the display panel in which the pixel structure of the present invention is used in the display portion, reduction in size and lower power consumption of the display panel can be achieved and a mobile object having a display medium with good operation can be provided. Further, in particular, display on the display panel inside the mobile object can be easily switched all at once by an external signal, thereby the display panel is very useful as an advertising display panel for an unspecified majority of customers or an information display board in disasters.

As an application example of using the display panel in which the display device employing the pixel structure of the present invention is used in the display portion, an application mode of a construction product is described with reference to FIG. 59.

Figure 59:
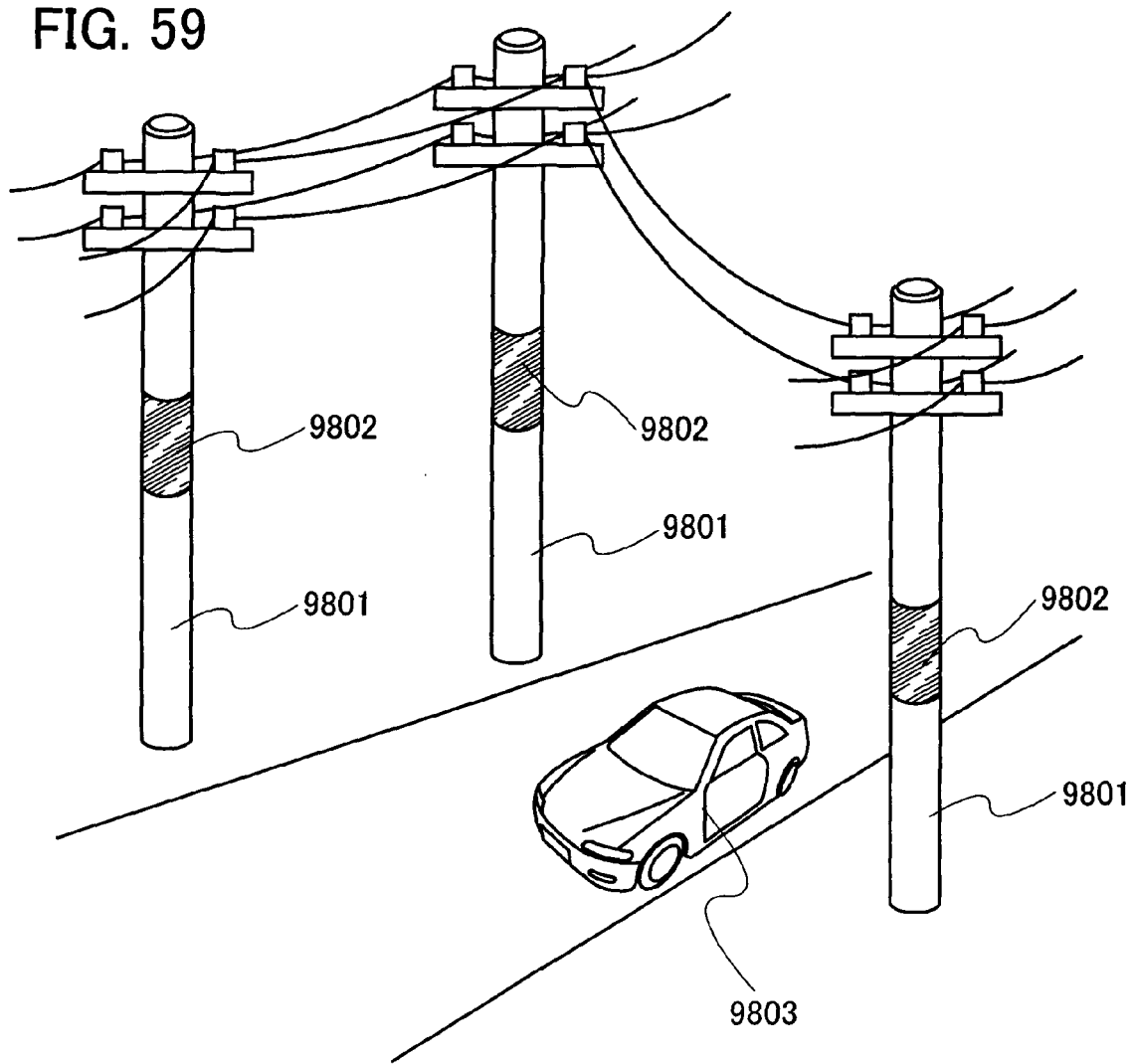
FIG. 59 is a diagram for showing application of an electronic apparatus of the present invention.

In FIG. 59, as the display panel in which the display device employing the pixel structure of the present invention is used in the display portion, a display panel which can display an image while bending the display panel itself by being provided with a switching element such as an organic transistor over a film substrate and driving a self-luminous display element is used, and an application example thereof is described. In FIG. 59, such a display panel is provided on a curved surface of a columnar object provided out of doors, such as an electrical pole as a construction product, and a structure in which a display panel 9802 is provided for an electrical pole 9801 as a construction product is here described.

The display panel 9802 shown in FIG. 59 is disposed at a position which is near the middle of height of the electrical pole and is higher than a human view point. Then, by seeing the display panel from a mobile object 9803, an image on the display panel 9802 can be recognized. With an outdoor forest of electrical poles or the like, by displaying the same image on the display panels 9802 provided for them, information and/or advertising display can be seen. The display panels 9802 provided for the electrical poles 9801 in FIG. 59 can easily display the same image by the use of an external signal, thereby very effective information display and advertising effectiveness can be expected. Further, by providing a self-luminous display element as a display element, the display panel of the present invention is useful as a display medium which is highly visible even in the night.

Further, as an application example of using the display panel in which the display device employing the pixel structure of the present invention is used in the display portion, another application mode of a construction product is described with reference to FIG. 60.

Figure 60:
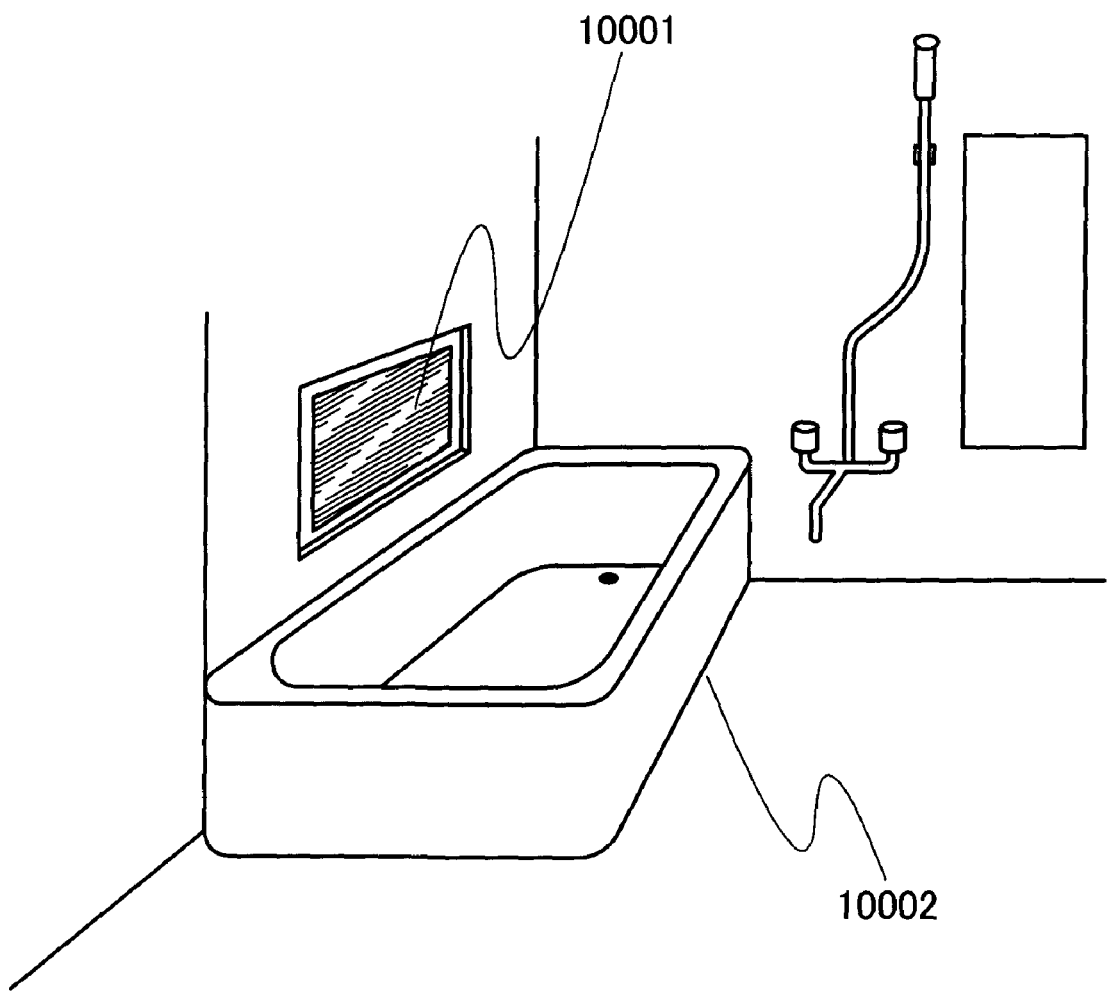
FIG. 60 is a diagram for showing application of an electronic apparatus of the present invention.

FIG. 60 shows an application example of the display panel in which the display device employing the pixel structure of the present invention is used in the display portion. As one example of an object with a display device incorporated, FIG. 60 shows an example in which a display panel 10002 is attached to be incorporated on a side wall inside a unit bath 10001. The display panel 10002 in which the display device employing the pixel structure of the present invention is used in the display portion is attached to be incorporated to the unit bath 10001. Those who bathe can see the display panel 10002. The display panel 10002 can display information and can be utilized as advertising or entertainment means when it is operated by those who bathe.

Note that the display panel in which the display device employing the pixel structure of the present invention is used in the display portion can be not only applied to the side wall of the unit bath 10001 shown in FIG. 60, but also applied to any place such as a part of a mirror or a bathtub itself, by changing the shape.

Figure 61:
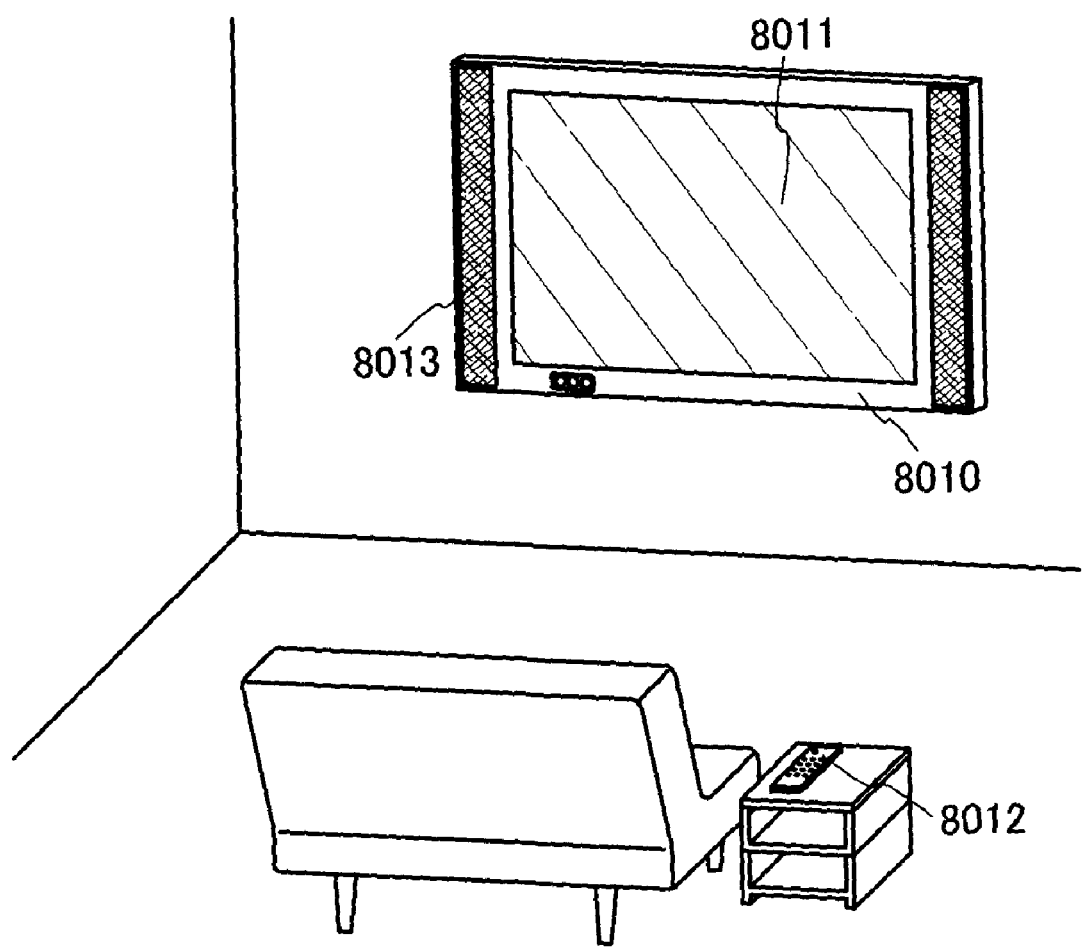
FIG. 61 is a diagram for showing application of an electronic apparatus of the present invention.

FIG. 61 shows an example in which a television set including a large display portion is provided inside a construction product. FIG. 61 includes a housing 8010, a display portion 8011, a remote-control unit 8012 which is an operation portion, speaker portions 8013, and the like. The display panel in which the display device employing the pixel structure of the present invention is used in the display portion is applied to the display portion 8011. The television set shown in FIG. 61 which is incorporated into a building, as a wall-hanging television set, can be disposed without requiring a large space.

Although the electrical pole as a columnar object, the unit bath, and the like are described as the examples of the construction product in this embodiment mode, the present invention is not limited to these as long as it is a construction product capable of including a display panel. By employing the display panel in which the pixel structure of the present invention is used in the display portion, reduction in size and lower power consumption of the display panel can be achieved and a construction product having a display medium with good operation can be provided.

Note that this embodiment mode can be implemented freely combining with any description in the other embodiment modes of this specification. Further, the descriptions in this embodiment mode can be freely combined to be implemented.

This application is based on Japanese Patent Application Serial No. 2006-155460 filed in Japan Patent Office on 2, Jun., 2006, the entire contents of which are hereby incorporated by reference.

What is claimed is:

1. A semiconductor device comprising:
a first capacitor, a second capacitor, a first transistor, a second transistor, a third transistor, and a fourth transistor, wherein:
a first electrode of the first capacitor is electrically connected to a third wiring, and a first electrode of the second capacitor is electrically connected to a fourth wiring;
a gate of the first transistor is electrically connected to a second electrode of the first capacitor;
a first terminal of the first transistor is electrically connected to a second wiring, and a second terminal of the first transistor is electrically connected to a second electrode of the second capacitor;
a gate of the second transistor is electrically connected to the second electrode of the second capacitor;
a first terminal of the second transistor is electrically connected to the second wiring, and a second terminal of the second transistor is electrically connected to the second electrode of the first capacitor;
a gate of the third transistor is electrically connected to the second electrode of the second capacitor;
a first terminal of the third transistor is electrically connected to the second wiring, and a second terminal of the third transistor is electrically connected to a fifth wiring; and
a gate and a first terminal of the fourth transistor are electrically connected to a first wiring, and a second terminal of the fourth transistor is electrically connected to the fifth wiring.

2. The semiconductor device according to claim 1, wherein the first to fourth transistors are transistors of the same conductivity type.

3. The semiconductor device according to claim 1, wherein the first to fourth transistors are P-channel transistors, and a potential of the first wiring is higher than a potential of the second wiring.

4. The semiconductor device according to claim 1, wherein the first to fourth transistors are N-channel transistors, and a potential of the first wiring is lower than a potential of the second wiring.

5. The semiconductor device according to claim 1, the semiconductor device is a display device.

6. A semiconductor device comprising:
a first capacitor, a second capacitor, a first transistor, a second transistor, a third transistor, a fourth transistor, a fifth transistor, and a sixth transistor, wherein:
a first electrode of the first capacitor is electrically connected to a third wiring, and a first electrode of the second capacitor is electrically connected to a fourth wiring;
a gate of the first transistor is electrically connected to a second electrode of the first capacitor;
a first terminal of the first transistor is electrically connected to a second wiring, and a second terminal of the first transistor is electrically connected to a second electrode of the second capacitor;
a gate of the second transistor is electrically connected to the second electrode of the second capacitor;
a first terminal of the second transistor is electrically connected to the second wiring, and a second terminal of the second transistor is electrically connected to the second electrode of the first capacitor;
a gate of the third transistor is electrically connected to the second electrode of the second capacitor;
a first terminal of the third transistor is electrically connected to the second wiring, and a second terminal of the third transistor is electrically connected to a fifth wiring;
a gate and a first terminal of the fourth transistor are electrically connected to a first wiring, and a second terminal of the fourth transistor is electrically connected to the fifth wiring;
a gate of the fifth transistor is electrically connected to the second electrode of the first capacitor;
a first terminal of the fifth transistor is electrically connected to the second wiring, and a second terminal of the fifth transistor is electrically connected to a sixth wiring; and
a gate and a first terminal of the sixth transistor are electrically connected to the first wiring, and a second terminal of the sixth transistor is electrically connected to the sixth wiring.

7. The semiconductor device according to claim 6, wherein the first to sixth transistors are transistors of the same conductivity type.

8. The semiconductor device according to claim 6, wherein the first to sixth transistors are P-channel transistors, and a potential of the first wiring is higher than a potential of the second wiring.

9. The semiconductor device according to claim 6, wherein the first to sixth transistors are N-channel transistors, and a potential of the first wiring is lower than a potential of the second wiring.

10. The semiconductor device according to claim 6, the semiconductor device is a display device.

11. A semiconductor device comprising:
a first capacitor, a second capacitor, a first transistor, a second transistor, a third transistor, a fourth transistor, a fifth transistor, and a sixth transistor; wherein:
a first electrode of the first capacitor is electrically connected to a third wiring, and a first electrode of the second capacitor is electrically connected to a fourth wiring;
a gate of the first transistor is electrically connected to a second electrode of the first capacitor;
a first terminal of the first transistor is electrically connected to a second wiring, and a second terminal of the first transistor is electrically connected to a second electrode of the second capacitor;
a gate of the second transistor is electrically connected to the second electrode of the second capacitor;
a first terminal of the second transistor is electrically connected to a second wiring, and a second terminal of the second transistor is electrically connected to the second electrode of the first capacitor;

a gate of the third transistor is electrically connected to the second electrode of the second capacitor;

a first terminal of the third transistor is electrically connected to the second wiring;

a gate and a first terminal of the fourth transistor are electrically connected to a first wiring, and a second terminal of the fourth transistor is electrically connected to a second terminal of the third transistor;

a gate of the fifth transistor is electrically connected to the second electrode of the second capacitor;

a first terminal of the fifth transistor is electrically connected to the second wiring, and a second terminal of the fifth transistor is electrically connected to a fifth wiring; and a gate of the sixth transistor is electrically connected to the second terminal of the third transistor and the second terminal of the fourth transistor, a first terminal of the sixth transistor is electrically connected to the first wiring, and a second terminal of the sixth transistor is electrically connected to the fifth wiring.

12. The semiconductor device according to claim 11, wherein the first to sixth transistors are transistors of the same conductivity type.

13. The semiconductor device according to claim 11, wherein the first to sixth transistors are P-channel transistors, and a potential of the first wiring is higher than a potential of the second wiring.

14. The semiconductor device according to claim 11, wherein the first to sixth transistors are N-channel transistors, and a potential of the first wiring is lower than a potential of the second wiring.

15. The semiconductor device according to claim 11, the semiconductor device is a display device.

16. An electronic apparatus includes the semiconductor device according to claim 1.

17. An electronic apparatus includes the semiconductor device according to claim 6.

18. An electronic apparatus includes the semiconductor device according to claim 11.

* * * * *